US012757565B2

(12) United States Patent
Kimura et al.

(10) Patent No.: US 12,757,565 B2
(45) Date of Patent: Oct. 6, 2026

(54) DISPLAY APPARATUS, DISPLAY MODULE, AND ELECTRONIC DEVICE

(71) Applicant: SEMICONDUCTOR ENERGY LABORATORY CO., LTD., Atsugi (JP)

(72) Inventors: Hajime Kimura, Atsugi (JP); Takayuki Ikeda, Atsugi (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 315 days.

(21) Appl. No.: 18/285,724

(22) PCT Filed: Apr. 5, 2022

(86) PCT No.: PCT/IB2022/053133
§ 371 (c)(1),
(2) Date: Oct. 5, 2023

(87) PCT Pub. No.: WO2022/219455
PCT Pub. Date: Oct. 20, 2022

(65) Prior Publication Data

US 2024/0196675 A1 Jun. 13, 2024

(30) Foreign Application Priority Data

Apr. 16, 2021 (JP) ................................ 2021-069423

(51) Int. Cl.
*H10K 50/11* (2023.01)
*H10K 39/34* (2023.01)
(Continued)

(52) U.S. Cl.
CPC ............. *H10K 50/11* (2023.02); *H10K 39/34* (2023.02); *H10K 59/1213* (2023.02); *H10K 59/131* (2023.02); *H10K 59/65* (2023.02)

(58) Field of Classification Search
CPC .... H10K 50/11; H10K 39/34; H10K 59/1213; H10K 59/131; H10K 59/65; H10K 59/60; G09F 9/30; H05B 33/02
(Continued)

(56) References Cited

U.S. PATENT DOCUMENTS 5,953,985 A 9/1999 Kobayashi
6,120,338 A 9/2000 Hirano et al.
(Continued)

FOREIGN PATENT DOCUMENTS

CN 105304673 A 2/2016
CN 109216421 A 1/2019
(Continued)

OTHER PUBLICATIONS

International Search Report (Application No. PCT/IB2022/053133) Dated Jun. 7, 2022.
(Continued)

*Primary Examiner* — Theresa T Doan
(74) *Attorney, Agent, or Firm* — NIXON PEABODY LLP; Jeffrey L. Costellia

(57) ABSTRACT

A display apparatus with a novel structure is provided. The display apparatus includes a power supply line, a first transistor, a second transistor, a light-emitting device, and a light-receiving device. The light-emitting device includes a first electrode, a light-emitting layer, a first electron-transport layer, an electron-injection layer, and a second electrode that are stacked in this order. The light-receiving device comprises a third electrode, an active layer, a first hole-transport layer, the electron-injection layer, and the second electrode that are stacked in this order. The first electrode is electrically connected to one of a source and a drain of the first transistor. The second electrode is electrically connected to one of a source and a drain of the second transistor.
(Continued)

The power supply line is electrically connected to the other of the source and the drain of the first transistor and the other of the source and the drain of the second transistor.

16 Claims, 85 Drawing Sheets

(51) Int. Cl.
*H10K 59/121* (2023.01)
*H10K 59/131* (2023.01)
*H10K 59/65* (2023.01)

(58) Field of Classification Search
USPC ........................................................ 257/40
See application file for complete search history.

(56) References Cited

U.S. PATENT DOCUMENTS

| | | | |
|---|---|---|---|
| 10,727,285 B2 | 7/2020 | Chung et al. | |
| 11,394,014 B2 | 7/2022 | Kubota et al. | |
| 11,469,277 B2 | 10/2022 | Chung et al. | |
| 12,178,093 B2 | 12/2024 | Yamazaki. et al. | |
| 2002/0072139 A1 | 6/2002 | Kashiwabara | |
| 2011/0148290 A1 | 6/2011 | Oota | |
| 2012/0256204 A1 | 10/2012 | Yoshizumi et al. | |
| 2012/0273804 A1 | 11/2012 | Hatano | |
| 2012/0276484 A1 | 11/2012 | Izumi et al. | |
| 2013/0084531 A1 | 4/2013 | Hamaguchi et al. | |
| 2013/0084664 A1 | 4/2013 | Yoshitoku et al. | |
| 2013/0084666 A1 | 4/2013 | Oshige | |
| 2013/0280839 A1 | 10/2013 | Sonoda et al. | |
| 2013/0295705 A1 | 11/2013 | Sonoda et al. | |
| 2014/0004640 A1 | 1/2014 | Hamaguchi et al. | |
| 2014/0004642 A1 | 1/2014 | Otsuka et al. | |
| 2015/0060826 A1 | 3/2015 | Matsumoto et al. | |
| 2015/0069360 A1 | 3/2015 | Sato | |
| 2015/0076476 A1 | 3/2015 | Odaka et al. | |
| 2015/0364527 A1 | 12/2015 | Wang et al. | |
| 2016/0172595 A1 | 6/2016 | Malinowski et al. | |
| 2016/0315133 A1 | 10/2016 | Sato | |
| 2017/0141167 A1 | 5/2017 | Naganuma | |
| 2017/0256754 A1 | 9/2017 | Defranco et al. | |
| 2018/0190908 A1 | 7/2018 | Ke et al. | |
| 2019/0013368 A1 | 1/2019 | Chung et al. | |
| 2020/0083302 A1 | 3/2020 | Park et al. | |
| 2020/0203662 A1 | 6/2020 | Mollard et al. | |
| 2020/0334435 A1* | 10/2020 | Hung | G06V 40/1318 |
| 2021/0066669 A1* | 3/2021 | Kubota | H10K 59/353 |
| 2021/0089741 A1 | 3/2021 | Yeh et al. | |
| 2021/0327979 A1 | 10/2021 | Kamada et al. | |
| 2022/0036817 A1* | 2/2022 | Xu | G09G 3/3216 |
| 2025/0127002 A1 | 4/2025 | Yamazaki. et al. | |

FOREIGN PATENT DOCUMENTS

| | | |
|---|---|---|
| CN | 112673488 A | 4/2021 |
| EP | 3425670 A | 1/2019 |
| EP | 3624194 A | 3/2020 |
| JP | 2000-036385 A | 2/2000 |
| JP | 2003-059663 A | 2/2003 |
| JP | 2008-098106 A | 4/2008 |
| JP | 2008-147072 A | 6/2008 |
| JP | 2008-251270 A | 10/2008 |
| JP | 2014-120218 A | 6/2014 |
| JP | 2014-135251 A | 7/2014 |
| JP | 2014-232568 A | 12/2014 |
| JP | 2015-115178 A | 6/2015 |
| JP | 2016-197494 A | 11/2016 |
| JP | 2019-033071 A | 2/2019 |
| JP | 2019-179696 A | 10/2019 |
| JP | 2020-160305 A | 10/2020 |
| JP | 2021-039342 A | 3/2021 |
| KR | 2015-0142816 A | 12/2015 |
| KR | 2019-0004678 A | 1/2019 |
| KR | 2020-0030222 A | 3/2020 |
| KR | 2021-0055699 A | 5/2021 |
| WO | WO-2020/053692 | 3/2020 |
| WO | WO-2021/053459 | 3/2021 |

OTHER PUBLICATIONS

Written Opinion (Application No. PCT/IB2022/053133) Dated Jun. 7, 2022.

Zakhidov.A et al., "Orthogonal processing: A new strategy for organic electronics", Chem. Sci. (Chemical Science), Apr. 7, 2011, vol. 2, No. 6, pp. 1178-1182.

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterened by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

* cited by examiner

X1
X2
Y1
Y2
101
111
113A
113a
113B
118a
119a
118B
119B
140
190b

FIG. 73A
100A
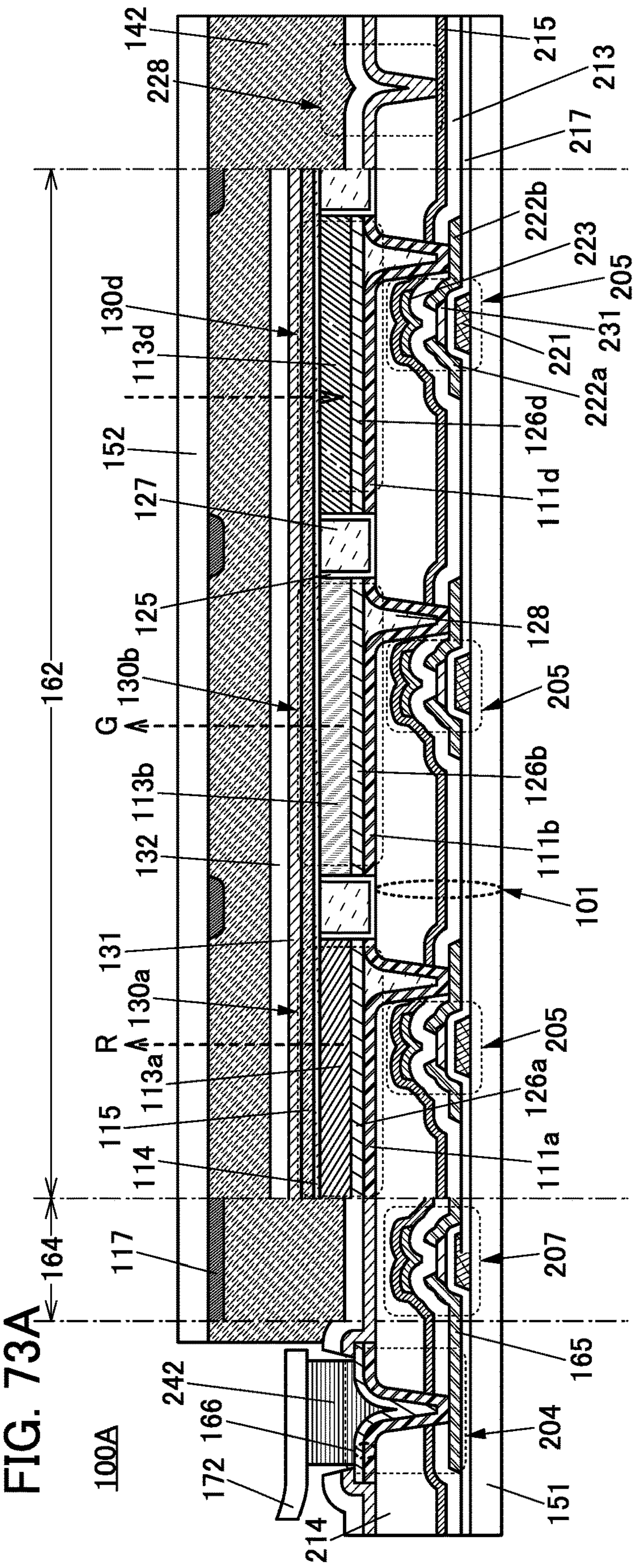
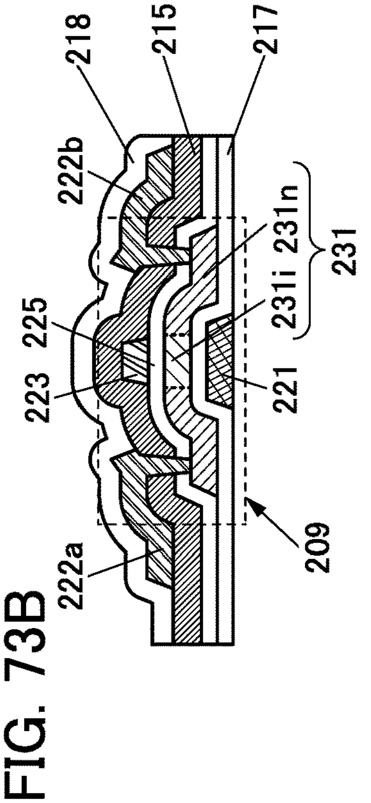
FIG. 73B
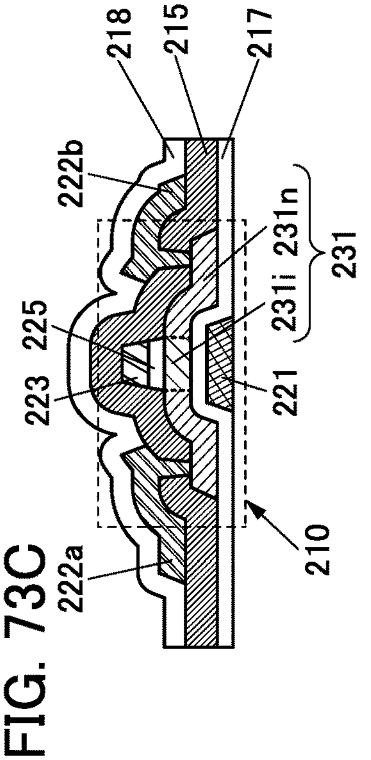
FIG. 73C

DISPLAY APPARATUS, DISPLAY MODULE, AND ELECTRONIC DEVICE

TECHNICAL FIELD

One embodiment of the present invention relates to a semiconductor device, a display apparatus, a display module, and an electronic device. One embodiment of the present invention relates to a manufacturing method of a display apparatus.

Note that one embodiment of the present invention is not limited to the above technical field. Examples of the technical field of one embodiment of the present invention include a semiconductor device, a display apparatus, a light-emitting apparatus, a power storage device, a memory device, an electronic device, a lighting device, an input device (e.g., a touch sensor or the like), an input/output device (e.g., a touch panel or the like), a method for driving any of them, and a method for manufacturing any of them.

BACKGROUND ART

In recent years, information terminal devices, for example, mobile phones such as smartphones, tablet information terminals, and laptop PCs (personal computers) have been widely used. Such information terminal devices often include personal information or the like, and thus various authentication technologies for preventing unauthorized use have been developed. Information terminal devices have been required to have a variety of functions such as an image display function, a touch sensor function, and a function of fingerprint image capturing for authentication.

For example, Patent Document 1 discloses an electronic device including a fingerprint sensor overlapping with a display portion.

For example, light-emitting apparatuses including light-emitting devices have been developed as display apparatuses. Light-emitting devices (also referred to as EL devices or EL elements) utilizing electroluminescence (hereinafter referred to as EL) have features such as ease of reduction in thickness and weight, high-speed response to input signals, and driving with a direct-current constant voltage power source, and have been used in display apparatuses.

REFERENCE

Patent Document

[Patent Document 1] United States Patent Application Publication No. 2021/0089741

SUMMARY OF THE INVENTION

Problems to be Solved by the Invention

An object of one embodiment of the present invention is to provide a display apparatus or the like including a display portion having a novel structure. An object of one embodiment of the present invention is to provide a display apparatus or the like including a high-definition display portion. An object of one embodiment of the present invention is to provide a display apparatus or the like including a high-resolution display portion. An object of one embodiment of the present invention is to provide a display apparatus or the like including a high-definition display portion having a light detection function. An object of one embodiment of the present invention is to provide a display apparatus or the like including a high-resolution display portion having a light detection function.

Note that the description of these objects does not preclude the presence of other objects. One embodiment of the present invention does not need to achieve all of these objects. Other objects can be derived from the description of the specification, the drawings, and the claims.

Means for Solving the Problems

One embodiment of the present invention is a display apparatus including a power supply line; a first transistor; a second transistor; a light-emitting device; and a light-receiving device. The light-emitting device includes a first electrode, a light-emitting layer, a first electron-transport layer, an electron-injection layer, and a second electrode that are stacked in this order, the light-receiving device includes a third electrode, an active layer, a first hole-transport layer, the electron-injection layer, and the second electrode that are stacked in this order, the first electrode is electrically connected to one of a source and a drain of the first transistor, the second electrode is electrically connected to one of a source and a drain of the second transistor, and the power supply line is electrically connected to the other of the source and the drain of the first transistor and the other of the source and the drain of the second transistor.

One embodiment of the present invention is a display apparatus including a power supply line; a first transistor; a second transistor; a light-emitting device; and a light-receiving device. The light-emitting device includes a first electrode, a light-emitting layer, a first electron-transport layer, an electron-injection layer, and a second electrode that are stacked in this order, the light-receiving device includes a third electrode, an active layer, a first hole-transport layer, the electron-injection layer, and the second electrode that are stacked in this order, the first electrode is electrically connected to one of a source and a drain of the first transistor, the second electrode is electrically connected to one of a source and a drain of the second transistor, the power supply line is electrically connected to the other of the source and the drain of the first transistor and the other of the source and the drain of the second transistor, and a potential of the power supply line is higher than a potential of the second electrode.

In the display apparatus according to one embodiment of the present invention, the first electrode and the third electrode are preferably provided over the same surface.

In the display apparatus according to one embodiment of the present invention, the light-emitting device preferably includes a second hole-transport layer between the first electrode and the light-emitting layer.

In the display apparatus according to one embodiment of the present invention, the light-receiving device preferably includes a second electron-transport layer between the third electrode and the active layer.

In the display apparatus according to one embodiment of the present invention, it is preferable that the light-emitting device have a function of emitting visible light and the light-receiving device have a function of detecting visible light.

In the display apparatus according to one embodiment of the present invention, it is preferable that the light-emitting device have a function of emitting infrared light and the light-receiving device have a function of detecting infrared light.

One embodiment of the present invention is a display module including the display apparatus described above and at least one of a connector and an integrated circuit.

One embodiment of the present invention is an electronic device including the display module described above and at least one of a housing, a battery, a camera, a speaker, and a microphone.

Effect of the Invention

One embodiment of the present invention can provide a display apparatus or the like including a display portion having a novel structure. One embodiment of the present invention can provide a display apparatus or the like including a high-definition display portion. One embodiment of the present invention can provide a display apparatus or the like including a high-resolution display portion. One embodiment of the present invention can provide a display apparatus or the like including a high-definition display portion having a light detection function. One embodiment of the present invention can provide a display apparatus or the like including a high-resolution display portion having a light detection function.

Note that the description of these effects does not preclude the presence of other effects. One embodiment of the present invention does not need to have all of these effects. Other effects can be derived from the description of the specification, the drawings, and the claims.

BRIEF DESCRIPTION OF THE DRAWINGS

FIG. 73A is a cross-sectional view illustrating an example of a display apparatus. FIG. 73B and FIG. 73C are cross-sectional views each illustrating an example of a transistor.

MODE FOR CARRYING OUT THE INVENTION

Figure 1A:
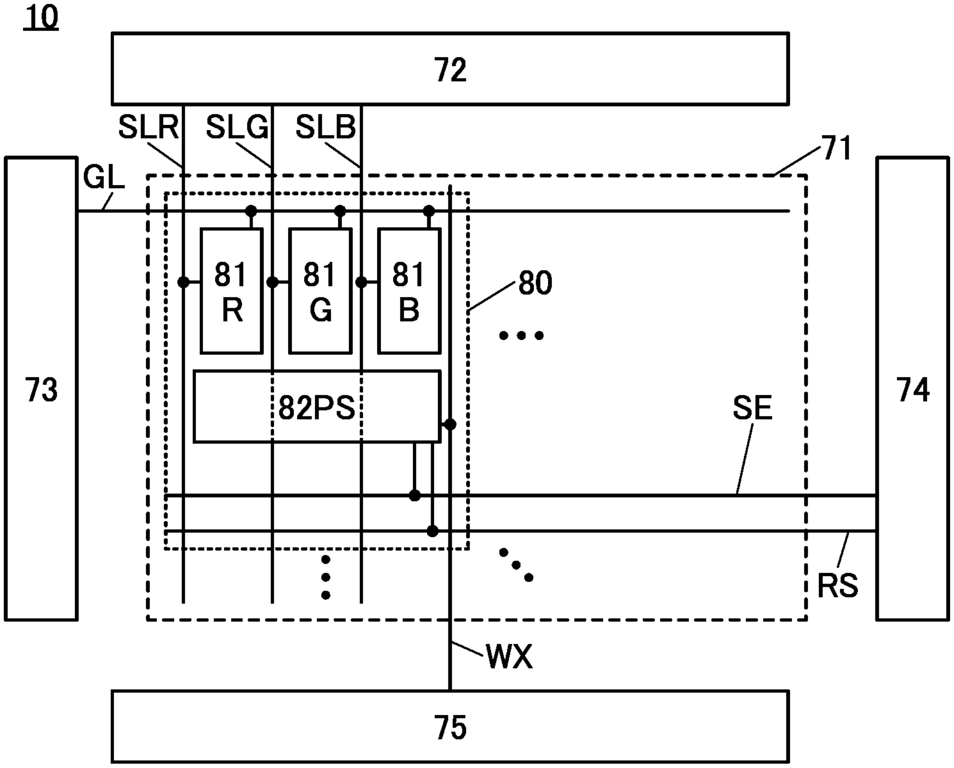
FIG. 1A to FIG. 1C are diagrams illustrating structure examples of a display apparatus.

Embodiments are described in detail with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments.

Note that in structures of the present invention described below, the same reference numerals are commonly used for the same portions or portions having similar functions in different drawings, and a repeated description thereof is omitted. Furthermore, the same hatch pattern is used to show the portions having similar functions, and the portions are not especially denoted by reference numerals in some cases.

In addition, the position, size, range, or the like of each structure illustrated in drawings does not represent the actual position, size, range, or the like in some cases for easy understanding. Therefore, the disclosed invention is not necessarily limited to the position, size, range, or the like disclosed in the drawings.

Note that the term "film" and the term "layer" can be interchanged with each other depending on the case or circumstances. For example, the term "conductive layer" can be replaced with the term "conductive film". As another example, the term "insulating film" can be replaced with the term "insulating layer".

Embodiment 1

In this embodiment, a display apparatus of one embodiment of the present invention will be described. In this embodiment, a circuit configuration of a pixel in the display apparatus is specifically described.

The display apparatus of one embodiment of the present invention includes a display portion, and the display portion includes a plurality of pixels arranged in a matrix. The pixel includes a light-emitting device (also referred to as a light-emitting element) and a light-receiving device (also referred to as a light-receiving element).

The light-emitting device functions as a display device (also referred to as a display element). In the display apparatus of one embodiment of the present invention, the light-emitting devices are arranged in a matrix in the display portion, and an image can be displayed on the display portion. In addition, the display apparatus of one embodiment of the present invention has a function of detecting light with the use of the light-receiving devices.

As the light-emitting device, an EL device such as an OLED (Organic Light Emitting Diode) or a QLED (Quantum-dot Light Emitting Diode) is preferably used. Examples of a light-emitting substance contained in the EL device include a substance exhibiting fluorescence (a fluorescent material), a substance exhibiting phosphorescence (a phosphorescent material), an inorganic compound (e.g., a quantum dot material), and a substance exhibiting thermally activated delayed fluorescence (a thermally activated delayed fluorescence (TADF) material). In addition, an LED (Light Emitting Diode) such as a micro-LED can be used as the light-emitting device. Note that as a TADF material, a material that is in a thermal equilibrium state between a singlet excited state and a triplet excited state may be used. Since such a TADF material enables a short emission lifetime (excitation lifetime), an efficiency decrease of a light-emitting device in a high-luminance region can be inhibited.

The light-receiving devices are arranged in a matrix in the display portion of the display apparatus of one embodiment of the present invention, and the display portion has one or both of an image capturing function and a sensing function in addition to an image displaying function. The display portion can be used as an image sensor or a touch sensor. That is, by detecting light with the display portion, an image can be captured or an approach or touch of an object (e.g., a finger, a hand, or a pen) can be detected. Furthermore, in the display apparatus of one embodiment of the present invention, the light-emitting devices can be used as a light source of the sensor. Accordingly, a light-receiving portion and a light source do not need to be provided separately from the display apparatus; hence, the number of components of an electronic device can be reduced.

In the case where the light-receiving devices are used as the image sensor, the display apparatus can capture an image using the light-receiving devices. For example, the display apparatus of this embodiment can be used as a scanner.

For example, data on biological information such as a fingerprint or a palm print can be obtained with the use of the image sensor. That is, a biometric authentication sensor can be incorporated in the display apparatus. When the display apparatus incorporates a biometric authentication sensor, the number of components of an electronic device can be reduced as compared with the case where a biometric authentication sensor is provided separately from the display apparatus; thus, the size and weight of the electronic device can be reduced.

In the case where the light-receiving devices are used as the touch sensor, the display apparatus can detect an approach or touch of an object with the use of the light-receiving devices.

More specific examples are described below with reference to drawings.

<Block Diagram of Display Apparatus>

FIG. 1A is a block diagram of a display apparatus 10. The display apparatus 10 includes a display portion 71, a driver circuit portion 72, a driver circuit portion 73, a driver circuit portion 74, a circuit portion 75, and the like.

The display portion 71 includes a plurality of pixels 80 arranged in a matrix. The pixel 80 includes a subpixel 81R, a subpixel 81G, a subpixel 81B, and a subpixel 82PS. The subpixel 81R, the subpixel 81G, and the subpixel 81B each include a light-emitting device functioning as a display device. The subpixel 82PS includes a light-receiving device functioning as a photoelectric conversion element.

Note that in this specification and the like, although a minimum unit in which independent operation is performed in one "pixel" is defined as a "subpixel" in the description for convenience, a "pixel" may be replaced with a "region" and a "subpixel" may be replaced with a "pixel".

The pixel 80 is electrically connected to a wiring GL, a wiring SLR, a wiring SLG, a wiring SLB, a wiring SE, a wiring RS, a wiring WX, and the like. The wiring SLR, the wiring SLG, and the wiring SLB are electrically connected to the driver circuit portion 72. The wiring GL is electrically connected to the driver circuit portion 73. The driver circuit portion 72 functions as a source line driver circuit (also referred to as a source driver). The driver circuit portion 73 functions as a gate line driver circuit (also referred to as a gate driver).

The pixel 80 includes the subpixel 81R, the subpixel 81G, and the subpixel 81B as the subpixels each including a light-emitting device. For example, the subpixel 81R is a subpixel exhibiting a red color, the subpixel 81G is a subpixel exhibiting a green color, and the subpixel 81B is a subpixel exhibiting a blue color. Thus, the display apparatus 100 can perform full-color display. Note that although the example where the pixel 80 includes subpixels of three colors is illustrated here, subpixels of four or more colors may be included.

The subpixel 81R includes a light-emitting device that emits red light. The subpixel 81G includes a light-emitting device that emits green light. The subpixel 81B includes a light-emitting device that emits blue light. Note that the pixel 80 may include a subpixel including a light-emitting device that emits light of another color. For example, the pixel 80 may include, in addition to the three subpixels, a subpixel including a light-emitting device that emits white light, a subpixel including a light-emitting device that emits yellow light, or the like.

The wiring GL is electrically connected to the subpixel 81R, the subpixel 81G, and the subpixel 81B arranged in a row direction (an extending direction of the wiring GL). The wiring SLR, the wiring SLG, and the wiring SLB are electrically connected to the subpixels 81R, the subpixels 81G, and the subpixels 81B arranged in a column direction (extending directions of the wiring SLR and the like), respectively.

The subpixel 82PS included in the pixel 80 is electrically connected to the wiring SE, the wiring RS, and the wiring WX. The wiring SE and the wiring RS are electrically connected to the driver circuit portion 74, and the wiring WX is electrically connected to the circuit portion 75.

The driver circuit portion 74 has a function of generating a signal for driving the subpixel 82PS and outputting the signal to the subpixel 82PS through the wiring SE and the wiring RS. The circuit portion 75 has a function of receiving a signal output from the subpixel 82PS through the wiring WX and outputting the signal to the outside as image data. The circuit portion 75 functions as a readout circuit.

<Configuration Example of Pixel Circuit>

Figure 1B:
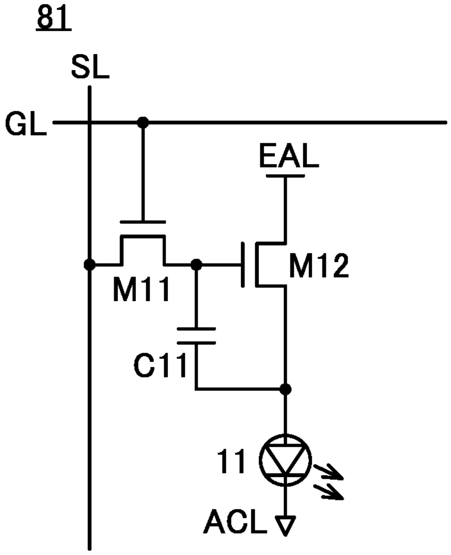

FIG. 1B illustrates an example of a circuit diagram of a pixel 81 that can be used as the subpixel 81R, the subpixel 81G, and the subpixel 81B. The pixel 81 includes a transistor M11, a transistor M12, a capacitor C11, and a light-emitting device 11. The wiring GL and a wiring SL are electrically connected to the pixel 81. The wiring SL corresponds to any of the wiring SLR, the wiring SLG, and the wiring SLB illustrated in FIG. 1A.

A gate of the transistor M11 is electrically connected to the wiring GL, one of a source and a drain of the transistor M11 is electrically connected to the wiring SL, and the other thereof is electrically connected to one electrode of the capacitor C11 and a gate of the transistor M12. One of a source and a drain of the transistor M12 is electrically connected to a wiring EAL, and the other of the source and the drain of the transistor M12 is electrically connected to one electrode of the light-emitting device 11 and the other electrode of the capacitor C11. The other electrode of the light-emitting device 11 is electrically connected to a wiring ACL.

The transistor M11 functions as a transfer switch. The transistor M12 functions as a transistor that controls current flowing through the light-emitting device 11.

Here, transistors containing silicon in the channel formation regions (hereinafter referred to as Si transistors) are preferably used as all of the transistor M11 and the transistor M12. Alternatively, it is preferable that a transistor including a metal oxide (hereinafter also referred to as an oxide semiconductor) in its channel formation region (hereinafter such a transistor is also referred to as an OS transistor) be used as the transistor M11 and a Si transistor be used as the transistor M12.

As silicon, single crystal silicon, polycrystalline silicon, amorphous silicon, and the like can be given. A Si transistor has high field-effect mobility and favorable frequency characteristics. For example, a transistor containing low-temperature polysilicon (LTPS) in its channel formation region (hereinafter such a transistor is also referred to as an LTPS transistor) can be used.

With the use of Si transistors such as LTPS transistors, a circuit required to be driven at a high frequency (e.g., a source driver circuit) can be formed on the same substrate as the display portion. Thus, external circuits mounted on the display apparatus can be simplified, and costs of parts and mounting costs can be reduced.

The oxide semiconductor preferably contains indium, a metal M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more selected from aluminum, gallium, yttrium, and tin. It is particularly preferable to use an oxide containing indium, gallium, and zinc (also referred to as IGZO) for the semiconductor layer of the OS transistor. Alternatively, it is preferable to use an oxide containing indium, tin, and zinc. Further alternatively, it is preferable to use an oxide containing indium, gallium, tin, and zinc.

An OS transistor using an oxide semiconductor having a wider band gap and a lower carrier density than silicon can achieve an extremely low off-state current. Thus, such a low off-state current enables long-term retention of charge accumulated in a capacitor that is connected in series with the OS transistor. Therefore, it is particularly preferable to use an OS transistor as the transistor M11 which is connected in series with the capacitor C11. The use of the OS transistor as the transistor M11 can prevent leakage of charge retained in the capacitor C11 through the transistor M11. Furthermore, since charge retained in the capacitor C11 can be retained for a long period, a still image can be displayed for a long period without rewriting data in the pixel 81.

The off-state current value per micrometer of channel width of the OS transistor at room temperature can be lower than or equal to 1 aA ($1\times10^{-18A}$), lower than or equal to 1 zA ($1\times10^{-21A}$), or lower than or equal to 1 yA ($1\times10^{-24A}$). Note that the off-state current value per micrometer of channel width of a Si transistor at room temperature is higher than or equal to 1 fA ($1\times10^{-15A}$) and lower than or equal to 1 pA ($1\times10^{-12}$ A). Thus, the off-state current of an OS transistor is lower than that of a Si transistor by approximately ten orders of magnitude.

A data potential is supplied to the wiring SL. A selection signal is supplied to the wiring GL. The selection signal includes a potential for allowing a transistor to be in a conduction state and a potential for allowing a transistor to be in a non-conduction state.

A first potential is supplied to the wiring EAL. A second potential is supplied to the wiring ACL. The wiring EAL is electrically connected to an anode of the light-emitting device 11 and has a function of supplying the first potential to the anode of the light-emitting device 11. The wiring ACL is electrically connected to a cathode of the light-emitting device 11 and has a function of supplying the second potential to the cathode of the light-emitting device 11. The second potential is a potential lower than the first potential. In the pixel 81, the first potential can be referred to as an anode potential, and the second potential can be referred to as a cathode potential. The wiring EAL is referred to as a power supply line in some cases.

Figure 1C:
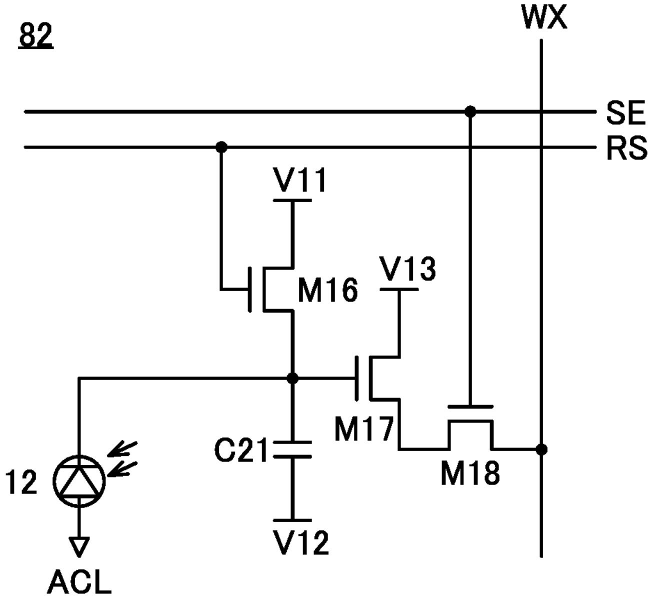

FIG. 1C illustrates an example of a circuit diagram that can be employed for the subpixel 82PS. A pixel 82 includes a transistor M16, a transistor M17, a transistor M18, a capacitor C21, a light-receiving device 12, and the like.

A cathode of the light-receiving device 12 is electrically connected to one of a source and a drain of the transistor M16, a first electrode of the capacitor C21, and a gate of the transistor M17. A gate of the transistor M16 is electrically connected to the wiring RS, and the other of the source and the drain of the transistor M16 is electrically connected to a wiring V11. One of a source and a drain of the transistor M17 is electrically connected to a wiring V13, and the other of the source and the drain of the transistor M17 is electrically connected to one of a source and a drain of the transistor M18. A gate of the transistor M18 is electrically connected to the wiring SE, and the other of the source and the drain of the transistor M18 is electrically connected to the wiring WX. An anode of the light-receiving device 12 is electrically connected to the wiring ACL. A second electrode of the capacitor C21 is electrically connected to a wiring V12.

The transistor M16 and the transistor M18 function as switches. The transistor M17 functions as an amplifier element (amplifier).

It is preferable to use Si transistors as all of the transistor M16 to the transistor M18. Alternatively, it is preferable to use OS transistors as the transistor M16 and to use a Si transistor as the transistor M17. In this case, the transistor M18 may be either an OS transistor or a Si transistor.

In contrast, as the transistor M17, a Si transistor is preferably used. A Si transistor can have a higher field-effect mobility than an OS transistor, and has excellent drive capability and current capability. Thus, the transistor M17 can operate at higher speed than the transistor M16. The use of Si transistor as the transistor M17 enables a quick output operation to the transistor M18 in accordance with an extremely low potential based on the amount of light received by the light-receiving device 12.

Although n-channel transistors are illustrated as the transistors in FIG. 1B and FIG. 1C, p-channel transistors can also be used.

The transistors included in the pixel 81 and the pixel 82 are preferably formed to be arranged over the same substrate.

The wiring ACL electrically connected to the anode of the light-receiving device 12 in the pixel 82 can also serves as the wiring ACL in the pixel 81, and is supplied with the second potential. In the pixel 82, the wiring ACL has a function of supplying the second potential to the anode of the light-receiving device 12. The wiring V11 electrically connected to the cathode of the light-receiving device 12 in the pixel 82 can also serves as the wiring EAL in the pixel 81, and is supplied with the first potential. The first potential is a potential higher than the second potential. Thus, a reverse bias voltage can be applied to the light-receiving device 12.

Figure 2A:
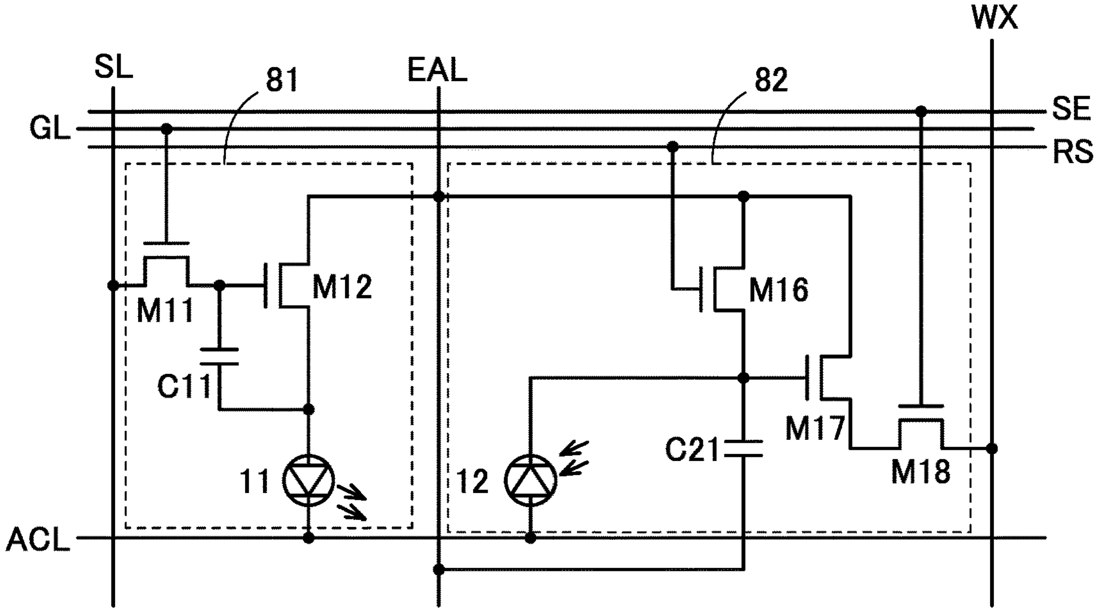
FIG. 2A to FIG. 2C are diagrams illustrating structure examples of a display apparatus.

That is, the pixel 81 and the pixel 82 can share the wiring EAL as illustrated in FIG. 2A. Note that FIG. 2A illustrates an example in which the wiring V11, the wiring V13, the wiring V12, and the wiring EAL are a common wiring. In other words, in the circuit diagram illustrated in FIG. 2A, a wiring can be shared by a plurality of wirings included in the pixel 81 and the pixel 82 in a structure in which a forward bias voltage is applied to the light-emitting device 11 and a reverse bias voltage is applied to the light-receiving device 12. Therefore, the number of wirings electrically connected to the pixel 80 and the number of potentials to be supplied to the pixel 80 can be decreased. As a result, the layout area of the pixel 80 can be reduced; thus, a display apparatus including a high-definition display portion having a light detection function can be provided. Furthermore, a display apparatus including a high-resolution display portion having a light detection function can be provided.

<Structure Example of Light-Emitting Device and Light-Receiving Device>

Figure 2B:
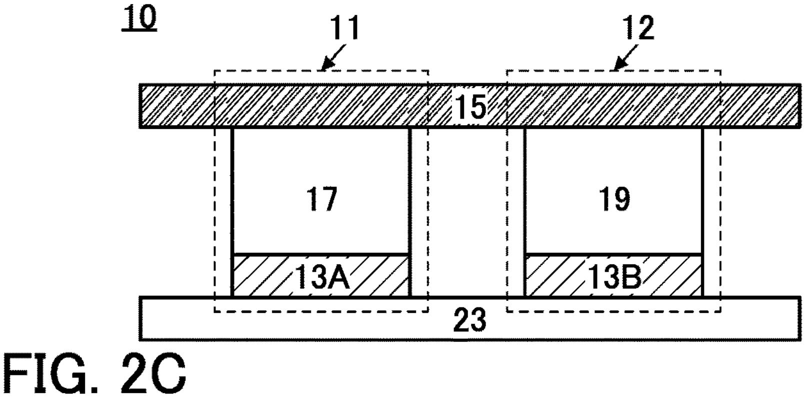

In this embodiment, a light-emitting device and a light-receiving device that can be used for the display apparatus of one embodiment of the present invention are described. FIG. 2B is a schematic cross-sectional view illustrating a light-emitting device 11 and a light-receiving device 12 included in a display apparatus 10 of one embodiment of the present invention.

The light-emitting device 11 has a function of emitting light (hereinafter, also referred to as a light-emitting function). The light-emitting device 11 includes an electrode 13A, an EL layer 17, and an electrode 15. The light-emitting device 11 is preferably an organic EL device (organic electroluminescent device). The EL layer 17 interposed between the electrode 13A and the electrode 15 includes at least a light-emitting layer. The light-emitting layer contains a light-emitting substance that emits light. The EL layer 17 emits light when a voltage is applied between the electrode 13A and the electrode 15. The EL layer 17 can further include any of a variety of layers such as a hole-injection layer, a hole-transport layer, an electron-transport layer, an electron-injection layer, a carrier-blocking layer, an exciton-blocking layer, and a charge generation layer.

The light-receiving device 12 has a function of detecting light (hereinafter, also referred to as a light-receiving function). For example, a pn or pin photodiode can be used as the light-receiving device 12. The light-receiving device 12 includes an electrode 13B, a light-receiving layer 19, and the electrode 15. Thus, the light-receiving layer 19 interposed between the electrode 13B and the electrode 15 includes at least an active layer. The light-receiving device 12 functions as a photoelectric conversion device; charge can be generated by light incident on the light-receiving layer 19 and extracted as a current. At this time, a voltage may be applied between the electrode 13B and the electrode 15. The amount of generated charge is determined depending on the amount of light incident on the light-receiving layer 19.

The light-receiving device 12 has a function of detecting visible light. The light-receiving device 12 has sensitivity to visible light. The light-receiving device 12 further preferably has a function of detecting visible light and infrared light. The light-receiving device 12 preferably has sensitivity to at least one of visible light and infrared light.

In this specification and the like, a blue (B) wavelength range is greater than or equal to 400 nm and less than 490 nm, and blue (B) light has at least one emission spectrum peak in the wavelength range. A green (G) wavelength range is greater than or equal to 490 nm and less than 580 nm, and green (G) light has at least one emission spectrum peak in the wavelength range. A red (R) wavelength range is greater than or equal to 580 nm and less than 700 nm, and red (R) light has at least one emission spectrum peak in the wavelength range. In this specification and the like, a wavelength range of visible light is greater than or equal to 400 nm and less than 700 nm, and visible light has at least one emission spectrum peak in the wavelength range. An infrared (IR) wavelength range is greater than or equal to 700 nm and less than 900 nm, and infrared (IR) light has at least one emission spectrum peak in the wavelength range.

The active layer includes a semiconductor. Examples of the semiconductor include an inorganic semiconductor such as silicon and an organic semiconductor including an organic compound. It is particularly preferable to use an organic photodiode including a layer containing an organic semiconductor, as the light-receiving device 12. An organic photodiode, which is easily made thin, lightweight, and large in area and has a high degree of freedom for shape and design, can be used in a variety of display apparatuses. An organic semiconductor is preferably used, in which case the EL layer included in the light-emitting device 11 and the light-receiving layer included in the light-receiving device 12 can be formed by the same method (e.g., a vacuum evaporation method) with the same manufacturing apparatus.

In the display apparatus of one embodiment of the present invention, an organic EL device can be used as the light-emitting device 11 and an organic photodiode can be suitably used as the light-receiving device 12. The organic EL device and the organic photodiode can be formed over the same substrate. Thus, the organic photodiode can be incorporated in the display apparatus including the organic EL device. The display apparatus of one embodiment of the present invention has one or both of an image capturing function and a sensing function in addition to an image displaying function.

The electrode 13A and the electrode 13B are provided on the same plane. FIG. 2B illustrates a structure where the electrode 13A and the electrode 13B are provided over a substrate 23. The electrode 13A and the electrode 13B can be formed by processing a conductive film formed over the substrate 23 into island-like shapes, for example. In other words, the electrode 13A and the electrode 13B can be formed through the same process.

As the substrate 23, a substrate having heat resistance high enough to withstand the formation of the light-emitting device 11 and the light-receiving device 12 can be used. In the case where an insulating substrate is used as the substrate 23, a glass substrate, a quartz substrate, a sapphire substrate, a ceramic substrate, an organic resin substrate, or the like can be used. Alternatively, a single crystal semiconductor substrate using silicon or silicon carbide, a polycrystalline semiconductor substrate, a compound semiconductor substrate of silicon germanium or the like, or a semiconductor substrate such as an SOI substrate can be used.

As the substrate 23, it is particularly preferable to use the insulating substrate or the semiconductor substrate over which a semiconductor circuit including a semiconductor element such as a transistor is formed. The semiconductor circuit preferably forms a pixel circuit, a gate line driver circuit (a gate driver), a source line driver circuit (a source driver), or the like. In addition to the above, an arithmetic circuit, a memory circuit, or the like may be formed.

The electrode 13A and the electrode 13B can each be referred to as a pixel electrode. The electrode 15 is a layer shared by the light-emitting device 11 and the light-receiving device 12, and can be referred to as a common electrode. A conductive film transmitting visible light and infrared light is used as the pixel electrode or the common electrode through which light exits or enters. A conductive film reflecting visible light and infrared light is preferably used as the electrode through which light neither exits nor enters.

The display apparatus of one embodiment of the present invention has a structure where the electrode 15 functioning as the common electrode functions as one of an anode and a cathode in the light-emitting device 11 and functions as the other of the anode and the cathode in the light-receiving device 12.

Figure 2C:
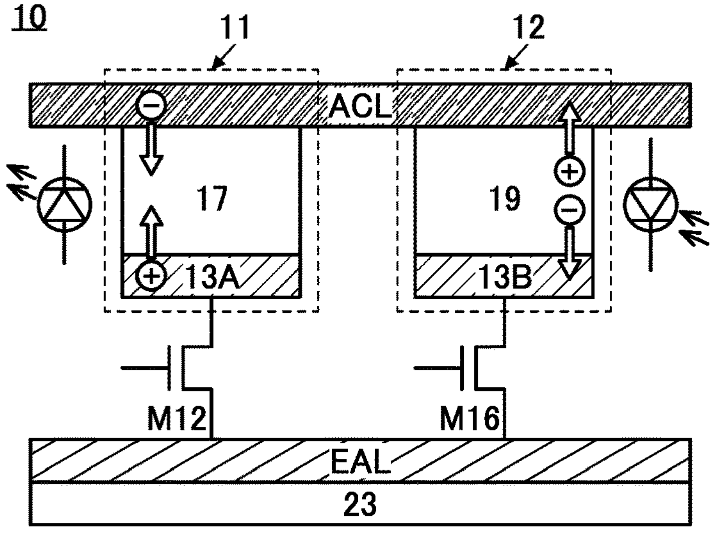

FIG. 2C is a schematic diagram to which circuit symbols and the like are added to FIG. 2B, so as to explicitly illustrates a structure where the electrode 13A functions as the anode and the electrode 15 functions as the cathode in the light-emitting device 11, and the electrode 13B functions as the cathode and the electrode 15 functions as the anode in the light-receiving device 12. For easy understanding of the direction of the anode and the cathode, FIG. 2C illustrates a circuit symbol of a light-emitting diode on the left of the light-emitting device 11 and a circuit symbol of a photodiode on the right of the light-receiving device 12. The flow directions of electrons and holes e are also schematically indicated by arrows. In FIG. 2C, the electrode 15 in FIG. 2B is illustrated as the wiring ACL. FIG. 2C illustrates the wiring EAL and the transistor M12 and the transistor M16 connected to the wiring EAL, which are provided over the substrate 23 and a state in which the transistor M12 and the transistor M16 are connected to the electrode 13A and the electrode 13B, respectively.

In the light-emitting device 11, the electrode 13A functions as the anode and is electrically connected to the wiring EAL that supplies a first potential through the transistor M12. In the light-emitting device 11, the wiring ACL functions as a cathode that supplies a second potential. The second potential is a potential lower than the first potential.

In the light-receiving device 12, the electrode 13B functions as a cathode and is connected to the wiring EAL that supplies the first potential through the transistor M16. In the light-receiving device 12, the wiring ACL functions as an anode that supplies the second potential. Here, since the second potential is lower than the first potential in the light-receiving device 12, a reverse bias voltage is applied to the light-receiving device 12.

With a structure where the electrode 13A functions as the anode and the electrode 15 functions as the cathode in the light-emitting device 11 and the electrode 13B functions as the cathode and the electrode 15 functions as the anode in the light-receiving device 12, a potential difference between the electrode 13A and the electrode 13B can be small, whereby leakage (hereinafter, also referred to as side leakage) between the electrode 13A and the electrode 13B can be inhibited. Thus, the light-receiving device can have a high SN ratio (Signal to Noise Ratio).

In the display apparatus of one embodiment of the present invention, the side leakage between the light-emitting device 11 and the light-receiving device 12 can be inhibited, which can shorten the distance between the light-emitting device 11 and the light-receiving device 12. That is, the proportions of the light-emitting device 11 and the light-receiving device 12 in a pixel (hereinafter, also referred to as an aperture ratio) can be increased. In addition, the size of a pixel can be reduced, so that the definition of the display apparatus can be increased. Thus, a display apparatus having a light detection function and a high aperture ratio can be achieved. In addition, a display apparatus having a light detection function and high definition can be achieved.

Note that the light-receiving devices 12 can be arranged at a definition higher than or equal to 100 ppi, preferably higher than or equal to 200 ppi, more preferably higher than or equal to 300 ppi, further preferably higher than or equal to 400 ppi, still further preferably higher than or equal to 500 ppi and lower than or equal to 2000 ppi, lower than or equal to 1000 ppi, or lower than or equal to 600 ppi, for example. In particular, when the light-receiving devices 12 are provided at a definition higher than or equal to 200 ppi and lower than or equal to 600 ppi, preferably higher than or equal to 300 ppi and lower than or equal to 600 ppi, the display apparatus can be suitably used for fingerprint image capturing. The definition is preferably higher than or equal to 500 ppi, in which case the authentication conforms to the standard by the National Institute of Standards and Technology (NIST) or the like. On the assumption that the light-receiving devices are arranged at a definition of 500 ppi, the size of a pixel is 50.8 μm, which is a definition adequate for image capturing of a fingerprint ridge distance (typically, greater than or equal to 300 μm and less than or equal to 500 μm).

Alternatively, the display apparatus 10 of one embodiment of the present invention may have a structure where the electrode 13A functions as the cathode and the electrode 15 functions as the anode in the light-emitting device 11, and the electrode 13B functions as the anode and the electrode 15 functions as the cathode in the light-receiving device 12.

<Modification Example of Pixel Circuit>

Structure examples of the pixel 81 and the pixel 82, which are different from the above, are described below.

Transistors each including a pair of gates overlapping with each other with a semiconductor layer therebetween can be used as the transistors included in the pixel 81 and the pixel 82. Specific examples of an LTPS transistor and an OS transistor each including a pair of gates are described in detail below.

In the transistor including a pair of gates, the same potential is supplied to the pair of gates electrically connected to each other, which brings advantage that the transistor can have a higher on-state current and improved saturation characteristics. A potential for controlling the threshold voltage of the transistor may be supplied to one of the pair of gates. Furthermore, when a constant potential is supplied to one of the pair of gates, the stability of the electrical characteristics of the transistor can be improved. For example, one of the gates of the transistor may be electrically connected to a wiring to which a constant potential is supplied or may be electrically connected to a source or a drain of the transistor.

Figure 3A:
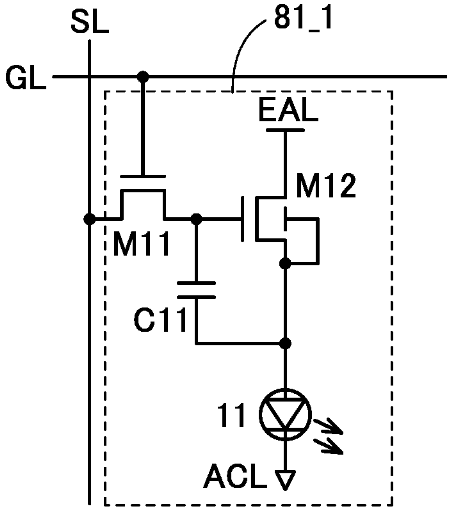
FIG. 3A to FIG. 3D are diagrams illustrating structure examples of a display apparatus.

The pixel 81_1 illustrated in FIG. 3A is an example where a transistor including a pair of gates is used as the transistor M12 in the pixel 81. One of the pair of gates of the transistor M12 is electrically connected to the source or the drain of the transistor M12. When such a transistor is used as the transistor M12, the saturation characteristics are improved, whereby emission luminance of the light-emitting device 11 can be controlled easily and the display quality can be increased.

Figure 3B:
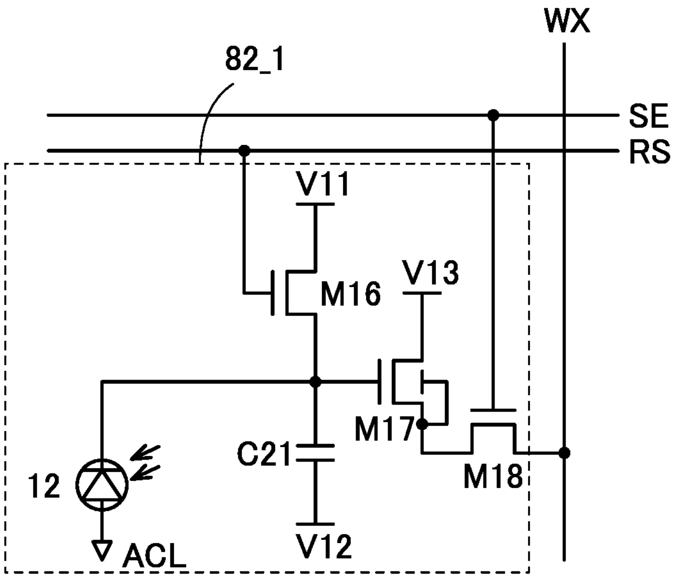

The pixel 82_1 illustrated in FIG. 3B is an example of the case where a transistor including a pair of gates is used as the transistor M17 in the pixel 82. The other of the pair of gates of the transistor M17 is electrically connected to the source or the drain of the transistor M17. In the case where such a transistor is used as the transistor M17, the accuracy of readout of signals generated by the light-receiving device 12 can be improved because the saturation characteristics are improved.

Figure 3C:
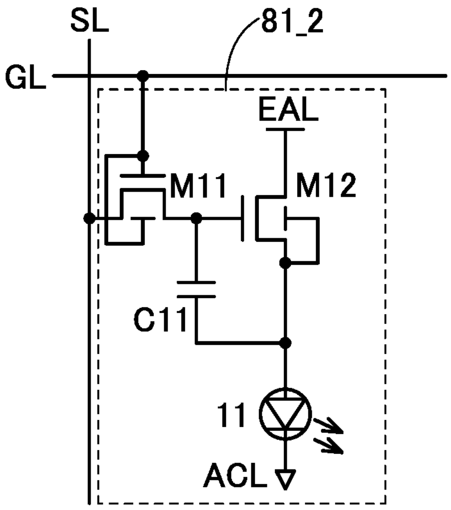

The pixel 812 illustrated in FIG. 3C is an example where a transistor including a pair of gates is used as the transistor M11 in the pixel 81_1. The other of the pair of gates of the transistor M12 is electrically connected to the source or the drain of the transistor M12. In the case where such a transistor is used as the transistor M11, favorable switching operation can be performed, so that time needed for display operation can be shortened.

Figure 3D:
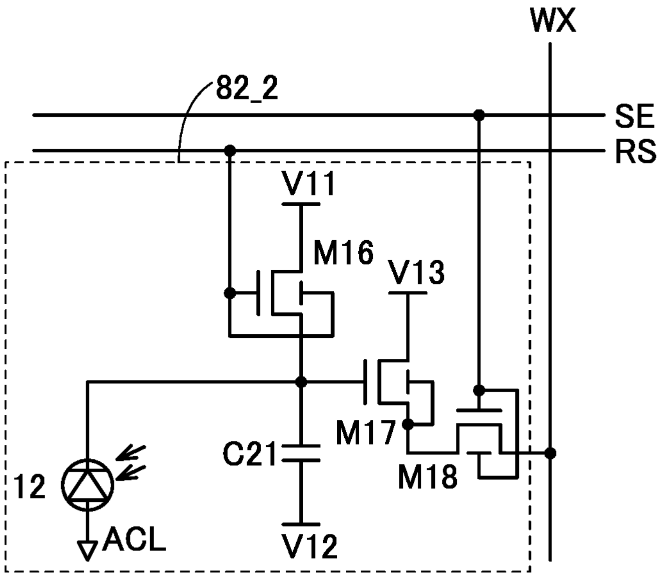

A pixel 82_2 illustrated in FIG. 3D is an example of the case where a transistor including a pair of gates is used as each of the transistors M16 and M18 in the pixel 82_1. The other of the pair of gates of the transistor M17 is electrically connected to the source or the drain of the transistor M17. In the case where such a transistor is used as the transistors M16 and M18, favorable switching operation can be performed, so that time needed for a reset operation can be shortened.

Figure 4A:
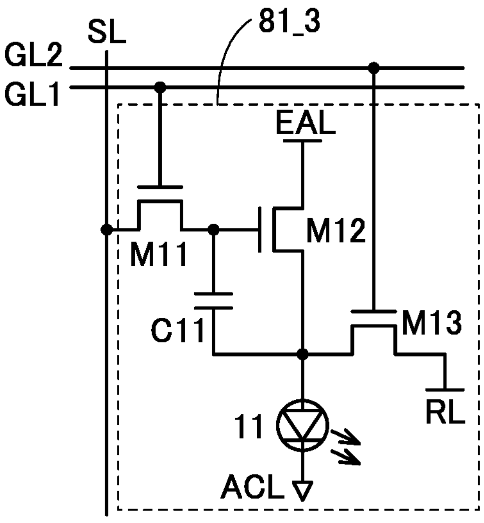
FIG. 4A and FIG. 4B are diagrams illustrating structure examples of a display apparatus.

A pixel 81_3 illustrated in FIG. 4A is an example in which a transistor M13 is added to the pixel 81, and a wiring GL1 and a wiring GL2 are included to control the transistors M11 and M13 independently. The gate of the transistor M11 is electrically connected to the wiring GL1. A gate of the transistor M13 is electrically connected to the wiring GL2. The transistor M13 serves as a switch, like the transistor M11. One of the source and the drain of the transistor M13 is electrically connected to one electrode of the light-emitting device 11, and the other of the source and the drain of the transistor M13 is electrically connected to a wiring RL.

A reset potential is supplied to the wiring RL. The reset potential supplied to the wiring RL can be set such that a potential difference between the reset potential and the cathode potential of the light-emitting device 11 is lower than the threshold voltage of the light-emitting device 11. The reset potential can be a potential higher than the cathode potential, a potential equal to the cathode potential, or a potential lower than the cathode potential.

Figure 4B:
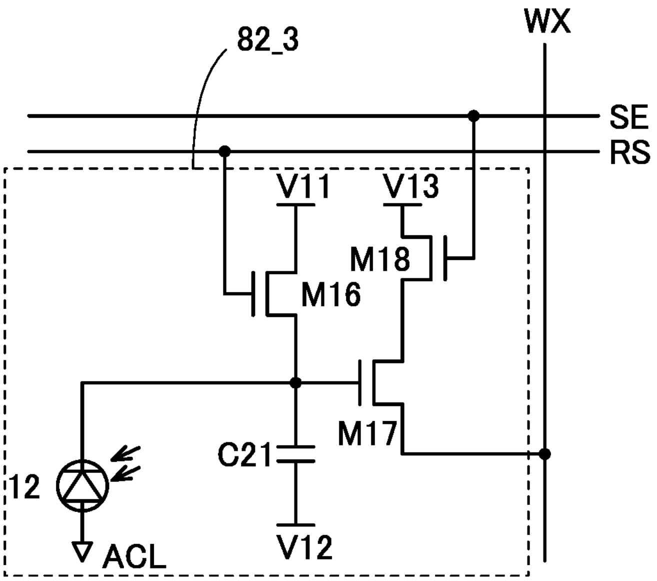

A pixel 82_3 illustrated in FIG. 4B is an example in which the position of the transistor M18 in the pixel 82 is changed to a position between the transistor M17 and the wiring V13.

Figure 5A:
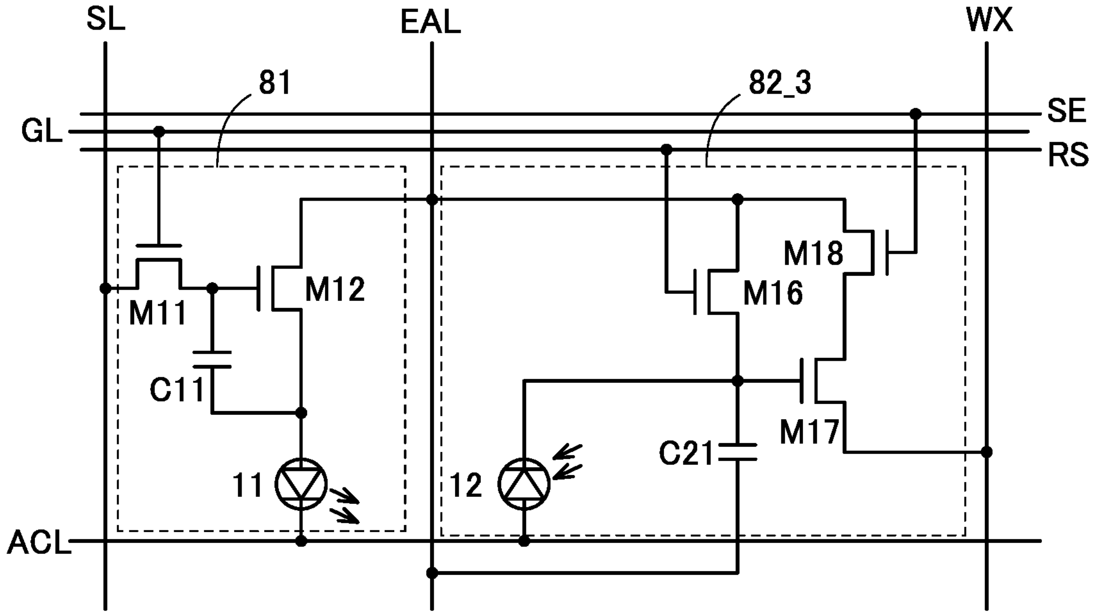
FIG. 5A and FIG. 5B are diagrams illustrating structure examples of a display apparatus.

FIG. 5A illustrates an example of a circuit diagram of the pixel 80 in the case where the pixel 81 is applied to the subpixel 81R, the subpixel 81G, or the subpixel 81B and the pixel 82_3 is applied to the subpixel 82PS. FIG. 5A illustrates an example in which the wiring V11, the wiring V13, the wiring V12, and the wiring EAL are a common wiring. In other words, in the circuit diagram in FIG. 5A, a wiring can be shared by a plurality of wirings included in the pixel 81 and the pixel 82 in the structure in which a forward bias voltage is applied to the light-emitting device 11 and a reverse bias voltage is applied to the light-receiving device 12. Thus, the number of wirings and the number of potentials to be supplied can be decreased in the pixel including the subpixel 81R, the subpixel 81G, the subpixel 81B, and the subpixel 82PS.

Figure 5B:
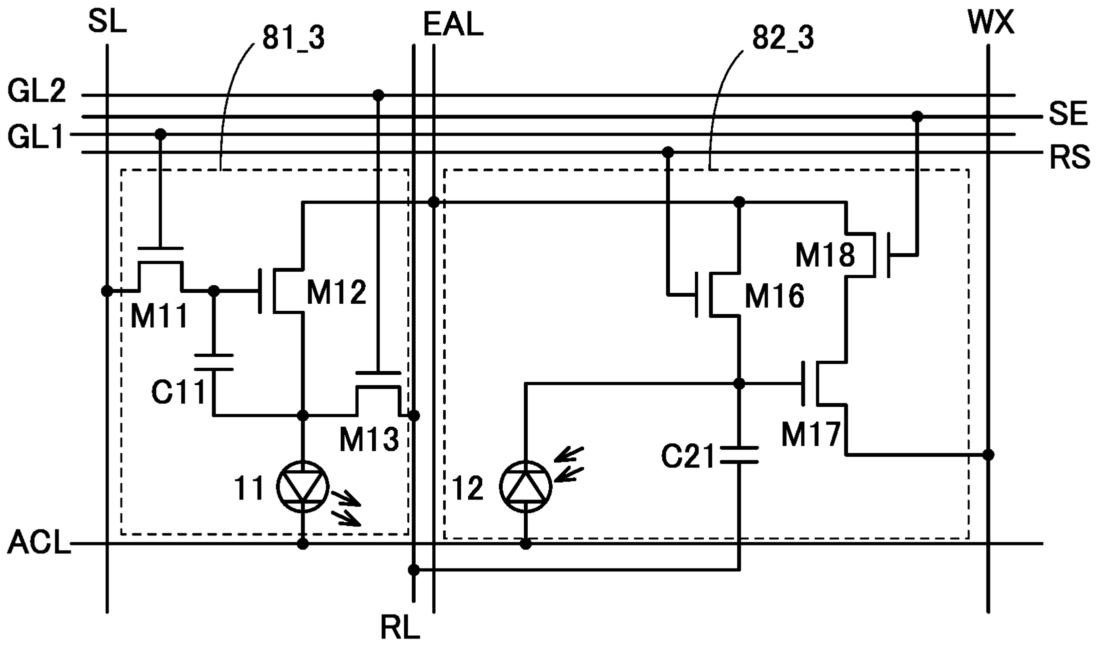

FIG. 5B illustrates an example of a circuit diagram included in the pixel 80 in the case where the pixel 81_3 is applied to the subpixel 81R, the subpixel 81G, or the subpixel 81B and the pixel 82_3 is applied to the subpixel 82PS. FIG. 5B illustrates an example in which the wiring V11, the wiring V13, and the wiring EAL are a common wiring and the wiring RL and the wiring V12 are a common wiring. In other words, in the circuit diagram in FIG. 5B, a wiring can be shared by a plurality of wirings included in the pixel 81 and the pixel 82 in the structure in which a forward bias voltage is applied to the light-emitting device 11 and a reverse bias voltage is applied to the light-receiving device 12. Thus, the number of wirings and the number of potentials to be supplied can be decreased in the pixel including the subpixel 81R, the subpixel 81G, the subpixel 81B, and the subpixel 82PS.

Figure 6A:
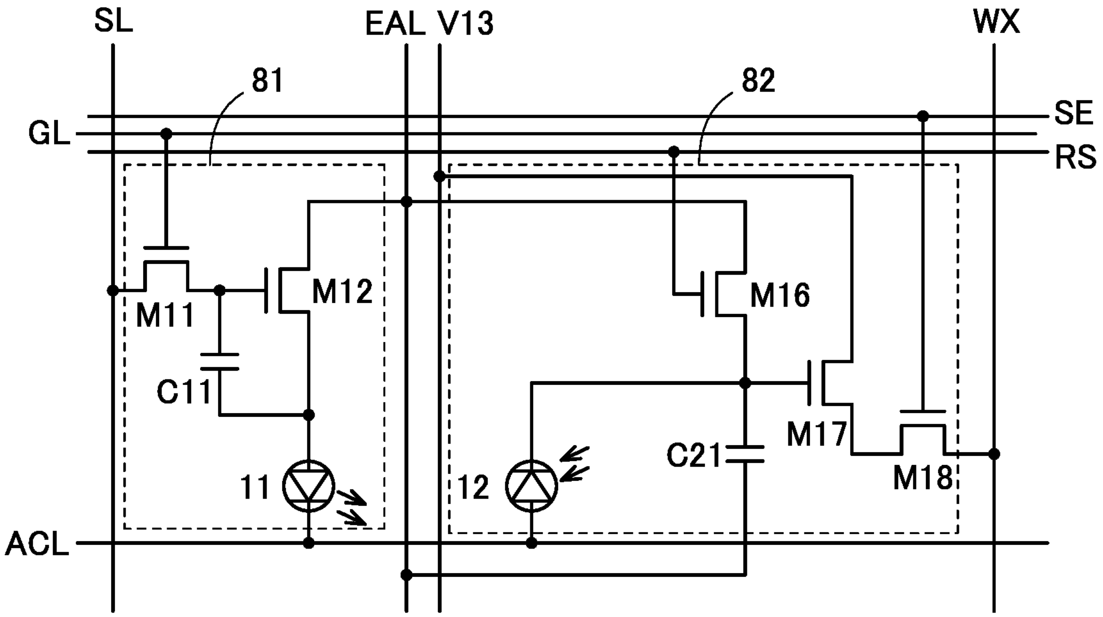
FIG. 6A and FIG. 6B are diagrams illustrating structure examples of a display apparatus.

FIG. 6A illustrates an example of a circuit diagram included in the pixel 80 in the case where the pixel 81 is applied to the subpixel 81R, the subpixel 81G, or the subpixel 81B and the pixel 82 is applied to the subpixel 82PS. FIG. 6A illustrates an example in which the wiring V11, the wiring V12, and the wiring EAL are a common wiring and the wiring V13 is a different wiring. In other words, in the circuit diagram in FIG. 6A, a wiring can be shared by a plurality of wirings included in the pixel 81 and the pixel 82 in the structure in which a forward bias voltage is applied to the light-emitting device 11 and a reverse bias voltage is applied to the light-receiving device 12. Thus, the number of wirings and the number of potentials to be supplied can be decreased in the pixel including the subpixel 81R, the subpixel 81G, the subpixel 81B, and the subpixel 82PS.

Figure 6B:
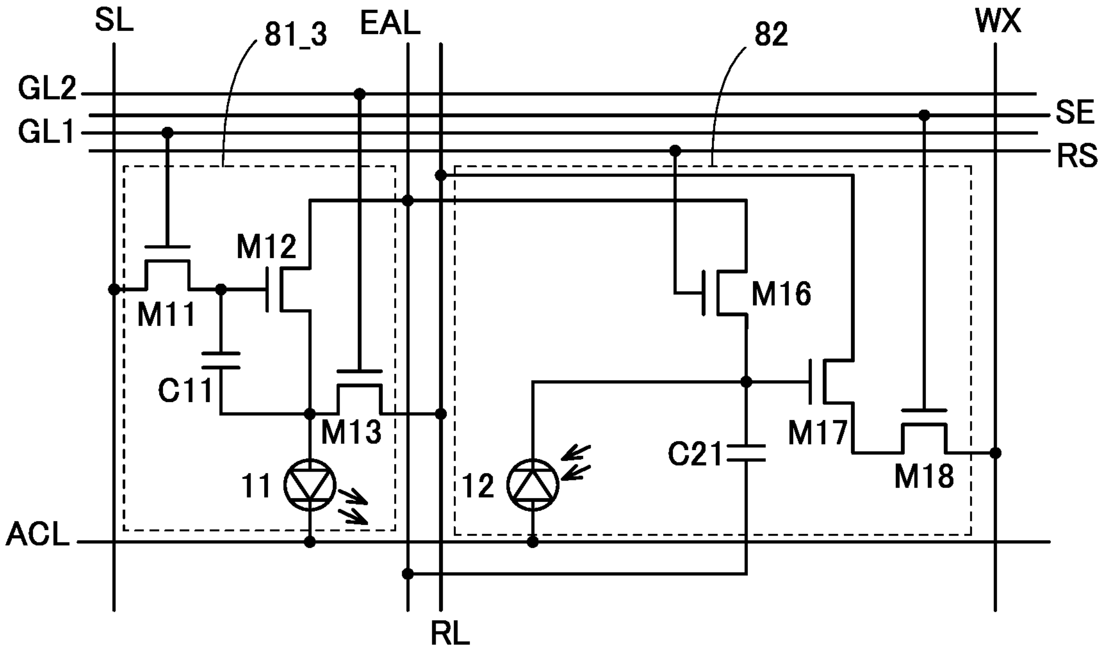

FIG. 6B illustrates an example of a circuit diagram included in the pixel 80 in the case where the pixel 81_3 is applied to the subpixel 81R, the subpixel 81G, or the subpixel 81B and the pixel 82 is applied to the subpixel 82PS. FIG. 6B illustrates an example in which the wiring V11, the wiring V12, and the wiring EAL are a common wiring and the wiring RL and the wiring V13 are a common wiring. In other words, in the circuit diagram in FIG. 6B, a wiring can be shared by a plurality of wirings included in the pixel 81_3 and the pixel 82 in the structure in which a forward bias voltage is applied to the light-emitting device 11 and a reverse bias voltage is applied to the light-receiving device 12. Thus, the number of wirings and the number of potentials to be supplied can be decreased in the pixel including the subpixel 81R, the subpixel 81G, the subpixel 81B, and the subpixel 82PS.

Figure 7A:
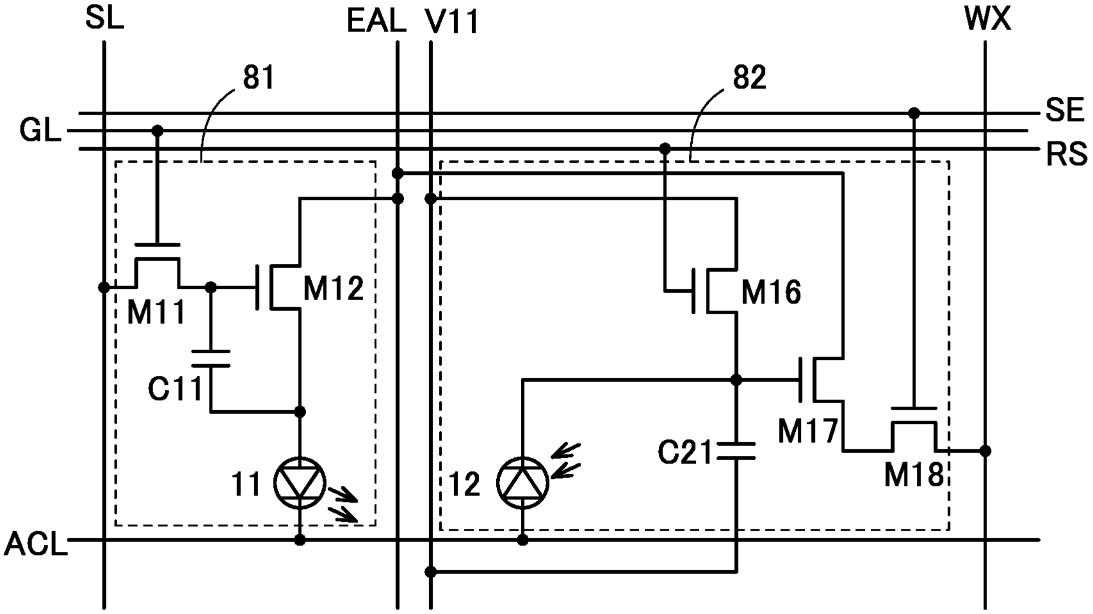
FIG. 7A and FIG. 7B are diagrams illustrating structure examples of a display apparatus.

FIG. 7A illustrates an example of a circuit diagram included in the pixel 80 in the case where the pixel 81 is applied to the subpixel 81R, the subpixel 81G, or the subpixel 81B and the pixel 82 is applied to the subpixel 82PS. FIG. 7A illustrates an example in which the wiring V13 and the wiring EAL are a common wiring and the wiring V11 and the wiring V12 are a common wiring. In other words, in the circuit diagram in FIG. 7A, a wiring can be shared by a plurality of wirings included in the pixel 81 and the pixel 82 in the structure in which a forward bias voltage is applied to the light-emitting device 11 and a reverse bias voltage is applied to the light-receiving device 12. Thus, the number of wirings and the number of potentials to be supplied can be decreased in the pixel including the subpixel 81R, the subpixel 81G, the subpixel 81B, and the subpixel 82PS.

Figure 7B:
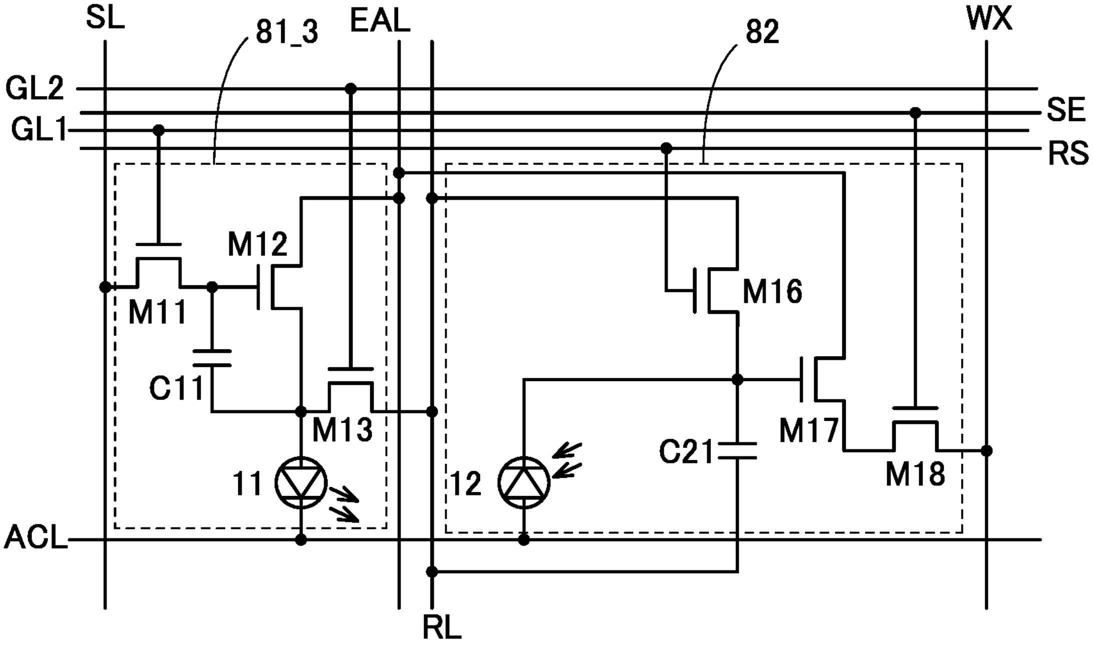

FIG. 7B illustrates an example of a circuit diagram included in the pixel 80 in the case where the pixel 81_3 is applied to the subpixel 81R, the subpixel 81G, or the subpixel 81B and the pixel 82 is applied to the subpixel 82PS. FIG. 7B illustrates an example in which the wiring V13 and the wiring EAL are a common wiring and the wiring RL, the wiring V11, and the wiring V12 are a common wiring. In other words, in the circuit diagram in FIG. 7B, a wiring can be shared by a plurality of wirings included in the pixel 81_3 and the pixel 82 in the structure in which a forward bias voltage is applied to the light-emitting device 11 and a reverse bias voltage is applied to the light-receiving device 12. Thus, the number of wirings and the number of potentials to be supplied can be decreased in the pixel including the subpixel 81R, the subpixel 81G, the subpixel 81B, and the subpixel 82PS.

Figure 8A:
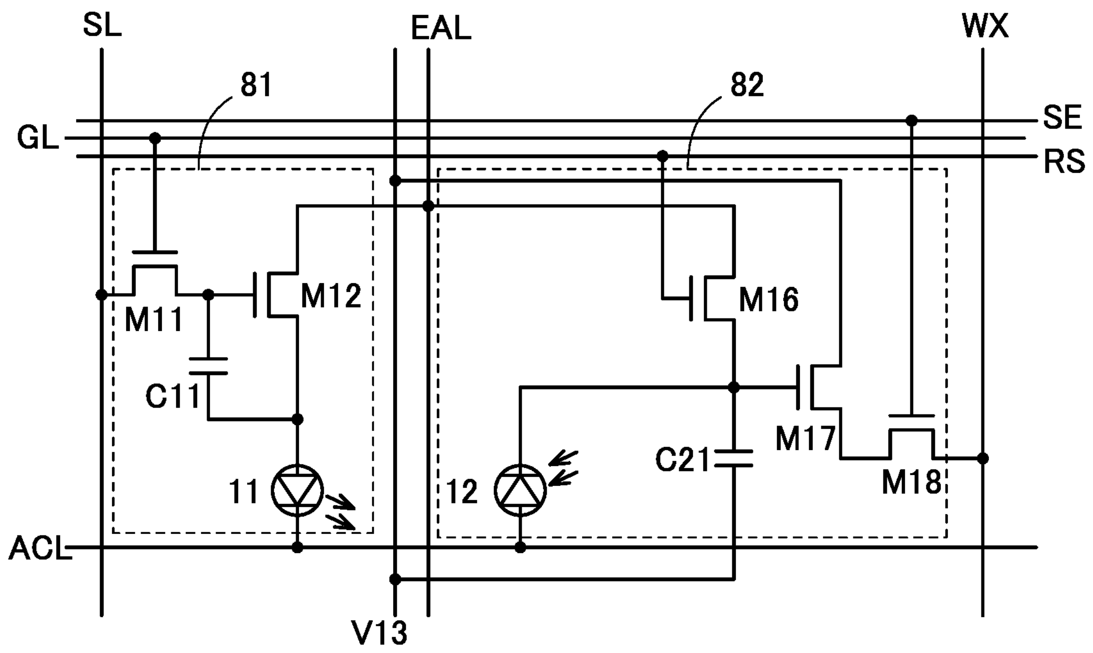
FIG. 8A and FIG. 8B are diagrams illustrating structure examples of a display apparatus.

FIG. 8A illustrates an example of a circuit diagram included in the pixel 80 in the case where the pixel 81 is applied to the subpixel 81R, the subpixel 81G, or the subpixel 81B and the pixel 82 is applied to the subpixel 82PS. FIG. 8A illustrates an example in which the wiring V13 and the wiring V12 are a common wiring and the wiring V11 and the wiring EAL are a common wiring. In other words, in the circuit diagram in FIG. 8A, a wiring can be shared by a plurality of wirings included in the pixel 81 and the pixel 82 in the structure in which a forward bias voltage is applied to the light-emitting device 11 and a reverse bias voltage is applied to the light-receiving device 12. Thus, the number of wirings and the number of potentials to be supplied can be decreased in the pixel including the subpixel 81R, the subpixel 81G, the subpixel 81B, and the subpixel 82PS.

Figure 8B:
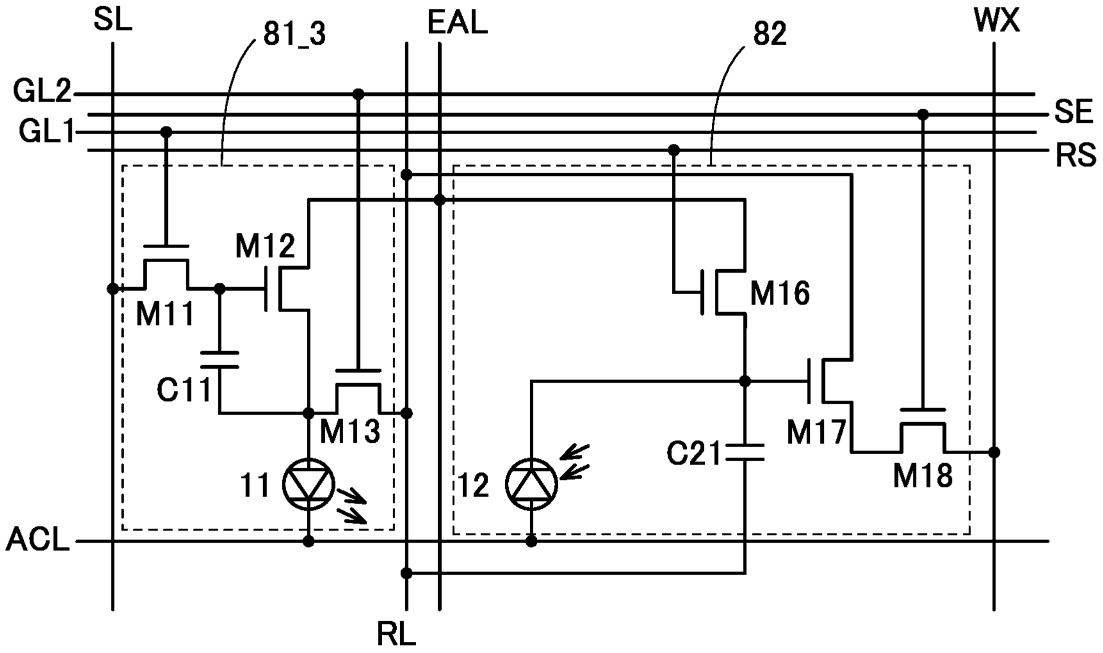

FIG. 8B illustrates an example of a circuit diagram included in the pixel 80 in the case where the pixel 81_3 is applied to the subpixel 81R, the subpixel 81G, or the subpixel 81B and the pixel 82 is applied to the subpixel 82PS. FIG. 8B illustrates an example in which the wiring V11 and the wiring EAL are a common wiring and the wiring RL, the wiring V12, and the wiring V13 are a common wiring. In other words, in the circuit diagram in FIG. 8B, a wiring can be shared by a plurality of wirings included in the pixel 81_3 and the pixel 82 in the structure in which a forward bias voltage is applied to the light-emitting device 11 and a reverse bias voltage is applied to the light-receiving device 12. Thus, the number of wirings and the number of potentials to be supplied can be decreased in the pixel including the subpixel 81R, the subpixel 81G, the subpixel 81B, and the subpixel 82PS.

Note that although FIG. 5A to FIG. 8B illustrate examples in which the pixel 82 (or the pixel 823) is applied to the subpixel 82PS, the pixel 82_1 to the pixel 82_3 may be applied. In addition, although FIG. 5A to FIG. 8B illustrate that the pixel 81 or the pixel 81_3 is applied to the subpixel 81R, the subpixel 81G, or the subpixel 81B, the pixel 81_1 and the subpixel 82_2 may be applied.

Although FIG. 5A to FIG. 8B illustrate the structure in which a wiring is shared by the wirings connected to the transistors included in the pixel 80, another structure may be employed.

Figure 9A:
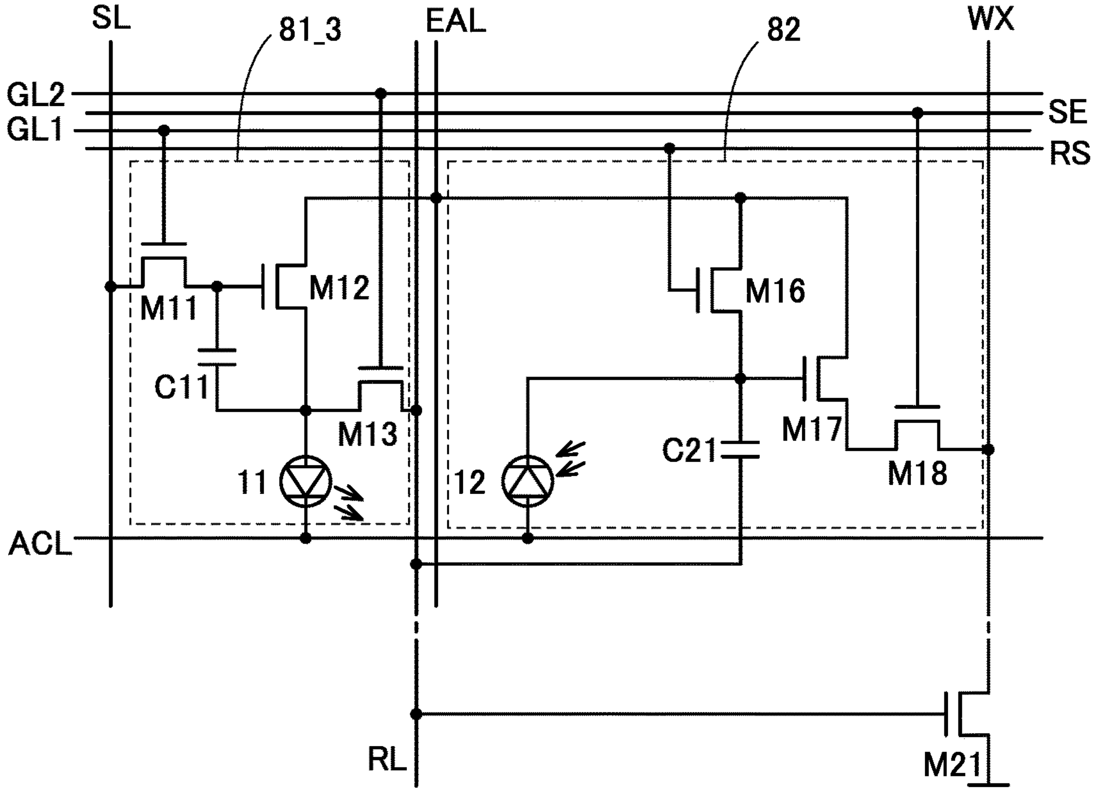
FIG. 9A and FIG. 9B are diagrams illustrating structure examples of a display apparatus.
Figure 9B:
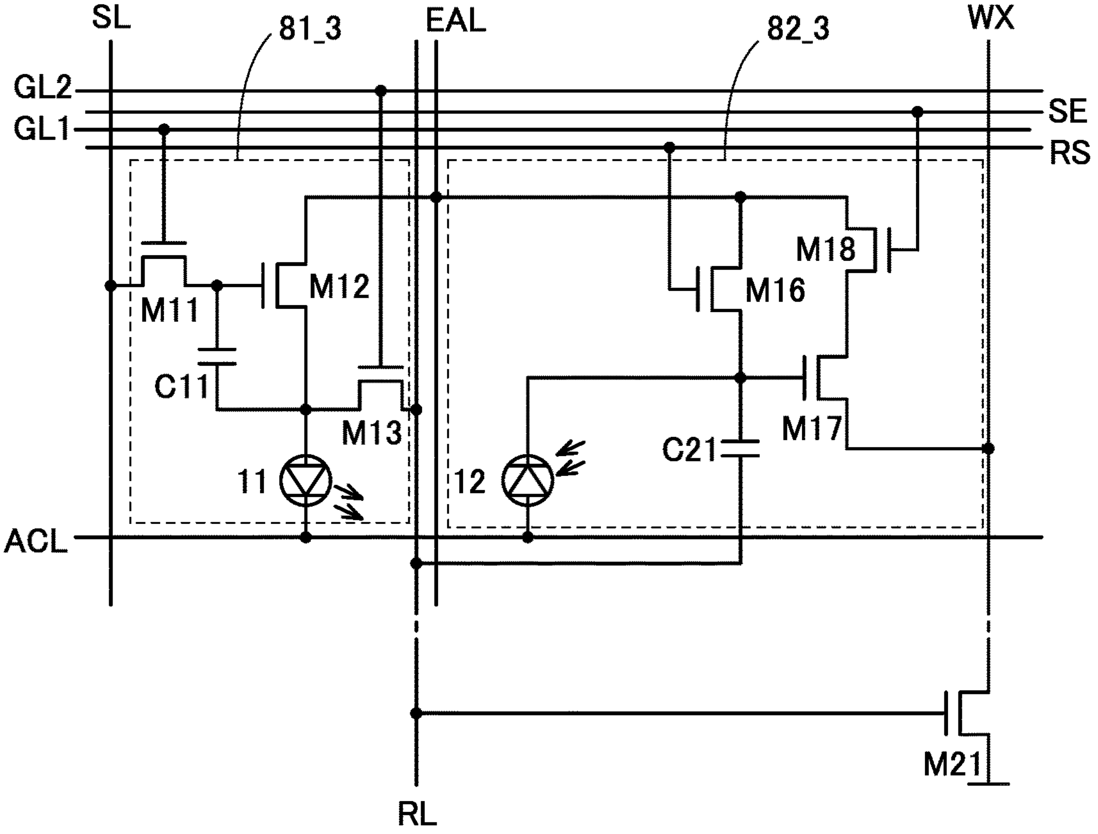

FIG. 9A illustrates an example of a circuit diagram included in the pixel 80 in the case where the pixel 81_3 is applied to the subpixel 81R, the subpixel 81G, or the subpixel 81B and the pixel 82 is applied to the subpixel 82PS, and a common wiring is used for the wiring RL and a gate of a transistor M21 electrically connected to the wiring WX. Supplying the reset potential supplied to the wiring RL to the gate of the transistor M21 enables the transistor M21 to serve as a constant current source. In addition, FIG. 9B illustrates an example of a circuit diagram included in the pixel 80 in the case where the pixel 81_3 is applied to the subpixel 81R, the subpixel 81G, or the subpixel 81B and the pixel 82_3 is applied to the subpixel 82PS, and a common wiring is used for the wiring RL and the gate of the transistor M21 electrically connected to the wiring WX. Supplying the reset potential supplied to the wiring RL to the gate of the transistor M21 enables the transistor M21 to serve as a constant current source. That is, in the circuit diagrams illustrated in FIG. 9A and FIG. 9B, a wiring can be shared by a plurality of wirings included in the pixel 81_3 and the pixel 82 (or the pixel 823) and another wiring (potential-supply wiring) in the structure in which a forward bias voltage is applied to the light-emitting device 11 and a reverse bias voltage is applied to the light-receiving device 12. Thus, the number of wirings and the number of potentials to be supplied can be decreased in the pixel including the subpixel 81R, the subpixel 81G, the subpixel 81B, and the subpixel 82PS.

A structure different from the block diagram of the display apparatus 10 illustrated in FIG. 1A will be described with reference to FIG. 10A. Note that description of FIG. 10A is made on only parts that are different from those in FIG. 1A, and components denoted by the same reference numerals are similar to those in FIG. 1A.

Figure 10A:
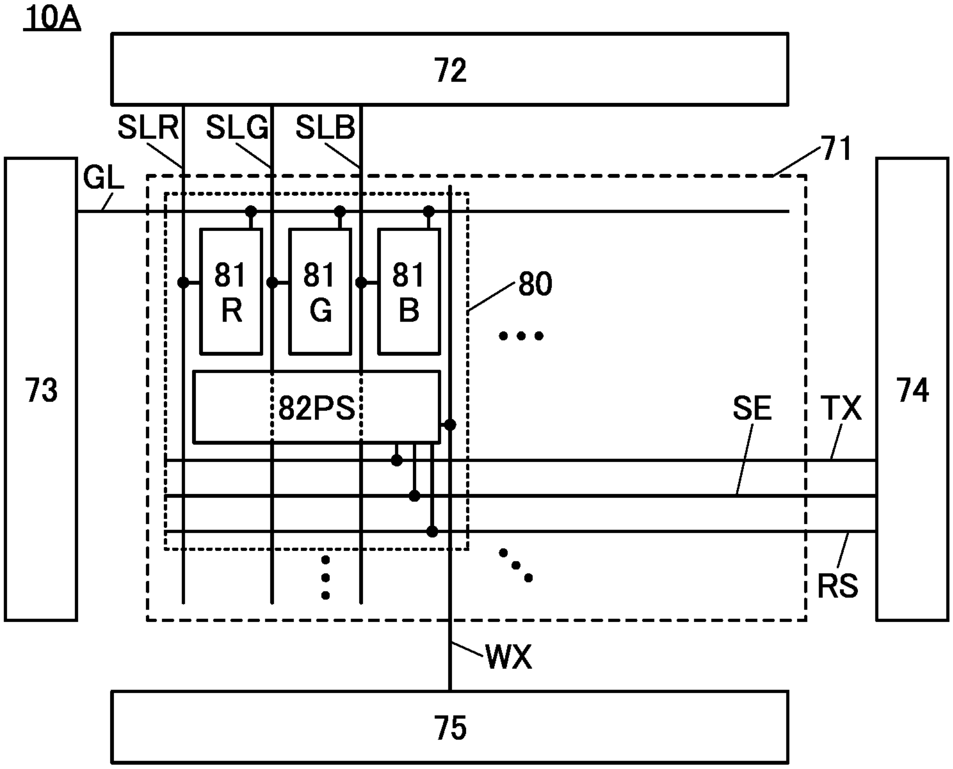
FIG. 10A and FIG. 10B are diagrams illustrating structure examples of a display apparatus.

In FIG. 10A, the pixel 80 is electrically connected to the wiring GL, the wiring SLR, the wiring SLG, the wiring SLB, a wiring TX, the wiring SE, the wiring RS, the wiring WX, and the like.

In FIG. 10A, the subpixel 82PS included in the pixel 80 is electrically connected to the wiring TX, the wiring SE, the wiring RS, and the wiring WX. The wiring TX, the wiring SE, and the wiring RS are electrically connected to the driver circuit portion 74, and the wiring WX is electrically connected to the circuit portion 75.

The driver circuit portion 74 has a function of generating a signal for driving the subpixel 82PS and outputting the signal to the subpixel 82PS through the wiring SE, the wiring TX, and the wiring RS.

Figure 10B:
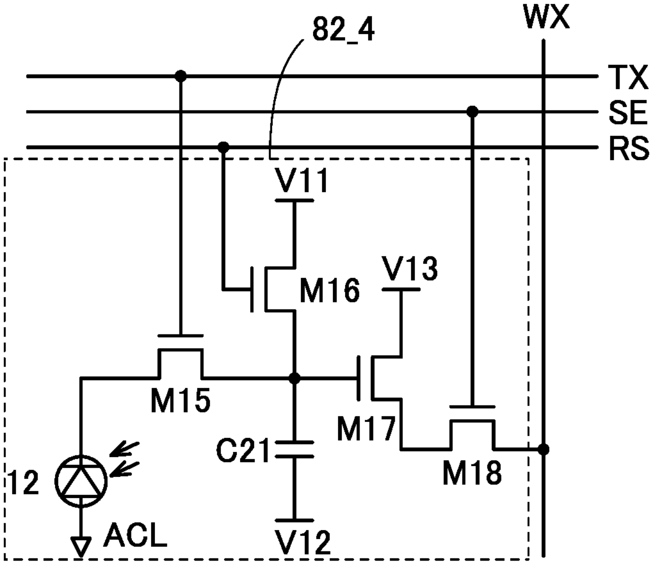

FIG. 10B illustrates an example of a circuit diagram that can be employed for the subpixel 82PS in FIG. 10A. A pixel 82_4 includes a transistor M15, the transistor M16, the transistor M17, the transistor M18, the capacitor C21, and the light-receiving device 12. Any of the light-receiving devices described above can be used as the light-receiving device 12.

A gate of the transistor M15 is electrically connected to the wiring TX, one of a source and a drain of the transistor M15 is electrically connected to a cathode of the light-receiving device 12, and the other of the source and the drain thereof is electrically connected to one of a source and a drain of the transistor M16, a first electrode of the capacitor C21, and a gate of the transistor M17.

The transistor M15 functions as a switch. A Si transistor or an OS transistor is preferably used as the transistor M15. By using OS transistors as the transistor M15 and the transistor M16, a potential retained in the gate of the transistor M17 on the basis of charge generated in the light-receiving device 12 can be prevented from leaking through the transistor M15 or the transistor M16.

For example, in the case where image capturing is performed using a global shutter mode, a period from the end of charge transfer operation to the start of readout operation (charge retention period) varies among pixels. When an image having the same gray level in all the pixels is captured, output signals in all the pixels ideally have potentials of the same level. However, in the case where the length of the charge retention period varies row by row, if charge accumulated at nodes in the pixels in each row leaks out over time, the potential of an output signal in a pixel varies row by row, and image data varies in gray level row by row. Thus, when OS transistors are used as the transistor M15 and the transistor M16, such a potential change at the node of the pixel can be extremely small. That is, even when image capturing is performed using the global shutter mode, it is possible to inhibit variation in gray level of image data due to a difference in the length of the charge retention period, and it is possible to enhance the quality of captured images.

In contrast, as the transistor M17, a Si transistor is preferably used. A Si transistor can have a higher field-effect mobility than an OS transistor, and has excellent drive capability and current capability. Thus, the transistor M17 can operate at higher speed than the transistor M15 and the transistor M16. The use of Si transistor as the transistor M17 enables a quick output operation to the transistor M18 in accordance with an extremely low potential based on the amount of light received by the light-receiving device 12.

In other words, in the subpixel 82, the transistor M15 and the transistor M16 each have a low leakage current and the transistor M17 has high drive capability, whereby, when the light-receiving device 12 receives light, the charge transferred through the transistor M15 can be retained without being leaked and high-speed readout can be performed.

Note that although the transistors are illustrated as n-channel transistors in FIG. 10B, a p-channel transistor can also be used.

Figure 11A:
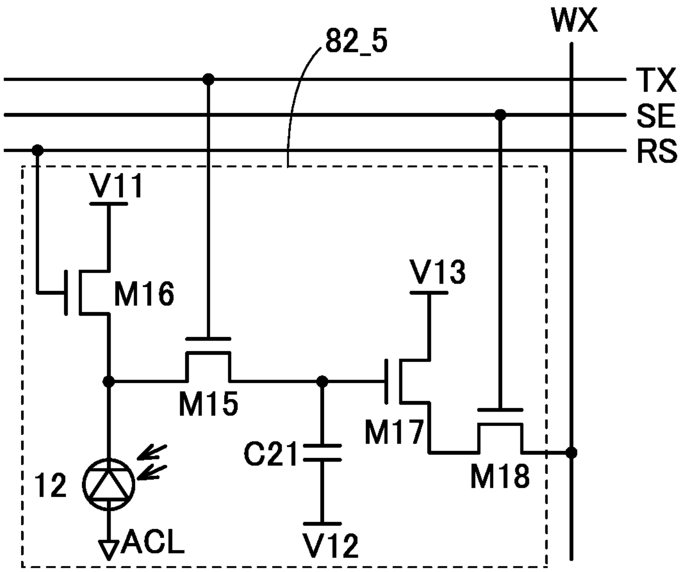
FIG. 11A and FIG. 11B are diagrams illustrating structure examples of a display apparatus.

A pixel 82_5 illustrated in FIG. 11A is an example in which the position of the transistor M16 in the pixel 82_4 is changed to a position in which the transistor M16 is electrically connected to one of the source and the drain of the transistor M15 and the cathode of the light-receiving device 12.

Figure 11B:
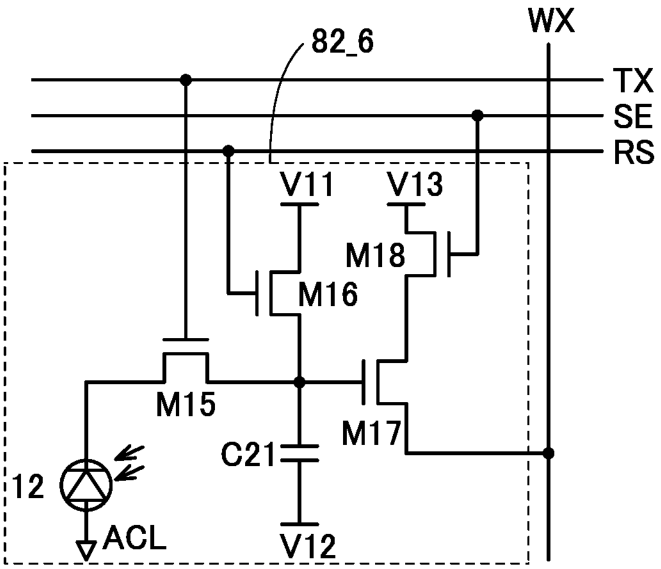

A pixel 82_6 illustrated in FIG. 11B is an example in which the position of the transistor M18 in the pixel 82_5 is changed to a position between the transistor M17 and the wiring V13.

Figure 12:
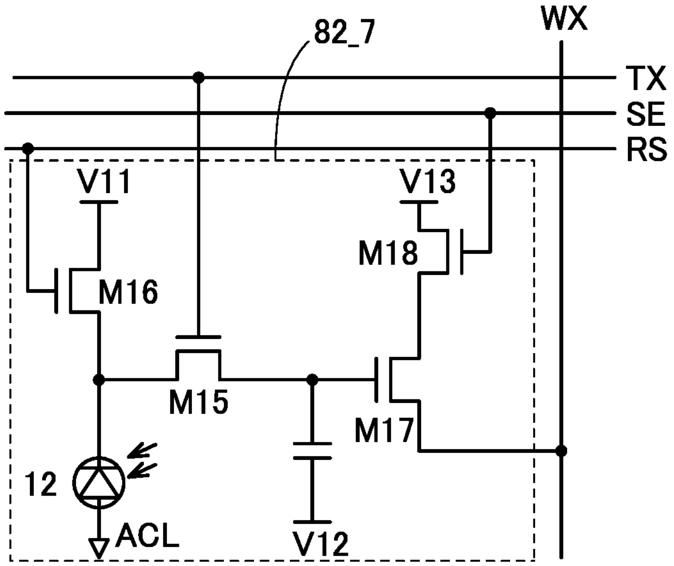
FIG. 12 is a diagram illustrating a structure example of a display apparatus.

A pixel 82_7 illustrated in FIG. 12 is an example in which the position of the transistor M16 in the pixel 82_6 is changed to a position in which the transistor M16 is electrically connected to one of the source and the drain of the transistor M15 and the cathode of the light-receiving device 12.

Figure 13A:
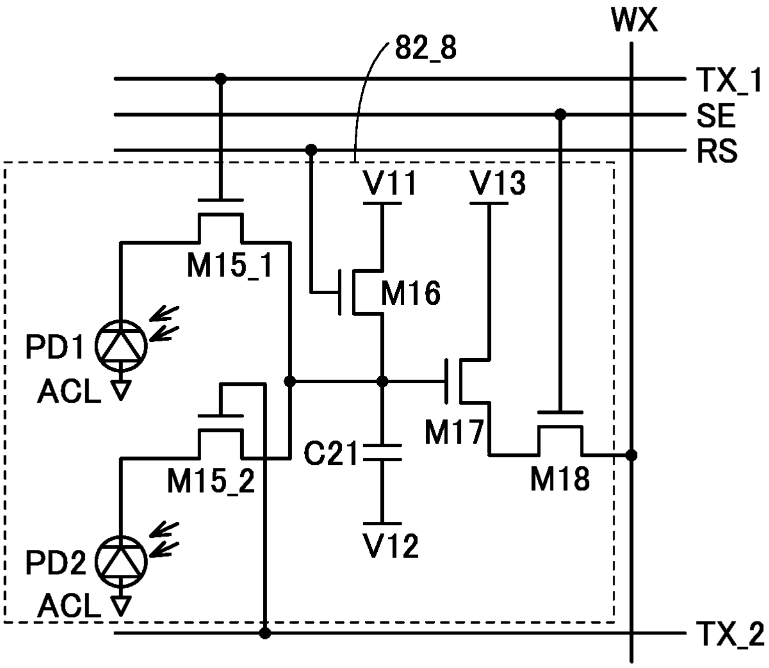
FIG. 13A and FIG. 13B are diagrams illustrating structure examples of a display apparatus.

A pixel 82_8 illustrated in FIG. 13A is a structure example in which a plurality of sets each including the transistor M15 and the light-receiving device PD in the pixel 82_4 are provided. A gate of a transistor M15_1 is electrically connected to a wiring TX_1, one of a source and a drain of the transistor M15_1 is electrically connected to a cathode of alight-receiving device PD1, and the other of the source and the drain thereof is electrically connected to one of a source and a drain of the transistor M16, a first electrode of the capacitor C21, and a gate of the transistor M17. A gate of a transistor M15_2 is electrically connected to a wiring TX_2, one of a source and a drain of the transistor M15_2 is electrically connected to a cathode of a light-receiving device PD2, and the other of the source and the drain thereof is electrically connected to one of the source and the drain of the transistor M16, the first electrode of the capacitor C21, and the gate of the transistor M17. Anodes of the light-receiving device PD1 and the light-receiving device PD2 are electrically connected to the wiring ACL.

Figure 13B:
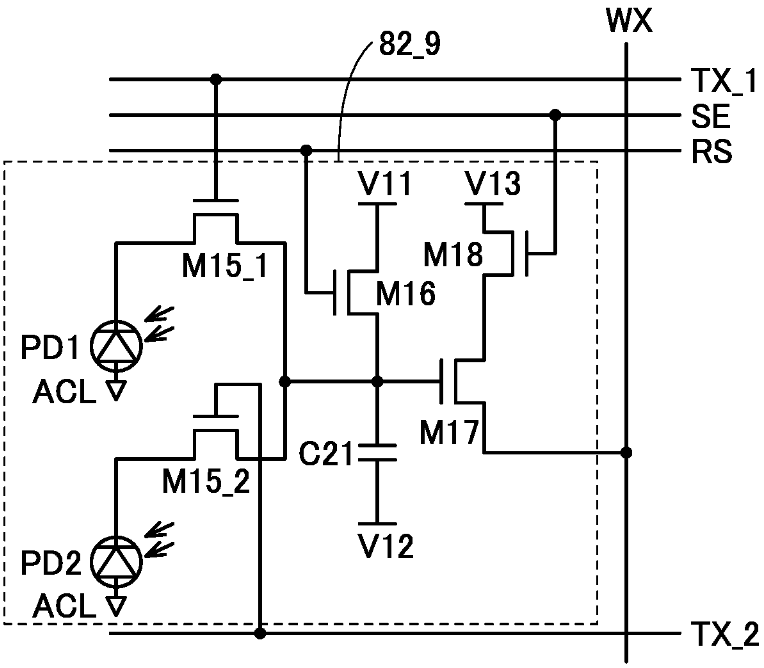

A pixel 82_9 illustrated in FIG. 13B is an example in which the position of the transistor M18 in the pixel 82_8 is changed to a position between the transistors M17 and the wiring V13.

Figure 14A:
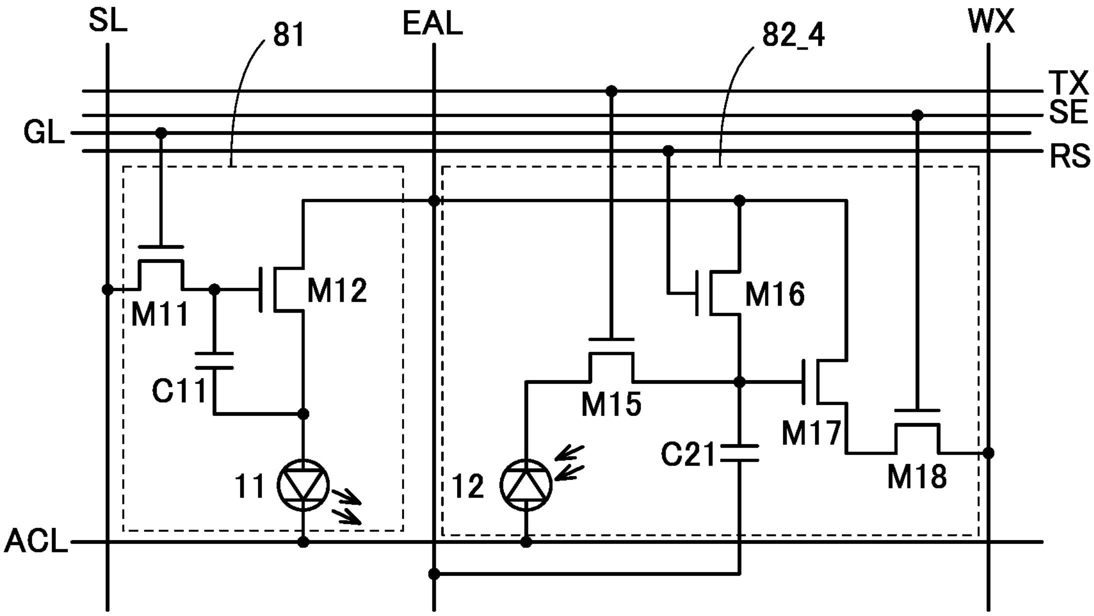
FIG. 14A and FIG. 14B are diagrams illustrating structure examples of a display apparatus.

FIG. 14A illustrates an example of a circuit diagram included in the pixel 80 in the case where the pixel 81 is applied to the subpixel 81R, the subpixel 81G, or the subpixel 81B and the pixel 82_4 is applied to the subpixel 82PS. FIG. 14A illustrates an example in which the wiring V11, the wiring V13, the wiring V12, and the wiring EAL are a common wiring. That is, in the circuit diagram in FIG. 14A, a wiring can be shared by a plurality of wirings included in the pixel 81 and the pixel 82_4 in the structure in which a forward bias voltage is applied to the light-emitting device 11 and a reverse bias voltage is applied to the light-receiving device 12. Thus, the number of wirings and the number of potentials to be supplied can be decreased in the pixel including the subpixel 81R, the subpixel 81G, the subpixel 81B, and the subpixel 82PS.

Figure 14B:
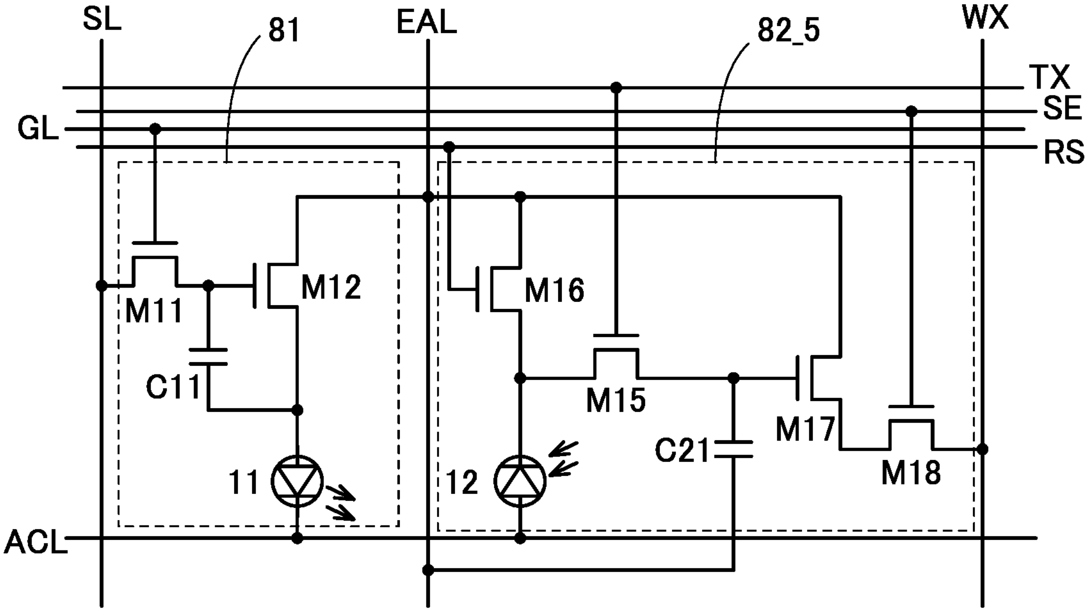

FIG. 14B is an example of a circuit diagram included in the pixel 80 in the case where the pixel 81 is applied to the subpixel 81R, the subpixel 81G, or the subpixel 81B and the pixel 82_5 is applied to the subpixel 82PS. FIG. 14B illustrates an example in which the wiring V11, the wiring V13, the wiring V12, and the wiring EAL are a common wiring. That is, in the circuit diagram in FIG. 14B, a wiring can be shared by a plurality of wirings included in the pixel 81 and the pixel 825 in the structure in which a forward bias voltage is applied to the light-emitting device 11 and a reverse bias voltage is applied to the light-receiving device 12. Thus, the number of wirings and the number of potentials to be supplied can be decreased in the pixel including the subpixel 81R, the subpixel 81G, the subpixel 81B, and the subpixel 82PS.

Figure 15A:
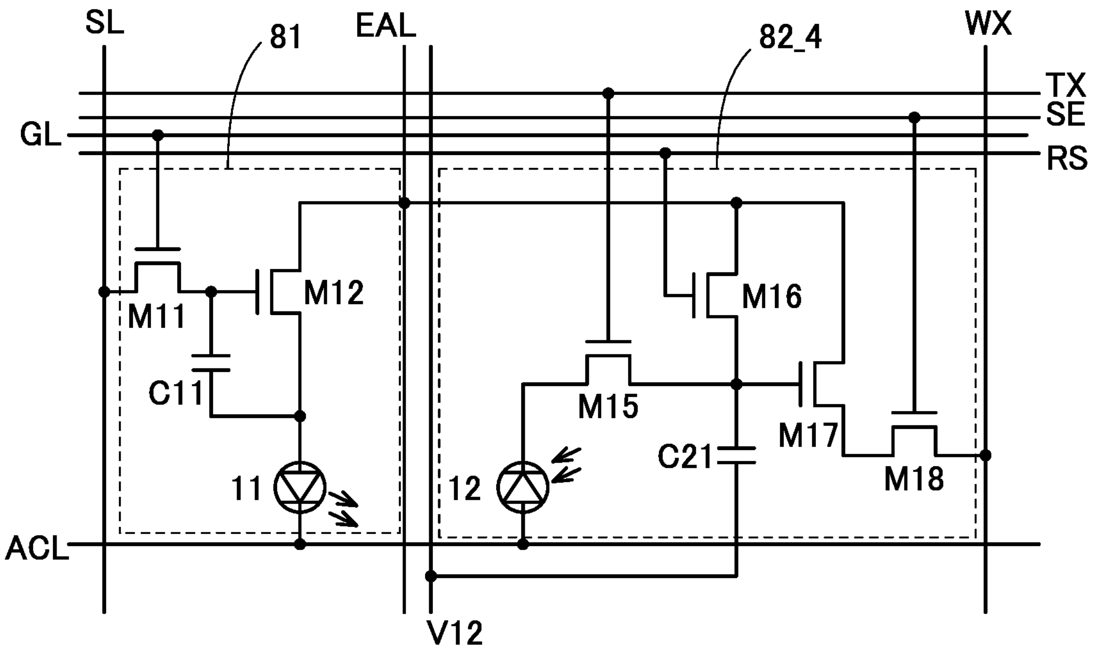
FIG. 15A and FIG. 15B are diagrams illustrating structure examples of display apparatuses.

FIG. 15A illustrates an example of a circuit diagram included in the pixel 80 in the case where the pixel 81 is applied to the subpixel 81R, the subpixel 81G, or the subpixel 81B and the pixel 82_4 is applied to the subpixel 82PS. FIG. 15A illustrates an example in which the wiring V11, the wiring V13, and the wiring EAL are a common wiring, and the wiring V12 is a different wiring. In other words, in the circuit diagram in FIG. 15A, a wiring can be shared by a plurality of wirings included in the pixel 81 and the pixel 824 in the structure in which a forward bias voltage is applied to the light-emitting device 11 and a reverse bias voltage is applied to the light-receiving device 12. Thus, the number of wirings and the number of potentials to be supplied can be decreased in the pixel including the subpixel 81R, the subpixel 81G, the subpixel 81B, and the subpixel 82PS.

Figure 15B:
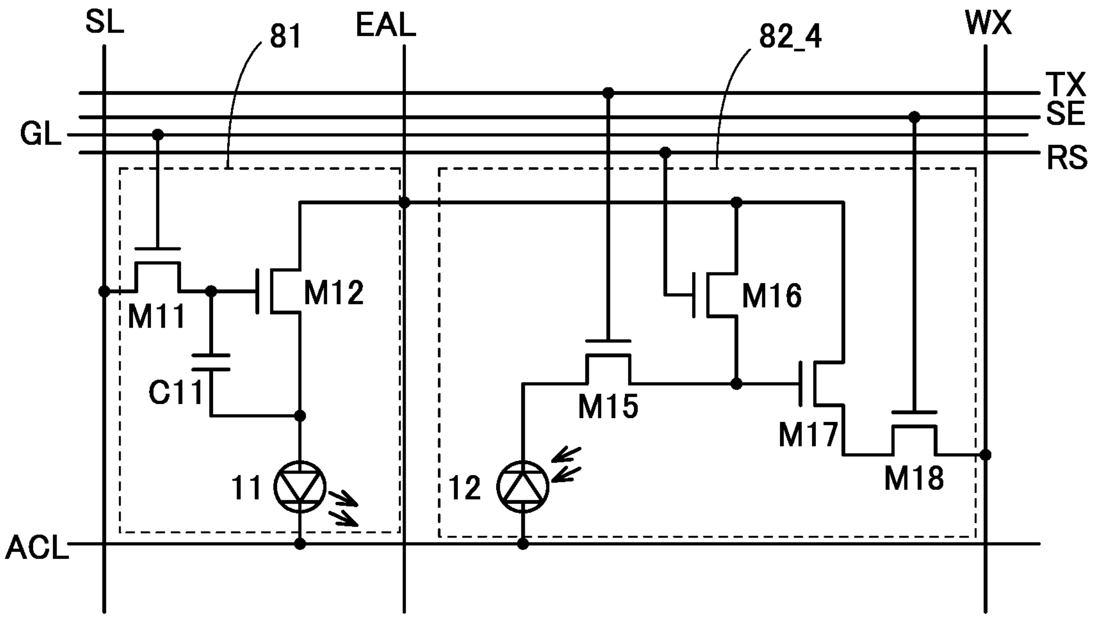

Note that the capacitor C21 included in the pixel 82_4 in FIG. 15A can be omitted by increasing a parasitic capacitance of the gate of the transistor M17, as illustrated in FIG. 15B.

Figure 16A:
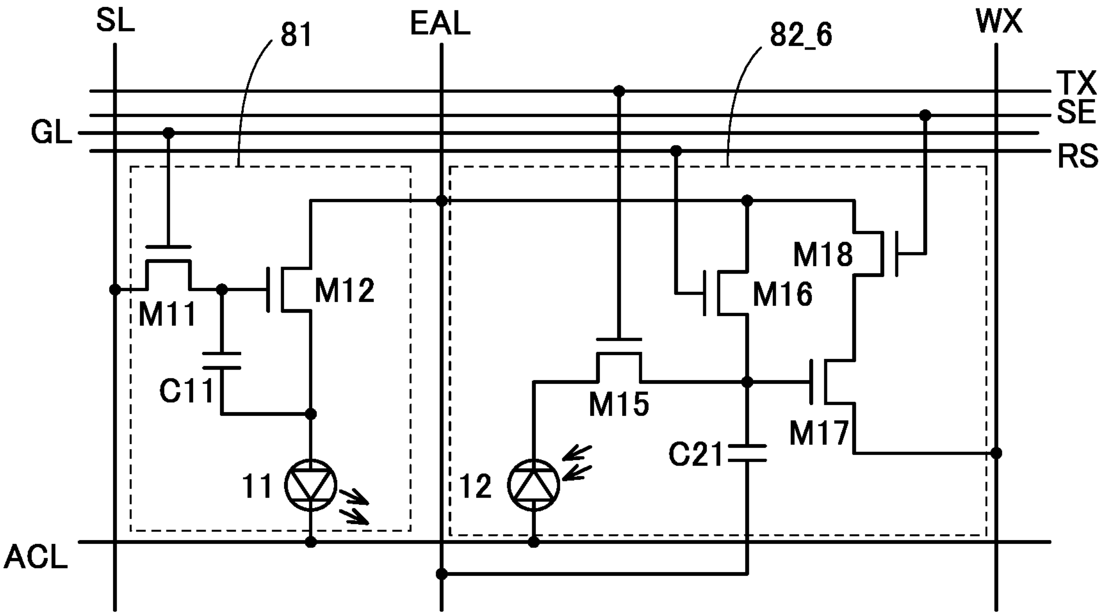
FIG. 16A and FIG. 16B are diagrams illustrating structure examples of a display apparatus.

FIG. 16A illustrates an example of a circuit diagram included in the pixel 80 in the case where the pixel 81 is applied to the subpixel 81R, the subpixel 81G, or the subpixel 81B and the pixel 82_6 is applied to the subpixel 82PS. FIG. 16A illustrates an example in which the wiring V11, the wiring V13, the wiring V12, and the wiring EAL are a common wiring. In other words, in the circuit diagram in FIG. 16A, a wiring can be shared by a plurality of wirings included in the pixel 81 and the pixel 82_6 in the structure in which a forward bias voltage is applied to the light-emitting device 11 and a reverse bias voltage is applied to the light-receiving device 12. Thus, the number of wirings and the number of potentials to be supplied can be decreased in the pixel including the subpixel 81R, the subpixel 81G, the subpixel 81B, and the subpixel 82PS.

Figure 16B:
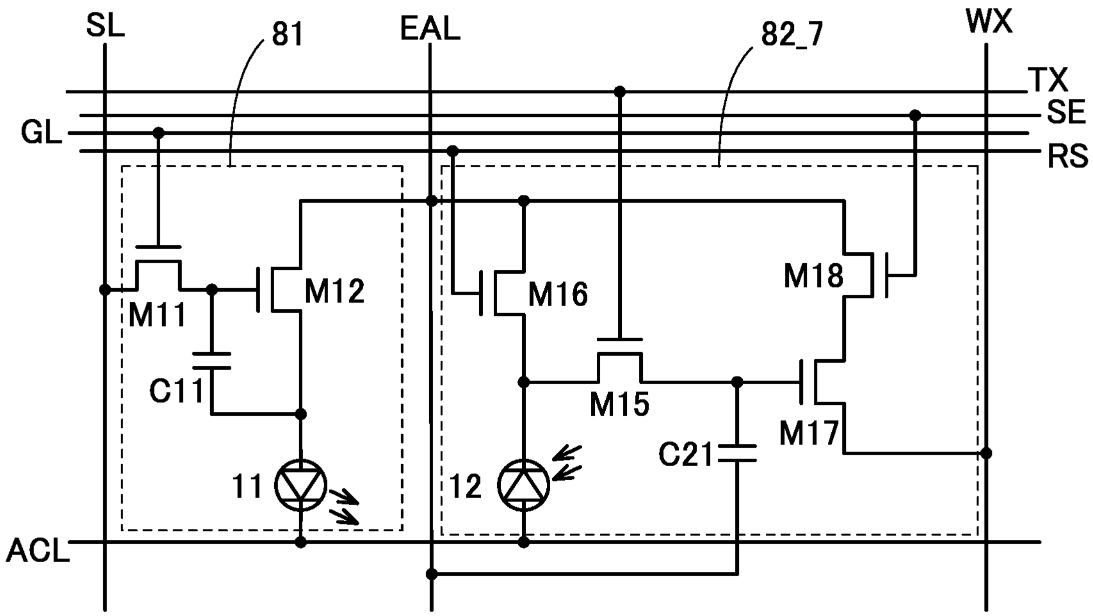

FIG. 16B illustrates an example of a circuit diagram included in the pixel 80 in the case where the pixel 81 is applied to the subpixel 81R, the subpixel 81G, or the subpixel 81B and the pixel 82_7 is applied to the subpixel 82PS. FIG. 16B illustrates an example in which the wiring V11, the wiring V13, the wiring V12, and the wiring EAL are a common wiring. In other words, in the circuit diagram in FIG. 16B, a wiring can be shared by a plurality of wirings included in the pixel 81 and the pixel 82_7 in the structure in which a forward bias voltage is applied to the light-emitting device 11 and a reverse bias voltage is applied to the light-receiving device 12. Thus, the number of wirings and the number of potentials to be supplied can be decreased in the pixel including the subpixel 81R, the subpixel 81G, the subpixel 81B, and the subpixel 82PS.

Figure 17A:
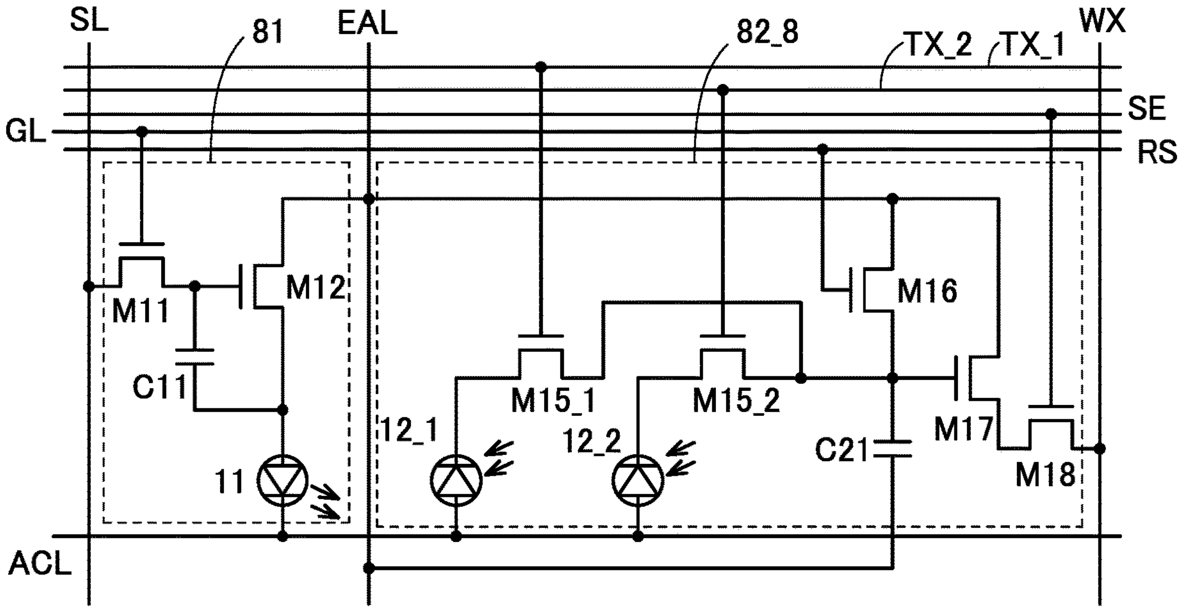
FIG. 17A and FIG. 17B are diagrams illustrating structure examples of a display apparatus.

FIG. 17A illustrates an example of a circuit diagram included in the pixel 80 in the case where the pixel 81 is applied to the subpixel 81R, the subpixel 81G, or the subpixel 81B and the pixel 82_8 is applied to the subpixel 82PS. FIG. 17A illustrates an example in which the wiring V11, the wiring V13, the wiring V12, and the wiring EAL are a common wiring. In other words, in the circuit diagram in FIG. 17A, a wiring can be shared by a plurality of wirings included in the pixel 81 and the pixel 82_8 in the structure in which a forward bias voltage is applied to the light-emitting device 11 and a reverse bias voltage is applied to the light-receiving device 12. Thus, the number of wirings and the number of potentials to be supplied can be decreased in the pixel including the subpixel 81R, the subpixel 81G, the subpixel 81B, and the subpixel 82PS.

Figure 17B:
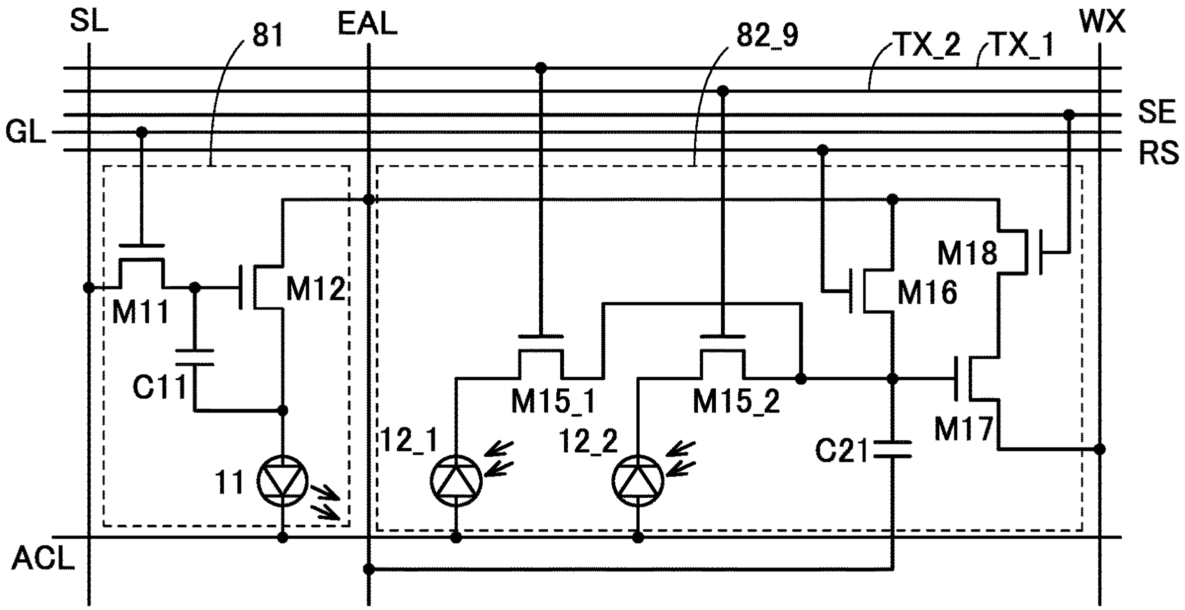

FIG. 17B illustrates an example of a circuit diagram included in the pixel 80 in the case where the pixel 81 is applied to the subpixel 81R, the subpixel 81G, or the subpixel 81B and the pixel 82_9 is applied to the subpixel 82PS. FIG. 17B illustrates an example in which the wiring V11, the wiring V13, the wiring V12, and the wiring EAL are a common wiring. In other words, in the circuit diagram in FIG. 17B, a wiring can be shared by a plurality of wirings included in the pixel 81 and the pixel 82_9 in the structure in which a forward bias voltage is applied to the light-emitting device 11 and a reverse bias voltage is applied to the light-receiving device 12. Thus, the number of wirings and the number of potentials to be supplied can be decreased in the pixel including the subpixel 81R, the subpixel 81G, the subpixel 81B, and the subpixel 82PS.

Figure 18A:
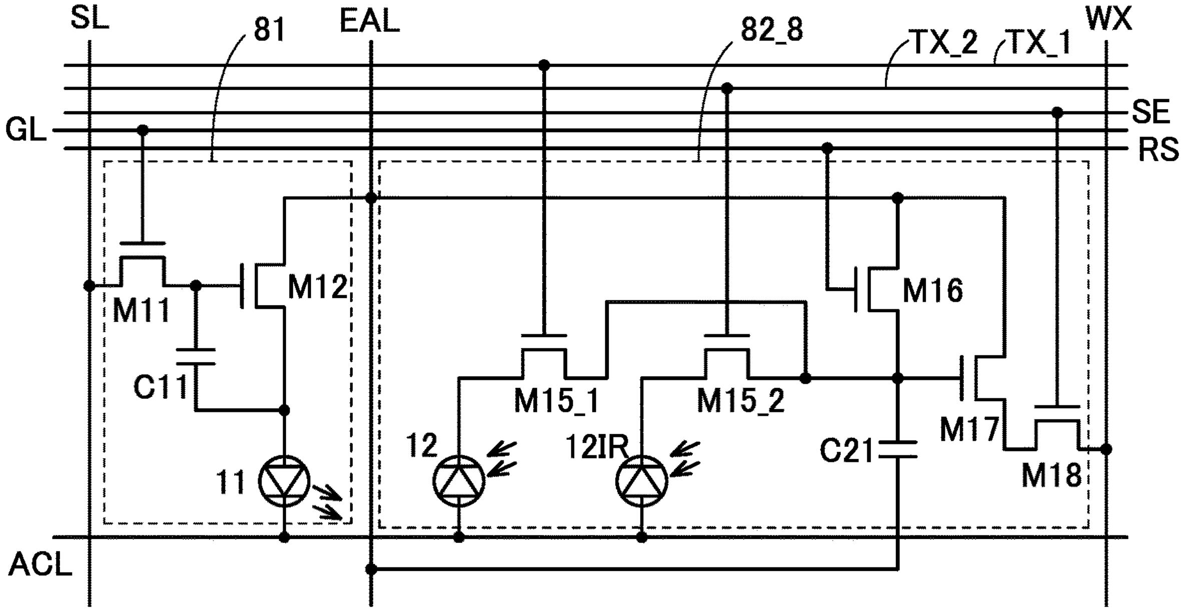
FIG. 18A and FIG. 18B are diagrams illustrating structure examples of a display apparatus.
Figure 18B:
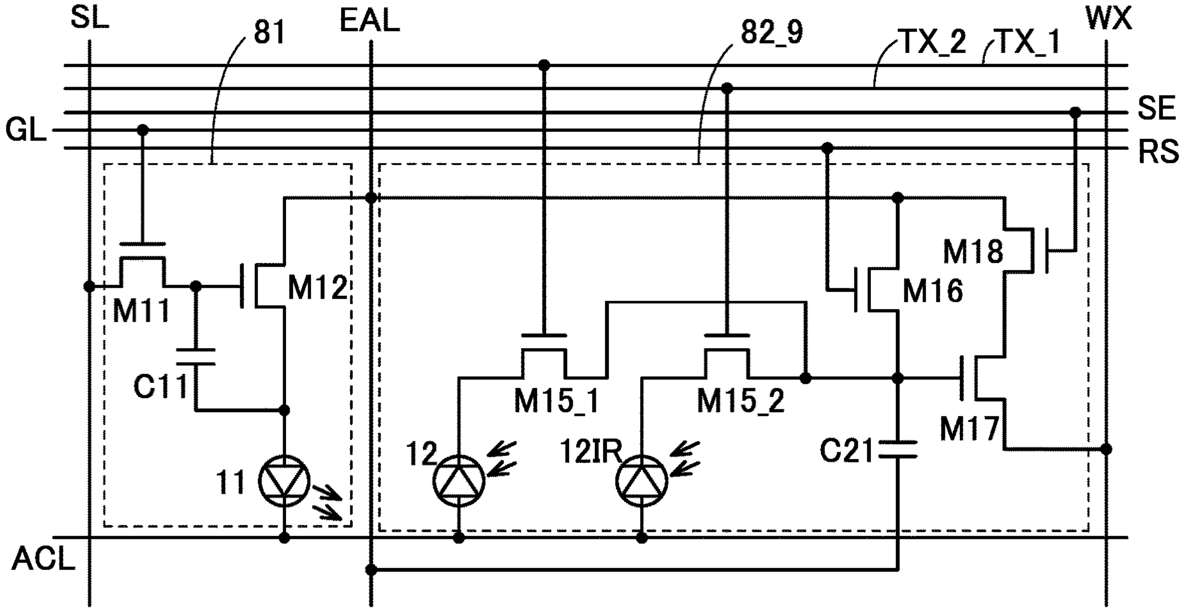

Note that as illustrated in FIG. 17A and FIG. 17B, in the case where a plurality of light-receiving devices are provided in the pixel 82_8 or the pixel 829, the light-receiving devices can have different spectral sensitivity characteristics. For example, a structure can be employed in which the light-receiving device 12IR having a spectral sensitivity characteristic in a wavelength region of infrared light and the light-receiving device 12 having a spectral sensitivity characteristic in a wavelength region of visible light are arranged. FIG. 18A is an example of a circuit diagram of the pixel 80 including the light-receiving device 12IR having a spectral sensitivity characteristic in a wavelength region of infrared light and the light-receiving device 12 having a spectral sensitivity characteristic in a wavelength region of visible light in the circuit diagram configuration illustrated in FIG. 17A. FIG. 18B is an example of a circuit diagram of the pixel 80 including the light-receiving device 12IR having a spectral sensitivity characteristic in a wavelength region of infrared light and the light-receiving device 12 having a spectral sensitivity characteristic in a wavelength region of visible light in the circuit diagram configuration illustrated in FIG. 17B.

Figure 19A:
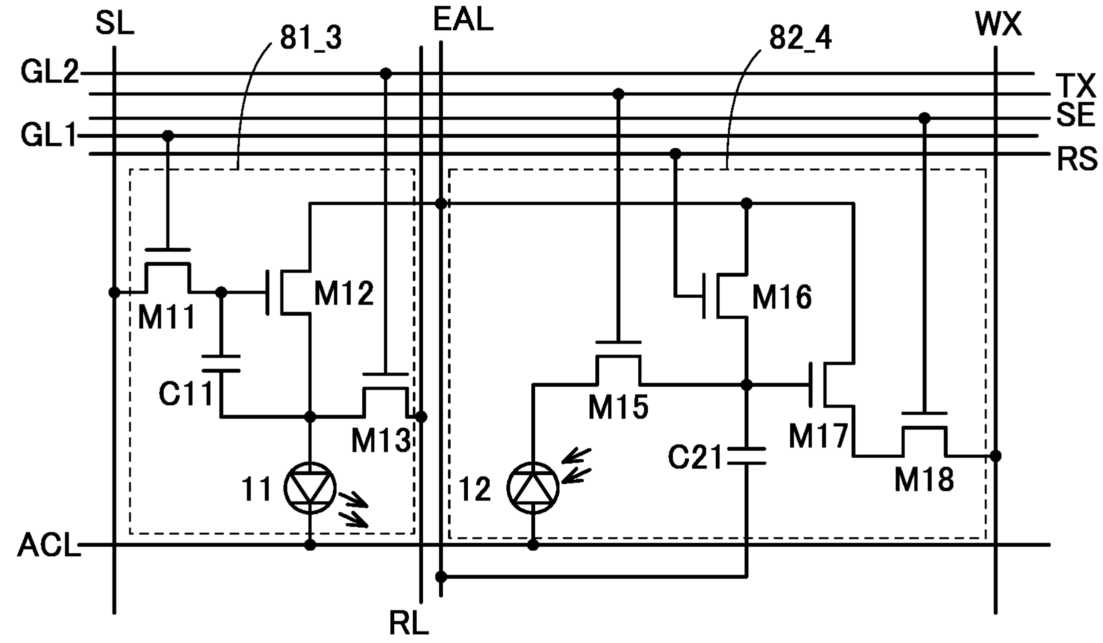
FIG. 19A and FIG. 19B are diagrams illustrating structure examples of a display apparatus.

FIG. 19A illustrates an example of a circuit diagram included in the pixel 80 in the case where the pixel 81_3 is applied to the subpixel 81R, the subpixel 81G, or the subpixel 81B and the pixel 82_4 is applied to the subpixel 82PS. FIG. 19A illustrates an example in which the wiring V11, the wiring V12, the wiring V13, and the wiring EAL are a common wiring. In other words, in the circuit diagram in FIG. 19A, a wiring can be shared by a plurality of wirings included in the pixel 81_3 and the pixel 82_4 in the structure in which a forward bias voltage is applied to the light-emitting device 11 and a reverse bias voltage is applied to the light-receiving device 12. Thus, the number of wirings and the number of potentials to be supplied can be decreased in the pixel including the subpixel 81R, the subpixel 81G, the subpixel 81B, and the subpixel 82PS.

Figure 19B:
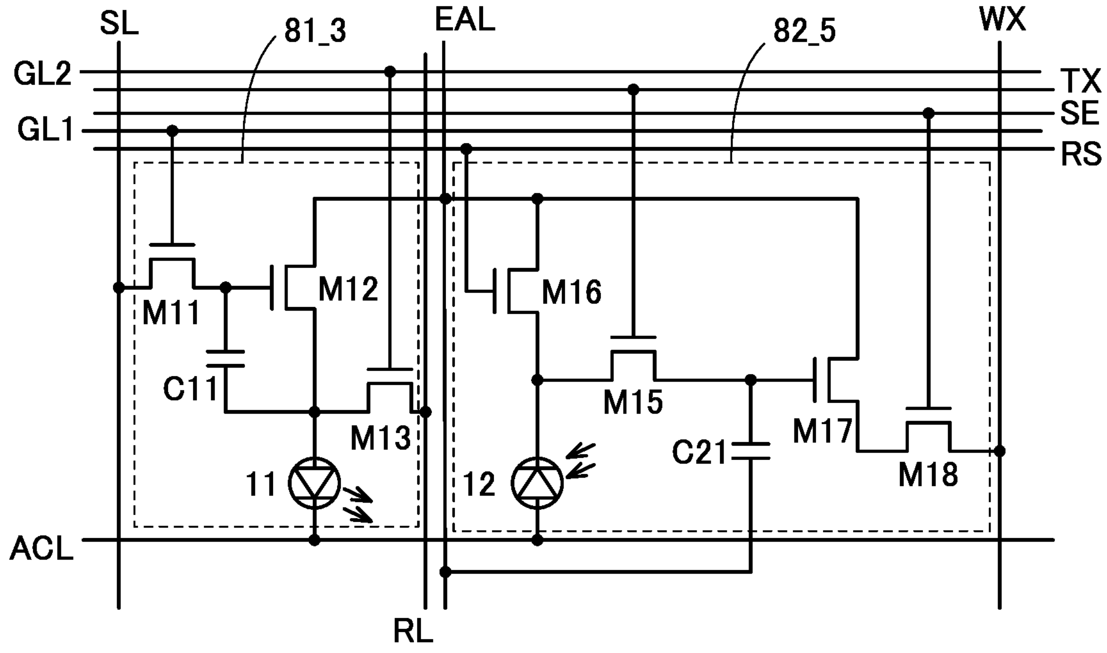

FIG. 19B illustrates an example of a circuit diagram included in the pixel 80 in the case where the pixel 81_3 is applied to the subpixel 81R, the subpixel 81G, or the subpixel 81B and the pixel 82_5 is applied to the subpixel 82PS. FIG. 19B illustrates an example in which the wiring V11, the wiring V12, the wiring V13, and the wiring EAL are a common wiring. In other words, in the circuit diagram in FIG. 19B, a wiring can be shared by a plurality of wirings included in the pixel 81_3 and the pixel 82_5 in the structure in which a forward bias voltage is applied to the light-emitting device 11 and a reverse bias voltage is applied to the light-receiving device 12. Thus, the number of wirings and the number of potentials to be supplied can be decreased in the pixel including the subpixel 81R, the subpixel 81G, the subpixel 81B, and the subpixel 82PS.

Figure 20A:
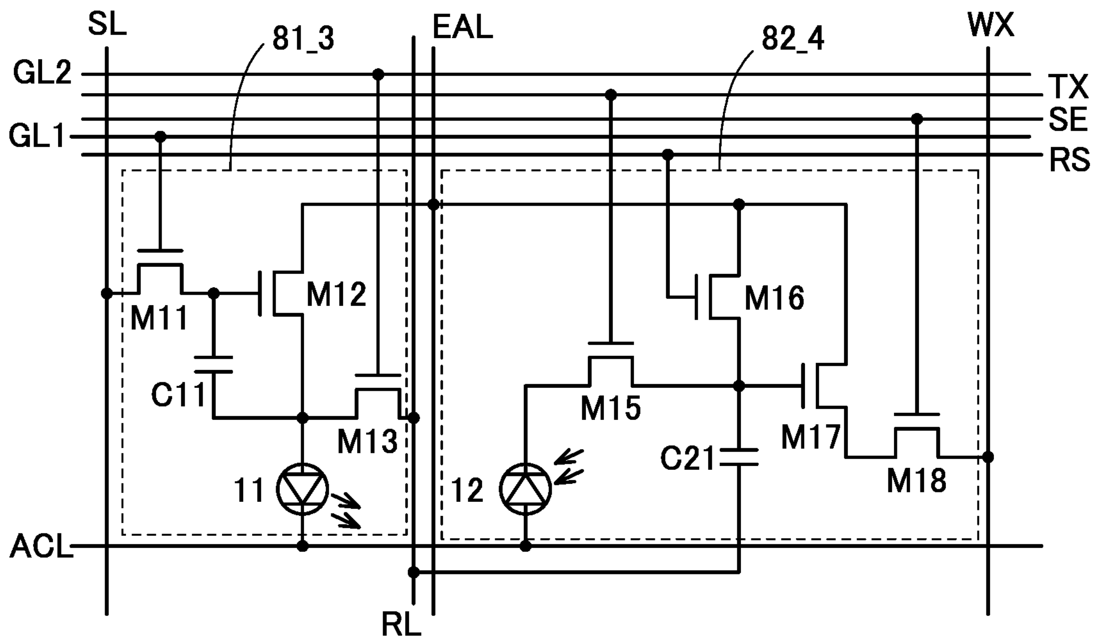
FIG. 20A and FIG. 20B are diagrams illustrating structure examples of a display apparatus.

FIG. 20A illustrates an example of a circuit diagram included in the pixel 80 in the case where the pixel 81_3 is applied to the subpixel 81R, the subpixel 81G, or the subpixel 81B and the pixel 82_4 is applied to the subpixel 82PS. FIG. 20A illustrates an example in which the wiring V11, the wiring V13, and the wiring EAL are a common wiring and the wiring RL and the wiring V12 are a common wiring. In other words, in the circuit diagram in FIG. 20A, a wiring can be shared by a plurality of wirings included in the pixel 81_3 and the pixel 82_4 in the structure in which a forward bias voltage is applied to the light-emitting device 11 and a reverse bias voltage is applied to the light-receiving device 12. Thus, the number of wirings and the number of potentials to be supplied can be decreased in the pixel including the subpixel 81R, the subpixel 81G, the subpixel 81B, and the subpixel 82PS.

Figure 20B:
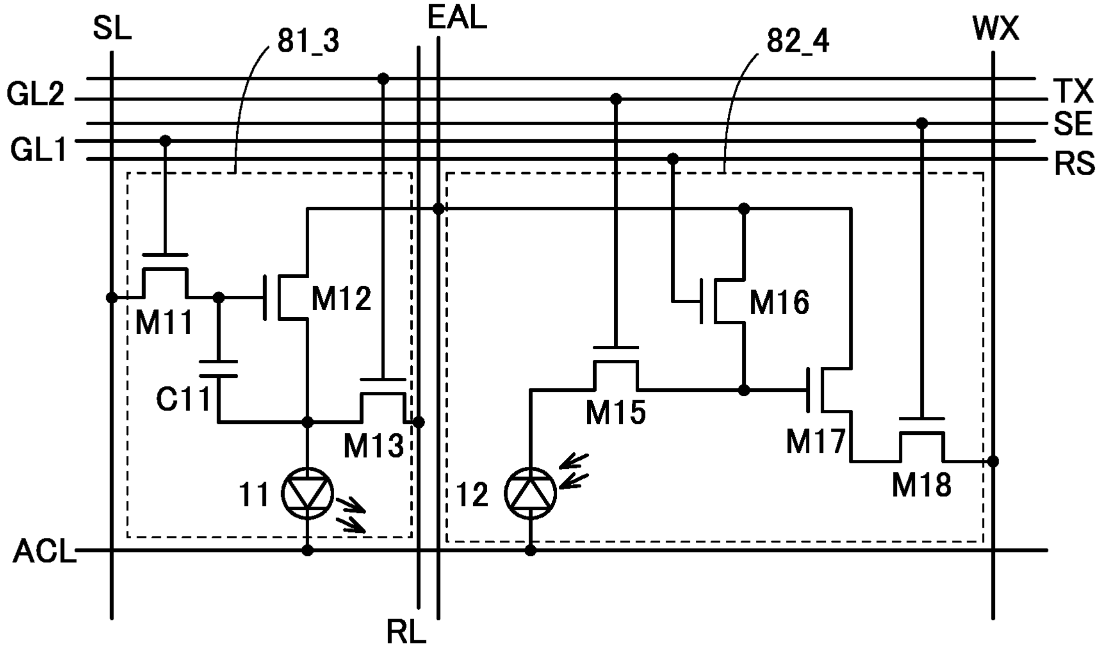

FIG. 20B illustrates an example of a circuit diagram included in the pixel 80 in the case where the pixel 81_3 is applied to the subpixel 81R, the subpixel 81G, or the subpixel 81B and the pixel 82_4 is applied to the subpixel 82PS. FIG. 20B illustrates an example in which the wiring V11, the wiring V13, and the wiring EAL are a common wiring and the wiring V12 is omitted. In other words, in the circuit diagram in FIG. 20B, a wiring can be shared by a plurality of wirings included in the pixel 813 and the pixel 82_4 in the structure in which a forward bias voltage is applied to the light-emitting device 11 and a reverse bias voltage is applied to the light-receiving device 12. Thus, the number of wirings and the number of potentials to be supplied can be decreased in the pixel including the subpixel 81R, the subpixel 81G, the subpixel 81B, and the subpixel 82PS.

Figure 21A:
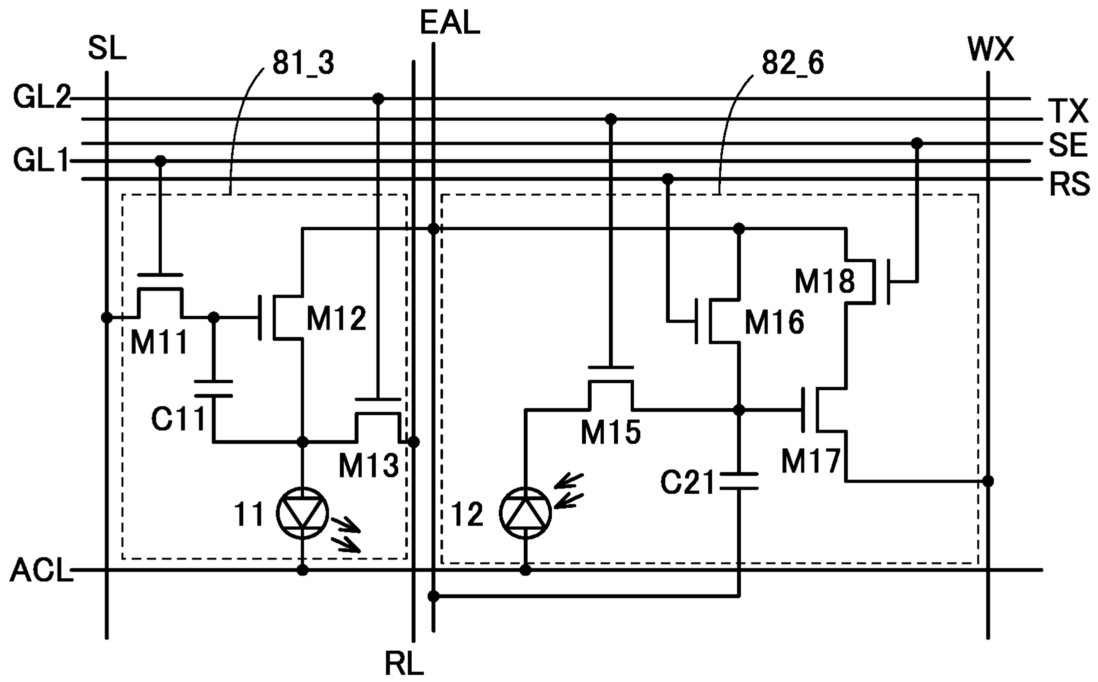
FIG. 21A and FIG. 21B are diagrams illustrating structure examples of a display apparatus.

FIG. 21A illustrates an example of a circuit diagram included in the pixel 80 in the case where the pixel 81_3 is applied to the subpixel 81R, the subpixel 81G, or the subpixel 81B and the pixel 82_6 is applied to the subpixel 82PS. FIG. 21A illustrates an example in which the wiring V11, the wiring V12, the wiring V13, and the wiring EAL are a common wiring. In other words, in the circuit diagram in FIG. 21A, a wiring can be shared by a plurality of wirings included in the pixel 81_3 and the pixel 826 in the structure in which a forward bias voltage is applied to the light-emitting device 11 and a reverse bias voltage is applied to the light-receiving device 12. Thus, the number of wirings and the number of potentials to be supplied can be decreased in the pixel including the subpixel 81R, the subpixel 81G, the subpixel 81B, and the subpixel 82PS.

Figure 21B:
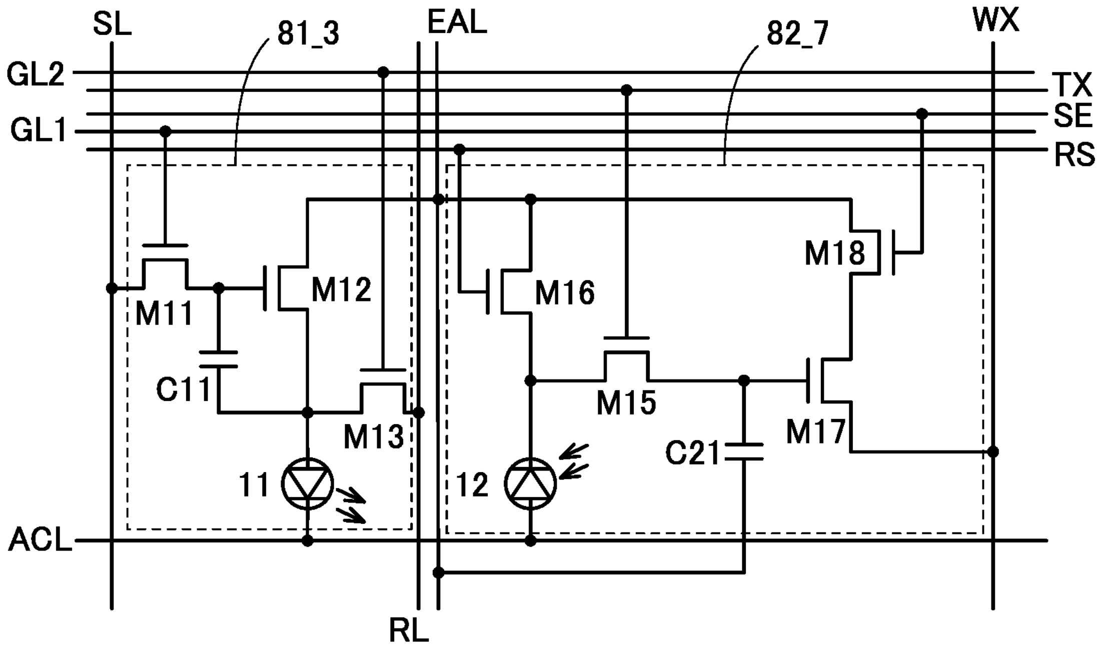

FIG. 21B illustrates an example of a circuit diagram included in the pixel 80 in the case where the pixel 81_3 is applied to the subpixel 81R, the subpixel 81G, or the subpixel 81B and the pixel 82_7 is applied to the subpixel 82PS. FIG. 21B illustrates an example in which the wiring V11, the wiring V12, the wiring V13, and the wiring EAL are a common wiring. In other words, in the circuit diagram in FIG. 21B, a wiring can be shared by a plurality of wirings included in the pixel 81_3 and the pixel 82_7 in the structure in which a forward bias voltage is applied to the light-emitting device 11 and a reverse bias voltage is applied to the light-receiving device 12. Thus, the number of wirings and the number of potentials to be supplied can be decreased in the pixel including the subpixel 81R, the subpixel 81G, the subpixel 81B, and the subpixel 82PS.

Figure 22A:
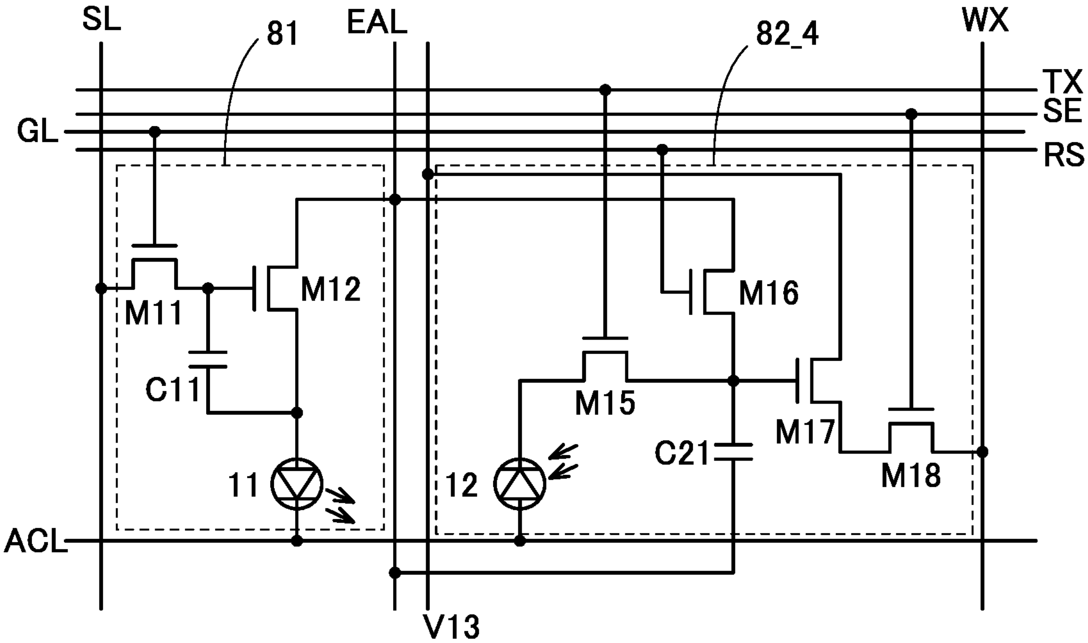
FIG. 22A and FIG. 22B are diagrams illustrating structure examples of a display apparatus.

FIG. 22A illustrates an example of a circuit diagram included in the pixel 80 in the case where the pixel 81 is applied to the subpixel 81R, the subpixel 81G, or the subpixel 81B and the pixel 82_4 is applied to the subpixel 82PS. FIG. 22A illustrates an example in which the wiring V11, the wiring V12, and the wiring EAL are a common wiring, and the wiring V13 is a different wiring. In other words, in the circuit diagram in FIG. 22A, a wiring can be shared by a plurality of wirings included in the pixel 81 and the pixel 824 in the structure in which a forward bias voltage is applied to the light-emitting device 11 and a reverse bias voltage is applied to the light-receiving device 12. Thus, the number of wirings and the number of potentials to be supplied can be decreased in the pixel including the subpixel 81R, the subpixel 81G, the subpixel 81B, and the subpixel 82PS.

Figure 22B:
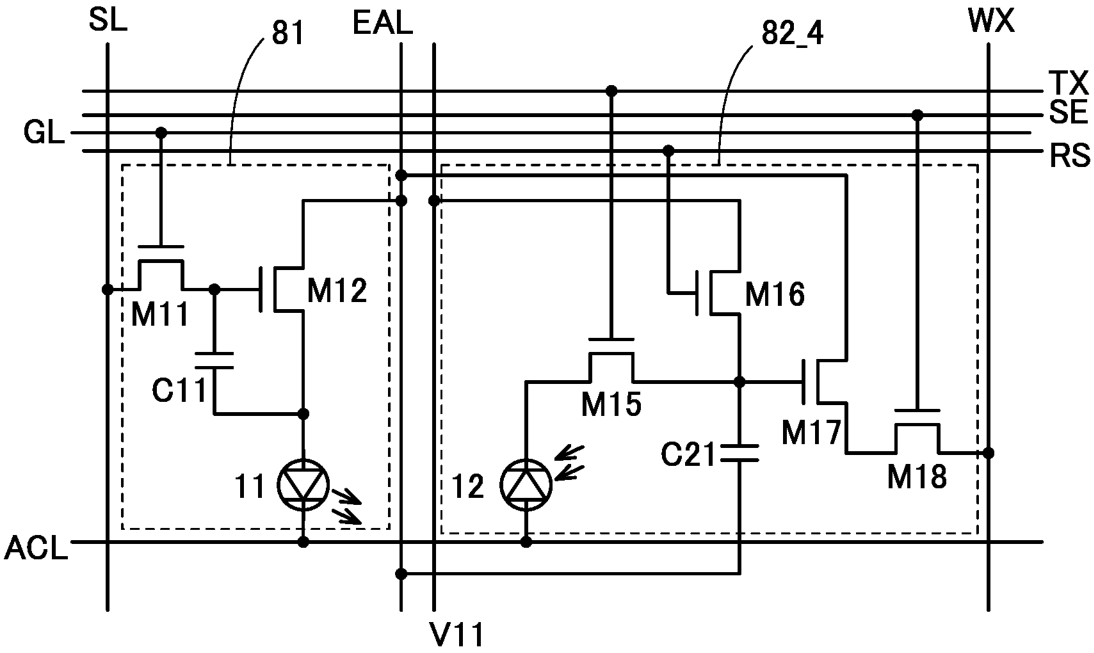

FIG. 22B illustrates an example of a circuit diagram included in the pixel 80 in the case where the pixel 81 is applied to the subpixel 81R, the subpixel 81G, or the subpixel 81B and the pixel 82_4 is applied to the subpixel 82PS. FIG. 22B illustrates an example in which the wiring V12, the wiring V13, and the wiring EAL are a common wiring, and the wiring V11 is a different wiring. In other words, in the circuit diagram in FIG. 22B, a wiring can be shared by a plurality of wirings included in the pixel 81 and the pixel 824 in the structure in which a forward bias voltage is applied to the light-emitting device 11 and a reverse bias voltage is applied to the light-receiving device 12. Thus, the number of wirings and the number of potentials to be supplied can be decreased in the pixel including the subpixel 81R, the subpixel 81G, the subpixel 81B, and the subpixel 82PS.

Figure 23A:
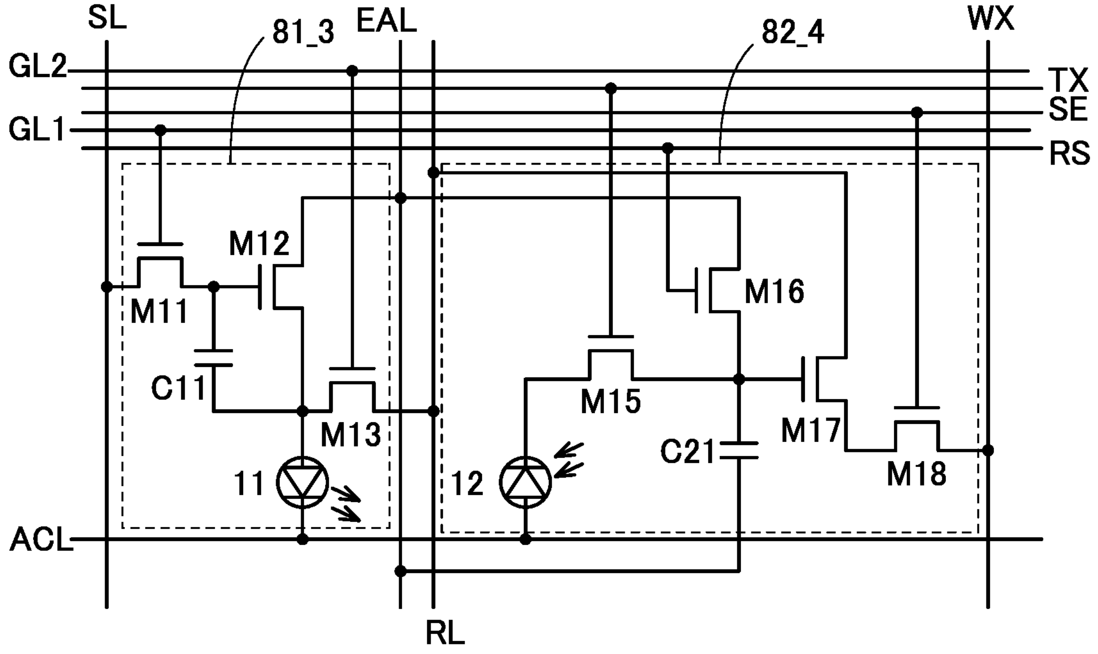
FIG. 23A and FIG. 23B are diagrams illustrating structure examples of a display apparatus.

FIG. 23A illustrates an example of a circuit diagram included in the pixel 80 in the case where the pixel 81_3 is applied to the subpixel 81R, the subpixel 81G, or the subpixel 81B and the pixel 82_4 is applied to the subpixel 82PS. FIG. 23A illustrates an example in which the wiring V11, the wiring V12, and the wiring EAL are a common wiring, and the wiring RL and the wiring V13 are a common wiring. In other words, in the circuit diagram in FIG. 23A, a wiring can be shared by a plurality of wirings included in the pixel 81_3 and the pixel 82_4 in the structure in which a forward bias voltage is applied to the light-emitting device 11 and a reverse bias voltage is applied to the light-receiving device 12. Thus, the number of wirings and the number of potentials to be supplied can be decreased in the pixel including the subpixel 81R, the subpixel 81G, the subpixel 81B, and the subpixel 82PS.

Figure 23B:
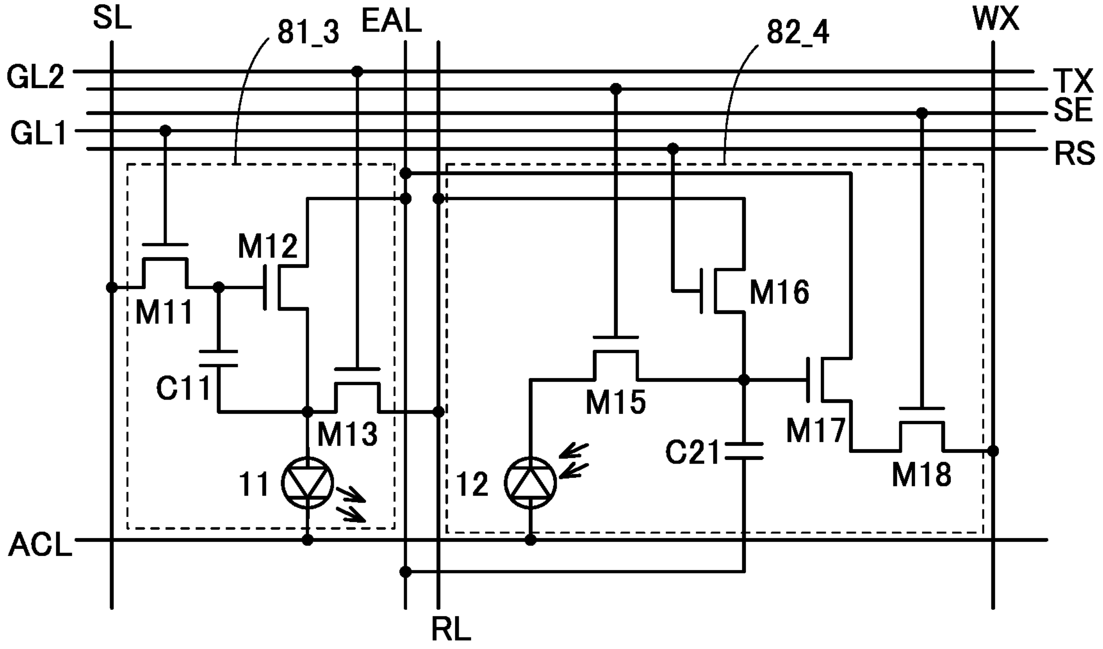

FIG. 23B illustrates an example of a circuit diagram included in the pixel 80 in the case where the pixel 81_3 is applied to the subpixel 81R, the subpixel 81G, or the subpixel 81B and the pixel 82_4 is applied to the subpixel 82PS. FIG. 23B illustrates an example in which the wiring V12, the wiring V13, and the wiring EAL are a common wiring, and the wiring RL and the wiring V11 are a common wiring. In other words, in the circuit diagram in FIG. 23B, a wiring can be shared by a plurality of wirings included in the pixel 81_3 and the pixel 82_4 in the structure in which a forward bias voltage is applied to the light-emitting device 11 and a reverse bias voltage is applied to the light-receiving device 12. Thus, the number of wirings and the number of potentials to be supplied can be decreased in the pixel including the subpixel 81R, the subpixel 81G, the subpixel 81B, and the subpixel 82PS.

Figure 24A:
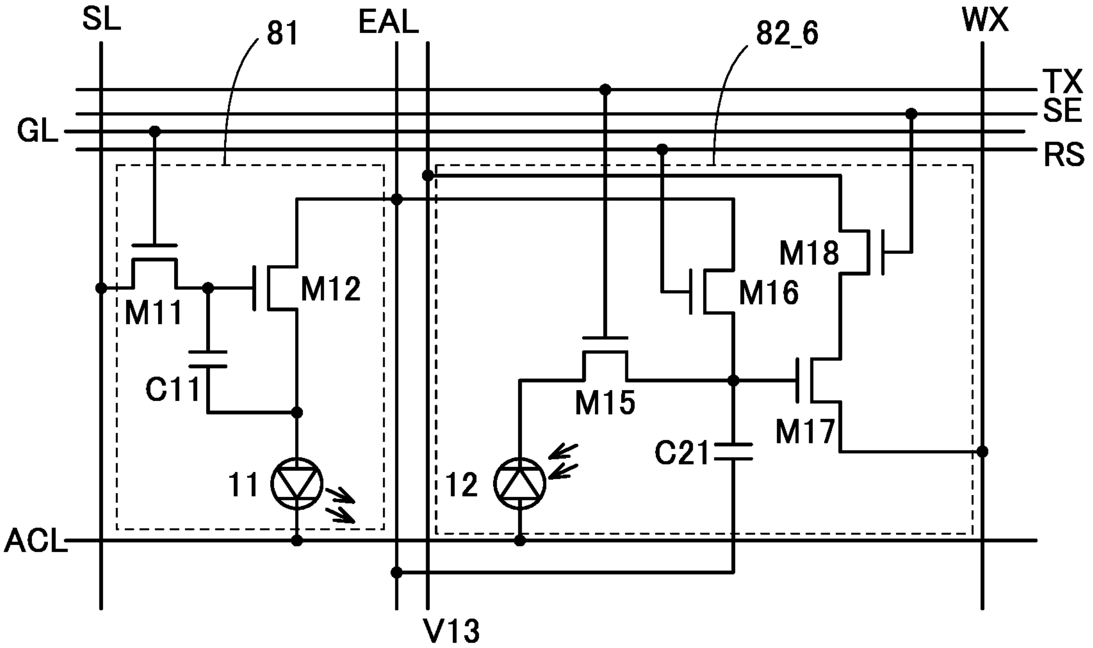
FIG. 24A and FIG. 24B are diagrams illustrating structure examples of a display apparatus.

FIG. 24A illustrates an example of a circuit diagram included in the pixel 80 in the case where the pixel 81 is applied to the subpixel 81R, the subpixel 81G, or the subpixel 81B and the pixel 82_6 is applied to the subpixel 82PS. FIG. 24A illustrates an example in which the wiring V11, the wiring V12, and the wiring EAL are a common wiring, and the wiring V13 is a different wiring. In other words, in the circuit diagram in FIG. 24A, a wiring can be shared by a plurality of wirings included in the pixel 81 and the pixel 826 in the structure in which a forward bias voltage is applied to the light-emitting device 11 and a reverse bias voltage is applied to the light-receiving device 12. Thus, the number of wirings and the number of potentials to be supplied can be decreased in the pixel including the subpixel 81R, the subpixel 81G, the subpixel 81B, and the subpixel 82PS.

Figure 24B:
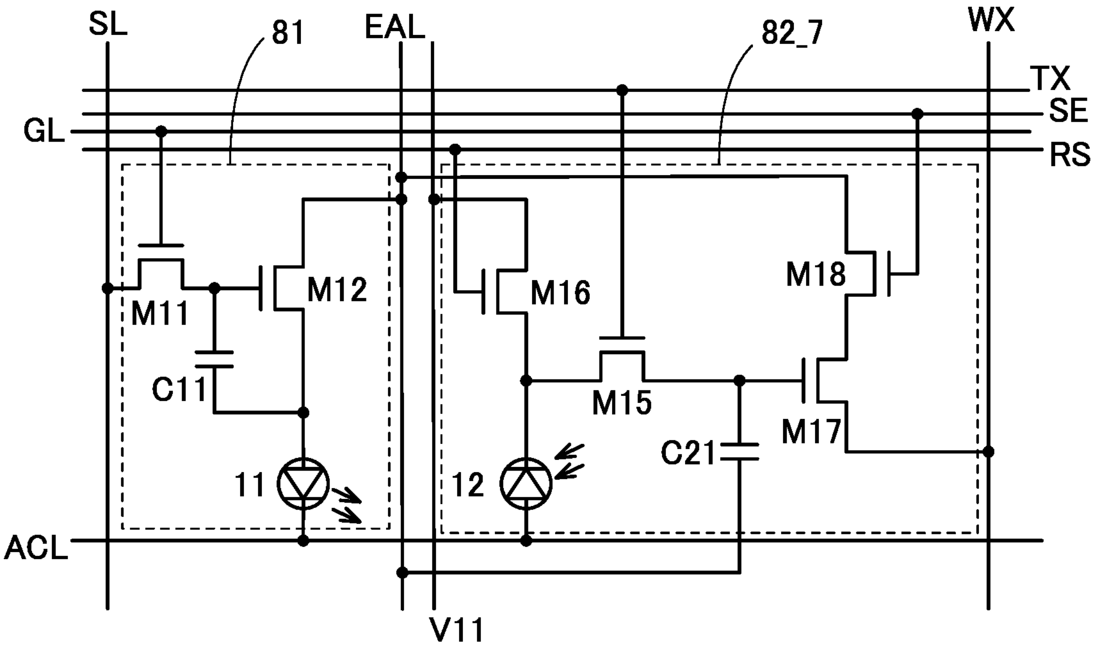

FIG. 24B illustrates an example of a circuit diagram included in the pixel 80 in the case where the pixel 81 is applied to the subpixel 81R, the subpixel 81G, or the subpixel 81B and the pixel 82_7 is applied to the subpixel 82PS. FIG. 24B illustrates an example in which the wiring V12, the wiring V13, and the wiring EAL are a common wiring, and the wiring V11 is a different wiring. In other words, in the circuit diagram in FIG. 24B, a wiring can be shared by a plurality of wirings included in the pixel 81 and the pixel 827 in the structure in which a forward bias voltage is applied to the light-emitting device 11 and a reverse bias voltage is applied to the light-receiving device 12. Thus, the number of wirings and the number of potentials to be supplied can be decreased in the pixel including the subpixel 81R, the subpixel 81G, the subpixel 81B, and the subpixel 82PS.

Figure 25A:
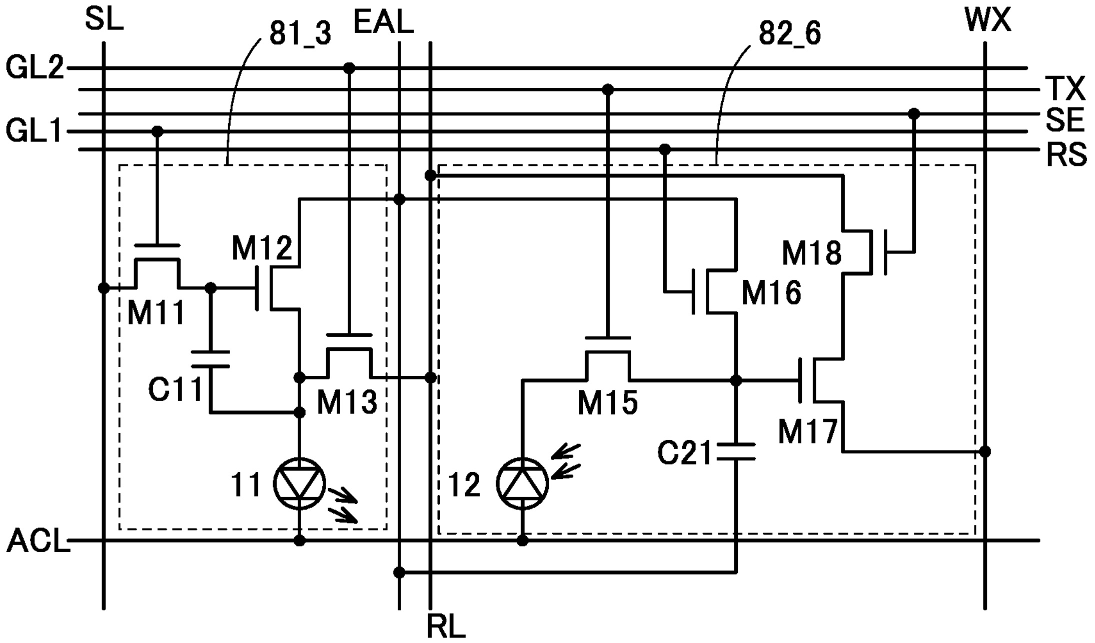
FIG. 25A and FIG. 25B are diagrams illustrating structure examples of a display apparatus.

FIG. 25A illustrates an example of a circuit diagram included in the pixel 80 in the case where the pixel 81_3 is applied to the subpixel 81R, the subpixel 81G, or the subpixel 81B and the pixel 82_6 is applied to the subpixel 82PS. FIG. 25A illustrates an example in which the wiring V11, the wiring V12, and the wiring EAL are a common wiring, and the wiring RL and the wiring V13 are a common wiring. In other words, in the circuit diagram in FIG. 25A, a wiring can be shared by a plurality of wirings included in the pixel 81_3 and the pixel 82_6 in the structure in which a forward bias voltage is applied to the light-emitting device 11 and a reverse bias voltage is applied to the light-receiving device 12. Thus, the number of wirings and the number of potentials to be supplied can be decreased in the pixel including the subpixel 81R, the subpixel 81G, the subpixel 81B, and the subpixel 82PS.

Figure 25B:
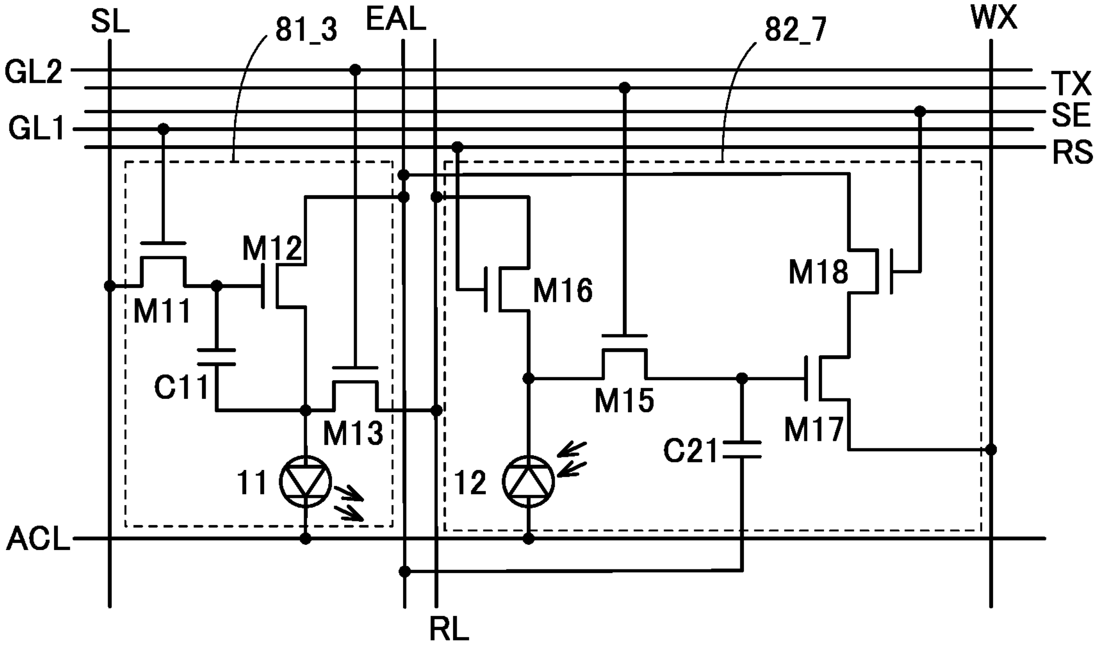

FIG. 25B illustrates an example of a circuit diagram included in the pixel 80 in the case where the pixel 81_3 is applied to the subpixel 81R, the subpixel 81G, or the subpixel 81B and the pixel 82_7 is applied to the subpixel 82PS. FIG. 25B illustrates an example in which the wiring V12, the wiring V13, and the wiring EAL are a common wiring, and the wiring RL and the wiring V11 are a common wiring. In other words, in the circuit diagram in FIG. 25B, a wiring can be shared by a plurality of wirings included in the pixel 81_3 and the pixel 82_7 in the structure in which a forward bias voltage is applied to the light-emitting device 11 and a reverse bias voltage is applied to the light-receiving device 12. Thus, the number of wirings and the number of potentials to be supplied can be decreased in the pixel including the subpixel 81R, the subpixel 81G, the subpixel 81B, and the subpixel 82PS.

Figure 26A:
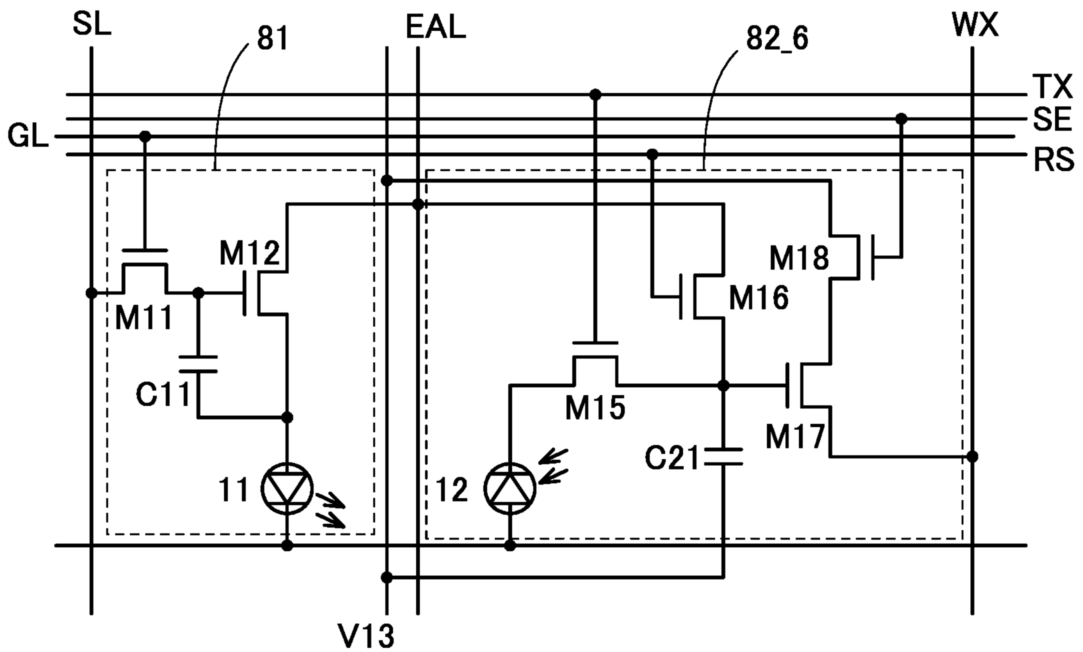
FIG. 26A and FIG. 26B are diagrams illustrating structure examples of a display apparatus.

FIG. 26A illustrates an example of a circuit diagram included in the pixel 80 in the case where the pixel 81 is applied to the subpixel 81R, the subpixel 81G, or the subpixel 81B and the pixel 82_6 is applied to the subpixel 82PS. FIG. 26A illustrates an example in which the wiring V11 and the wiring EAL are a common wiring, and the wiring V12 and the wiring V13 are a common wiring. In other words, in the circuit diagram in FIG. 26A, a wiring can be shared by a plurality of wirings included in the pixel 81 and the pixel 82_6 in the structure in which a forward bias voltage is applied to the light-emitting device 11 and a reverse bias voltage is applied to the light-receiving device 12. Thus, the number of wirings and the number of potentials to be supplied can be decreased in the pixel including the subpixel 81R, the subpixel 81G, the subpixel 81B, and the subpixel 82PS.

Figure 26B:
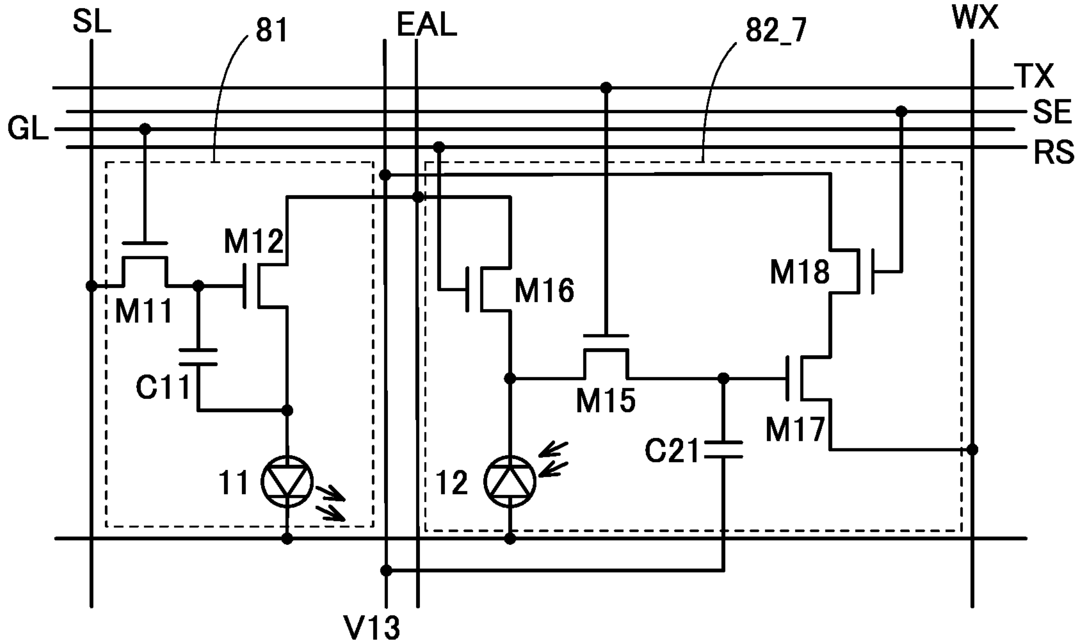

FIG. 26B illustrates an example of a circuit diagram included in the pixel 80 in the case where the pixel 81 is applied to the subpixel 81R, the subpixel 81G, or the subpixel 81B and the pixel 82_7 is applied to the subpixel 82PS. FIG. 26B illustrates an example in which the wiring V11 and the wiring EAL are a common wiring, and the wiring V12 and the wiring V13 are a common wiring. In other words, in the circuit diagram in FIG. 26B, a wiring can be shared by a plurality of wirings included in the pixel 81 and the pixel 82_7 in the structure in which a forward bias voltage is applied to the light-emitting device 11 and a reverse bias voltage is applied to the light-receiving device 12. Thus, the number of wirings and the number of potentials to be supplied can be decreased in the pixel including the subpixel 81R, the subpixel 81G, the subpixel 81B, and the subpixel 82PS.

Figure 27A:
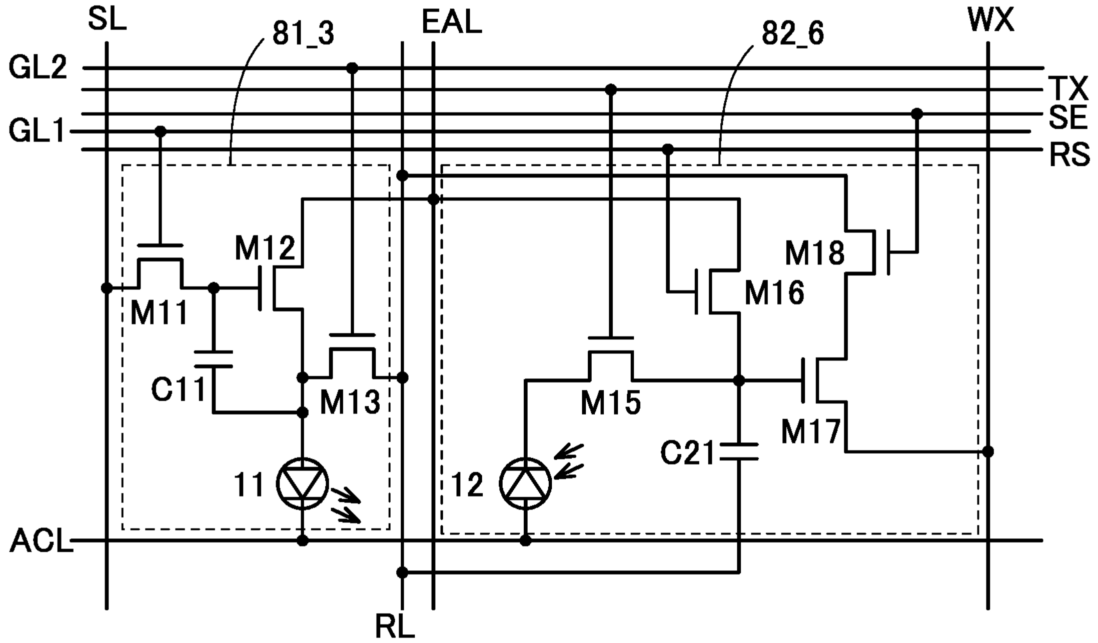
FIG. 27A and FIG. 27B are diagrams illustrating structure examples of a display apparatus.

FIG. 27A illustrates an example of a circuit diagram included in the pixel 80 in the case where the pixel 81_3 is applied to the subpixel 81R, the subpixel 81G, or the subpixel 81B and the pixel 82_6 is applied to the subpixel 82PS. FIG. 27A illustrates an example in which the wiring V11 and the wiring EAL are a common wiring, and the wiring RL, the wiring V12 and the wiring V13 are a common wiring. In other words, in the circuit diagram in FIG. 27A, a wiring can be shared by a plurality of wirings included in the pixel 81_3 and the pixel 826 in the structure in which a forward bias voltage is applied to the light-emitting device 11 and a reverse bias voltage is applied to the light-receiving device 12. Thus, the number of wirings and the number of potentials to be supplied can be decreased in the pixel including the subpixel 81R, the subpixel 81G, the subpixel 81B, and the subpixel 82PS.

Figure 27B:
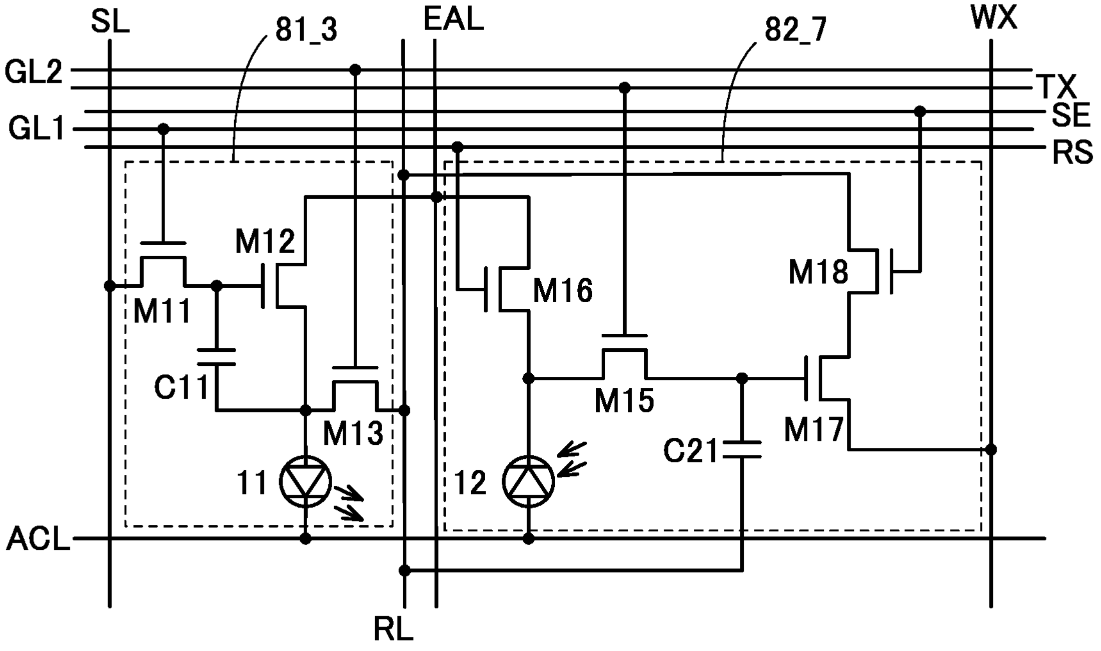

FIG. 27B illustrates an example of a circuit diagram included in the pixel 80 in the case where the pixel 81_3 is applied to the subpixel 81R, the subpixel 81G, or the subpixel 81B and the pixel 82_7 is applied to the subpixel 82PS. FIG. 27B illustrates an example in which the wiring V11 and the wiring EAL are a common wiring, and the wiring RL, the wiring V12 and the wiring V13 are a common wiring. In other words, in the circuit diagram in FIG. 27B, a wiring can be shared by a plurality of wirings included in the pixel 81_3 and the pixel 827 in the structure in which a forward bias voltage is applied to the light-emitting device 11 and a reverse bias voltage is applied to the light-receiving device 12. Thus, the number of wirings and the number of potentials to be supplied can be decreased in the pixel including the subpixel 81R, the subpixel 81G, the subpixel 81B, and the subpixel 82PS.

Although FIG. 19A to FIG. 27B illustrate the structure in which a wiring is shared by the wirings connected to the transistors included in the pixel 80, another structure may be employed.

Figure 28A:
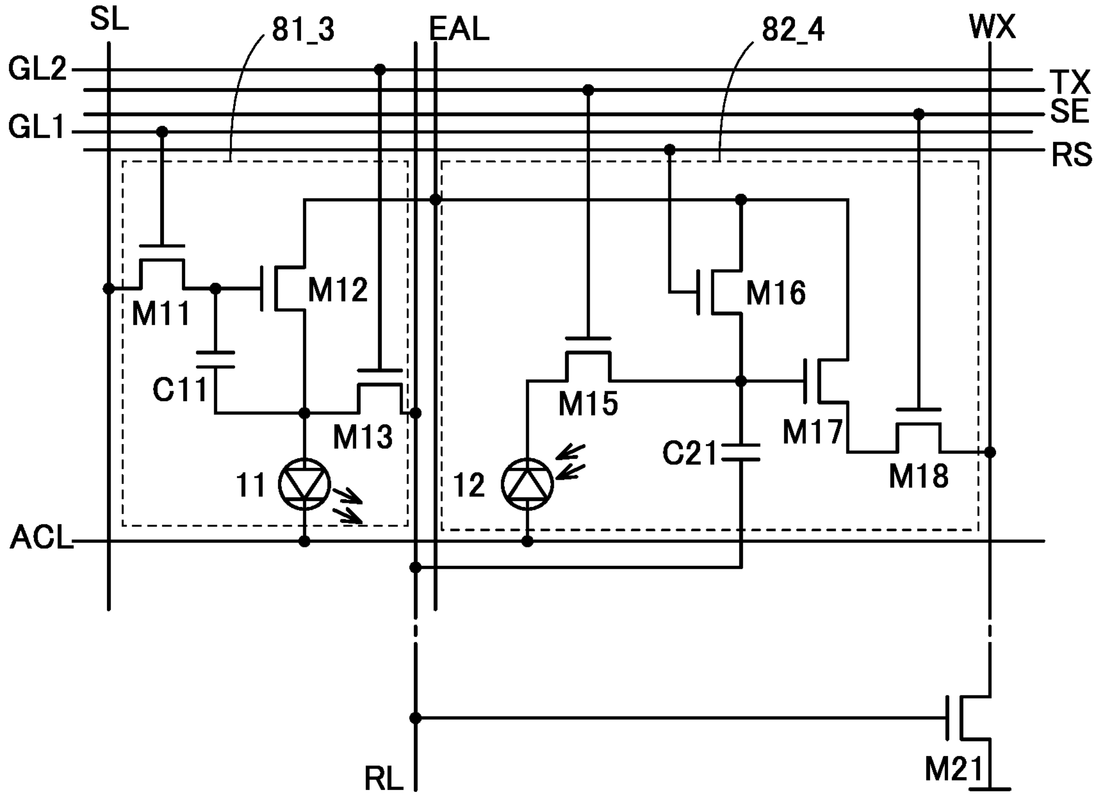
FIG. 28A and FIG. 28B are diagrams illustrating structure examples of a display apparatus.
Figure 28B:
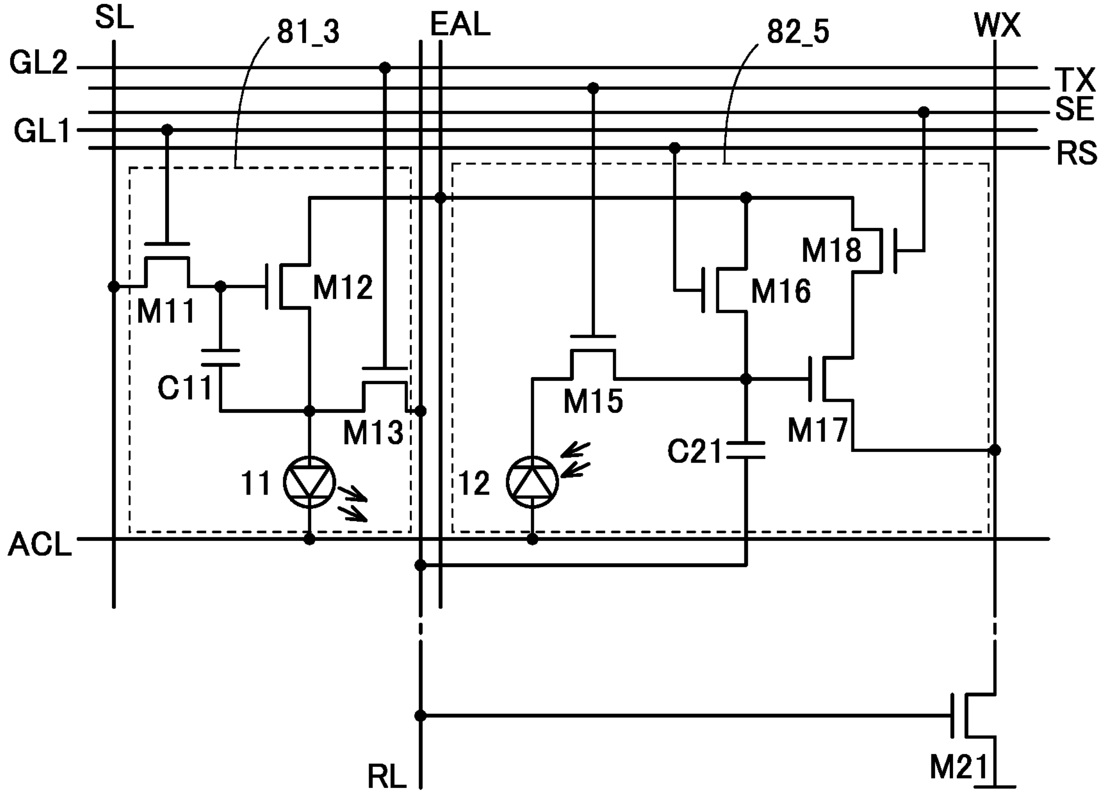

FIG. 28A illustrates an example of a circuit diagram included in the pixel 80 in the case where the pixel 81_3 is applied to the subpixel 81R, the subpixel 81G, or the subpixel 81B, the pixel 82_4 is applied to the subpixel 82PS, and a common wiring is used for the gate of the transistor M21 electrically connected to the wiring WX and the wiring RL. The transistor M21 can serve as a power source that supplies current in accordance with a reset signal supplied to the wiring RL. FIG. 28B illustrates an example of a circuit diagram included in the pixel 80 in the case where the pixel 81_3 is applied to the subpixel 81R, the subpixel 81G, or the subpixel 81B, the pixel 82_5 is applied to the subpixel 82PS, and a common wiring is used for the gate of the transistor M21 electrically connected to the wiring WX and the wiring RL. The transistor M21 can serve as a power source that supplies current in accordance with a reset signal supplied to the wiring RL. In other words, in the circuit diagrams illustrated in FIG. 28A and FIG. 28B, a wiring can be shared by a plurality of wirings included in the pixel 813 and the pixel 82_4 (or the pixel 82_5) and another wiring (potential-supply wiring) in the structure in which a forward bias voltage is applied to the light-emitting device 11 and a reverse bias voltage is applied to the light-receiving device 12. Thus, the number of wirings and the number of potentials to be supplied can be decreased in the pixel including the subpixel 81R, the subpixel 81G, the subpixel 81B, and the subpixel 82PS.

Figure 29:
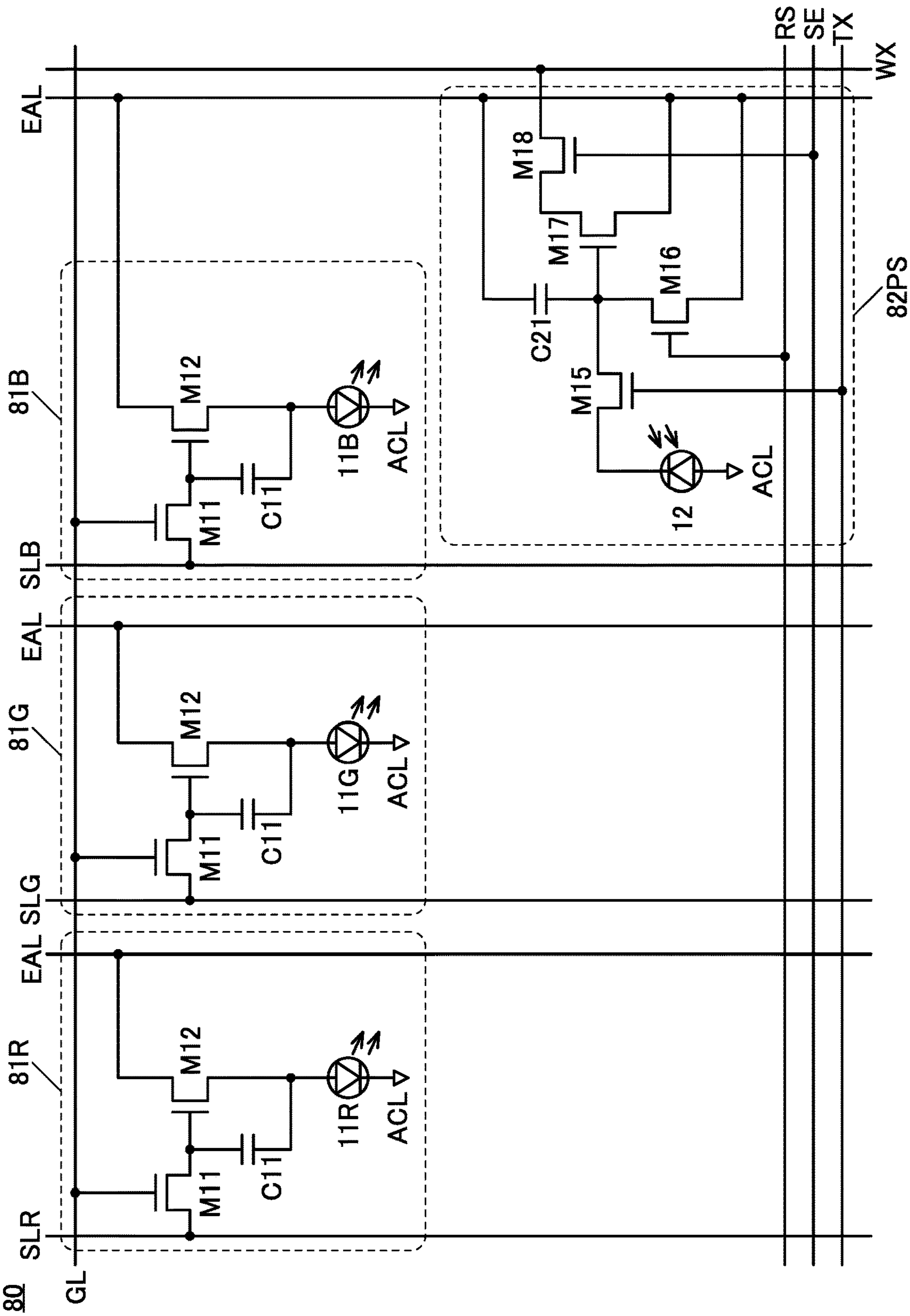
FIG. 29 is a diagram illustrating a structure example of a display apparatus.

FIG. 29 illustrates an example of a circuit diagram of the pixel 80 including the subpixel 81R, the subpixel 81G, the subpixel 81B, and the subpixel 82PS. FIG. 29 illustrates an example of a circuit diagram of the pixel 80 in the case where the pixel 81 is applied to the subpixel 81R, the subpixel 81G, or the subpixel 81B and the pixel 824 is applied to the subpixel 82PS.

In the subpixel 82PS, the wiring EAL in the subpixel 81B and the wiring V11 to the wiring V13 can be a common wiring. In the circuit diagram illustrated in FIG. 29, in the structure in which a forward bias voltage is applied to the light-emitting devices 11R, 11G, and 11B, and a reverse bias voltage is applied to the light-receiving device 12, a wiring can be shared by a plurality of wirings in the subpixel 81B and the pixel 82PS. Instead of the subpixel 81B, the subpixel 81R or the subpixel 81G may be used. As illustrated in FIG. 29, the number of wirings and the number of potentials to be supplied can be decreased in the pixel including the subpixel 81R, the subpixel 81G, the subpixel 81B, and the subpixel 82PS. Consequently, a display apparatus including a high-definition display portion having a light detection function can be provided. Furthermore, a display apparatus including a high-resolution display portion having a light detection function can be provided.

Figure 30:
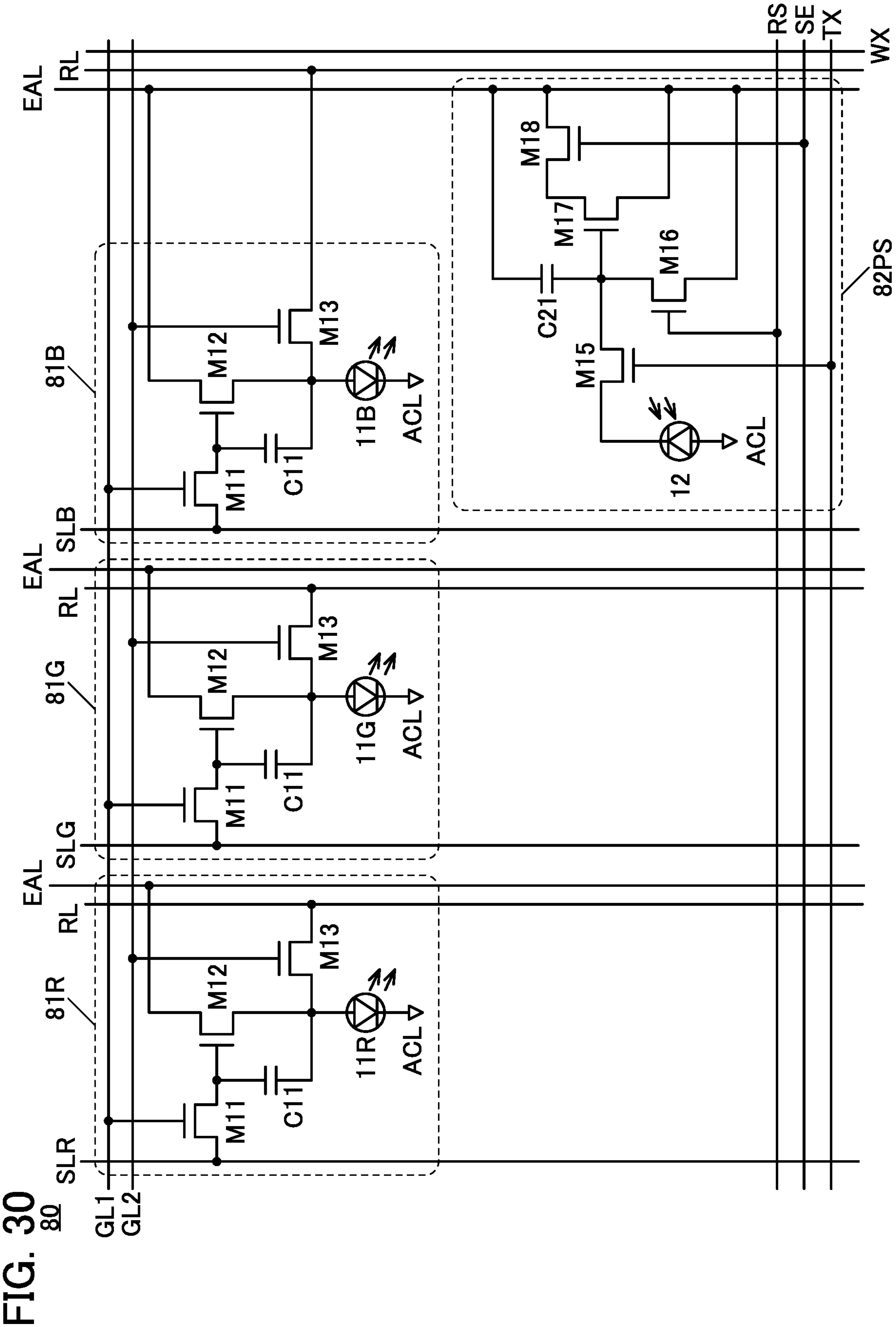
FIG. 30 is a diagram illustrating a structure example of a display apparatus.

Note that the structures of the subpixel 81R, the subpixel 81G, the subpixel 81B, and the subpixel 82PS are not limited to the structures illustrated in FIG. 29. FIG. 30 illustrates a circuit diagram of the pixel 80 different from that in FIG. 29. FIG. 30 illustrates a circuit diagram of the pixel 80 in the case where the pixel 81_3 is applied to the subpixel 81R, the subpixel 81G, or the subpixel 81B and the pixel 82_4 is applied to the subpixel 82PS.

In the subpixel 82PS, the wiring EAL in the subpixel 81B and the wiring V11 to the wiring V13 can be a common wiring. In the circuit diagram in FIG. 29, in the structure in which a forward bias voltage is applied to the light-emitting devices 11R, 11G, and 11B, and a reverse bias voltage is applied to the light-receiving device 12, a wiring can be shared by a plurality of wirings in the subpixel 81B and the subpixel 82PS. Instead of the subpixel 81B, the subpixel 81R or the subpixel 81G may be used. As illustrated in FIG. 30, the number of wirings and the number of potentials to be supplied can be decreased in the pixel including the subpixel 81R, the subpixel 81G, the subpixel 81B, and the subpixel 82PS. Consequently, a display apparatus including a high-definition display portion having a light detection function can be provided. Furthermore, a display apparatus including a high-resolution display portion having a light detection function can be provided.

Figure 31:
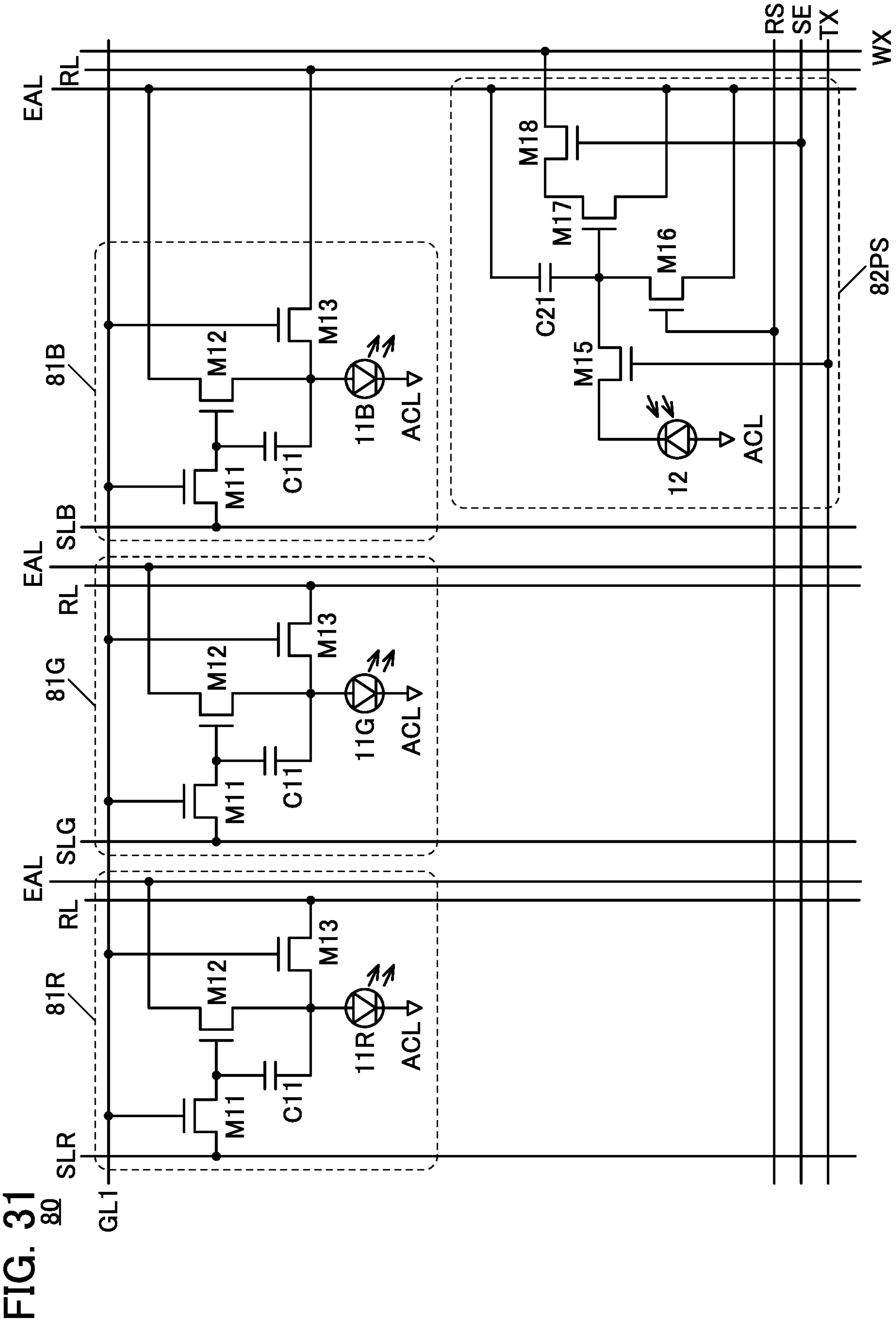
FIG. 31 is a diagram illustrating a structure example of a display apparatus.

Note that as illustrated in FIG. 31, another wiring may be shared among the structures of the subpixel 81R, the subpixel 81G, the subpixel 81B, and the subpixel 82PS illustrated in FIG. 30. For example, the wiring GL1 and the wiring GL2 may be a common wiring. As illustrated in FIG. 31, the number of wirings and the number of potentials to be supplied can be decreased in the pixel including the subpixel 81R, the subpixel 81G, the subpixel 81B, and the subpixel 82PS. Consequently, a display apparatus including a high-definition display portion having a light detection function can be provided. Furthermore, a display apparatus including a high-resolution display portion having a light detection function can be provided.

Figure 32:
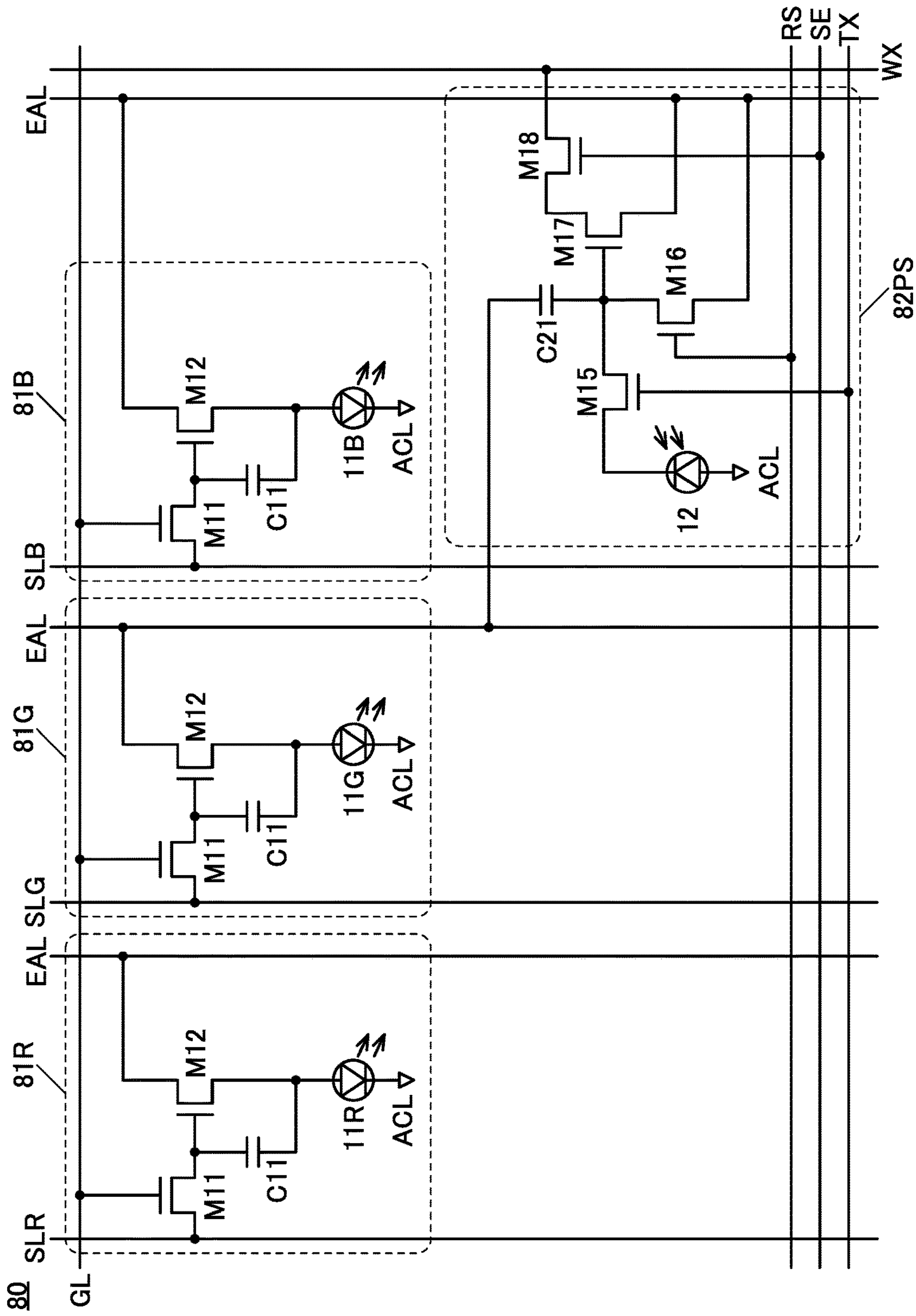
FIG. 32 is a diagram illustrating a structure example of a display apparatus.

Note that as illustrated in FIG. 32, another wiring may be shared among the structures of the subpixel 81G, the subpixel 81B, and the subpixel 82PS illustrated in FIG. 29. For example, a wiring connected to the subpixel 82PS may be separated into the wiring EAL connected to the subpixel 81G and the wiring EAL connected to the subpixel 81B. As illustrated in FIG. 32, the number of wirings and the number of potentials to be supplied can be decreased in the pixel including the subpixel 81R, the subpixel 81G, the subpixel 81B, and the subpixel 82PS. Consequently, a display apparatus including a high-definition display portion having a light detection function can be provided. Furthermore, a display apparatus including a high-resolution display portion having a light detection function can be provided.

Figure 33A:
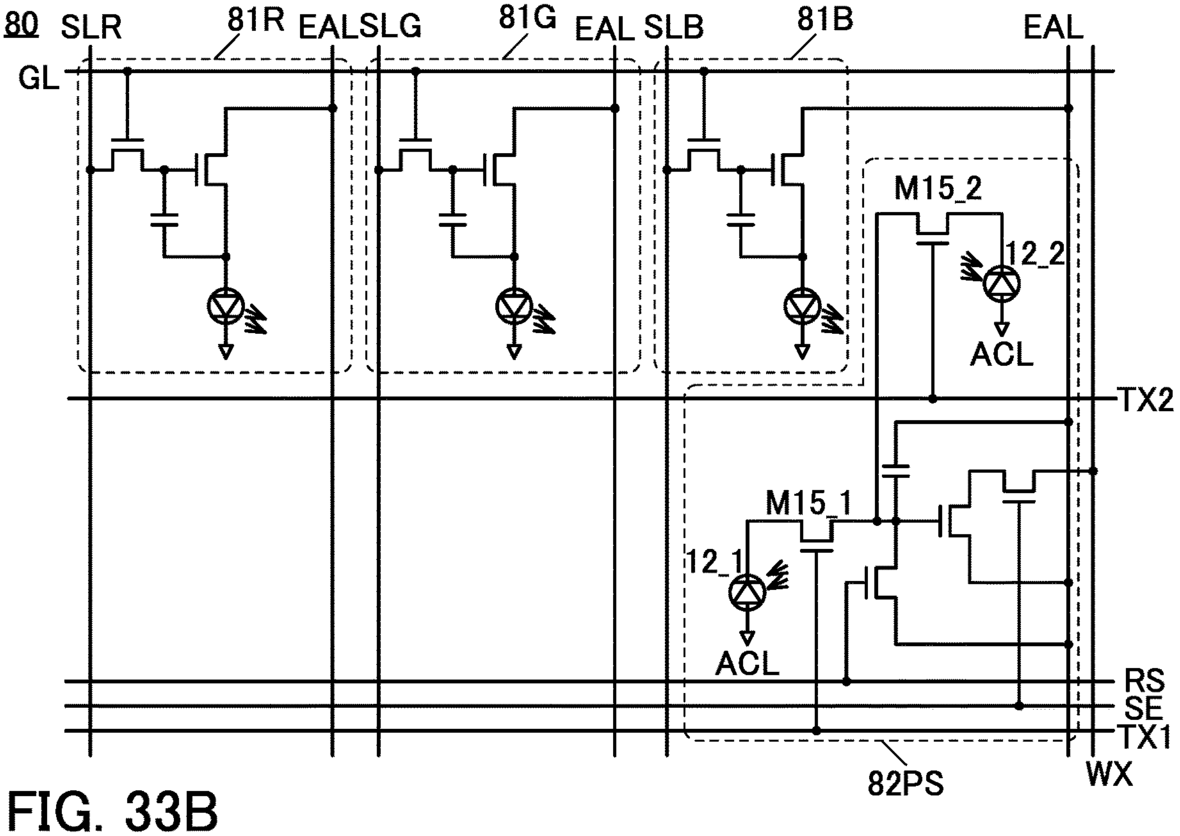
FIG. 33A and FIG. 33B are diagrams illustrating structure examples of a display apparatus.

In the structure in which a plurality of light-receiving devices are included in the pixel 82PS as illustrated in FIG. 17A and FIG. 17B, for example, a light-receiving device can be provided between the wiring EAL connected to the subpixel 81G and the wiring EAL connected to the subpixel 81B as illustrated in FIG. 33A. FIG. 33A illustrates a state where a light-receiving device 12_1 connected to the transistor M15_1 and a light-receiving device 12_2 connected to a transistor M15_2 are provided between the wiring EAL connected to the subpixel 81G and the wiring EAL connected to the subpixel 81B. As illustrated in FIG. 33A, the number of wirings and the number of potentials to be supplied can be decreased in the pixel including the subpixel 81R, the subpixel 81G, the subpixel 81B, and the subpixel 82PS. Consequently, a display apparatus including a high-definition display portion having a light detection function can be provided. Furthermore, a display apparatus including a high-resolution display portion having a light detection function can be provided.

Figure 33B:
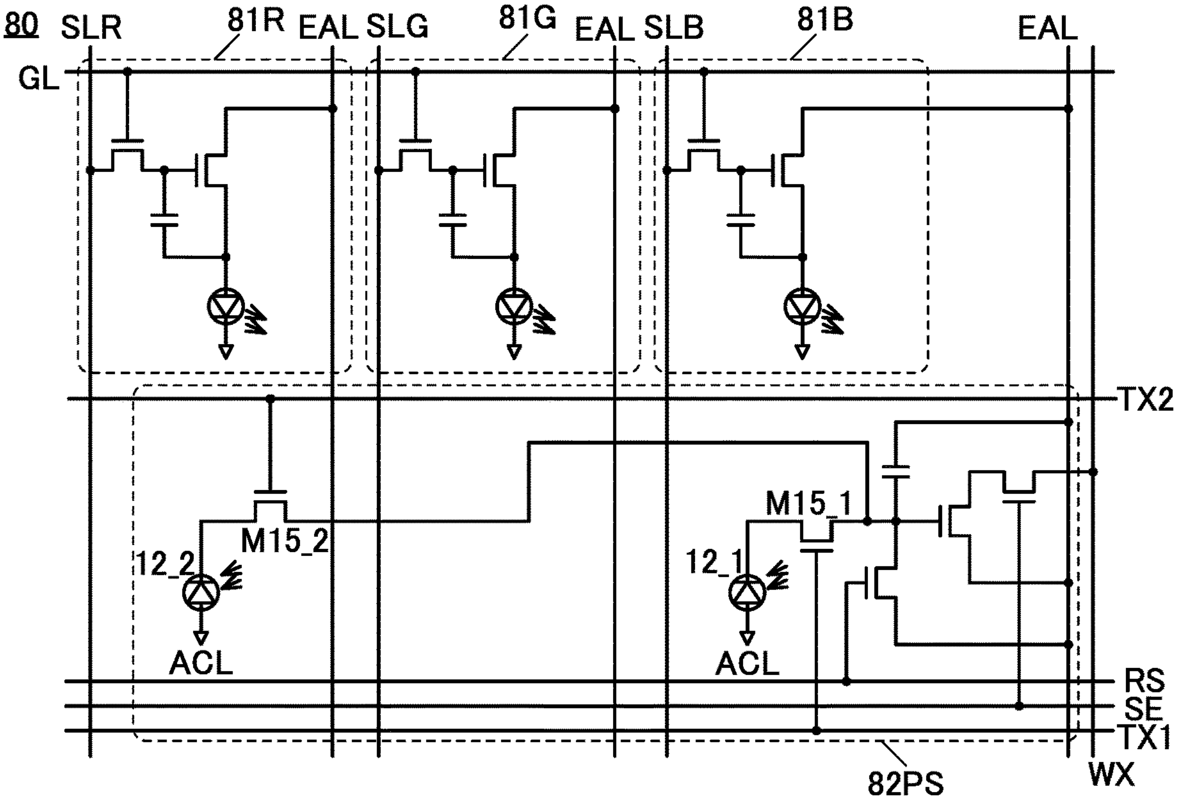

FIG. 33B illustrates a structure different from the above structure in FIG. 33A, in which the light-receiving device 12_1 connected to the transistor M15_1 and the light-receiving device 12_2 connected to the transistor M15_2 are provided across the wiring EAL connected to the subpixel 81G and the wiring EAL connected to the subpixel 81R. As illustrated in FIG. 33B, the number of wirings and the number of potentials to be supplied can be decreased in the pixel including the subpixel 81R, the subpixel 81G, the subpixel 81B, and the subpixel 82PS. Consequently, a display apparatus including a high-definition display portion having a light detection function can be provided. Furthermore, a display apparatus including a high-resolution display portion having a light detection function can be provided.

Figure 34:
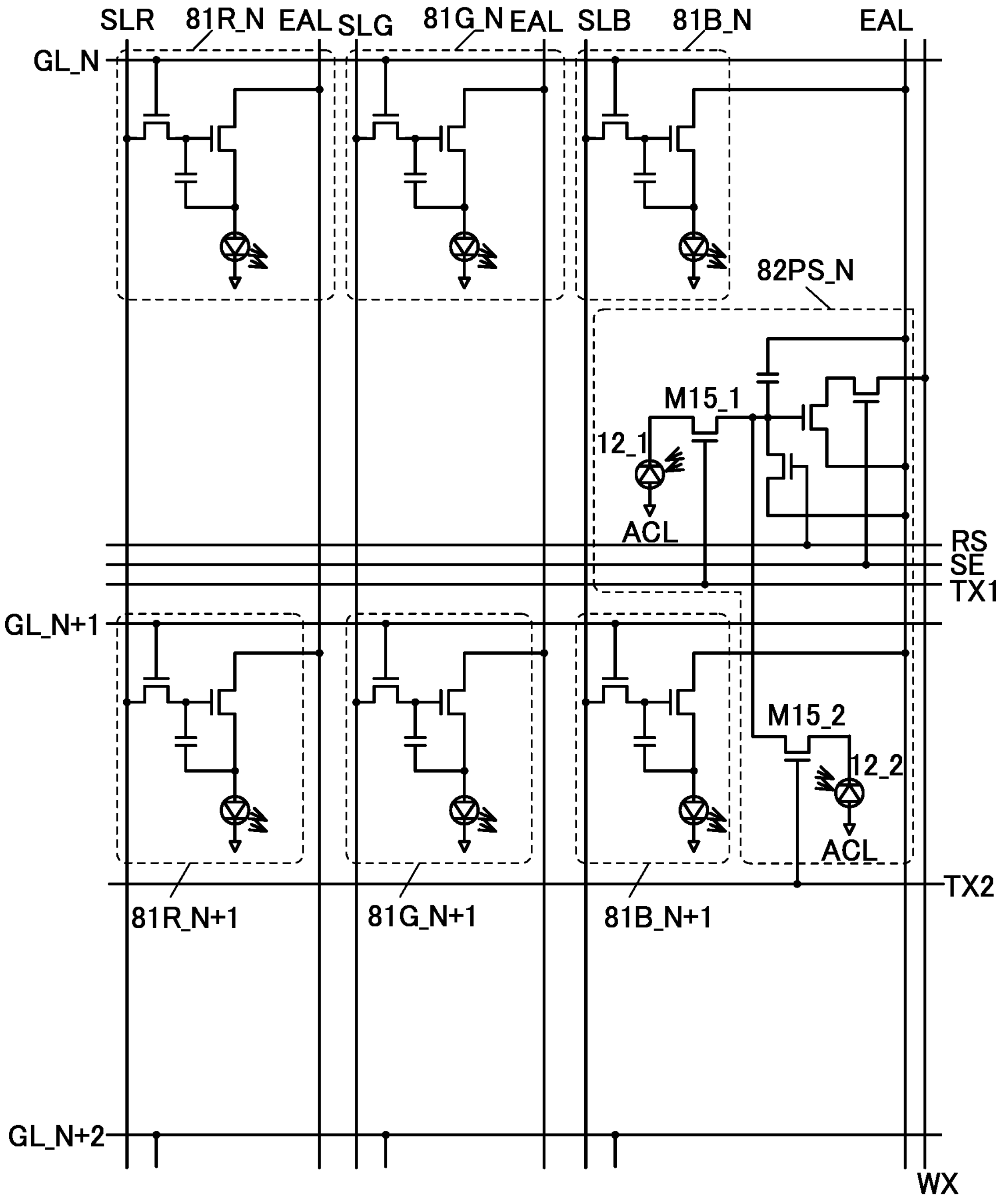
FIG. 34 is a diagram illustrating a structure example of a display apparatus.

In addition, FIG. 34 illustrates a structure different from the above structures illustrated in FIG. 33A and FIG. 33B, in which the light-receiving device 12_1 connected to the transistor M15_1 and the light-receiving device 12_2 connected to the transistor M15_2 are provided so as to spread over different pixel regions. As illustrated in FIG. 34, the light-receiving device 12_2 connected to the transistor M15_2 in a subpixel 82PS_N in a pixel including a subpixel 81R_N, a subpixel 81G_N, a subpixel 81B_N, and the subpixel 82PS_N in an N-th row is provided in a pixel including a subpixel 81R_N+1, a subpixel 81G_N+1, and a subpixel 81B_N+1 in an (N+1)-th row. As illustrated in FIG. 34, the number of wirings and the number of potentials to be supplied can be decreased also in the subpixel 82PS spreading over a plurality of rows. Consequently, a display apparatus including a high-definition display portion having a light detection function can be provided. Furthermore, a display apparatus including a high-resolution display portion having a light detection function can be provided.

Figure 35A:
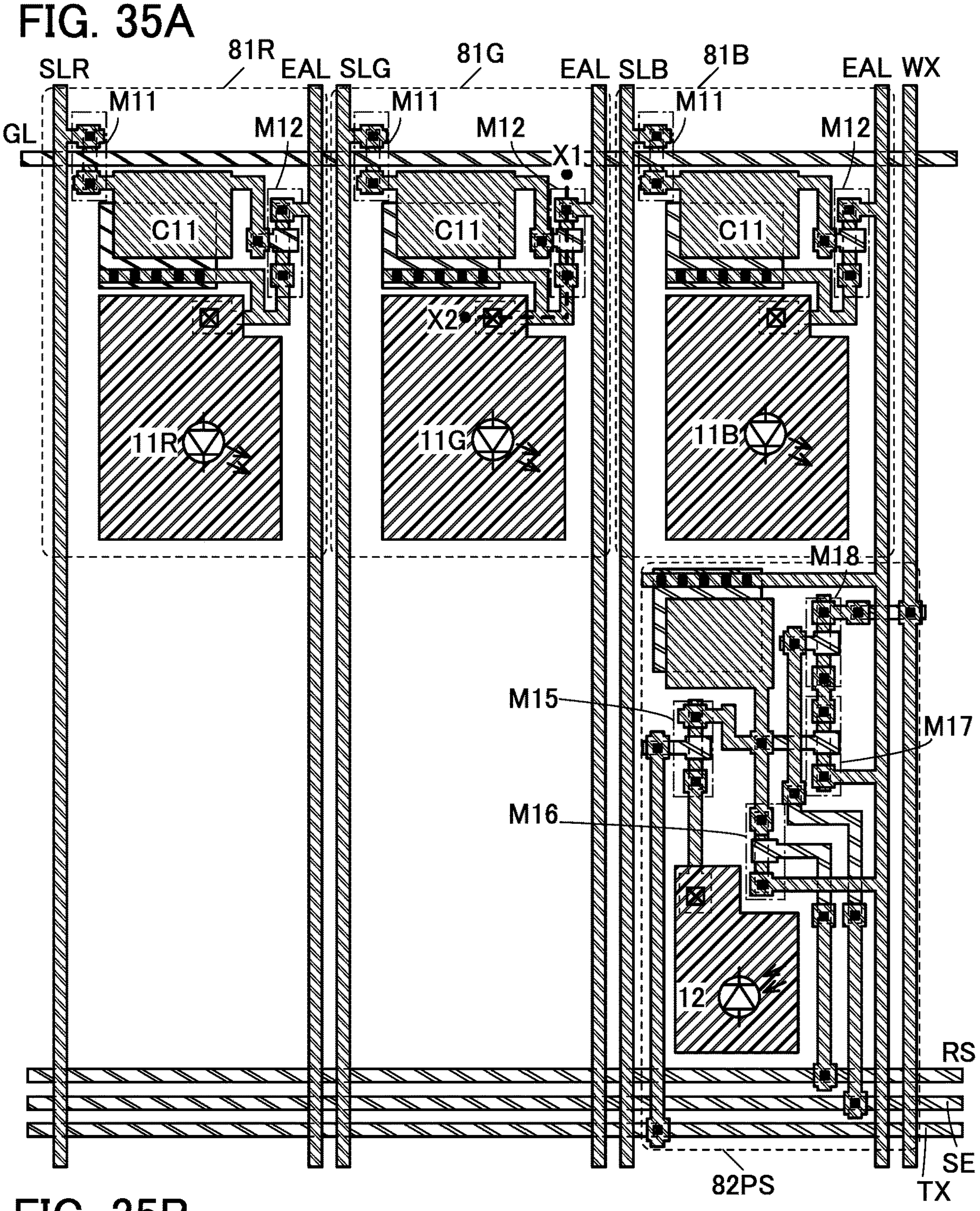
FIG. 35A and FIG. 35B are diagrams illustrating a structure example of a display apparatus.

FIG. 35A illustrates an example of a pixel layout diagram corresponding to the circuit diagram illustrated in FIG. 29. Reference numerals illustrated in FIG. 35A correspond to those illustrated in FIG. 29. Note that FIG. 35A illustrates the layout diagram in which components up to electrodes connected to the light-emitting devices and the light-receiving devices are illustrated but components such as insulating layers and the wiring ACL are omitted for easy understanding. In addition, the shapes, sizes, and the like of the transistors are the same in FIG. 35A for easy understanding; however, the transistors may have different channel widths and channel lengths.

Figure 35B:
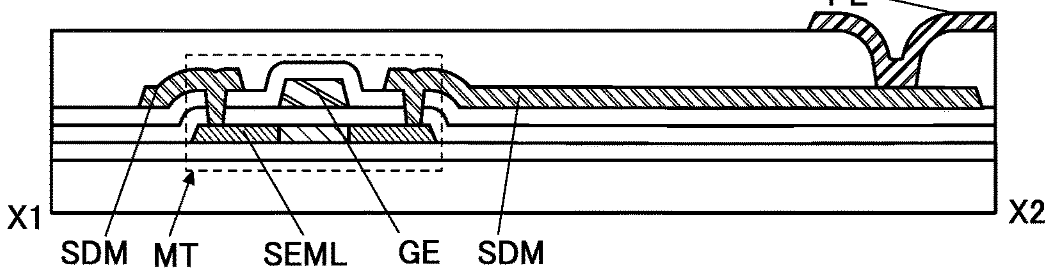

FIG. 35B is a schematic cross-sectional view taken along the dashed line X1-X2 in FIG. 35A. A transistor MT including a semiconductor layer SEML, a conductive layer SDM, and a conductive layer GE and a conductor layer PE connected to the transistor MT illustrated in FIG. 35B are illustrated in the layout diagram illustrated in FIG. 35A. The schematic cross-sectional view of the transistor MT can be applied to the transistors M11 and M12 and the transistors M15 to M18. As illustrated in FIG. 35A and FIG. 35B, the wiring EAL connected to the subpixel 81B in which the light-emitting element 11B is provided can be used as the wiring connected to the transistors M15 to M18; thus, the number of wirings and the potentials to be supplied can be decreased. Consequently, a display apparatus including a high-definition display portion having a light detection function can be provided. Furthermore, a display apparatus including a high-resolution display portion having a light detection function can be provided.

<Example of Driving Method>

Next, an example of a driving method of the above-described pixel will be described. As an example, an example of a driving method of the pixel 813 illustrated in FIG. 36A will be described.

Figure 36A:
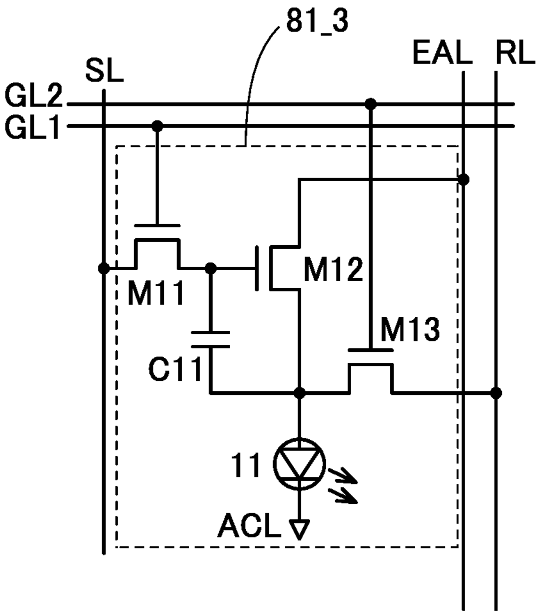
FIG. 36A and FIG. 36B are diagrams illustrating a structure example of a display apparatus.
Figure 36B:
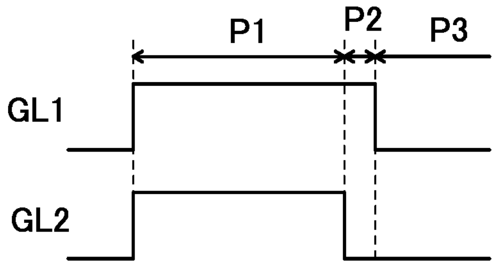

FIG. 36B is a timing chart illustrating the operation in FIG. 36A. In the pixel 81_3 illustrated in FIG. 36A, a variation in luminance due to a variation in transistor characteristics among pixels can be corrected by making signals supplied to the wiring GL1 and the wiring GL2 different from each other as illustrated in FIG. 36B. The operation of the pixel 81_3 in Periods P1 to P3 illustrated in FIG. 36B is described with reference to FIG. 37A to FIG. 37C.

Figure 37A:
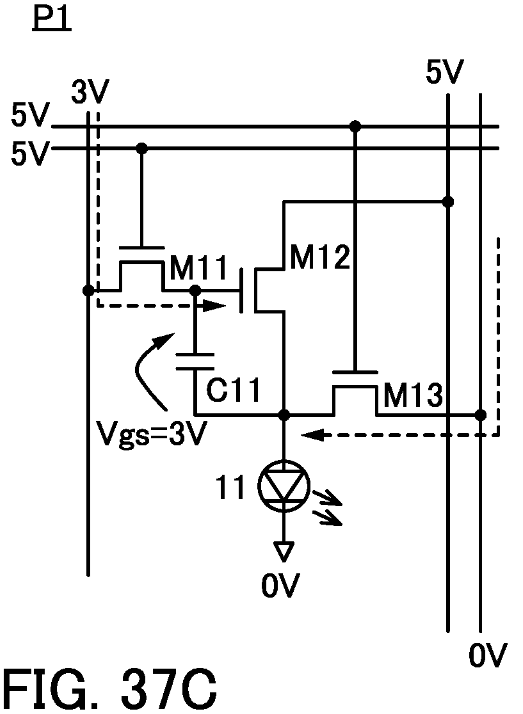
FIG. 37A to FIG. 37C are diagrams illustrating structure examples of a display apparatus.

FIG. 37A illustrates the operation in Period P1 in which signals supplied to the wiring GL1 and the wiring GL2 are both in H level. In FIG. 37A, the H level of the signals supplied to the wiring GL1 and the wiring GL2 are set to 5 V for easy understanding. Similarly, a data potential supplied to the wiring SL, which is to be supplied to the pixel 813, is set to 3 V, a potential supplied to the wiring EAL is set to 5 V, a potential supplied to the wiring ACL is set to 0 V, and a potential supplied to the wiring RL is set to 0 V. At this time, the transistor M11 and the transistor M13 are both in conduction states. In FIG. 37A, actions of potentials of wirings in the pixel 81_3 are illustrated by dotted-line arrows. A voltage of 3 V is applied to both ends of the capacitor C11. The voltage is a voltage between a gate and a source (gate-source voltage: Vgs) of the transistor M12, which is described as Vgs=3 V in FIG. 37A. Note that the signals supplied to the wiring GL1 and the wiring GL2 become H level at the same time in FIG. 36B, but may become H level not necessarily at the same time.

Figure 37B:
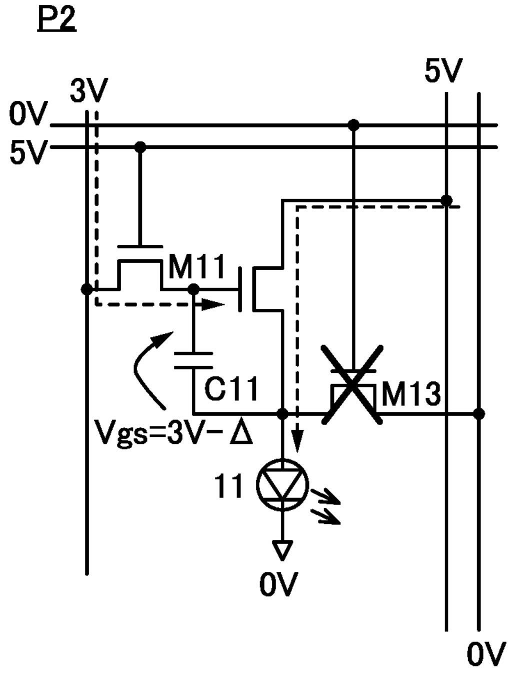

FIG. 37B illustrates the operation of Period P2 in which the signal supplied to the wiring GL1 is set at H level and the signal to be supplied to the wiring GL2 is set at L level. In FIG. 37B, the L level of the signal supplied to the wiring GL2 is set to 0 V for easy understanding. At this time, the transistor M11 is in a conduction state and the transistor M13 is in a non-conduction state. Transistors in non-conduction states are represented by a cross in FIG. 37B. In FIG. 37B, actions of potentials of the wirings in the pixel 813 are illustrated by dotted-line arrows. A current corresponding to Vgs flows to the transistor M12. Thus, the potential on the source side of the transistor M12 is increased, and the voltage held at both the ends of the capacitor C11 is changed from 3 V by A. The amount of change Δ in the voltage is different among pixels due to the field-effect mobility or the like of the transistor M12. That is, by the operation in FIG. 37B, Vgs corresponding to a variation in characteristics of the transistor M12 is held. Note that the length of Period P2 is preferably shorter than the length of Period P1 because too long a period increases the voltage change Δ and decreases the voltage of both the ends of the capacitor C11.

Figure 37C:
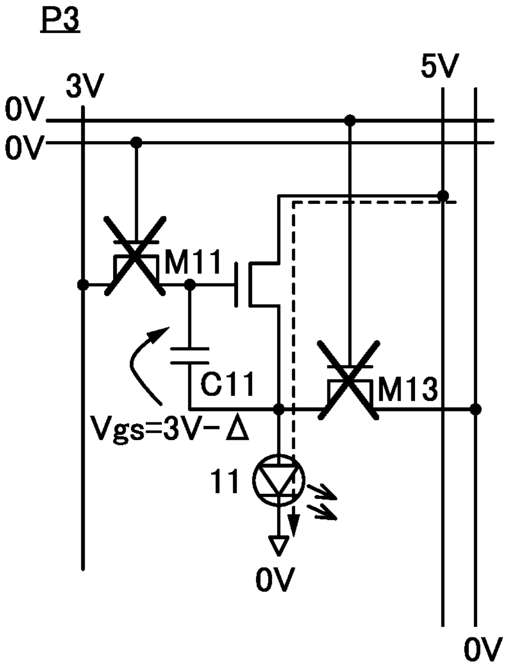

FIG. 37C illustrates the operation in Period P3 in which signals supplied to the wiring GL1 and the wiring GL2 are both set at L level. In FIG. 37C, the L level of each of the signals supplied to the wiring GL1 and the wiring GL2 is set to 0 V for easy understanding. Thus, the transistor M11 and the transistor M13 are in non-conduction states. Transistors in non-conduction states are represented by a cross in FIG. 37C. In FIG. 37C, actions of potentials of wirings in the pixel 813 are illustrated by dotted-line arrows. The transistor M13 can allow current corresponding to a voltage (3 V−Δ), which is the voltage that is held at both the ends of the capacitor C11 and has changed from 3 V by Δ, to flow the light-emitting device 11. With the voltage (3 V−Δ) serving as Vgs, a current in which a variation of characteristics of the transistor M12 is corrected can flow to the light-emitting device 11.

Figure 38A:
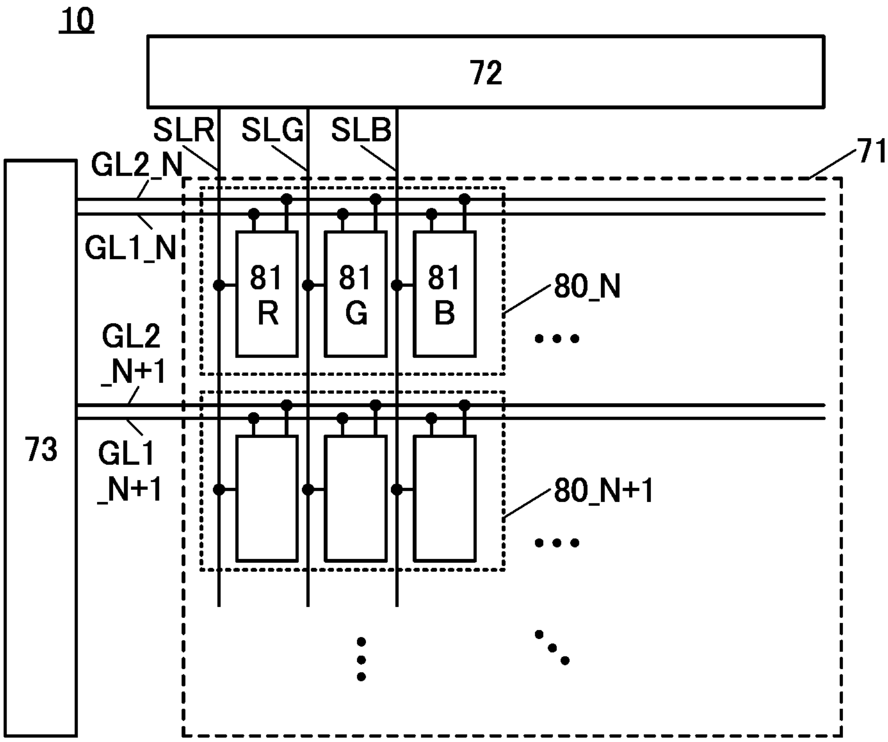
FIG. 38A and FIG. 38B are a block diagram of a display apparatus and a timing chart thereof.
Figure 38B:
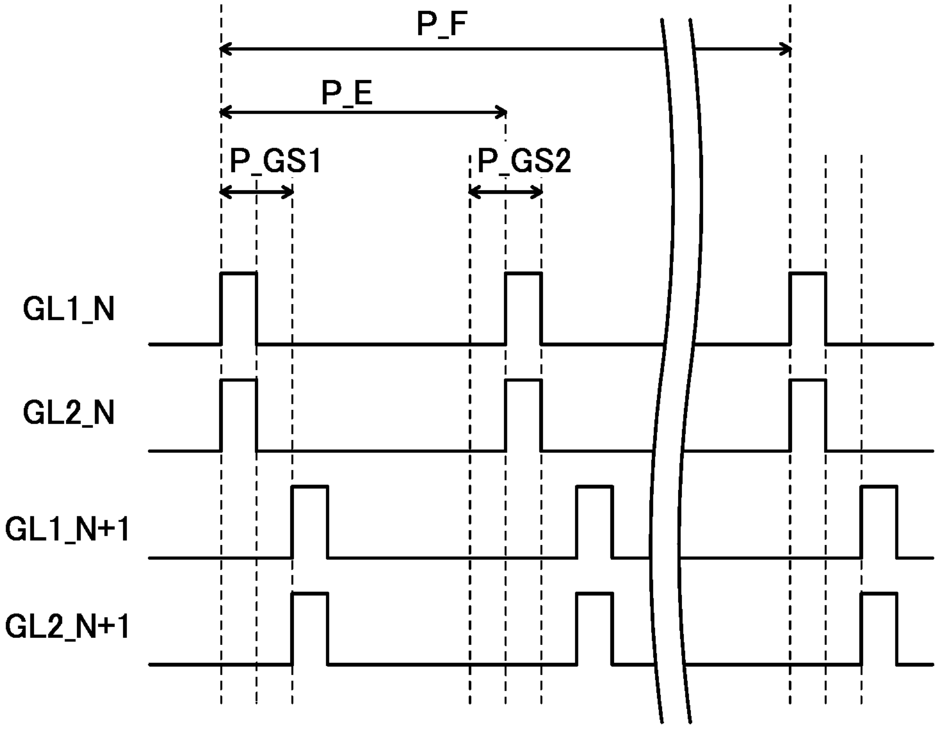

FIG. 38A and FIG. 38B illustrates an example of a driving method in the case of driving the pixel 81_3 illustrated in FIG. 36A in a different row.

FIG. 38A illustrates a block diagram in the case where the pixel 813 is applied to the subpixels 81R, 81G, and 81B in the display apparatus 10. The display apparatus 10 includes the display portion 71, the driver circuit portion 72, the driver circuit portion 73, and the like. The display portion 71 includes a plurality of pixels 80_N and a plurality of pixels 80_N+1 arranged in a matrix. FIG. 38A illustrates the pixel 80_N and the pixel 80_N+1 as pixels in different rows. In FIG. 38A, a wiring GL1_N and a wiring GL2_N are illustrated as the wirings GL1 and GL2 in the row of the pixels 80_N. In FIG. 38A, a wiring GL1_N+1 and a wiring GL2_N+1 are illustrated as the wirings GL1 and GL2 in the row of the pixels 80_N+1.

FIG. 38B is a timing chart for describing signals supplied to the wirings GL1_N and GL2_N and the wirings GL1_N+1 and GL2_N+1 illustrated in FIG. 38A. In FIG. 38B, Period P_F is one frame period and Period P_E is a light-emitting period of the light-emitting device 11. In addition, the periods P_GS1 and P_GS2 are periods in which signals for selecting pixels are supplied to wirings. Although signals to the wirings GL1_N and GL2_N and the wirings GL1_N+1 and GL2_N+1 are changed at the same timing in FIG. 38B, the signals may be changed at different timings as illustrated in FIG. 36B described above.

In a selection period of the pixel in Period P_GS1, a signal for allowing the light-emitting device 11 to emit light to display an image is supplied to the wiring SL. In a selection period of the pixel in Period P_GS2, a signal to turn off the light-emitting device 11 for black display is supplied to the wiring SL. With this structure, a driving method in which a non-lighting period is provided in one frame period (duty driving), instead of constant lighting in one frame period, can be performed. With duty driving, an afterimage phenomenon can be reduced at the time of displaying moving images; therefore, a display apparatus with high performance in displaying moving images can be provided. Particularly in a VR device and the like, a reduction in an afterimage can reduce what is called VR sickness.

In the duty driving, the proportion of the lighting period in one horizontal period can be called a duty ratio. Note that the duty ratio can be set freely and can be adjusted appropriately within a range higher than 0% and lower than or equal to 100%, for example.

Figure 39:
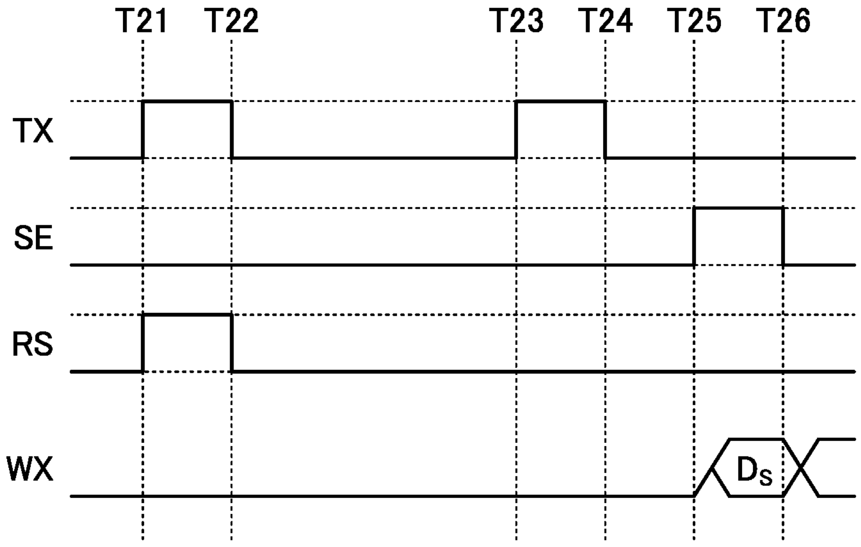
FIG. 39 is a timing chart of a display apparatus.

An example of a driving method of the pixel 82_4 illustrated in FIG. 10B is described with reference to a timing chart shown in FIG. 39. FIG. 39 illustrates signals input to the wiring TX, the wiring SE, the wiring RS, and the wiring WX.

Before Time T21, a low-level potential is supplied to the wiring TX, the wiring SE, and the wiring RS. Data is not output to the wiring WX, and the wiring WX is regarded as being set to a low-level potential here. Note that a predetermined potential may be supplied to the wiring WX.

At Time T21, a potential for bringing a transistor into a conduction state (here, a high-level potential) is supplied to the wiring TX and the wiring RS. In addition, a potential for bringing a transistor into a non-conduction state (here, a low-level potential) is supplied to the wiring SE.

At this time, the transistor M15 and the transistor M16 are brought into conduction states, so that a potential lower than the potential of the cathode of the light-receiving device 12 is supplied to the anode of the light-receiving device 12 from the wiring V11 through the transistor M16 and the transistor M15. That is, a reverse bias voltage is applied to the light-receiving device 12.

The potential of the wiring V11 is also supplied to the first electrode of the capacitor C21, so that charge is stored in the capacitor C21.

Period T21-T22 can also be referred to as a reset (initialization) period.

At Time T22, a low-level potential is supplied to the wiring TX and the wiring RS. Accordingly, the transistor M15 and the transistor M16 are each brought into a non-conduction state.

Since the transistor M15 is in a non-conduction state, the reverse bias voltage is retained in the light-receiving device 12. Here, photoelectric conversion is caused by light incident on the light-receiving device 12, and charge is accumulated in the light-receiving device 12.

Period T22-T23 can also be referred to as a light exposure period. The light exposure period is set in accordance with the sensitivity of the light-receiving device 12, the amount of incident light, or the like and is preferably set to be much longer than at least the reset period.

Since the transistor M15 and the transistor M16 are brought into non-conduction states in Period T22-T23, the potential of the first electrode of the capacitor C21 is retained at a potential supplied from the wiring V11.

At Time T23, a high-level potential is supplied to the wiring TX. Accordingly, the transistor M15 is brought into a conduction state, and the charge accumulated in the light-receiving device 12 is transferred to the first electrode of the capacitor C21 through the transistor M15. Accordingly, the potential of a node to which the first electrode of the capacitor C21 is connected increases in accordance with the amount of the charge accumulated in the light-receiving device 12. Consequently, a potential corresponding to the amount of light to which the light-receiving device 12 is exposed is supplied to the gate of the transistor M17.

At Time T24, a low-level potential is supplied to the wiring TX. Thus, the transistor M15 is brought into a non-conduction state, and the node to which the gate of the transistor M17 is connected is brought into a floating state. Since the light-receiving device 12 is continuously exposed to light, a change in the potential of the node to which the gate of the transistor M17 is connected can be prevented by bringing the transistor M15 into a non-conduction state after the transfer operation in Period T23-T24 is completed.

At Time T25, a high-level potential is supplied to the wiring SE. Accordingly, the transistor M18 is brought into a conduction state. Period T25-T26 can also be referred to as a readout period.

For example, data can be read out when a source follower circuit is formed using the transistor M17 and a transistor included in the circuit portion 75. In this case, a data potential DS output to the wiring WX is determined in accordance with a gate potential of the transistor M17. Specifically, a potential obtained by subtracting the threshold voltage of the transistor M17 from the gate potential of the transistor M17 is output to the wiring WX as the data potential DS, and the potential is read out by the readout circuit included in the circuit portion 75.

Note that a source ground circuit can also be formed using the transistor M17 and the transistor included in the circuit portion 75, in which case data can be read by the readout circuit included in the circuit portion 75.

At Time T26, a low-level potential is supplied to the wiring SE. Accordingly, the transistor M18 is brought into a non-conduction state. Thus, data readout in the pixel 82 is completed. After Time T26, data readout operation is sequentially performed in the subsequent rows.

When the driving method illustrated as an example in FIG. 39 is used, the light exposure period and the readout period can be set independently; therefore, light exposure can be concurrently performed on all the pixels 82 in the display portion 71, and then data can be sequentially read out. Accordingly, what is called global shutter driving can be performed. In the case of performing global shutter driving, a transistor including an oxide semiconductor, which has an extremely low leakage current in a non-conduction state, is preferably used as a transistor functioning as a switch in the pixel 82 (in particular, the transistor M15 and the transistor M16).

The above is the description of the example of a driving method of the pixel 82_4.

As described above, in the display apparatus of one embodiment of the present invention, in a pixel including subpixels in which a forward bias voltage is applied to the light-emitting device, and a reverse bias voltage is applied to a light-receiving device, the wiring EAL and another wiring can have common functions. Accordingly, the number of wirings electrically connected to pixels and the number of potentials to be supplied to the pixels can be decreased. Consequently, the layout area of the pixel can be reduced, so that a display apparatus including a high-definition display portion having a light detection function can be provided. Furthermore, a display apparatus including a high-resolution display portion having a light detection function can be provided.

Embodiment 2

In this embodiment, a display apparatus of one embodiment of the present invention will be described. In particular, structure examples of a light-emitting device and a light-emitting device included in the display apparatus will be described in this embodiment.

Figure 40A:
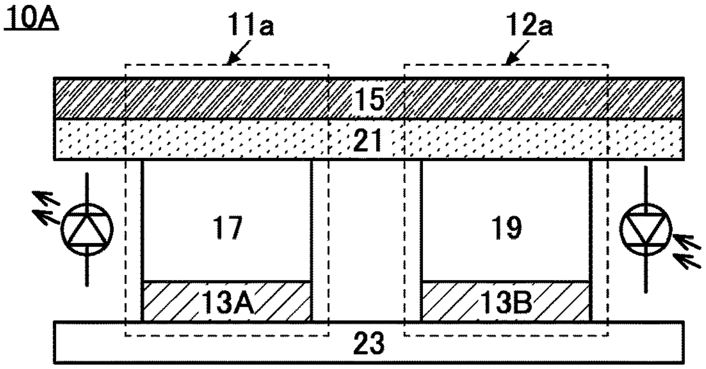
FIG. 40A to FIG. 40D are diagrams illustrating structure examples of display apparatuses.

FIG. 40A illustrates an example different from that of the display apparatus 10 described in Embodiment 1. A display apparatus 10A illustrated in FIG. 40A includes a light-emitting device 11*a* and a light-receiving device 12*a*. The display apparatus 10A is different from the above-described display apparatus 10 mainly in that the light-emitting device 11*a* includes a layer 21 between the EL layer 17 and the electrode 15, and the light-receiving device 12*a* includes the layer 21 between the light-receiving layer 19 and the electrode 15. The layer 21 is a layer shared by the light-emitting device 11*a* and the light-receiving device 12*a*, and can be referred to as a common layer. For example, at least one of a hole-injection layer, a hole-transport layer, an electron-transport layer, and an electron-injection layer is preferably a layer shared by the light-receiving device and the light-emitting device.

In the case where the electrode 13A functions as an anode and the electrode 15 functions as a cathode in the light-emitting device 11*a* and the electrode 13B functions as a cathode and the electrode 15 functions as an anode in the light-receiving device 12*a*, as illustrated in FIG. 40A, the layer 21 includes a layer containing a substance with a high electron-injection property (an electron-injection layer), for example. In the light-emitting device 11*a*, the layer 21 can function as an electron-injection layer that injects electrons from the electrode 15 functioning as the cathode to the EL layer 17.

Note that in the light-receiving device 12*a*, the layer 21 including the layer with a high electron-injection property (the electron-injection layer), for example, does not have a specific function. As described above, the layer 21 is configured to function as the electron-injection layer in the light-emitting device 11*a*.

In some cases, a layer shared by the light-receiving device and the light-emitting device have different functions between the light-emitting device and the light-receiving device. In this specification, the name of a component is based on its function in the light-emitting device in some cases. For example, a hole-injection layer functions as a hole-injection layer in the light-emitting device and functions as a hole-transport layer in the light-receiving device. Similarly, an electron-injection layer functions as an electron-injection layer in the light-emitting device and functions as an electron-transport layer in the light-receiving device. In other cases, a layer shared by the light-receiving device and the light-emitting device have the same function in both the light-emitting device and the light-receiving device. The hole-transport layer functions as a hole-transport layer in both the light-emitting device and the light-receiving device, and the electron-transport layer functions as an electron-transport layer in both the light-emitting device and the light-receiving device.

Figure 40B:
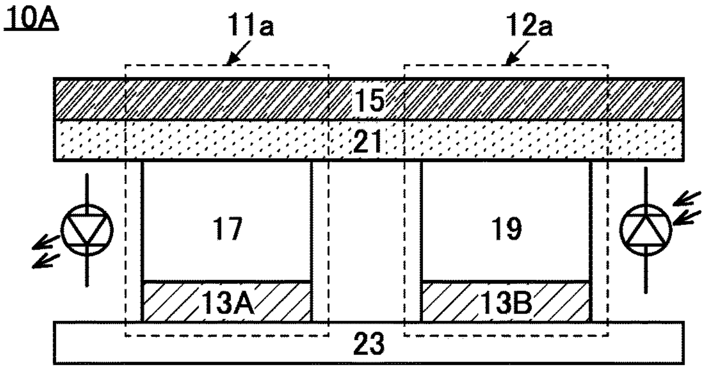

In the case where the electrode 13A functions as the cathode and the electrode 15 functions as the anode in the light-emitting device 11*a* and the electrode 13B functions as the anode and the electrode 15 functions as the cathode in the light-receiving device 12*a*, as illustrated in FIG. 40B, the layer 21 includes a layer containing a substance with a high hole-injection property (a hole-injection layer), for example. In the light-emitting device 11*a*, the layer 21 can function as a hole-injection layer that injects holes from the electrode 15 functioning as the anode to the EL layer 17.

Note that in the light-receiving device 12*a*, the layer 21 including the layer with a high hole-injection property (the hole-injection layer), for example, does not have a specific function. As described above, the layer 21 is configured to function as the hole-injection layer in the light-emitting device 11*a*.

Figure 40C:
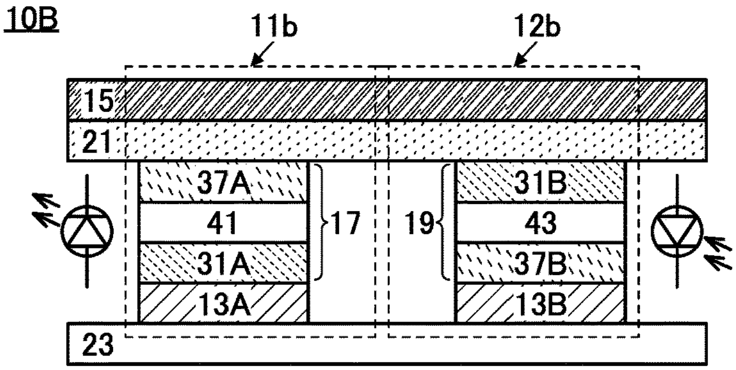

FIG. 40C illustrates a display apparatus of one embodiment of the present invention. A display apparatus 10B illustrated in FIG. 40C includes a light-emitting device 11*b* and a light-receiving device 12*b*. The EL layer 17 included in the light-emitting device 11*b* has a stacked-layer structure where a layer 31A, a light-emitting layer 41, and a layer 37A are stacked in this order. The light-receiving layer 19 included in the light-receiving device 12*b* has a stacked-layer structure where a layer 37B, an active layer 43, and a layer 31B are stacked in this order.

In the light-emitting device 11*b*, the electrode 13A functions as an anode and the electrode 15 functions as a cathode. In the light-receiving device 12*b*, the electrode 13B functions as a cathode and the electrode 15 functions as an anode. The layer 21 includes, for example, a layer containing a substance with a high electron-injection property (an electron-injection layer).

The layer 31A and the layer 31B each include, for example, a layer containing a substance with a high hole-transport property (a hole-transport layer). Furthermore, the layer 31A and the layer 31B may each include a layer containing a substance with a high hole-injection property (a hole-injection layer). Note that in the case where the layer 31A and the layer 31B each contain a substance with a high hole-transport property, the substance with a high hole-transport property contained in the layer 31A and the substance with a high hole-transport property contained in the layer 31B may be the same or different from each other. Similarly, in the case where the layer 31A and the layer 31B each contain a substance with a high hole-injection property, the substance with a high hole-injection property contained in the layer 31A and the substance with a high hole-injection property contained in the layer 31B may be the same or different from each other. In addition, the layer 31A and the layer 31B may each have a stacked-layer structure.

The layer 37A and the layer 37B each include, for example, a layer containing a substance with a high electron-transport property (an electron-transport layer). Furthermore, the layer 37A and the layer 37B may each include a layer containing a substance with a high electron-injection property (an electron-injection layer). In the case where the layer 37A and the layer 37B each contain a substance with a high electron-transport property, the substance with a high electron-transport property contained in the layer 37A and the substance with a high electron-transport property contained in the layer 37B may be the same or different from each other. Similarly, in the case where the layer 37A and the layer 37B each contain a substance with a high electron-injection property, the substance with a high electron-injection property contained in the layer 37A and the substance with a high electron-injection property contained in the layer 37B may be the same or different from each other. In addition, the layer 37A and the layer 37B may each have a stacked-layer structure.

The active layer 43 includes a semiconductor. In particular, the active layer 43 preferably includes an organic semiconductor.

The light-emitting layer 41 contains a light-emitting substance that emits light. In the light-emitting device 11, a structure including the layer 31A, the light-emitting layer 41, and the layer 37A provided between a pair of electrodes (the electrode 13A and the electrode 15) can function as a single light-emitting unit; in this specification and the like, the structure of the light-emitting device 11*b* is referred to as a single structure in some cases.

The light-emitting device 11*b* includes the layer 31A including the layer containing a substance with a high hole-transport property (the hole-transport layer), the light-emitting layer 41, and the layer 37A including the layer containing a substance with a high electron-transport property (the electron-transport layer) in this order from the electrode 13A side. The light-receiving device 12*b* includes the layer 37B including the layer containing a substance with a high electron-transport property (the electron-transport layer), the active layer 43, and the layer 31B including the layer containing a substance with a high hole-transport property (the hole-transport layer) in this order from the electrode 13B side. In the display apparatus of one embodiment of the present invention, the layer containing a substance with a high electron-transport property (the electron-transport layer) and the layer containing a substance with a high hole-transport property (the hole-transport layer), between which the light-emitting layer or the active layer is interposed, are stacked in the opposite order between the light-emitting device and the light-receiving device. With such a structure, side leakage between the light-emitting device and the light-receiving device can be reduced.

Figure 40D:
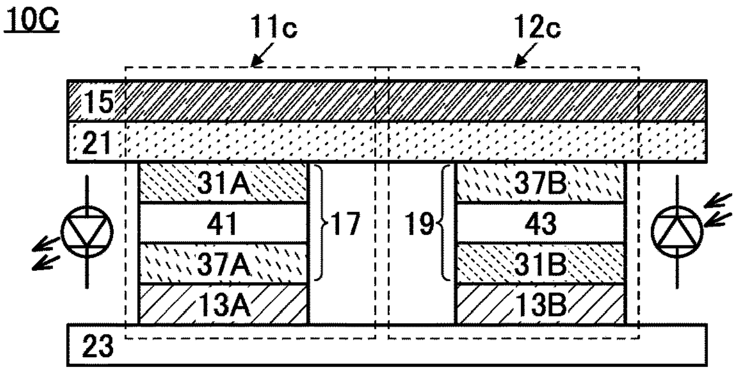

FIG. 40D illustrates a structure different from that of the above-described display apparatus 10B. A display apparatus 10C illustrated in FIG. 40D includes a light-emitting device 11*c* and a light-receiving device 12*c*. The light-emitting device 11*c* is different from the light-emitting device 11*b* mainly in that the stacking order of the layers included in the EL layer 17 is reversed. The light-receiving device 12$c$ is different from the light-receiving device 12$b$ mainly in that the stacking order of the layers included in the light-receiving layer 19 is reversed.

The EL layer 17 included in the light-emitting device 11$c$ has a stacked-layer structure where the layer 37A, the light-emitting layer 41, and the layer 31A are stacked in this order. The light-receiving layer 19 included in the light-receiving device 12$c$ has a stacked-layer structure where the layer 31B, the active layer 43, and the layer 37B are stacked in this order.

In the light-emitting device 11$b$, the electrode 13A functions as the cathode and the electrode 15 functions as the anode. In the light-receiving device 12, the electrode 13B functions as the anode and the electrode 15 functions as the cathode. The layer 21 includes, for example, a layer containing a substance with a high hole-injection property (a hole-injection layer).

A structure different from that of the above-described display apparatus will be described. Described below as an example is a structure where the electrode 13A functions as the anode and the electrode 15 functions as the cathode in the light-emitting device, and the electrode 13B functions as the cathode and the electrode 15 functions as the anode in the light-receiving device.

Figure 41A:
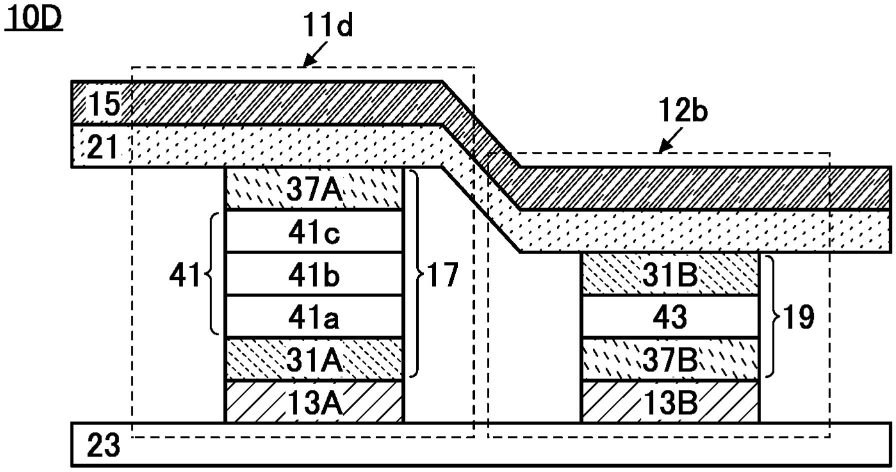
FIG. 41A to FIG. 41C are diagrams illustrating structure examples of display apparatuses.

FIG. 41A illustrates a display apparatus of one embodiment of the present invention. A display apparatus 10D illustrated in FIG. 41A includes a light-emitting device 11$d$ and the light-receiving device 12$b$. The light-emitting layer 41 included in the light-emitting device 11$d$ has a stacked-layer structure where a light-emitting layer 41$a$, a light-emitting layer 41$b$, and a light-emitting layer 41$c$ are stacked in this order. A structure where a plurality of light-emitting layers (e.g., the light-emitting layer 41$a$, the light-emitting layer 41$b$, and the light-emitting layer 41$c$) are provided between the layer 31A and the layer 37A can also be referred to as a single structure.

Figure 41B:
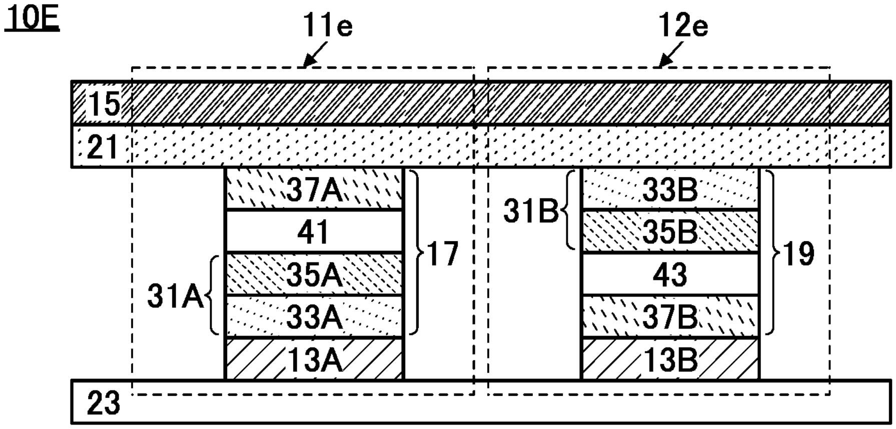

FIG. 41B illustrates a display apparatus of one embodiment of the present invention. A display apparatus 10E illustrated in FIG. 41B includes a light-emitting device 11$e$ and a light-receiving device 12$e$.

The light-emitting device 11$e$ is different from the above-described light-emitting device 11$b$ mainly in that the layer 31A has a stacked-layer structure of a layer 33A and a layer 35A over the layer 33A. The light-receiving device 12$e$ is different from the above-described light-receiving device 12$b$ mainly in that the layer 31B has a stacked-layer structure of a layer 35B and a layer 33B over the layer 35B.

The layer 33A and the layer 33B each include, for example, a layer containing a substance with a high hole-injection property (a hole-injection layer). The substance with a high hole-injection property contained in the layer 33A and the substance with a high hole-injection property contained in the layer 33B may be the same or different from each other.

The layer 35A and the layer 35B each include, for example, a layer containing a substance with a high hole-transport property (a hole-transport layer). The substance with a high hole-transport property contained in the layer 35A and the substance with a high hole-transport property contained in the layer 35B may be the same or different from each other.

With such a layer structure, the light-emitting device 11$e$ can efficiently inject carriers to the light-emitting layer 41, and the efficiency of the recombination of carriers in the light-emitting layer 41 can be enhanced. Note that as described above, the layer 33B functions as a hole-transport layer in the light-receiving device 12$e$.

Figure 41C:
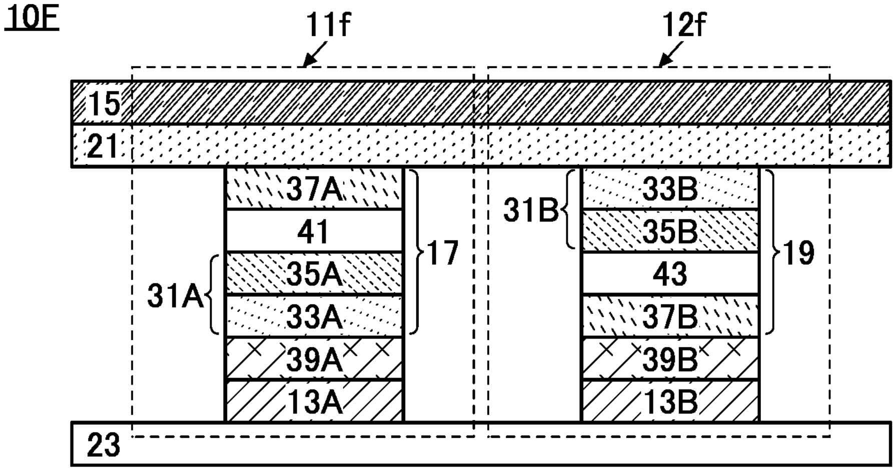

FIG. 41C illustrates a display apparatus of one embodiment of the present invention. A display apparatus 10F illustrated in FIG. 41C includes a light-emitting device 11$f$ and a light-receiving device 12$f$.

The light-emitting device 1 if is different from the above-described light-emitting device 11$e$ mainly in that an optical adjustment layer 39A is included between the electrode 13A and the EL layer 17. The light-receiving device 12$f$ is different from the above-described light-receiving device 12$e$ mainly in that an optical adjustment layer 39B is included between the electrode 13B and the light-receiving layer 19.

The optical adjustment layer 39A and the optical adjustment layer 39B are each preferably formed using a conductive material having a high transmitting property with respect to visible light. It is further preferable that the optical adjustment layer 39A and the optical adjustment layer 39B be each formed using a conductive material having a high transmitting property with respect to visible light and infrared light. For example, the optical adjustment layer 39A and the optical adjustment layer 39B can each be formed using a conductive oxide such as indium oxide, indium tin oxide, indium zinc oxide, zinc oxide, zinc oxide containing gallium, indium tin oxide containing silicon, or indium zinc oxide containing silicon.

Here, a conductive film having a reflecting property with respect to visible light is used for the electrode 13A and the electrode 13B, and a conductive film having a reflecting property and a transmitting property with respect to visible light is used for the electrode 15. Thus, the light-emitting device 11$f$ and the light-receiving device 12$f$ each achieve what is called a microcavity structure. The light-emitting device 1 if intensifies light with a specific wavelength, and thus can be a light-emitting device with high color purity. The light-receiving device 12$f$ intensifies light with a specific wavelength to be detected, and thus can be a light-receiving device with high sensitivity.

Note that by making the thicknesses of the optical adjustment layer 39A included in the light-emitting device 11$f$ and the optical adjustment layer 39B included in the light-receiving device 12$f$ different, the optical path lengths can be different. The optical adjustment layers may be formed using conductive films with different thicknesses, or may have different structures by employing a single-layer structure and a multi-layer structure.

Figure 42:
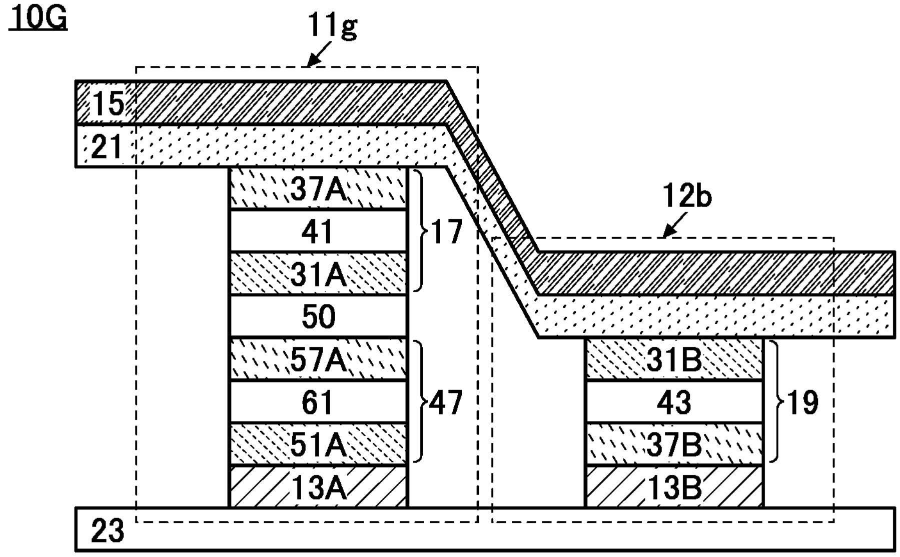
FIG. 42 is a diagram illustrating a structure example of a display apparatus.

FIG. 42 illustrates a display apparatus of one embodiment of the present invention. A display apparatus 10G illustrated in FIG. 42 includes a light-emitting device 11$g$ and the light-receiving device 12$b$.

The light-emitting device 11$g$ has a stacked-layer structure where an EL layer 47, an intermediate layer 50, and the EL layer 17 are stacked in this order, between the electrode 13A and the electrode 15. The EL layer 47 has a stacked-layer structure where a layer 51A, a light-emitting layer 61, and a layer 57A are stacked in this order.

Note that the layer 51A, the light-emitting layer 61, and the layer 57A may each have a stacked-layer structure. Since the description of the layer 31A can be referred to for the layer 51A, the detailed description thereof is omitted. Since the description of the light-emitting layer 41 can be referred to for the light-emitting layer 61, the detailed description thereof is omitted. Since the description of the layer 37A can be referred to for the layer 57A, the detailed description thereof is omitted.

A structure where a plurality of light-emitting units (the EL layer 17 and the EL layer 47) are connected in series with the intermediate layer 50 (also referred to as a charge generation layer) therebetween, as in the light-emitting device 11*g*, is sometimes referred to as a tandem structure in this specification and the like. Note that the tandem structure may be referred to as a stack structure. The tandem structure enables a light-emitting device capable of high-luminance light emission.

The emission color of the light-emitting device can be red, green, blue, cyan, magenta, yellow, white, or the like depending on the material contained in the EL layer 17. Furthermore, the color purity can be further increased when the light-emitting device has a microcavity structure.

The light-emitting device that emits white light preferably contains two or more kinds of light-emitting substances in the light-emitting layer 41. In the case of a structure containing two light-emitting substances, the light-emitting substances are selected such that their emission colors are complementary. For example, when an emission color of a first light-emitting layer and an emission color of a second light-emitting layer are complementary, the light-emitting device can be configured to emit white light as a whole. In the case of a structure containing three or more light-emitting substances, white light emission can be obtained by mixing emission colors. Similarly, the same can apply to the case of a light-emitting device including two or more light-emitting layers. For example, in the light-emitting device 11*d* illustrated in FIG. 41A, the emission colors of the light-emitting layer 41*a*, the light-emitting layer 41*b*, and the light-emitting layer 41*c* are mixed, so that a white-light-emitting device with a single structure can be achieved.

The light-emitting layer preferably contains two or more of light-emitting substances that emit light of red (R), green (G), blue (B), yellow (Y), orange (O), and the like. Alternatively, the light-emitting layer preferably contains two or more light-emitting substances that emit light containing two or more of spectral components of R, G, and B.

Note that there is no particular limitation on the combination of the light-emitting device and the light-receiving device. The display apparatus can include one or more of the above-described light-emitting devices and one or more of the above-described light-receiving devices. For example, the display apparatus may include the light-emitting device 11*e* and the light-receiving device 12*c*.

Figure 43A:
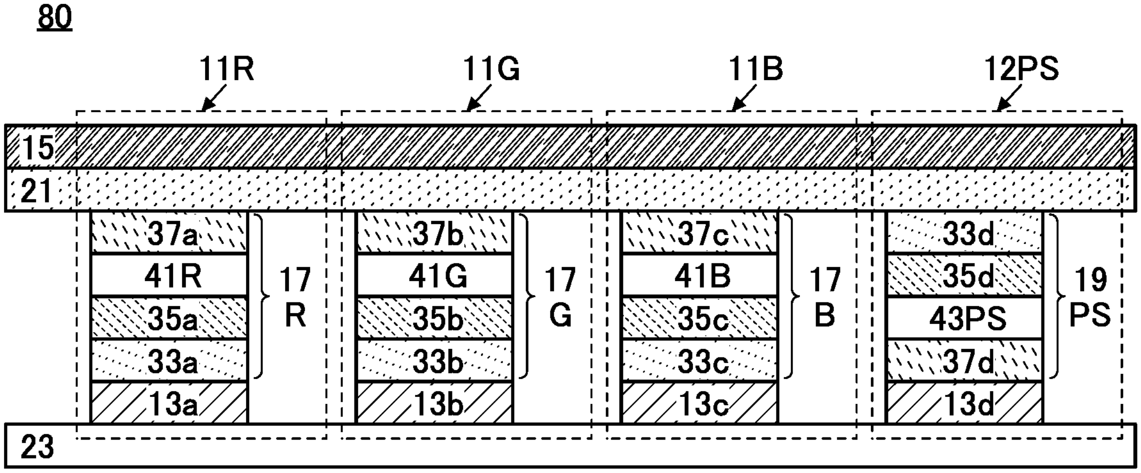
FIG. 43A and FIG. 43B are diagrams illustrating structure examples of a display apparatus.

FIG. 43A illustrates a structure example of a light-emitting device and a light-receiving device in one pixel of a display apparatus. FIG. 43A is a schematic cross-sectional view of a pixel including subpixels of three colors R, G, and B in the pixel 80. The cross-sectional view of the pixel 80 illustrates the light-emitting device 11R, the light-emitting device 11G, the light-emitting device 11B, and the light-receiving device 12PS.

Note that FIG. 43A illustrates an example where the structure of the light-emitting device 11*e* illustrated in FIG. 41B is employed for the light-emitting device 11R, the light-emitting device 11G, and the light-emitting device 11B and the structure of the light-receiving device 12*e* illustrated in FIG. 41B is employed for the light-receiving device 12PS.

The light-emitting device 11R can be used as the light-emitting device included in the subpixel 81R and has a function of emitting red light. The light-emitting device 11R has a stacked-layer structure where an electrode 13*a*, an EL layer 17R, the layer 21, and the electrode 15 are stacked in this order over the substrate 23. The EL layer 17R has a stacked-layer structure where a layer 33*a*, a layer 35*a*, a light-emitting layer 41R, and a layer 37*a* are stacked in this order.

The layer 33*a* includes a layer containing a substance with a high hole-injection property (a hole-injection layer). The layer 35*a* includes a layer containing a substance with a high hole-transport property (a hole-transport layer). The light-emitting layer 41R contains a light-emitting substance that emits red light. The layer 37*a* includes a layer containing a substance with a high electron-transport property (an electron-transport layer). The layer 21 includes a layer containing a substance with a high electron-injection property (an electron-injection layer).

In the light-emitting device 11R, the electrode 13*a* functions as an anode and the electrode 15 functions as a cathode. That is, a potential supplied to the electrode 13*a* is higher than a potential supplied to the electrode 15.

The light-emitting device 11G can be used as the light-emitting device ELG included in the subpixel 81G and has a function of emitting green light. The light-emitting device 11G has a stacked-layer structure where an electrode 13*b*, an EL layer 17G, the layer 21, and the electrode 15 are stacked in this order over the substrate 23. The EL layer 17G has a stacked-layer structure where a layer 33*b*, a layer 35*b*, alight-emitting layer 41G, and a layer 37*b* are stacked in this order.

The layer 33*b* includes a layer containing a substance with a high hole-injection property (a hole-injection layer). The layer 35*b* includes a layer containing a substance with a high hole-transport property (a hole-transport layer). The light-emitting layer 41G contains a light-emitting substance that emits green light. The layer 37*b* includes a layer containing a substance with a high electron-transport property (an electron-transport layer).

In the light-emitting device 11G, the electrode 13*b* functions as an anode and the electrode 15 functions as a cathode. That is, a potential supplied to the electrode 13*b* is higher than a potential supplied to the electrode 15.

The light-emitting device 11B can be used as the light-emitting device ELB included in the subpixel 81B and has a function of emitting blue light. The light-emitting device 11B has a stacked-layer structure where an electrode 13*c*, an EL layer 17B, the layer 21, and the electrode 15 are stacked in this order over the substrate 23. The EL layer 17B has a stacked-layer structure where a layer 33*c*, a layer 35*c*, a light-emitting layer 41B, and a layer 37*c* are stacked in this order.

The layer 33*c* includes a layer containing a substance with a high hole-injection property (a hole-injection layer). The layer 35*c* includes a layer containing a substance with a high hole-transport property (a hole-transport layer). The light-emitting layer 41B contains a light-emitting substance that emits blue light. The layer 37*c* includes a layer containing a substance with a high electron-transport property (an electron-transport layer).

In the light-emitting device 11B, the electrode 13*c* functions as an anode and the electrode 15 functions as a cathode. That is, a potential supplied to the electrode 13*c* is higher than a potential supplied to the electrode 15.

The light-receiving device 12PS can be used as the light-receiving device 12 included in the subpixel 82PS, and has a function of detecting visible light and infrared light. The light-receiving device 12PS has a stacked-layer structure where an electrode 13*d*, a light-receiving layer 19PS, the layer 21, and the electrode 15 are stacked in this order over the substrate 23. The light-receiving layer 19PS has a stacked-layer structure where a layer 37*d*, the active layer 43, a layer 35*d*, and a layer 33*d* are stacked in this order.

The layer 37*d* includes a layer containing a substance with a high electron-transport property (an electron-transport layer). An active layer 43PS includes a semiconductor. In particular, the active layer 43PS preferably includes an organic semiconductor. The layer 35*d* includes a layer containing a substance with a high hole-transport property (a hole-transport layer). The layer 33*d* includes a layer containing a substance with a high hole-injection property (a hole-injection layer). Note that in the light-receiving device 12PS, the layer 33*d* functions as a hole-transport layer.

In the light-receiving device 12PS, the electrode 13*d* functions as a cathode and the electrode 15 functions as an anode. That is, a potential supplied to the electrode 13*d* is higher than a potential supplied to the electrode 15. In the light-receiving device 12PS, a reverse bias is applied between the electrode 13*d* and the electrode 15.

The electrode 13*a*, the electrode 13*b*, the electrode 13*c*, and the electrode 13*d* are provided over the substrate 23. The electrode 13*a*, the electrode 13*b*, the electrode 13*c*, and the electrode 13*d* can be formed by processing a conductive film formed over the substrate 23 into island-like shapes, for example. The electrode 13*a*, the electrode 13*b*, the electrode 13*c*, and the electrode 13*d* each function as a pixel electrode. Since the above description of the electrode 13A and the electrode 13B can be referred to for the electrode 13*a*, the electrode 13*b*, the electrode 13*c*, and the electrode 13*d*, the detailed description thereof is omitted. The electrode 15 functions as a common electrode. Since the above description can be referred to for the electrode 15, the detailed description thereof is omitted.

Since the above description of the layer 33A and the layer 33B can be referred to for the layer 33*a*, the layer 33*b*, the layer 33*c*, and the layer 33*d*, the detailed description thereof is omitted. Since the above description of the layer 35A and the layer 35B can be referred to for the layer 35*a*, the layer 35*b*, the layer 35*c*, and the layer 35*d*, the detailed description thereof is omitted. Since the above description of the layer 37A and the layer 37B can be referred to for the layer 37*a*, the layer 37*b*, the layer 37*c*, and the layer 37*d*, the detailed description thereof is omitted. Since the above description can be referred to for the layer 21 that is a common layer, the detailed description thereof is omitted.

Figure 43B:
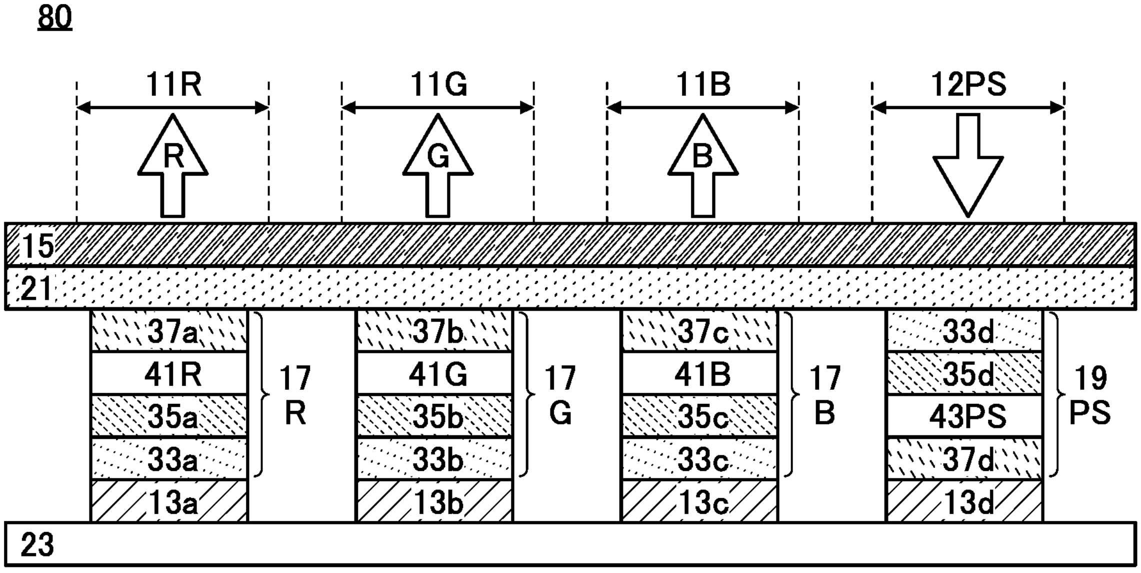

In FIG. 43B, red (R) light emitted from the light-emitting device 11R, green (G) light emitted from the light-emitting device 11G, blue (B) light emitted from the light-emitting device 11B, and light incident on the light-receiving device 12PS are schematically indicated by arrows.

Figure 44A:
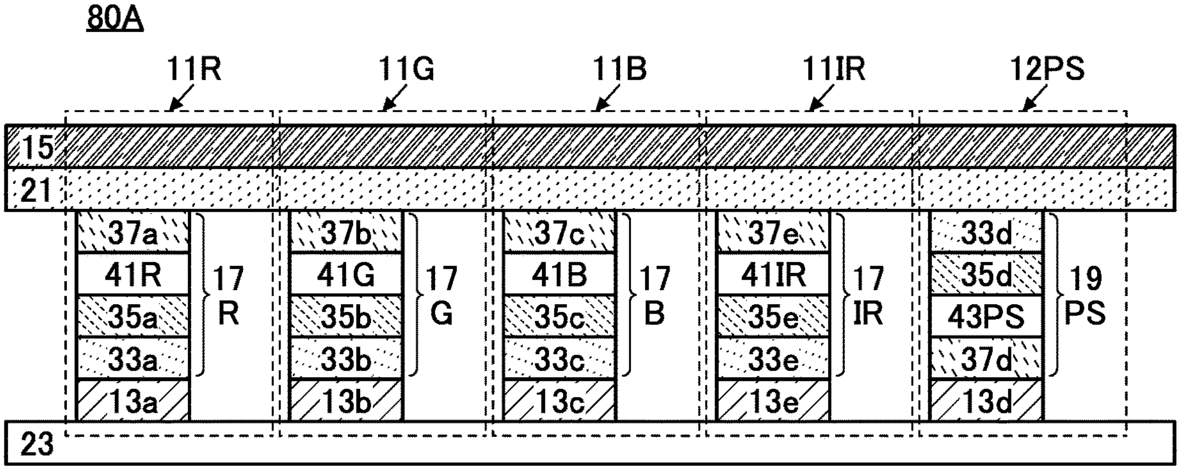
FIG. 44A and FIG. 44B are diagrams illustrating structure examples of a display apparatus.

FIG. 44A illustrates a structure example different from that of the above-described pixel 80. A pixel 80A illustrated in FIG. 44A includes the light-emitting device 11R, the light-emitting device 11G, the light-emitting device 11B, a light-emitting device 11IR, and the light-receiving device 12PS. FIG. 44A is a schematic cross-sectional view illustrating the structures of the light-emitting device 11R, the light-emitting device 11G, the light-emitting device 11B, the light-emitting device 11IR, and the light-receiving device 12PS. The pixel 80A is different from the pixel 80 illustrated in FIG. 43A and the like mainly in including the light-emitting device 11IR.

The light-emitting device 11IR has a function of emitting infrared light. The light-emitting device 11IR has a stacked-layer structure where an electrode 13*e*, an EL layer 171R, the layer 21, and the electrode 15 are stacked in this order over the substrate 23. The EL layer 17IR has a stacked-layer structure where a layer 33*e*, a layer 35*e*, a light-emitting layer 41IR, and a layer 37*e* are stacked in this order.

The layer 33*e* includes a layer containing a substance with a high hole-injection property (a hole-injection layer). The layer 35*e* includes a layer containing a substance with a high hole-transport property (a hole-transport layer). The light-emitting layer 41IR contains a light-emitting substance that emits light in an infrared wavelength range. The layer 37*e* includes a layer containing a substance with a high electron-transport property (an electron-transport layer).

In the light-emitting device 11IR, the electrode 13*e* functions as an anode and the electrode 15 functions as a cathode. That is, a potential supplied to the electrode 13*e* is higher than a potential supplied to the electrode 15.

The electrode 13*e* is provided over the substrate 23. The electrode 13*e* can be formed in the same step as the electrode 13*a*, the electrode 13*b*, the electrode 13*c*, and the electrode 13*d*. The electrode 13*e* functions as a pixel electrode. Since the above description of the electrode 13A and the electrode 13B can be referred to for the electrode 13*e*, the detailed description thereof is omitted.

Since the above description of the layer 33A and the layer 33B can be referred to for the layer 33*e*, the detailed description thereof is omitted. Since the above description of the layer 35A and the layer 35B can be referred to for the layer 35*e*, the detailed description thereof is omitted. Since the above description of the layer 37A and the layer 37B can be referred to for the layer 37*e*, the detailed description thereof is omitted.

Figure 44B:
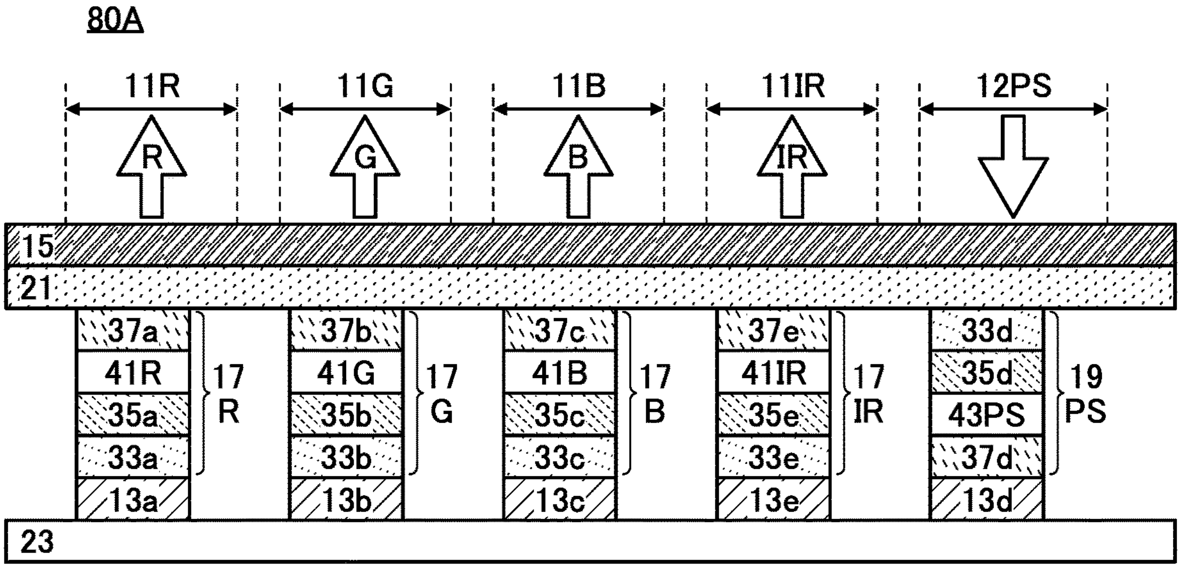

In FIG. 44B, red (R) light emitted from the light-emitting device 11R, green (G) light emitted from the light-emitting device 11G, blue (B) light emitted from the light-emitting device 11B, infrared (IR) light emitted from the light-emitting device 11IR, and light incident on the light-receiving device 12PS are schematically indicated by arrows.

Figure 45A:
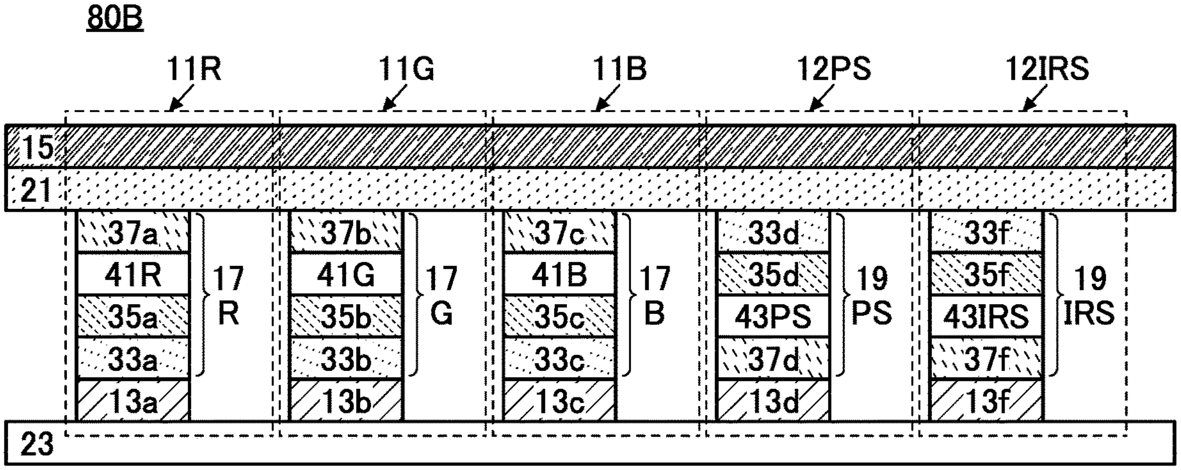
FIG. 45A and FIG. 45B are diagrams illustrating structure examples of a display apparatus.

FIG. 45A illustrates a structure example different from that of the above-described pixel 80. A pixel 80B illustrated in FIG. 45A includes the light-emitting device 11R, the light-emitting device 11G, the light-emitting device 11B, the light-receiving device 12PS, and a light-receiving device 12IRS. FIG. 45A is a schematic cross-sectional view illustrating the structures of the light-emitting device 11R, the light-emitting device 11G, the light-emitting device 11B, the light-receiving device 12PS, and the light-receiving device 12IRS. The pixel 80B is different from the pixel 80 illustrated in FIG. 43A and the like mainly in the structure of the light-receiving device.

The light-receiving device 12PS included in the pixel 80 has a function of receiving visible light, and the light-receiving device 12IRS has a function of receiving infrared light.

The light-receiving device 12IRS has a stacked-layer structure where an electrode 13*f*, a light-receiving layer 19IRS, the layer 21, and the electrode 15 are stacked in this order over the substrate 23. The light-receiving layer 19IRS has a stacked-layer structure where a layer 37*f*, an active layer 43IRS, a layer 35*f*, and a layer 33*f* are stacked in this order.

The layer 37*f* includes a layer containing a substance with a high electron-transport property (an electron-transport layer). The active layer 43IRS includes a semiconductor. In particular, the active layer 43IRS preferably includes an organic semiconductor. The layer 35*f* includes a layer containing a substance with a high hole-transport property (a hole-transport layer). The layer 33*f* includes a layer containing a substance with a high hole-injection property (a hole-injection layer). Note that in the light-receiving device 12IRS, the layer 33*f* functions as a hole-transport layer.

In the light-receiving device 12IRS, the electrode 13*f* functions as a cathode and the electrode 15 functions as an anode. That is, a potential supplied to the electrode 13*f* is higher than a potential supplied to the electrode 15.

The electrode 13*f* is provided over the substrate 23. The electrode 13*f* can be formed in the same step as the electrode 13*a*, the electrode 13*b*, the electrode 13*c*, the electrode 13*d*, and the electrode 13*e*. The electrode 13*e* functions as a pixel electrode. Since the above description of the electrode 13A and the electrode 13B can be referred to for the electrode 13*f*, the detailed description thereof is omitted.

Since the above description of the layer 33A and the layer 33B can be referred to for the layer 33*f*, the detailed description thereof is omitted. Since the above description of the layer 35A and the layer 35B can be referred to for the layer 35*f*, the detailed description thereof is omitted. Since the above description of the layer 37A and the layer 37B can be referred to for the layer 37*f*, the detailed description thereof is omitted.

Figure 45B:
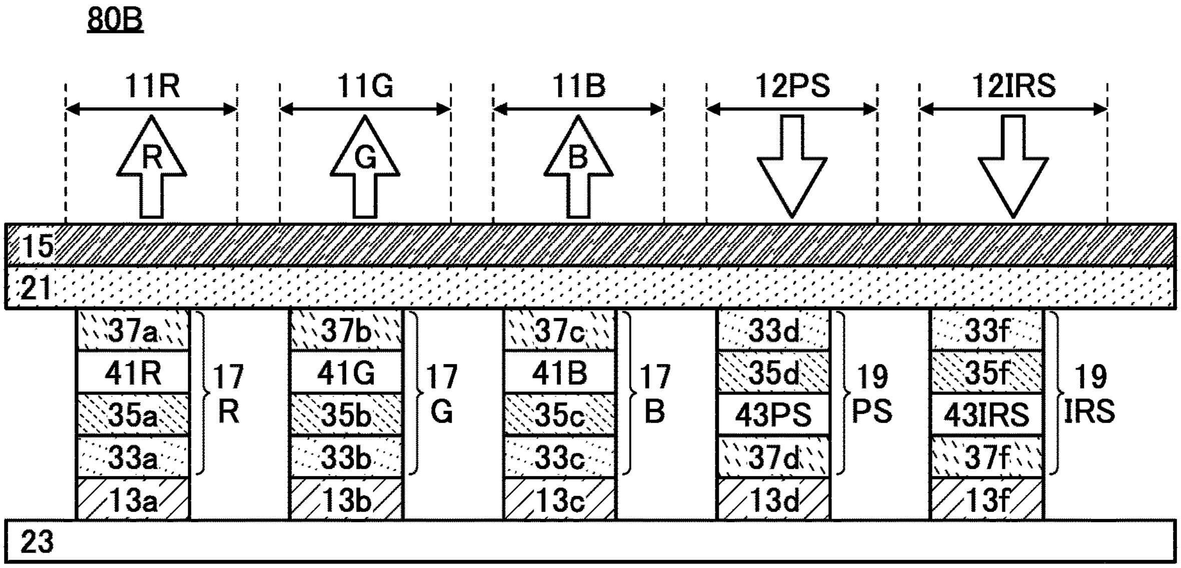

In FIG. 45B, red (R) light emitted from the light-emitting device 11R, green (G) light emitted from the light-emitting device 11G, blue (B) light emitted from the light-emitting device 11B, light incident on the light-receiving device 12PS, and light incident on the light-receiving device 12IRS are schematically indicated by arrows.

Figure 46A:
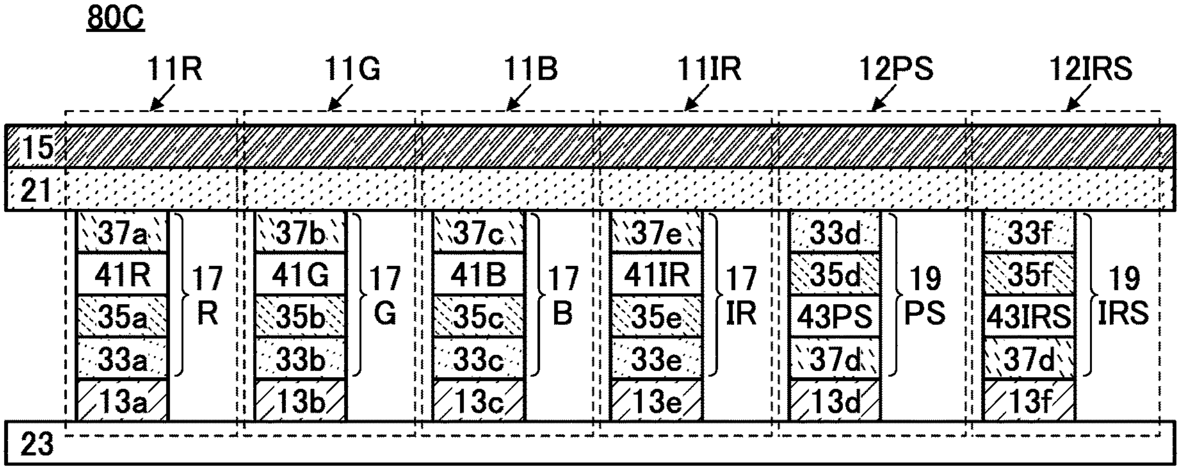
FIG. 46A and FIG. 46B are diagrams illustrating structure examples of a display apparatus.

FIG. 46A illustrates a structure example different from that of the above-described pixel 80B. The pixel 80C illustrated in FIG. 46A includes the light-emitting device 11R, the light-emitting device 11G, the light-emitting device 11B, the light-emitting device 11IR, the light-receiving device 12PS, and the light-receiving device 12IRS. FIG. 46A is a schematic cross-sectional view illustrating the structures of the light-emitting device 11R, the light-emitting device 11G, the light-emitting device 11B, the light-emitting device 11IR, the light-receiving device 12PS, and the light-receiving device 12IRS. A pixel 80C is different from the pixel 80B illustrated in FIG. 45A and the like mainly in including the light-emitting device 11IR.

Figure 46B:
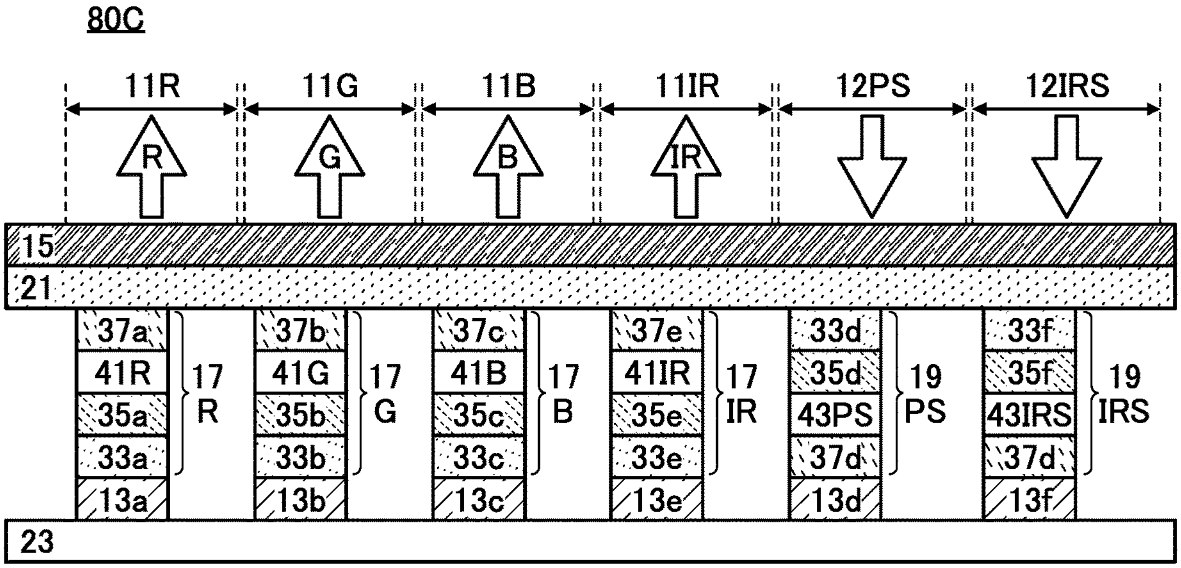

In FIG. 46B, red (R) light emitted from the light-emitting device 11R, green (G) light emitted from the light-emitting device 11G, blue (B) light emitted from the light-emitting device 11B, infrared (IR) light emitted from the light-emitting device 11IR, light incident on the light-receiving device 12PS, and light incident on the light-receiving device 12IRS are schematically indicated by arrows.

This embodiment can be combined with the other embodiments as appropriate. In the case where a plurality of structure examples are described in one embodiment in this specification, the structure examples can be combined as appropriate.

Embodiment 3

In this embodiment, a usage mode and the like of a display apparatus including any of the light-emitting devices and any of the light-receiving devices described in the above embodiments will be described.

Figure 47A:
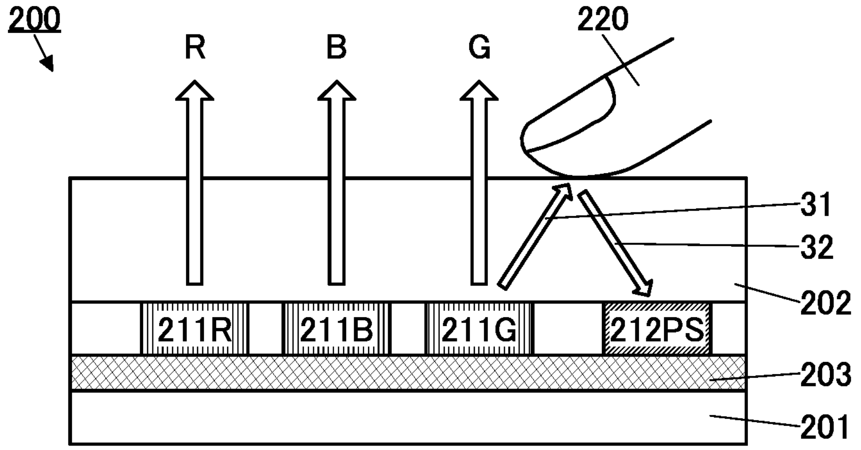
FIG. 47A, FIG. 47B, and FIG. 47D are cross-sectional views illustrating an example of a display apparatus.

FIG. 47A shows a schematic view illustrating a display apparatus of one embodiment of the present invention. A display apparatus 200 illustrated in FIG. 47A includes a substrate 201, a substrate 202, alight-emitting device 211R, alight-emitting device 211G, alight-emitting device 211B, a light-receiving device 212PS, a functional layer 203, and the like.

The light-emitting device 211R, the light-emitting device 211G, the light-emitting device 211B, and the light-receiving device 212PS are provided between the substrate 201 and the substrate 202. The light-emitting device 211R, the light-emitting device 211G, and the light-emitting device 211B emit red (R) light, green (G) light, and blue (B) light, respectively. Any of the above-described light-emitting devices can be used as the light-emitting device 211R, the light-emitting device 211G, and the light-emitting device 211B. Any of the light-receiving devices can be used as the light-receiving device 212PS. Note that in the following description, the term "light-emitting device 211" is sometimes used when the light-emitting device 211R, the light-emitting device 211G, and the light-emitting device 211B are not particularly distinguished from each other.

FIG. 47A illustrates a state where a finger 220 is in contact with a surface of the substrate 202. Part of light emitted by the light-emitting device (e.g., the light-emitting device 211G) is reflected by a contact portion between the substrate 202 and the finger 220. In the case where part of the reflected light is incident on the light-receiving device 212PS, the contact of the finger 220 with the substrate 202 can be detected. That is, the display apparatus 200 can function as a touch panel.

The functional layer 203 includes a circuit for driving the light-emitting device 211R, the light-emitting device 211G, and the light-emitting device 211B and a circuit for driving the light-receiving device 212PS. The functional layer 203 is provided with a switch, a transistor, a capacitor, a wiring, and the like. Note that in the case where the light-emitting device 211R, the light-emitting device 211G, the light-emitting device 2111B, and the light-receiving device 212PS are driven by a passive matrix method, the switch and the transistor are not necessarily provided.

Figure 47B:
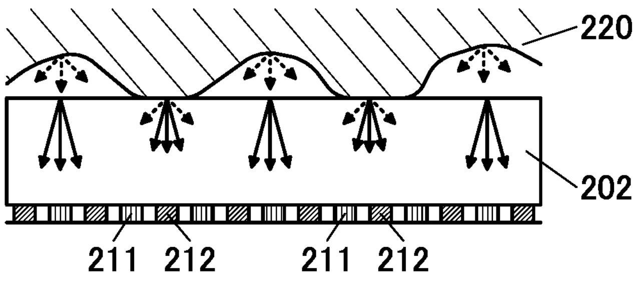

The display apparatus 200 can detect a fingerprint of the finger 220, for example. FIG. 47B schematically shows an enlarged view of the contact portion between the substrate 202 and the finger 220. FIG. 47B illustrates the light-emitting devices 211 and the light-receiving devices 212 that are alternately arranged.

The fingerprint of the finger 220 is formed of depressions and projections. Accordingly, as illustrated in FIG. 47B, the projections of the fingerprint touch the substrate 202.

Reflection of light from a surface or an interface is categorized into regular reflection and diffuse reflection. Regularly reflected light is highly directional light with an angle of reflection equal to the angle of incidence. Diffusely reflected light has low directionality and low angular dependence of intensity. As for regular reflection and diffuse reflection, diffuse reflection components are dominant in the light reflected from the surface of the finger 220. Meanwhile, regular reflection components are dominant in the light reflected from the interface between the substrate 202 and the air.

The intensity of light that is reflected from contact surfaces or non-contact surfaces between the finger 220 and the substrate 202 and is incident on the light-receiving devices 212 positioned directly below the contact surfaces or the non-contact surfaces is the sum of intensities of regularly reflected light and diffusely reflected light. As described above, regularly reflected light (indicated by solid arrows) is dominant near the depressions of the finger 220, where the finger 220 is not in contact with the substrate 202; whereas diffusely reflected light (indicated by dashed arrows) from the finger 220 is dominant near the projections of the finger 220, where the finger 220 is in contact with the substrate 202. Thus, the intensity of light received by the light-receiving device 212 positioned directly below the depression is higher than the intensity of light received by the light-receiving device 212 positioned directly below the projection. Accordingly, a fingerprint image of the finger 220 can be captured.

In the case where an arrangement interval between the light-receiving devices 212 is smaller than a distance between two projections of a fingerprint, preferably a distance between a depression and a projection adjacent to each other, a clear fingerprint image can be obtained. The distance between a depression and a projection of a human's fingerprint is approximately 200 μm; thus, the arrangement interval between the light-receiving devices 212 is, for example, less than or equal to 400 μm, preferably less than or equal to 200 μm, further preferably less than or equal to 150 μm, still further preferably less than or equal to 100 μm, yet still further preferably less than or equal to 50 μm and greater than or equal to 1 μm, preferably greater than or equal to 10 μm, further preferably greater than or equal to 20 μm.

Figure 47C:
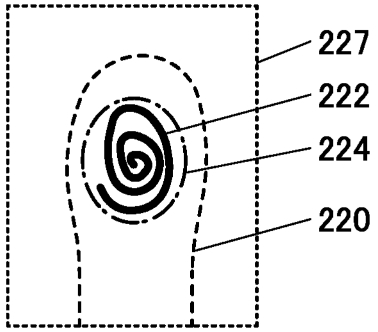
FIG. 47C and FIG. 47E are diagrams each illustrating an example of an image captured by the display apparatus.

FIG. 47C illustrates an example of a fingerprint image captured by the display apparatus 200. In FIG. 47C, in an imaging range 227, the outline of the finger 220 is indicated by a dashed line and the outline of a contact portion 224 is indicated by a dashed-dotted line. In the contact portion 224, a high-contrast image of a fingerprint 222 can be captured owing to a difference in the amount of light incident on the light-receiving devices 212.

Figure 47D:
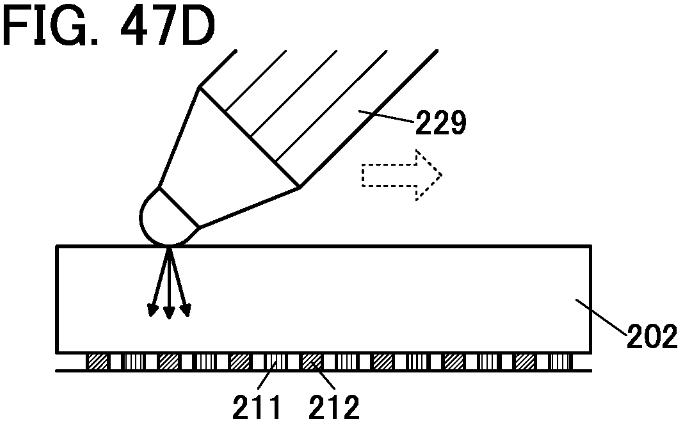

The display apparatus 200 can also function as a touch panel or a pen tablet. FIG. 47D illustrates a state where a tip of a stylus 229 slides in a direction indicated by a dashed arrow while the tip of the stylus 229 is in contact with the substrate 202.

As illustrated in FIG. 47D, when diffusely reflected light that is diffused at the contact surface between the tip of the stylus 229 and the substrate 202 is incident on the light-receiving device 212 positioned in a portion overlapping with the contact surface, the position of the tip of the stylus 229 can be detected with high accuracy.

Figure 47E:
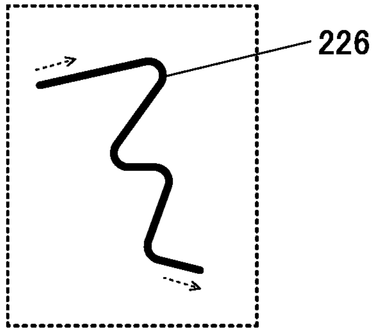

FIG. 47E illustrates an example of a path 226 of the stylus 229 that is detected by the display apparatus 200. The display apparatus 200 can detect the position of an object to be detected, such as the stylus 229, with high position accuracy, so that high-resolution drawing can be performed using a drawing application or the like. Unlike the case of using a capacitive touch sensor, an electromagnetic induction touch pen, or the like, the display apparatus 200 can detect even the position of a highly insulating object to be detected, the material of a tip portion of the stylus 229 is not limited, and a variety of writing materials (e.g., a brush, a glass pen, and a quill pen) can be used.

Figure 48:
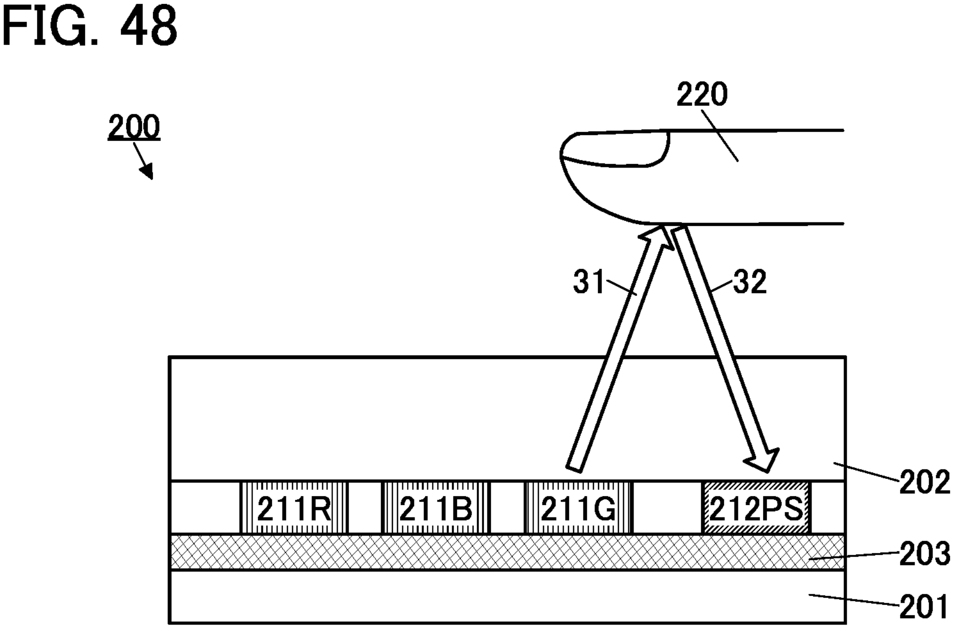
FIG. 48 is a cross-sectional view illustrating an example of a display apparatus.

The light-receiving device 212PS can be used in a touch sensor (also referred to as a direct touch sensor), a near touch sensor (also referred to as a hover sensor, a hover touch sensor, a contactless sensor, or a touchless sensor), or the like. FIG. 48 illustrates a state where light 31 emitted from the light-emitting device (e.g., the light-emitting device 211G) is reflected by an object (e.g., the finger 220), and light 32 that is reflected light is incident on the light-receiving device 212PS. The object is not in contact with the display apparatus 200; however, the object can be detected with the use of the light-receiving device 212PS. Note that the wavelength of light detected by the light-receiving device 212PS may be determined as appropriate depending on the intended use.

The touch sensor or the near touch sensor can detect an approach or contact of an object (e.g., a finger, a hand, or a pen). The touch sensor can detect the object when the display apparatus and the object come in direct contact with each other. Furthermore, even when an object is not in contact with the display apparatus, the near touch sensor can detect the object. For example, the display apparatus is preferably capable of detecting an object positioned in the range of 0.1 mm to 300 mm inclusive, further preferably 3 mm to 50 mm inclusive from the display apparatus. This structure enables the display apparatus to be operated without direct contact of an object; in other words, the display apparatus can be operated in a contactless (touchless) manner. With the above structure, the display apparatus can have a reduced risk of being dirty or damaged, or can be operated without the object directly touching a dirt (e.g., dust or a virus) attached to the display apparatus.

The refresh rate of the display apparatus of one embodiment of the present invention can be variable. For example, the refresh rate is adjusted (adjusted in the range from 1 Hz to 240 Hz inclusive, for example) in accordance with contents displayed on the display apparatus, whereby power consumption can be reduced. The driving frequency of the touch sensor or the near touch sensor may be changed in accordance with the refresh rate. In the case where the refresh rate of the display apparatus is 120 Hz, for example, the driving frequency of the touch sensor or the near touch sensor can be higher than 120 Hz (typically 240 Hz). With this structure, low power consumption can be achieved, and the response speed of the touch sensor or the near touch sensor can be increased.

The light-receiving device 212PS is preferably provided in all of the pixels included in the display apparatus. Providing the light-receiving device 212PS in all of the pixels enables highly accurate touch detection. Note that the light-receiving device 212PS may be provided in some of the pixels. For example, the display apparatus may include a pixel including the light-emitting device and the light-receiving device and a pixel including the light-receiving device (not including light-emitting device).

Figure 49A:
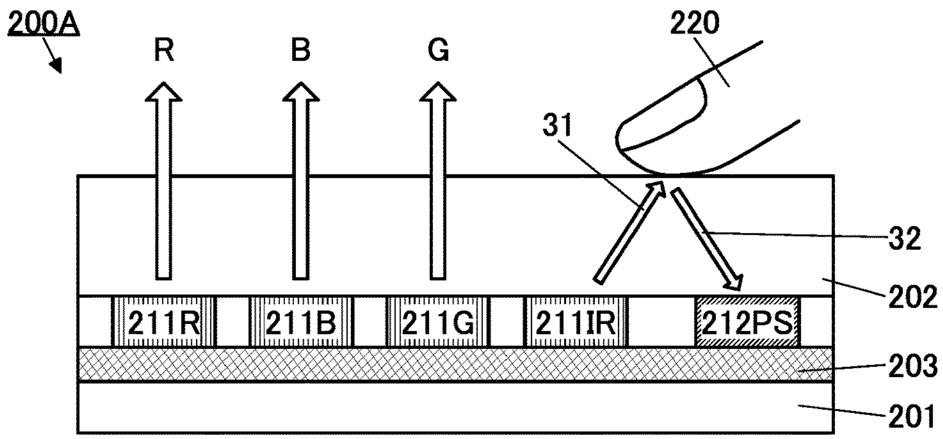
FIG. 49A to FIG. 49C are cross-sectional views illustrating examples of a display apparatus.

FIG. 49A illustrates a structure example different from that of the above-described display apparatus 200. A display apparatus 200A illustrated in FIG. 49A includes the substrate 201, the substrate 202, the light-emitting device 211R, the light-emitting device 211G, the light-emitting device 211B, a light-emitting device 211IR, the light-receiving device 212PS, the functional layer 203, and the like. The display apparatus 200A is different from the display apparatus 200 mainly in including the light-emitting device 211IR.

The light-emitting device 211R, the light-emitting device 211G, the light-emitting device 211B, and the light-receiving element 212PS are provided between the substrate 201 and the substrate 202. The light-emitting device 211IR emits infrared light. Any of the above-described light-emitting devices can be used as the light-emitting device 211IR.

FIG. 49A illustrates a state where the finger 220 touches a surface of the substrate 202. Part of light emitted from the light-emitting device (e.g., the light-emitting device 211IR) is reflected by a contact portion between the substrate 202 and the finger 220. In the case where part of the reflected light is incident on the light-receiving device 212PS, the contact of the finger 220 with the substrate 202 can be detected. For example, infrared rays are emitted from the light-emitting device 211IR and infrared light is detected by the light-receiving device 212PS, so that a touch can be detected even in a dark place.

The display apparatus 200A can perform touch detection in a display portion with the use of the light-emitting device 211IR and the light-receiving device 212PS while displaying an image on the display portion with the use of the light-emitting device 211R, the light-emitting device 211G, and the light-emitting device 211B. In addition, the display apparatus 200A can perform image capturing in the display portion while displaying an image on the display portion.

Figure 49B:
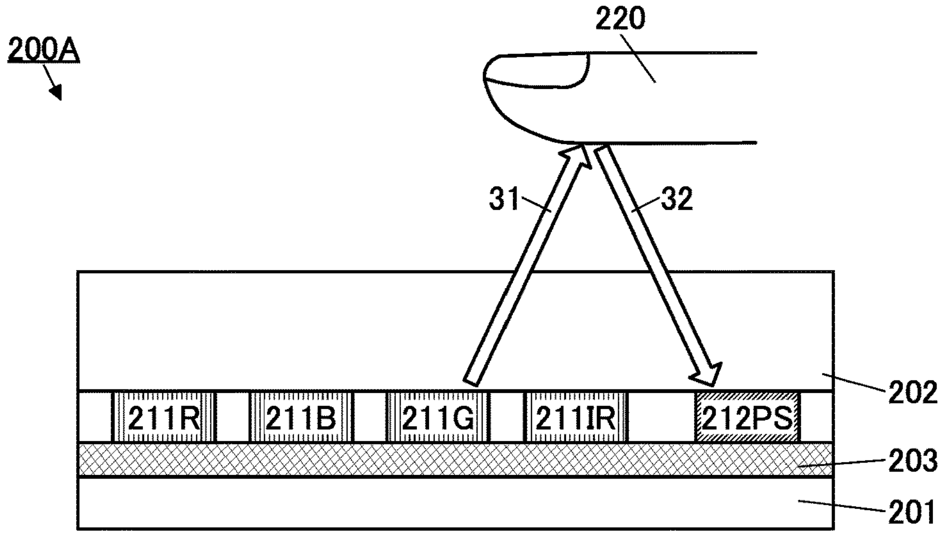
Figure 49C:
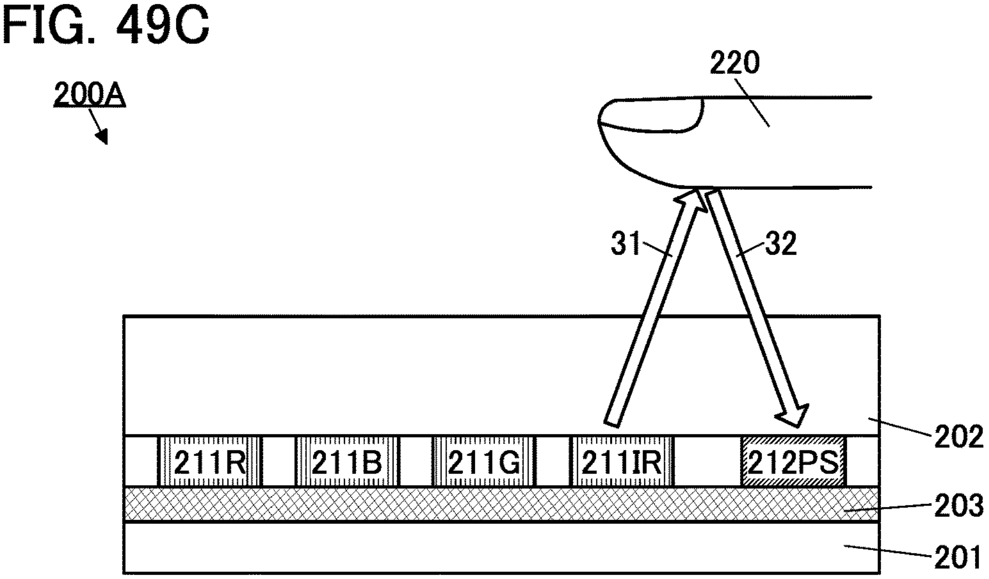

FIG. 49B illustrates a state where the light 31 emitted from the light-emitting device 211G is reflected by an object (e.g., the finger 220), and the light 32 that is reflected light is incident on the light-receiving device 212PS. FIG. 49C illustrates a state where the light 31 emitted from the light-emitting device 211IR is reflected by an object (e.g., the finger 220), and the light 32 that is reflected light is incident on the light-receiving device 212PS. The object is not in contact with the display apparatus 200A; however, the object can be detected with the use of the light-receiving device 212PS.

Figure 50A:
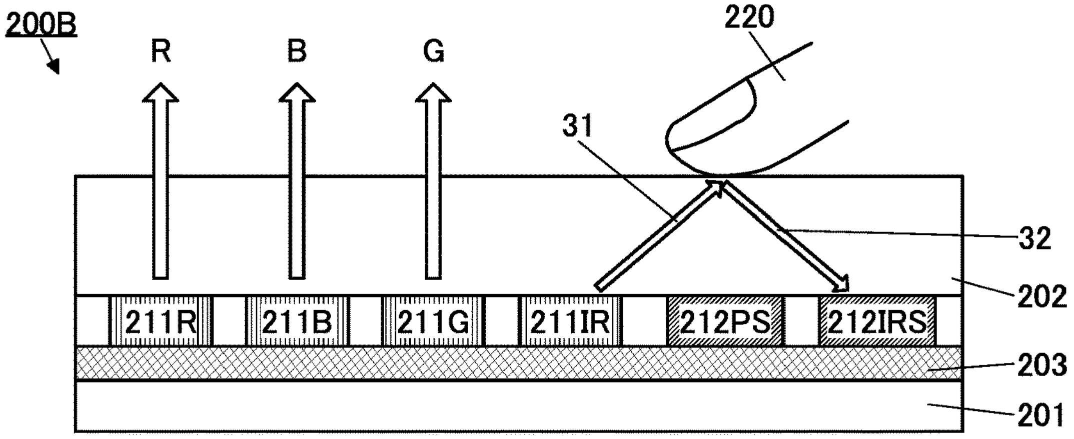
FIG. 50A to FIG. 50C are cross-sectional views illustrating examples of a display apparatus.

FIG. 50A illustrates a structure example different from that of the above-described display apparatus 200A. A display apparatus 200B illustrated in FIG. 50A includes the substrate 201, the substrate 202, the light-emitting device 211R, the light-emitting device 211G, the light-emitting device 211B, the light-emitting device 211IR, the light-receiving device 212PS, a light-receiving device 212IRS, the functional layer 203, and the like. The display apparatus 200B is different from the above-described display apparatus 200A mainly in the structure of the light-receiving device.

The light-emitting device 211R, the light-emitting device 211G, the light-emitting device 211B, the light-receiving device 212PS, and the light-receiving device 212IRS are provided between the substrate 201 and the substrate 202. The light-receiving device 212PS receives visible light. The light-receiving device 212IRS receives infrared light. Any of the above-described light-receiving devices can be used as the light-receiving device 212PS and the light-receiving device 212IRS.

FIG. 50A illustrates a state where the finger 220 touches a surface of the substrate 202. Part of light emitted from the light-emitting device (e.g., the light-emitting device 211IR) is reflected by a contact portion between the substrate 202 and the finger 220. In the case where part of the reflected light is incident on the light-receiving device 212IRS, the contact of the finger 220 with the substrate 202 can be detected.

Figure 50B:
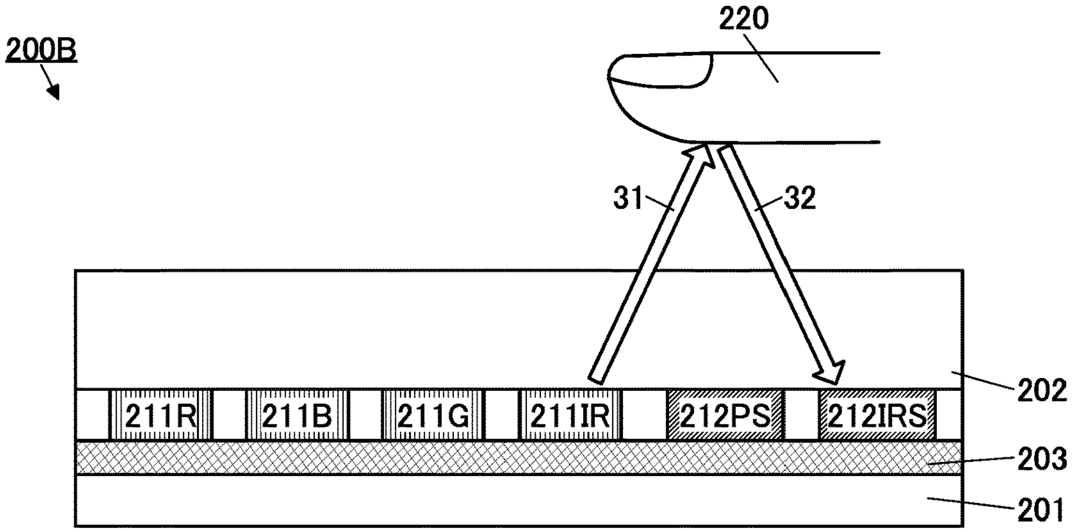
Figure 50C:
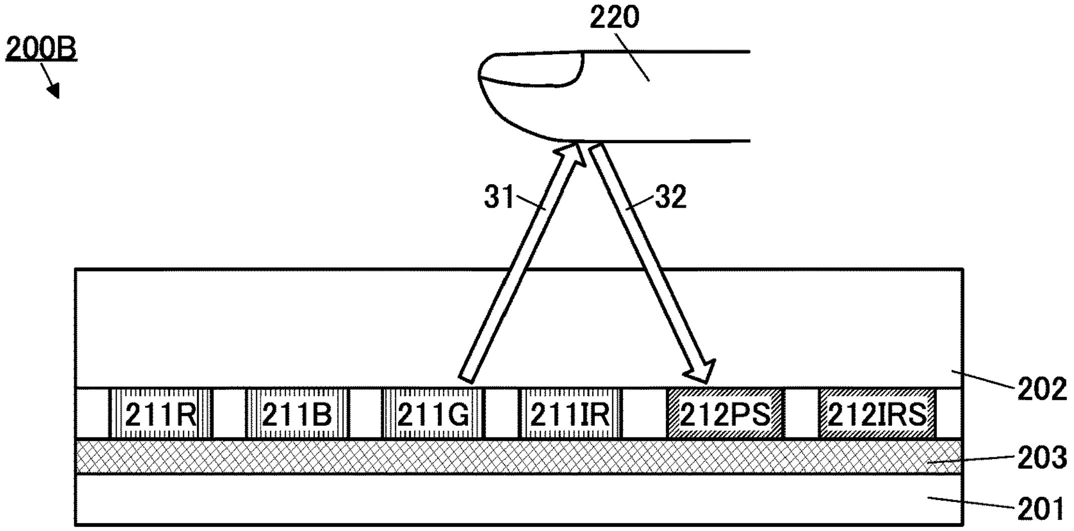

FIG. 50B illustrates a state where the light 31 emitted from the light-emitting device 211IR is reflected by an object (e.g., the finger 220), and the light 32 that is reflected light is incident on the light-receiving device 212IRS. FIG. 50C illustrates a state where the light 31 emitted from the light-emitting device 211G is reflected by an object (e.g., the finger 220), and the light 32 that is reflected light is incident on the light-receiving device 212PS. The object is not in contact with the display apparatus 200B; however, the object can be detected with the use of the light-receiving device 212PS or the light-receiving device 212IRS.

The area of a light-receiving region (hereinafter, also referred to as a light-receiving area) of the light-receiving device 212PS is preferably smaller than the light-receiving area of the light-receiving device 212IRS. When the light-receiving area of the light-receiving device 212PS is made small, that is, the image capturing range is made small, the light-receiving device 212PS can perform higher-resolution image capturing than the light-receiving device 212IRS. In this case, the light-receiving device 212PS can be used to capture an image for personal authentication using a fingerprint, a palm print, the iris, the shape of a blood vessel (including the shape of a vein and the shape of an artery), a face, or the like. Note that the wavelength of light detected by the light-receiving device 212PS may be determined as appropriate depending on the intended use.

Since the light-receiving device 212PS and the light-receiving device 212IRS have difference in the detection accuracy, methods for detecting an object may be selected depending on the functions. For example, a function of scrolling a display screen may be achieved by a near touch sensor function using the light-receiving device 212IRS, and an input function with a keyboard displayed on a screen may be achieved by a high-resolution touch sensor function using the light-receiving device 212PS.

When one pixel includes two kinds of light-receiving devices, the display apparatus can have two additional functions as well as a display function, enabling a multi-functional display apparatus.

For high-resolution image capturing, the light-receiving device 212PS is preferably provided in all of the pixels included in the display apparatus. Meanwhile, the light-receiving device 212IRS used for a touch sensor, a near touch sensor, or the like may be provided in some of the pixels included in the display apparatus because detection with the light-receiving device 212IRS is not required to have high accuracy as compared to detection with the light-receiving device 212PS. When the number of the light-receiving devices 212IRS included in the display apparatus is smaller than the number of the light-receiving devices 212PS, the detection speed can be increased.

As described above, the display apparatus of this embodiment can be a multifunctional display apparatus by including a light-emitting device and a light-receiving device in one pixel. For example, a display apparatus with a high-resolution image capturing function and a sensing function of a touch sensor, a near touch sensor, or the like can be achieved.

Figure 51A:
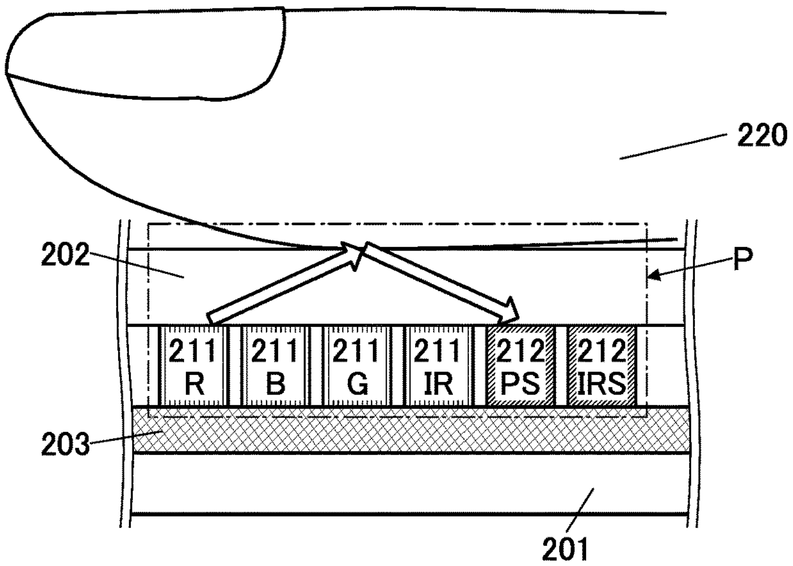
FIG. 51A to FIG. 51C are diagrams illustrating examples of a display apparatus.
Figure 51B:
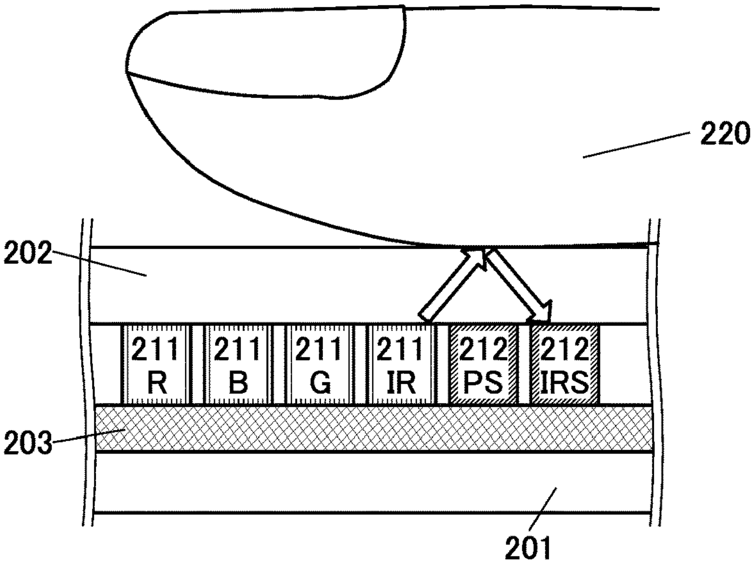

The display apparatus of one embodiment of the present invention may emit light of a particular color and receive reflected light that has been reflected by an object. In FIG. 51A, red light emitted from the display apparatus and the red light incident on the display apparatus after being reflected by an object (here, the finger 220) are schematically indicated by arrows. In FIG. 51B, infrared light emitted from the display apparatus and the infrared light incident on the display apparatus after being reflected by an object (here, the finger 220) are schematically indicated by arrows.

Red light is emitted with an object being in contact with or approaching the display apparatus, and light reflected by the object is incident on the display apparatus, so that the red light transmittance of the object can be measured. Similarly, infrared light is emitted with an object being in contact with or approaching the display apparatus, and light reflected by the object is incident on the display apparatus, so that the infrared light transmittance of the object can be measured.

Figure 51C:
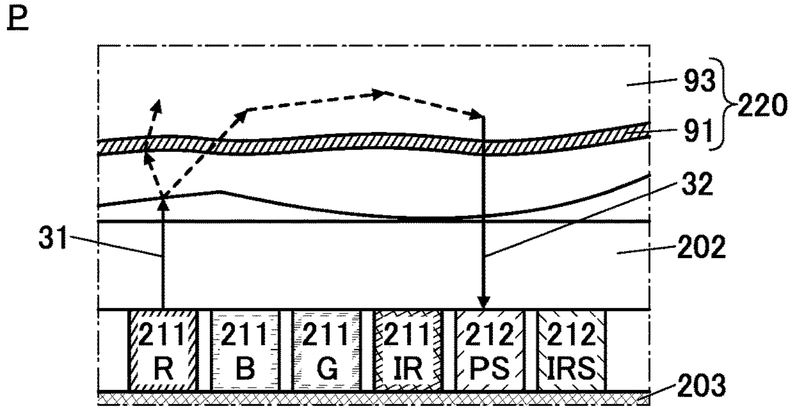

FIG. 51C shows an enlarged view of a region P indicated by the dashed-dotted line in FIG. 51A. The light 31 emitted from the light-emitting device 211R is scattered by biological tissue on the surface or at the inside of the finger 220, and part of the scattered light advances from the inside of the living body toward the light-receiving device 212PS. The scattered light passes through a blood vessel 91, and the light 32 having passed through the blood vessel 91 is incident on the light-receiving device 212PS.

Similarly, infrared light emitted from the light-emitting device 211IR is scattered by biological tissue on the surface or at the inside of the finger 220, and part of the scattered infrared light advances from the inside of the living body toward the light-receiving device 212IRS. The scattered infrared light passes through the blood vessel 91, and the infrared light having passed through the blood vessel 91 is incident on the light-receiving device 212IRS.

Here, the light 32 is light having passed through biological tissue 93 and the blood vessel 91 (an artery and a vein). Since an arterial blood pulses by heartbeat, light absorption by the artery fluctuates in accordance with the heartbeat. In contrast, the biological tissue 93 and the vein are not influenced by the heartbeat, and thus light absorption by the biological tissue 93 and light absorption by the vein are constant. Therefore, light transmittance of the artery can be calculated by subtracting the components that are constant over time from the light 32 that is incident on the display apparatus. The red light transmittance of oxygen-unbound hemoglobin (also referred to as reduced hemoglobin) is lower than that of oxygen-bound hemoglobin (also referred to as oxyhemoglobin). Oxyhemoglobin and reduced hemoglobin have substantially the same infrared light transmittance. Measuring the red light transmittance of the artery and the infrared light transmittance of the artery enables the ratio of oxyhemoglobin to the total amount of oxyhemoglobin and reduced hemoglobin, that is, the oxygen saturation (hereinafter, also referred to as percutaneous oxygen saturation ($SpO_2$: Peripheral Oxygen Saturation)), to be calculated. In this way, the display apparatus of one embodiment of the present invention can have a function of a reflective pulse oximeter.

For example, when a finger is in contact with a display portion of a display apparatus, positional information of a region that the finger is in contact with is obtained. Then, red light is emitted from pixels in and around the region that the finger is in contact with to measure the red light transmittance of the artery. After that, infrared light is emitted to measure the infrared light transmittance of the artery, whereby the oxygen saturation can be calculated. Note that the order of measuring the red light transmittance and measuring the infrared light transmittance is not particularly limited. After the infrared light transmittance is measured, the red light transmittance may be measured. Furthermore, although an example of calculating the oxygen saturation using the finger is described here, one embodiment of the present invention is not limited thereto. The oxygen saturation can be calculated using a part other than the finger. For example, the oxygen saturation can be calculated by measuring the red light transmittance of an artery and the infrared light transmittance of the artery while a palm is in contact with the display portion of the display apparatus.

Figure 52A:
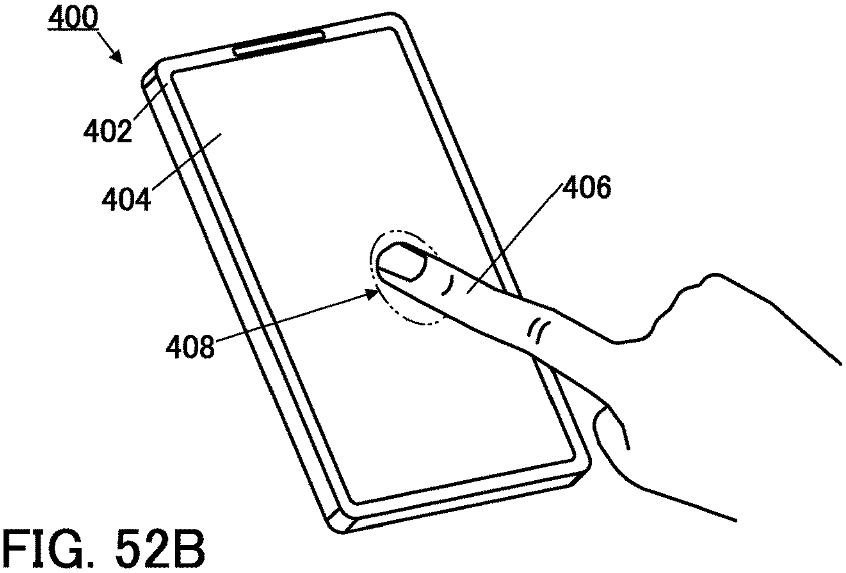
FIG. 52A to FIG. 52C are diagrams showing examples of an electronic device.

FIG. 52A illustrates an example of an electronic device including the display apparatus of one embodiment of the present invention. A portable information terminal 400 illustrated in FIG. 52A can be used as a smartphone, for example. The portable information terminal 400 includes a housing 402 and a display portion 404. Any of the above-described display apparatuses can be used for the display portion 404. For example, the above-described display apparatus 200B can be suitably used for the display portion 404.

FIG. 52A illustrates a state where a finger 406 is in contact with the display portion 404 of the portable information terminal 400. In FIG. 52A, a region 408 including a region where a touch is detected and the vicinity thereof is indicated by a dashed double-dotted line.

Figure 52B:
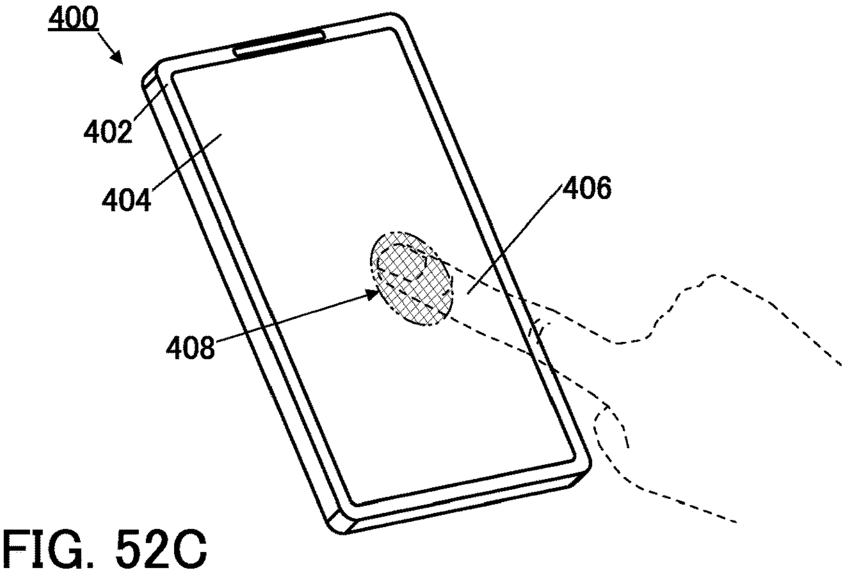

The portable information terminal 400 emits red light from pixels in the region 408 and detects red light incident on the display portion 404. Similarly, the portable information terminal 400 can measure the oxygen saturation of the finger 406 by emitting infrared light from pixels in the region 408 and detecting infrared light incident on the display portion 404. FIG. 52B illustrates a state where the pixels in the region 408 are in a lighting state. In FIG. 52B, the finger 406 is illustrated to be transparent with only the outline indicated by a dashed line, and the region 408 is shown with a hatch pattern. As illustrated in FIG. 52B, the region 408 in a lighting state is hidden by the finger 406 and thus is less likely to be recognized by a user. Therefore, the oxygen saturation can be measured without causing stress to the user. In addition, the portable information terminal 400 can measure the oxygen saturation at any position in the display portion 404.

Figure 52C:
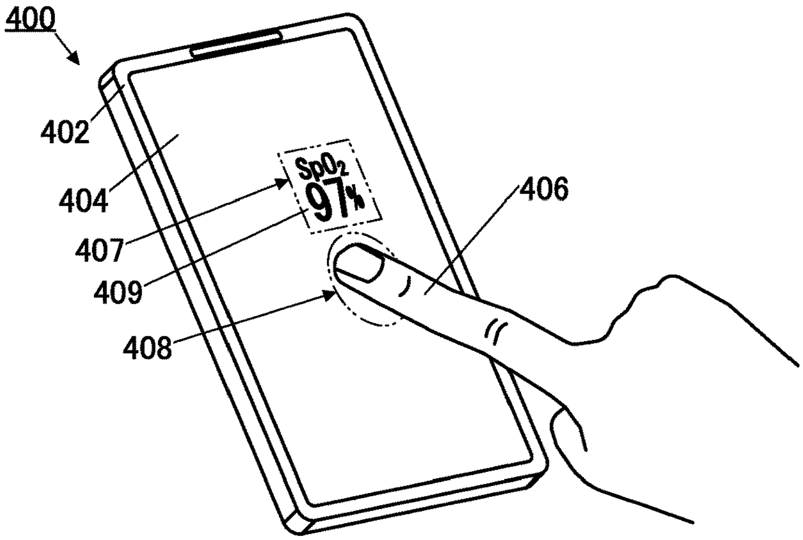

The obtained oxygen saturation may be displayed on the display portion 404. FIG. 52C illustrates a state where an image 409 showing the oxygen saturation is displayed in a region 407. FIG. 52C illustrates characters of "$SpO_2$ 97%" as an example of the image 409. Note that the image 409 may be an image or may include an image and a character. The region 407 is provided at a given position in the display portion 404.

This embodiment can be combined with any of the other embodiments as appropriate. In the case where a plurality of structure examples are described in one embodiment in this specification, the structure examples can be combined as appropriate.

Embodiment 4

In this embodiment, a display apparatus of one embodiment of the present invention and a manufacturing method thereof are described with reference to FIG. 53 to FIG. 71.

In the case of manufacturing a display apparatus including light-emitting devices emitting light of different colors and a light-receiving device, a plurality of light-emitting layers and an active layer each need to be formed into an island-like shape.

For example, an island-shaped light-emitting layer and active layer can be formed by a vacuum evaporation method using a metal mask (also referred to as a shadow mask). However, this method causes a deviation from the designed shape and position of an island-shaped light-emitting layer and an active layer due to various influences such as the accuracy of the metal mask, the positional deviation between the metal mask and a substrate, a warp of the metal mask, and expansion of the outline of a deposited film due to vapor scattering or the like; accordingly, it is difficult to achieve high definition and a high aperture ratio of the display apparatus.

In a manufacturing method of a display apparatus of one embodiment of the present invention, an island-shaped pixel electrode (also can be referred to as a lower electrode) is formed, a first layer to be an EL layer is formed over the entire surface, and then a first sacrificial layer is formed over the first layer. After that, a first resist mask is formed over the first sacrificial layer and the first layer and the first sacrificial layer are processed using the first resist mask, whereby an island-shaped EL layer is formed. Similarly, a second layer to be a light-receiving layer is formed into an island-shaped light-receiving layer using a second sacrificial layer and a second resist mask.

As described above, in the manufacturing method of the display apparatus of one embodiment of the present invention, the island-shaped EL layer is formed not by using a pattern of a metal mask but by processing a layer to be an EL layer deposited over the entire surface. Similarly, the island-shaped light-receiving layer is formed by processing the layer to be the light-receiving layer formed over the entire surface, not with a pattern of a metal mask. Accordingly, a display apparatus with high definition or a display apparatus with a high aperture ratio, which has been difficult to achieve so far, can be obtained. Moreover, EL layers can be formed separately for the respective colors, enabling the display apparatus to perform extremely clear display with high contrast and high display quality. Furthermore, a light-receiving device can be provided in the pixel, enabling the display apparatus to have a high-resolution image capturing function and a sensing function of a touch sensor, a near touch sensor, or the like. In addition, a sacrificial layer provided over an EL layer and a light-receiving layer can reduce damage to the EL layer and the light-receiving layer in the manufacturing process of the display apparatus, increasing the reliability of the light-emitting device and the light-receiving device.

It is difficult to set the distance between adjacent devices among the light-emitting devices and the light-receiving device to be less than 10 μm with a formation method using a metal mask, for example; however, with the above method, the distance can be decreased to less than or equal to 3 μm, less than or equal to 2 μm, or less than or equal to 1 μm. For example, with the use of a light exposure apparatus for LSI, the distance can be decreased to less than or equal to 500 nm, less than or equal to 200 nm, less than or equal to 100 nm, or less than or equal to 50 nm. Thus, the area of a light-emitting region (hereinafter, also referred to as a light-emitting area) and the light-receiving area in a pixel can be increased and the aperture ratio can be close to 100%. For example, the aperture ratio higher than or equal to 50%, higher than or equal to 60%, higher than or equal to 70%, higher than or equal to 80%, or higher than or equal to 90% and lower than 100% can be achieved.

Furthermore, patterns of the EL layer and the light-receiving layer themselves can be made extremely smaller than those in the case of using a metal mask. For example, in the case of using a metal mask for separate formation of EL layers and a light-receiving layer, the thickness varies between the center and the edge of the pattern, which causes a reduction in an effective area that can be used as a light-emitting region or a light-receiving region with respect to the whole area of the pattern. In contrast, in the above formation method, a pattern is formed by processing a film deposited to a uniform thickness, which enables a uniform thickness in the pattern; thus, even in a fine pattern, almost the entire area can be used as a light-emitting region or the light-receiving region. Thus, a display apparatus having both high definition and a high aperture ratio can be manufactured.

Structure Example 1 of Display Apparatus

Figure 53A:
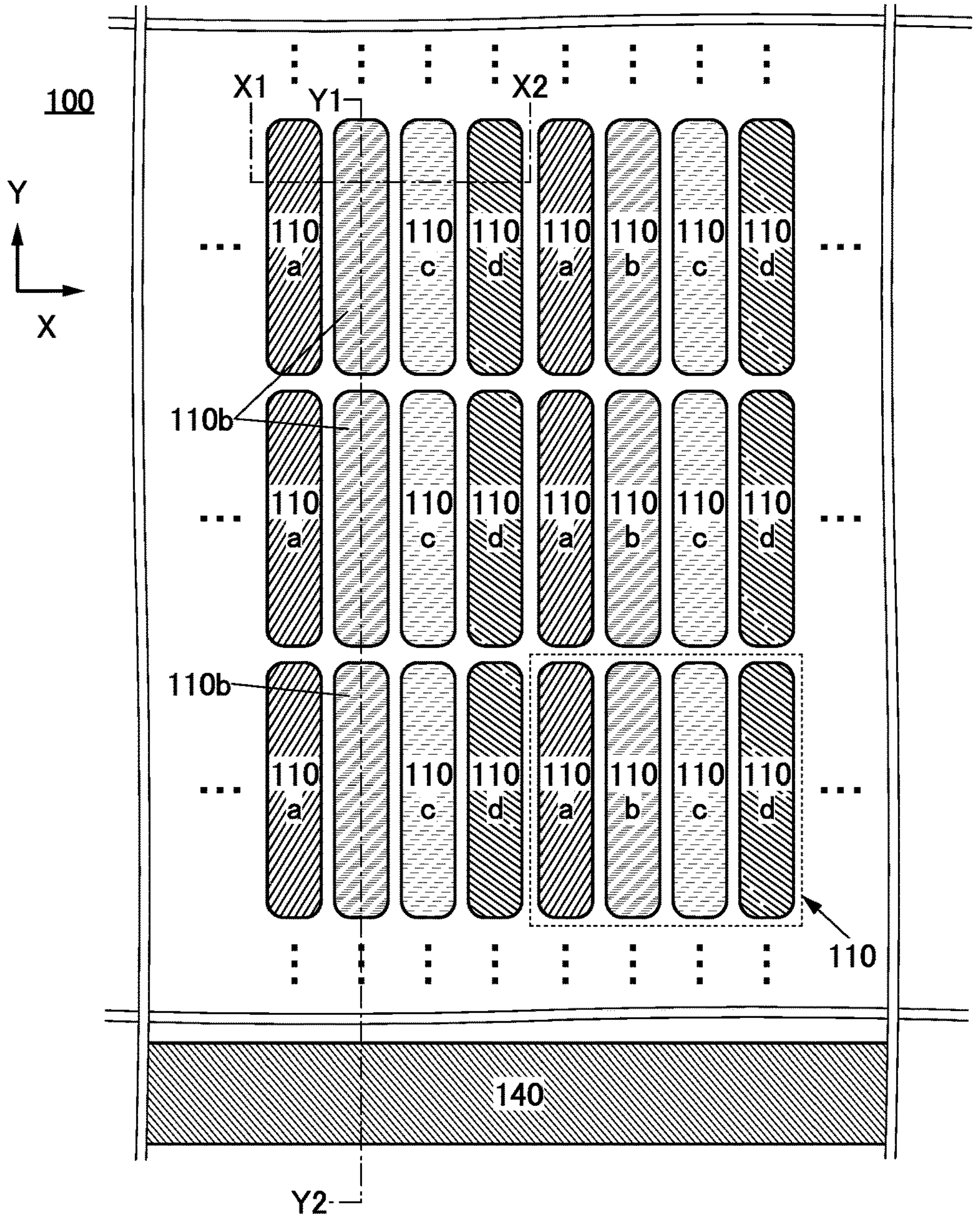
FIG. 53A is a top view illustrating an example of a display apparatus.
Figure 53B:
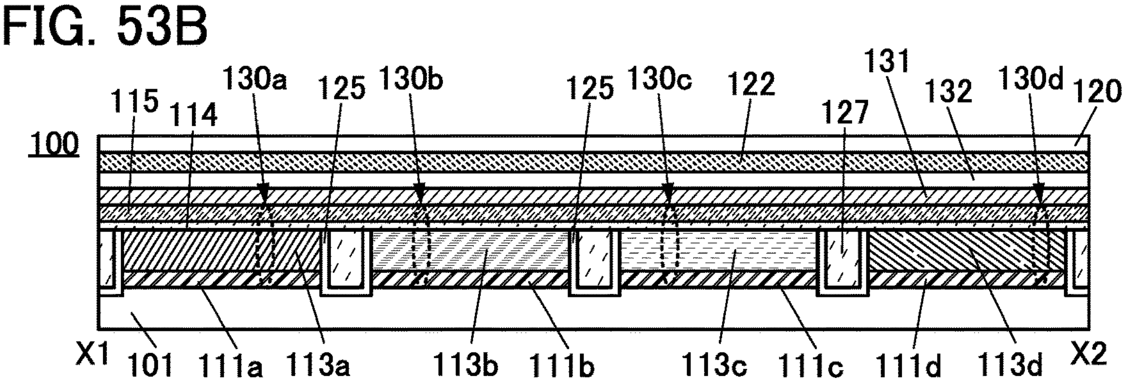
FIG. 53B is a cross-sectional view illustrating an example of the display apparatus.

FIG. 53A and FIG. 53B illustrate the display apparatus of one embodiment of the present invention.

FIG. 53A is a top view of the display apparatus 100. The display apparatus 100 includes a display portion in which a plurality of pixels 110 are arranged in a matrix, and a connection portion 140 outside the display portion.

The pixel 110 illustrated in FIG. 53A employs stripe arrangement. The pixel 110 illustrated in FIG. 53A is composed of four subpixels: a subpixel 110*a*, a subpixel 110*b*, a subpixel 110*c*, and a subpixel 110*d*. The subpixel 110*a*, the subpixel 110*b*, and the subpixel 110*c* include light-emitting devices that emit light in different wavelength ranges. Any of the above-described light-emitting devices can be used as the light-emitting device. The subpixel 110*a*, the subpixel 110*b*, and the subpixel 110*c* can be subpixels of three colors of red (R), green (G), and blue (B) or subpixels of three colors of yellow (Y), cyan (C), and magenta (M), for example. The subpixel 110*d* includes a light-receiving device. Any of the above-described light-receiving devices can be used as the light-receiving device.

FIG. 53A illustrates an example where subpixels are arranged to be aligned in the X direction and subpixels of the same kind are arranged to be aligned in the Y direction. Note that subpixels of different kinds may be arranged to be aligned in the Y direction, and subpixels of the same kind may be arranged to be aligned in the X direction.

Although the top view in FIG. 53A illustrates an example where the connection portion 140 is positioned in the lower side of the display portion, one embodiment of the present invention is not particularly limited thereto. The connection portion 140 is provided in at least one of the upper side, the right side, the left side, and the lower side of the display portion in the top view, or may be provided so as to surround the four sides of the display portion. The number of the connection portions 140 can be one or more.

FIG. 53B is a cross-sectional view along a dashed-dotted line X1-X2 in FIG. 53A.

As illustrated in FIG. 53B, the display apparatus 100 includes a light-emitting device 130*a*, a light-emitting device 130*b*, a light-emitting device 130*c*, and a light-receiving device 130*d* over a layer 101 including transistors. Furthermore, a protective layer 131 and a protective layer 132 are provided to cover these light-emitting devices and the light-receiving device. A substrate 120 is bonded onto the protective layer 132 with a resin layer 122. In a region between adjacent devices among the light-emitting devices and the light-receiving device, an insulating layer 125 and an insulating layer 127 over the insulating layer 125 are provided.

The display apparatus of one embodiment of the present invention can have any of the following structures: a top-emission structure where light is emitted in a direction opposite to the substrate where the light-emitting device is formed, a bottom-emission structure where light is emitted toward the substrate where the light-emitting device is formed, and a dual-emission structure where light is emitted toward both surfaces.

The layer 101 including transistors can employ a stacked-layer structure where a plurality of transistors are provided over a substrate and an insulating layer is provided to cover these transistors, for example. The layer 101 including transistors may have a depressed portion between adjacent light-emitting devices. For example, an insulating layer positioned on the outermost surface of the layer 101 including transistors may have a depressed portion.

The light-emitting device 130*a*, the light-emitting device 130*b*, and the light-emitting device 130*c* emit light in different wavelength ranges. The light-emitting device 130*a*, the light-emitting device 130*b*, and the light-emitting device 130*c* preferably emit light of three colors, red (R), green (G), and blue (B) as a combination, for example.

The light-emitting device 130*a* includes a pixel electrode 111*a* over the layer 101 including transistors, an island-shaped EL layer 113*a* over the pixel electrode 111*a*, a layer 114 over the island-shaped EL layer 113*a*, and a common electrode 115 over the layer 114.

The light-emitting device 130*b* includes a pixel electrode 111*b* over the layer 101 including transistors, an island-shaped EL layer 113*b* over the pixel electrode 111*b*, the layer 114 over the island-shaped EL layer 113*b*, and the common electrode 115 over the layer 114.

The light-emitting device 130*c* includes a pixel electrode 111*c* over the layer 101 including transistors, an island-shaped EL layer 113*c* over the pixel electrode 111*c*, the layer 114 over the island-shaped EL layer 113*c*, and the common electrode 115 over the layer 114.

The light-receiving device 130*d* includes a pixel electrode 111*d* over the layer 101 including transistors, an island-shaped light-receiving layer 113*d* over the pixel electrode 111*d*, the layer 114 over the island-shaped light-receiving layer 113*d*, and the common electrode 115 over the layer 114.

The light-emitting devices of different colors and the light-receiving device share one film as the common electrode. The common electrode is electrically connected to a conductive layer provided in the connection portion 140. Thus, the same potential is supplied to the common electrode included in the light-emitting devices of different colors and the light-receiving device.

For the pair of electrodes (the pixel electrode and the common electrode) of the light-emitting devices and the light-receiving device, a metal, an alloy, an electrically conductive compound, a mixture thereof, and the like can be used as appropriate. Specific examples include an indium tin oxide (also referred to as an In—Sn oxide or ITO), an In—Si—Sn oxide (also referred to as ITSO), an indium zinc oxide (In—Zn oxide), an In—W—Zn oxide, an alloy containing aluminum (an aluminum alloy) such as an alloy of aluminum, nickel, and lanthanum (Al—Ni—La), and an alloy of silver, palladium, and copper (Ag—Pd—Cu, also referred to as APC). In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) and an alloy containing an appropriate combination of any of these metals. It is also possible to use an element belonging to Group 1 or Group 2 of the periodic table, which is not described above (e.g., lithium (Li), cesium (Cs), calcium (Ca), or strontium (Sr)), a rare earth metal such as europium (Eu) or ytterbium (Yb), an alloy containing an appropriate combination of any of these, graphene, or the like.

The light-emitting devices preferably employ a microcavity structure. Therefore, one of the pair of electrodes of the light-emitting devices is preferably an electrode having a transmitting property and a reflecting property with respect to visible light (a semi-transmissive and semi-reflective electrode), and the other is preferably an electrode having a reflecting property with respect to visible light (a reflective electrode). When the light-emitting devices have a microcavity structure, light emitted from the light-emitting layers can be resonated between the electrodes, whereby light emitted from the light-emitting devices can be intensified.

Note that the semi-transmissive and semi-reflective electrode can have a stacked-layer structure of an electrode having a reflecting property with respect to visible light and an electrode having a transmitting property with respect to visible light (also referred to as a transparent electrode).

The transparent electrode has a light transmittance higher than or equal to 40%. For example, an electrode having a visible light transmittance higher than or equal to 40% is preferably used in light-emitting elements. The semi-transmissive and semi-reflective electrode has a visible light reflectance higher than or equal to 10% and lower than or equal to 95%, preferably higher than or equal to 30% and lower than or equal to 80%. The reflective electrode has a visible light reflectance higher than or equal to 40% and lower than or equal to 100%, preferably higher than or equal to 70% and lower than or equal to 100%. These electrodes each preferably have a resistivity lower than or equal to $1\times10^{-2}$ Ωcm. Note that in the case where any of the light-emitting elements emits infrared light, the infrared light transmittance and reflectance of these electrodes preferably satisfy the above-described numerical ranges of the visible light transmittance and reflectance.

The EL layer 113*a*, the EL layer 113*b*, the EL layer 113*c*, and the light-receiving layer 113*d* are formed in island-like shapes. The EL layer 113*a*, the EL layer 113*b*, and the EL layer 113*c* include light-emitting layers. The EL layer 113*a*, the EL layer 113*b*, and the EL layer 113*c* preferably include light-emitting layers that emit light in different wavelength ranges. The light-receiving layer 113*d* includes an active layer.

The light-emitting layer is a layer containing a light-emitting substance. The light-emitting layer can contain one or more kinds of light-emitting substances. As the light-emitting substance, a substance that exhibits an emission color of blue, violet, bluish violet, green, yellowish green, yellow, orange, red, or the like is appropriately used. As the light-emitting substance, a substance that emits infrared light can also be used.

Examples of the light-emitting substance include a fluorescent material, a phosphorescent material, a TADF material, and a quantum dot material.

Examples of the fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (e.g., a host material and an assist material) in addition to the light-emitting substance (a guest material). As one or more kinds of organic compounds, one or both of the hole-transport material and the electron-transport material can be used. Alternatively, as one or more kinds of organic compounds, a bipolar material or a TADF material may be used.

The light-emitting layer preferably contains, for example, a phosphorescent material and a combination of a hole-transport material and an electron-transport material that easily forms an exciplex. With such a structure, light emission can be efficiently obtained by ExTET (Exciplex-Triplet Energy Transfer), which is energy transfer from an exciplex to a light-emitting substance (a phosphorescent material). When a combination of materials is selected to form an exciplex that exhibits light emission whose wavelength overlaps with the wavelength of a lowest-energy-side absorption band of the light-emitting substance, energy can be transferred smoothly and light emission can be obtained efficiently. With this structure, high efficiency, low-voltage driving, and a long lifetime of the light-emitting device can be achieved at the same time.

In the combination of materials for forming an exciplex, the HOMO level (highest occupied molecular orbital level) of the hole-transport material is preferably higher than or equal to the HOMO level of the electron-transport material. The LUMO level (lowest unoccupied molecular orbital level) of the hole-transport material is preferably higher than or equal to the LUMO level of the electron-transport material. The LUMO levels and the HOMO levels of the materials can be derived from the electrochemical characteristics (reduction potentials and oxidation potentials) of the materials that are measured by cyclic voltammetry (CV).

Note that the formation of an exciplex can be confirmed by a phenomenon in which the emission spectrum of a mixed film in which the hole-transport material and the electron-transport material are mixed is shifted to the longer wavelength than the emission spectrum of each of the materials (or has another peak on the longer wavelength side), observed by comparison of the emission spectrum of the hole-transport material, the emission spectrum of the electron-transport material, and the emission spectrum of the mixed film of these materials, for example. Alternatively, the formation of an exciplex can be confirmed by a difference in transient response, such as a phenomenon in which the transient photoluminescence (PL) lifetime of the mixed film has a longer lifetime component or has a delayed component at a higher proportion than the PL lifetime of each of the materials, observed by comparison of the transient PL of the hole-transport material, the transient PL of the electron-transport material, and the transient PL of the mixed film of these materials. The transient PL can be rephrased as transient electroluminescence (EL). That is, the formation of an exciplex can also be confirmed by a difference in transient response observed by comparison of the transient EL of the hole-transport material, the transient EL of the electron-transport material, and the transient EL of the mixed film of these materials.

In addition to the light-emitting layer, the EL layer 113*a*, the EL layer 113*b*, and the EL layer 113*c* may further include a layer containing any of a substance with a high hole-injection property, a substance with a high hole-transport property (also referred to as a hole-transport material), a hole-blocking material, a substance with a high electron-transport property (also referred to as an electron-transport material), a substance with a high electron-injection property, an electron-blocking material, a substance with a bipolar property (also referred to as a substance with a high electron-transport property and a high hole-transport property or a bipolar material), and the like.

Either a low molecular compound or a high molecular compound can be used for the light-emitting device, and an inorganic compound may also be included. Each layer included in the light-emitting device can be formed by an evaporation method (including a vacuum evaporation method), a transfer method, a printing method, an inkjet method, a coating method, or the like.

For example, the EL layer 113*a*, the EL layer 113*b*, and the EL layer 113*c* may each include one or more of a hole-injection layer, a hole-transport layer, a hole-blocking layer, an electron-blocking layer, an electron-transport layer, and an electron-injection layer.

In the EL layer, one or more of a hole-injection layer, a hole-transport layer, a hole-blocking layer, an electron-blocking layer, an electron-transport layer, and an electron-injection layer can be formed as a layer common to the light-emitting devices of the respective colors. For example, a carrier-injection layer (a hole-injection layer or an electron-injection layer) may be formed as the layer 114. Note that all the layers in the EL layer may be separately formed for the respective colors. That is, the EL layer does not necessarily include a layer common to the light-emitting devices of the respective colors.

The EL layer 113*a*, the EL layer 113*b*, and the EL layer 113*c* each preferably include a light-emitting layer and a carrier-transport layer over the light-emitting layer. Accordingly, the light-emitting layer is inhibited from being exposed on the outermost surface during the manufacturing process of the display apparatus 100, so that damage to the light-emitting layer can be reduced. Thus, the reliability of the light-emitting device can be increased.

The hole-injection layer is a layer injecting holes from an anode to the hole-transport layer, and a layer containing a substance with a high hole-injection property. Examples of the substance with a high hole-injection property include an aromatic amine compound and a composite material containing a hole-transport material and an acceptor material (electron-accepting material).

The hole-transport layer is a layer transporting holes, which are injected from the anode by the hole-injection layer, to the light-emitting layer. The hole-transport layer is a layer containing a hole-transport material. As the hole-transport material, a substance having a hole mobility greater than or equal to $10^{-6}$ $cm^2/Vs$ is preferable. Note that other substances can also be used as long as they have a property of transporting more holes than electrons. As the hole-transport material, a substance with a high hole-transport property, such as a π-electron rich heteroaromatic compound (e.g., a carbazole derivative, a thiophene derivative, or a furan derivative) or an aromatic amine (a compound having an aromatic amine skeleton), is preferable.

The electron-transport layer is a layer transporting electrons, which are injected from a cathode by the electron-injection layer, to the light-emitting layer. The electron-transport layer is a layer containing an electron-transport material. As the electron-transport material, a substance having an electron mobility greater than or equal to $1\times10^{-6}$ $cm^2/Vs$ is preferable. Note that other substances can also be used as long as they have a property of transporting more electrons than holes. For the electron-transport material, it is possible to use a substance having a high electron-transport property, such as an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound such as a nitrogen-containing heteroaromatic compound, as well as a metal complex having a quinoline skeleton, a metal complex having a benzoquinoline skeleton, a metal complex having an oxazole skeleton, or a metal complex having a thiazole skeleton.

The electron-injection layer is a layer injecting electrons from the cathode to the electron-transport layer, and a layer containing a substance with a high electron-injection property. As the substance with a high electron-injection property, an alkali metal, an alkaline earth metal, or a compound thereof can be used. As the substance with a high electron-injection property, a composite material containing an electron-transport material and a donor material (electron-donating material) can also be used.

For the electron-injection layer, for example, an alkali metal, an alkaline earth metal, or a compound thereof, such as lithium, cesium, ytterbium, lithium fluoride (LiF), cesium fluoride (CsF), calcium fluoride ($CaF_x$, X is a given number), 8-(quinolinolato)lithium (abbreviation: Liq), 2-(2-pyridyl)phenolatolithium (abbreviation: LiPP), 2-(2-pyridyl)-3-pyridinolatolithium (abbreviation: LiPPy), 4-phenyl-2-(2-pyridyl)phenolatolithium (abbreviation: LiPPP), lithium oxide ($LiO_x$), or cesium carbonate can be used. The electron-injection layer may have a stacked-layer structure of two or more layers. The stacked-layer structure can be, for example, a structure where lithium fluoride is used for a first layer and ytterbium is provided for a second layer.

Alternatively, for the electron-injection layer, an electron-transport material may be used. For example, a compound having an unshared electron pair and an electron deficient heteroaromatic ring can be used as the electron-transport material. Specifically, a compound having at least one of a pyridine ring, a diazine ring (a pyrimidine ring, a pyrazine ring, and a pyridazine ring), and a triazine ring can be used.

Note that the lowest unoccupied molecular orbital (LUMO) of the organic compound having an unshared electron pair is preferably greater than or equal to −3.6 eV and less than or equal to −2.3 eV. In general, the highest occupied molecular orbital (HOMO) level and the LUMO level of an organic compound can be estimated by CV (cyclic voltammetry), photoelectron spectroscopy, optical absorption spectroscopy, inverse photoelectron spectroscopy, or the like.

For example, 4,7-diphenyl-1,10-phenanthroline (abbreviation: BPhen), 2,9-bis(naphthalen-2-yl)-4,7-diphenyl-1,10-phenanthroline (abbreviation: NBPhen), diquinoxalino<2,3-a:2',3'-c>phenazine (abbreviation: HATNA), 2,4,6-tris<3'-(pyridin-3-yl)biphenyl-3-yl>-1,3,5-triazine (abbreviation: TmPPPyTz), or the like can be used as the organic compound having an unshared electron pair. Note that NBPhen has a higher glass transition temperature (Tg) than BPhen and thus has high heat resistance.

In the case of manufacturing a light-emitting device with a tandem structure, an intermediate layer is provided between two light-emitting units. The intermediate layer has a function of injecting electrons into one of the two light-emitting units and injecting holes to the other when a voltage is applied between the pair of electrodes.

For the intermediate layer, for example, a material that can be used for the electron-injection layer, such as lithium, can be suitably used. For the intermediate layer, for example, a material that can be used for the hole-injection layer can be suitably used. For the intermediate layer, a layer containing a hole-transport material and an acceptor material (electron-accepting material) can be used. For the intermediate layer, a layer containing an electron-transport material and a donor material can be used. Forming the intermediate layer including such a layer can suppress an increase in the driving voltage that would be caused by stacking light-emitting units.

The active layer includes a semiconductor. Examples of the semiconductor include an inorganic semiconductor such as silicon and an organic semiconductor including an organic compound. This embodiment shows an example where an organic semiconductor is used as the semiconductor contained in the active layer. The use of an organic semiconductor is preferable because the light-emitting layer and the active layer can be formed by the same method (e.g., a vacuum evaporation method) and thus the same manufacturing apparatus can be used.

Examples of an n-type semiconductor material contained in the active layer include electron-accepting organic semiconductor materials such as fullerene (e.g., $C_{60}$ and $C_{70}$) and fullerene derivatives. Fullerene has a soccer ball-like shape, which is energetically stable. Both the HOMO level and the LUMO level of fullerene are deep (low). Having a deep LUMO level, fullerene has an extremely high electron-accepting property (acceptor property). In general, when π-electron conjugation (resonance) spreads in a plane as in benzene, an electron-donating property (donor property) becomes high; however, since fullerene has a spherical shape, fullerene has a high electron-accepting property even when π-electron conjugation widely spreads. The high electron-accepting property efficiently causes rapid charge separation and thus is useful for a light-receiving element. Both $C_{60}$ and $C_{70}$ have a wide absorption band in the visible light region, and $C_{70}$ is especially preferable because of having a larger π-electron conjugation system and a wider absorption band in the long wavelength region than $C_{60}$. Other examples of the fullerene derivative include [6,6]-phenyl-C71-butyric acid methyl ester (abbreviation: PC70BM), [6,6]-phenyl-C61-butyric acid methyl ester (abbreviation: PC60BM), and 1',1",4',4"-tetrahydro-di[1,4]methanonaphthaleno[1,2:2',3',56,60:2",3"][5,6]fullerene-C60 (abbreviation: ICBA).

Examples of an n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of a p-type semiconductor material contained in the active layer include electron-donating organic semiconductor materials such as copper(II) phthalocyanine (CuPc), tetraphenyldibenzoperiflanthene (DBP), zinc phthalocyanine (ZnPc), tin phthalocyanine (SnPc), and quinacridone.

Examples of a p-type semiconductor material include a carbazole derivative, a thiophene derivative, a furan derivative, and a compound having an aromatic amine skeleton. Other examples of the p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a polyphenylene vinylene derivative, a polyparaphenylene derivative, a polyfluorene derivative, a polyvinylcarbazole derivative, and a polythiophene derivative.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape is preferably used as the electron-accepting organic semiconductor material, and an organic semiconductor material having a substantially planar shape is preferably used as the electron-donating organic semiconductor material. Molecules of similar shapes tend to aggregate, and aggregated molecules of similar kinds, which have molecular orbital energy levels close to each other, can improve the carrier-transport property.

For example, the active layer is preferably formed by co-evaporation of an n-type semiconductor and a p-type semiconductor. Alternatively, the active layer may be formed by stacking an n-type semiconductor and a p-type semiconductor.

Either a low molecular compound or a high molecular compound can be used for the light-emitting element and the light-receiving element, and an inorganic compound may be contained. Each layer included in the light-emitting element and the light-receiving element can be formed by an evaporation method (including a vacuum evaporation method), a transfer method, a printing method, an inkjet method, a coating method, or the like.

As the hole-transport material, a high molecular compound such as poly(3,4-ethylenedioxythiophene)/poly(styrenesulfonic acid) (PEDOT/PSS), or an inorganic compound such as a molybdenum oxide or copper iodide (CuI) can be used, for example. As the electron-transport material, an inorganic compound such as zinc oxide (ZnO) can be used.

For the active layer, a high molecular compound such as poly[[4,8-bis[5-(2-ethylhexyl)-2-thienyl]benzo[1,2-b:4,5-b']dithiophene-2,6-diyl]-2,5-thiophenediyl[5,7-bis(2-ethylhexyl)-4,8-dioxo-4H,8H-benzo[1,2-c:4,5-c']dithiophene-1,3-diyl]] polymer (abbreviation: PBDB-T) or a PBDB-T derivative, which functions as a donor, can be used. For example, a method in which an acceptor material is dispersed to PBDB-T or a PBDB-T derivative can be used.

The active layer may contain a mixture of three or more kinds of materials. For example, a third material may be mixed with an n-type semiconductor material and a p-type semiconductor material in order to extend the wavelength range. In this case, the third material may be a low molecular compound or a high molecular compound.

The side surfaces of the pixel electrode 111*a*, the pixel electrode 111*b*, the pixel electrode 111*c*, the pixel electrode 111*d*, the EL layer 113*a*, the EL layer 113*b*, the EL layer 113*c*, and the light-receiving layer 113*d* are covered with the insulating layer 125 and the insulating layer 127. This can inhibit contact between the layer 114 (or the common electrode 115) and the side surface of any of the pixel electrode 111*a*, the pixel electrode 111*b*, the pixel electrode 111*c*, the pixel electrode 111*d*, the EL layer 113*a*, the EL layer 113*b*, the EL layer 113*c*, and the light-receiving layer 113*d*, thereby inhibiting a short circuit of the light-emitting devices and the light-receiving device.

The insulating layer 125 preferably covers at least the side surfaces of the pixel electrode 111*a*, the pixel electrode 111*b*, the pixel electrode 111*c*, and the pixel electrode 111*d*. It is further preferable that the insulating layer 125 cover the side surfaces of the EL layer 113*a*, the EL layer 113*b*, the EL layer 113*c*, and the light-receiving layer 113*d*. The insulating layer 125 can be in contact with the side surfaces of the pixel electrode 111*a*, the pixel electrode 111*b*, the pixel electrode 111*c*, the pixel electrode 111*d*, the EL layer 113*a*, the EL layer 113*b*, the EL layer 113*c*, and the light-receiving layer 113*d*.

The insulating layer 127 is provided over the insulating layer 125 to fill a depressed portion formed by the insulating layer 125. The insulating layer 127 can overlap with the side surfaces of the pixel electrode 111*a*, the pixel electrode 111*b*, the pixel electrode 111*c*, the pixel electrode 111*d*, the EL layer 113*a*, the EL layer 113*b*, the EL layer 113*c*, and the light-receiving layer 113*d* with the insulating layer 125 therebetween.

Note that one of the insulating layer 125 and the insulating layer 127 is not necessarily provided. For example, in the case where the insulating layer 125 is not provided, the insulating layer 127 can be in contact with the side surfaces of the EL layer 113*a*, the EL layer 113*b*, the EL layer 113*c*, and the light-receiving layer 113*d*. The insulating layers 127 can be provided over the layer 101 so as to fill spaces between adjacent layers among the EL layers included in the light-emitting devices and the light-receiving layer included in the light-receiving device.

The layer 114 and the common electrode 115 are provided over the EL layer 113*a*, the EL layer 113*b*, the EL layer 113*c*, the light-receiving layer 113*d*, the insulating layer 125, and the insulating layer 127. Before the insulating layer 125 and the insulating layer 127 are provided, a level difference is generated between a region where the pixel electrode is provided and a region where the pixel electrode is not provided (a region between adjacent devices among the light-emitting devices and the light-receiving device). In the display apparatus of one embodiment of the present invention, the level difference can be eliminated with the insulating layer 125 and the insulating layer 127, and the coverage with the layer 114 and the common electrode 115 can be improved. Consequently, a connection defect due to disconnection of the common electrode 115 can be inhibited. Alternatively, an increase in electric resistance due to local thinning of the common electrode 115 by the level difference can be inhibited.

In order to improve the planarity of the formation surfaces of the layer 114 and the common electrode 115, the levels of the top surface of the insulating layer 125 and the top surface of the insulating layer 127 are each preferably equal to or substantially equal to the level of the top surface of at least one of the EL layer 113*a*, the EL layer 113*b*, the EL layer 113*c*, and the light-receiving layer 113*d*. The top surface of the insulating layer 127 preferably has a flat shape and may have a projected portion or a depressed portion.

The insulating layer 125 includes regions in contact with the side surfaces of the EL layer 113*a*, the EL layer 113*b*, the EL layer 113*c*, and the light-receiving layer 113*d*, and functions as a protective insulating layer for the EL layer 113*a*, the EL layer 113*b*, the EL layer 113*c*, and the light-receiving layer 113*d*. With the insulating layer 125, entry of impurities (e.g., oxygen or moisture) through the side surfaces of the EL layer 113*a*, the EL layer 113*b*, the EL layer 113*c*, and the light-receiving layer 113*d* into their insides can be inhibited, and thus a highly reliable display apparatus can be obtained.

When the width (thickness) of the insulating layer 125 in the regions in contact with the side surfaces of the EL layer 113*a*, the EL layer 113*b*, the EL layer 113*c*, and the light-receiving layer 113*d* is large in a cross-sectional view, spaces between adjacent layers among the EL layer 113*a*, the EL layer 113*b*, the EL layer 113*c*, and the light-receiving layer 113*d* each increase, which might result in a lower aperture ratio. In addition, when the width (thickness) of the insulating layer 125 is small, the effect of inhibiting entry of impurities through the side surfaces of the EL layer 113*a*, the EL layer 113*b*, the EL layer 113*c*, and the light-receiving layer 113*d* into their insides might be weakened.

The width (thickness) of the insulating layer 125 in the regions in contact with the side surfaces of the EL layer 113*a*, the EL layer 113*b*, the EL layer 113*c*, and the light-receiving layer 113*d* is preferably greater than or equal to 3 nm and less than or equal to 200 nm, further preferably greater than or equal to 3 nm and less than or equal to 150 nm, further preferably greater than or equal to 5 nm and less than or equal to 150 nm, still further preferably greater than or equal to 5 nm and less than or equal to 100 nm, still further preferably greater than or equal to 10 nm and less than or equal to 100 nm, yet further preferably greater than or equal to 10 nm and less than or equal to 50 nm. When the width (thickness) of the insulating layer 125 is within the above-described range, a highly reliable display apparatus with a high aperture ratio can be obtained.

The insulating layer 125 can contain an inorganic material. As the insulating layer 125, an inorganic insulating film such as an oxide insulating film, a nitride insulating film, an oxynitride insulating film, or a nitride oxide insulating film can be used, for example. The insulating layer 125 may have a single-layer structure or a stacked-layer structure.

The insulating layer 125 can be formed by a sputtering method, a chemical vapor deposition (CVD) method, a vacuum evaporation method, a pulsed laser deposition (PLD) method, an atomic layer deposition (ALD) method, or the like. The insulating layer 125 is preferably formed by an ALD method achieving good coverage. An ALD method causes less deposition damage to a formation surface, and thus can be suitably used.

Examples of the oxide insulating film include a silicon oxide film, an aluminum oxide film, a magnesium oxide film, an indium gallium zinc oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film. In particular, aluminum oxide is preferable because it has high selectivity with respect to the EL layer in etching and has a function of protecting the EL layer in forming the insulating layer 127 which is to be described later. In particular, when an inorganic insulating film such as an aluminum oxide film, a hafnium oxide film, or a silicon oxide film formed by an ALD method is used as the insulating layer 125, the insulating layer 125 including few pinholes and having an excellent function of protecting the EL layer can be formed.

Note that in this specification and the like, oxynitride refers to a material that contains more oxygen than nitrogen in its composition, and nitride oxide refers to a material that contains more nitrogen than oxygen in its composition. For example, in the case where silicon oxynitride is described, it refers to a material that contains more oxygen than nitrogen in its composition. In the case where silicon nitride oxide is described, it refers to a material that contains more nitrogen than oxygen in its composition.

The insulating layer 127 provided over the insulating layer 125 has a planarization function for the depressed portion of the insulating layer 125, which is formed between adjacent light-emitting devices. In other words, the insulating layer 127 has an effect of improving the planarity of the formation surface of the common electrode 115. An insulating layer containing an organic material can be suitably used as the insulating layer 127. For the insulating layer 127, an acrylic resin, a polyimide resin, an epoxy resin, an imide resin, a polyamide resin, a polyimide-amide resin, a silicone resin, a siloxane resin, a benzocyclobutene-based resin, a phenol resin, a precursor of any of these resins, or the like can be used, for example. For the insulating layer 127, an organic material such as polyvinyl alcohol (PVA), polyvinylbutyral, polyvinylpyrrolidone, polyethylene glycol, polyglycerin, pullulan, water-soluble cellulose, or an alcohol-soluble polyamide resin may be used. Moreover, a photosensitive resin can be used for the insulating layer 127. A photoresist may be used for the photosensitive resin. As the photosensitive resin, a positive material or a negative material can be used.

A difference between the top surface level of the insulating layer 127 and the top surface level of one of the EL layer 113*a*, the EL layer 113*b*, the EL layer 113*c*, and the light-receiving layer 113*d* is preferably less than or equal to 0.5 times, further preferably less than or equal to 0.3 times the thickness of the insulating layer 127, for example. As another example, the insulating layer 127 may be provided such that the top surface level of one of the EL layer 113*a*, the EL layer 113*b*, the EL layer 113*c*, and the light-receiving layer 113*d* is higher than the top surface level of the insulating layer 127. As another example, the insulating layer 127 may be provided such that the top surface level of the insulating layer 127 is higher than the top surface levels of the light-emitting layers included in the EL layer 113*a*, the EL layer 113*b*, and the EL layer 113*c*, and higher than the top surface level of the active layer included in the light-receiving layer 113*d*.

The protective layer 131 and the protective layer 132 are preferably provided over the light-emitting device 130*a*, the light-emitting device 130*b*, the light-emitting device 130*c*, and the light-receiving device 130*d*. Providing the protective layer 131 and the protective layer 132 can improve the reliability of the light-emitting devices and the light-receiving device.

There is no limitation on the conductivity of the protective layer 131 and the protective layer 132. As the protective layer 131 and the protective layer 132, at least one kind of insulating films, semiconductor films, and conductive films can be used.

The protective layer 131 and the protective layer 132 each including an inorganic film can inhibit deterioration of the light-emitting devices and the light-receiving device by preventing oxidation of the common electrode 115 and inhibiting entry of impurities (e.g., moisture and oxygen) into the light-emitting device 130*a*, the light-emitting device 130*b*, the light-emitting device 130*c*, and the light-receiving device 130*d*, for example; thus, the reliability of the display apparatus can be improved.

For each of the protective layer 131 and the protective layer 132, an inorganic insulating film such as an oxide insulating film, a nitride insulating film, an oxynitride insulating film, or a nitride oxide insulating film can be used, for example. Examples of the oxide insulating film include a silicon oxide film, an aluminum oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film.

Each of the protective layers 131 and 132 preferably includes a nitride insulating film or a nitride oxide insulating film, and further preferably includes a nitride insulating film.

For each of the protective layer 131 and the protective layer 132, an inorganic film containing an In—Sn oxide (also referred to as ITO), an In—Zn oxide, a Ga—Zn oxide, an Al—Zn oxide, an indium gallium zinc oxide (In—Ga—Zn oxide, also referred to as IGZO), or the like can also be used. The inorganic film preferably has high resistance, specifically, higher resistance than the common electrode 115. The inorganic film may further contain nitrogen.

When extraction of light emitted from the light-emitting device and incidence of light on the light-receiving device are performed through the protective layer 131 and the protective layer 132, the protective layer 131 and the protective layer 132 each preferably have a high transmitting property with respect to visible light. For example, ITO, IGZO, and aluminum oxide are preferable because they are each an inorganic material having a high property of transmitting visible light.

The protective layer 131 and the protective layer 132 can each have, for example, a stacked-layer structure of an aluminum oxide film and a silicon nitride film over the aluminum oxide film, or a stacked-layer structure of an aluminum oxide film and an IGZO film over the aluminum oxide film. Such a stacked-layer structure can inhibit entry of impurities (e.g., water and oxygen) into the EL layer.

Furthermore, the protective layer 131 and the protective layer 132 may each include an organic film. For example, the protective layer 132 may include both an organic film and an inorganic film.

The protective layer 131 and the protective layer 132 may be formed by different deposition methods. Specifically, the protective layer 131 may be formed by an ALD method, and the protective layer 132 may be formed by a sputtering method.

The end portions of the top surfaces of the pixel electrode 111*a*, the pixel electrode 111*b*, the pixel electrode 111*c*, and the pixel electrode 111*d* are not covered with an insulating layer. This allows the distance between adjacent devices among the light-emitting devices and the light-emitting device to be extremely short. Accordingly, the display apparatus can have high definition or high resolution.

In this specification and the like, a device manufactured using a metal mask or an FMM (fine metal mask or a high-resolution mask) may be referred to as a device having an MM (metal mask) structure. In this specification and the like, a device manufactured without using a metal mask or an FMM may be referred to as a device having an MML (metal maskless) structure.

In this specification and the like, a structure where light-emitting layers in light-emitting devices of different colors (here, blue (B), green (G), and red (R)) are separately formed or separately patterned is sometimes referred to as an SBS (Side By Side) structure. The SBS structure can optimize materials and structures of light-emitting devices and thus can extend freedom of choice of materials and structures, whereby the luminance and the reliability can be easily improved.

In this specification and the like, a light-emitting device capable of emitting white light is sometimes referred to as a white-light-emitting device. Note that a combination of white-light-emitting devices with coloring layers (e.g., color filters) enables a full-color display apparatus.

Note that structures of light-emitting devices can be classified roughly into a single structure and a tandem structure. A device having a single structure includes one light-emitting unit between a pair of electrodes, and the light-emitting unit preferably includes one or more light-emitting layers. To obtain white light emission, two or more of light-emitting layers are selected such that their emission colors are complementary. For example, when an emission color of a first light-emitting layer and an emission color of a second light-emitting layer are complementary, the light-emitting device can be configured to emit white light as a whole. In the case of a light-emitting device including three or more light-emitting layers, white light emission can be obtained by mixing emission colors of the light-emitting layers.

A device having a tandem structure includes two or more light-emitting units between a pair of electrodes, and each light-emitting unit preferably includes one or more light-emitting layers. To obtain white light emission, the structure is made so that light from light-emitting layers of the plurality of light-emitting units can be combined to be white light. Note that a structure for obtaining white light emission is similar to that in the case of a single structure. In the device having a tandem structure, an intermediate layer such as a charge generation layer is suitably provided between the plurality of light-emitting units.

When the white-light-emitting device (having a single structure or a tandem structure) and a light-emitting device having an SBS structure are compared to each other, the light-emitting device having an SBS structure can have lower power consumption than the white-light-emitting device. To reduce power consumption, a light-emitting device having an SBS structure is suitably used. Meanwhile, the white-light-emitting device is suitable in terms of lower manufacturing cost or higher manufacturing yield because the manufacturing process of the white-light-emitting device is simpler than that of the light-emitting device having an SBS structure.

In the display apparatus of this embodiment, the distance between the light-emitting devices can be short. Specifically, the distance between the light-emitting devices, the distance between the EL layers, or the distance between the pixel electrodes can be less than 10 μm, less than or equal to 5 μm, less than or equal to 3 μm, less than or equal to 2 μm, less than or equal to 1 μm, less than or equal to 500 nm, less than or equal to 200 nm, less than or equal to 100 nm, less than or equal to 90 nm, less than or equal to 70 nm, less than or equal to 50 nm, less than or equal to 30 nm, less than or equal to 20 nm, less than or equal to 15 nm, or less than or equal to 10 nm. In other words, the display apparatus includes a region where the distance between the side surface of the EL layer 113*a* and the side surface of the EL layer 113*b* or the distance between the side surface of the EL layer 113*b* and the side surface of the EL layer 113*c* is less than or equal to 1 μm, preferably less than or equal to 0.5 μm (500 nm), further preferably less than or equal to 100 nm.

Similarly, in the display apparatus of this embodiment, the distance between the light-receiving devices can be short. Specifically, the distance between the light-receiving devices, the distance between the light-receiving layers, or the distance between the pixel electrodes can be less than 10 μm, less than or equal to 5 μm, less than or equal to 3 μm, less than or equal to 2 μm, less than or equal to 1 μm, less than or equal to 500 nm, less than or equal to 200 nm, less than or equal to 100 nm, less than or equal to 90 nm, less than or equal to 70 nm, less than or equal to 50 nm, less than or equal to 30 nm, less than or equal to 20 nm, less than or equal to 15 nm, or less than or equal to 10 nm. In other words, the display apparatus includes a region where a distance between a side surface of a light-receiving layer and a side surface of a light-receiving layer that are adjacent to each other is less than or equal to 1 μm, preferably less than or equal to 0.5 μm (500 nm), further preferably less than or equal to 100 nm.

In the display apparatus of this embodiment, the distance between the light-emitting device and the light-receiving device can be short. Specifically, the distance between the light-emitting device and the light-receiving device, the distance between the EL layer and the light-receiving layer, or the distance between the pixel electrodes can be less than 20 μm, less than or equal to 10 μm, less than or equal to 5 μm, less than or equal to 3 μm, less than or equal to 2 μm, less than or equal to 1 μm, less than or equal to 500 nm, less than or equal to 200 nm, less than or equal to 100 nm, less than or equal to 90 nm, less than or equal to 70 nm, less than or equal to 50 nm, less than or equal to 30 nm, less than or equal to 20 nm, less than or equal to 15 nm, or less than or equal to 10 nm. In other words, the display apparatus includes a region where the distance between the side surface of the EL layer 113*a* and the side surface of the light-receiving layer 113*d*, the distance between the side surface of the EL layer 113*b* and the side surface of the light-receiving layer 113*d*, or the distance between the side surface of the EL layer 113*c* and the light-receiving layer 113*d* is less than or equal to 1 μm, preferably less than or equal to 0.5 μm (500 nm), further preferably less than or equal to 100 nm.

A light-blocking layer may be provided on the surface of the substrate 120 on the resin layer 122 side. A variety of optical members can be arranged on the outer surface of the substrate 120. Examples of the optical members include a polarizing plate, a retardation plate, a light diffusion layer (a diffusion film or the like), an anti-reflective layer, and a light-condensing film. Furthermore, an antistatic film to inhibit attachment of dust, a water repellent film to reduce attachment of stain, a hard coat film to inhibit generation of a scratch caused by the use, an impact-absorbing layer, or the like may be arranged on the outer surface of the substrate 120.

For the substrate 120, glass, quartz, ceramics, sapphire, a resin, a metal, an alloy, a semiconductor, or the like can be used. The substrate on the side from which light from the light-emitting device is extracted is formed using a material that transmits the light. When the substrate 120 is formed using a flexible material, the flexibility of the display apparatus can be increased. Furthermore, a polarizing plate may be used as the substrate 120.

For the substrate 120, any of the following can be used: polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber. Glass that is thin enough to have flexibility may be used for the substrate 120.

In the case where a circularly polarizing plate overlaps with the display apparatus, a highly optically isotropic substrate is preferably used as the substrate included in the display apparatus. A highly optically isotropic substrate has a low birefringence (in other words, a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of a highly optically isotropic film include a triacetyl cellulose (TAC, also referred to as cellulose triacetate) film, a cycloolefin polymer (COP) film, a cycloolefin copolymer (COC) film, and an acrylic film.

When a film is used for the substrate and the film absorbs water, the shape of the display panel might be changed, e.g., creases are generated. Thus, for the substrate, a film with a low water absorption rate is preferably used. For example, the water absorption rate of the film is preferably lower than or equal to 1%, further preferably lower than or equal to 0.1%, still further preferably lower than or equal to 0.01%.

For the resin layer 122, any of a variety of curable adhesives such as a reactive curable adhesive, a thermosetting curable adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferable. Alternatively, a two-component resin may be used. An adhesive sheet or the like may be used.

As materials that can be used for a gate, a source, and a drain of a transistor and conductive layers such as a variety of wirings and electrodes included in a display apparatus, metals such as aluminum, titanium, chromium, nickel, copper, yttrium, zirconium, molybdenum, silver, tantalum, or tungsten, an alloy containing any of these metals as its main component, and the like can be given. A single layer or a stacked-layer structure including a film containing any of these materials can be used.

As a light-transmitting conductive material, a conductive oxide such as indium oxide, indium tin oxide, indium zinc oxide, zinc oxide, or zinc oxide containing gallium, or graphene can be used. Alternatively, a metal material such as gold, silver, platinum, magnesium, nickel, tungsten, chromium, molybdenum, iron, cobalt, copper, palladium, or titanium, or an alloy material containing the metal material can be used. Further alternatively, a nitride of the metal material (e.g., titanium nitride) or the like may be used. Note that in the case of using the metal material or the alloy material (or the nitride thereof), it is preferably thinned so as to have a light-transmitting property. A stacked film of any of the above materials can be used as a conductive layer. For example, a stacked film of indium tin oxide and an alloy of silver and magnesium, or the like is preferably used to increase the conductivity. They can also be used for conductive layers such as wirings and electrodes included in the display apparatus, and conductive layers (e.g., a conductive layer functioning as a pixel electrode or a common electrode) included in a light-emitting device.

As an insulating material that can be used for each insulating layer, for example, a resin such as an acrylic resin or an epoxy resin, and an inorganic insulating material such as silicon oxide, silicon oxynitride, silicon nitride oxide, silicon nitride, or aluminum oxide can be given.

Note that the display apparatus of one embodiment of the present invention can have a structure including the OS transistor and the light-emitting element having a metal maskless (MML) structure. With this structure, the leakage current that might flow through the transistor and the leakage current that might flow between adjacent light-emitting elements (also referred to as a lateral leakage current, a side leakage current, or the like) can become extremely low. With the structure, a viewer can notice any one or more of the image crispness, the image sharpness, and a high contrast ratio in an image displayed on the display apparatus. Note that when the leakage current that might flow through the transistor and the lateral leakage current between the light-emitting elements are extremely low, light leakage or the like that might occur in black display can be reduced as much as possible (such display is also referred to as completely black display).

<Pixel Layout>

Pixel layouts will be described below. There is no particular limitation on the arrangement of subpixels, and a variety of methods can be employed. Examples of the arrangement of subpixels include stripe arrangement, S stripe arrangement, matrix arrangement, delta arrangement, Bayer arrangement, and PenTile arrangement.

Examples of a top surface shape of the subpixel include polygons such as a triangle, a quadrangle (including a rectangle and a square), and a pentagon; polygons with rounded corners; an ellipse; and a circle. Here, the top surface shape of the subpixel corresponds to the top surface shape of a light-emitting region of a light-emitting device or a light-receiving region of a light-receiving device.

Figure 54A:
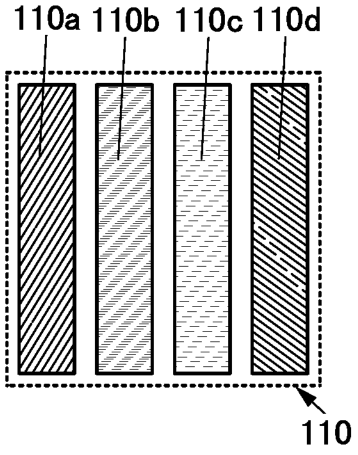
FIG. 54A to FIG. 54I are top views each illustrating an example of a pixel.
Figure 54B:
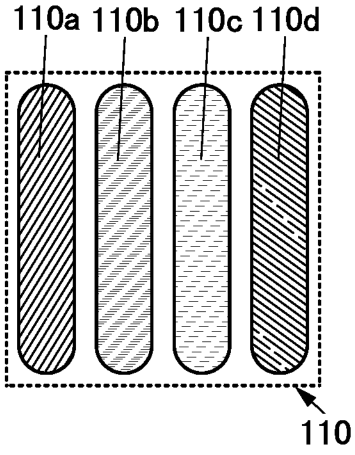
Figure 54C:
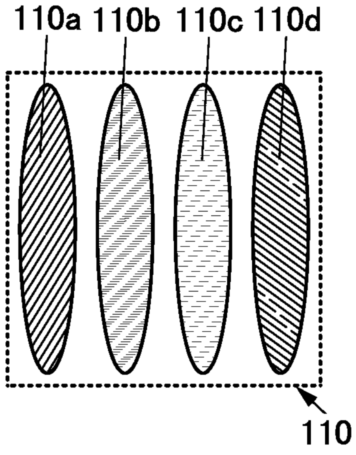

The pixels 110 illustrated in FIG. 54A to FIG. 54C employ stripe arrangement.

The display portion of the display apparatus of one embodiment of the present invention includes a plurality of pixels, and the pixels are arranged in the row direction and the column direction in a matrix. A display portion employing the pixel layout illustrated in FIG. 54A to FIG. 54C includes a first arrangement where the subpixels 110*a*, the subpixels 110*b*, the subpixel 110*c*, and the subpixels 110*d* are repeatedly arranged in this order in the row direction. Furthermore, the first arrangement is repeated in the column direction.

The display portion includes a second arrangement where the subpixels 110*a* are repeatedly arranged in the column direction, a third arrangement where the subpixels 110*b* are repeatedly arranged in the column direction, a fourth arrangement where the subpixels 110*c* are repeatedly arranged in the column direction, and a fifth arrangement where the subpixels 110*d* are repeatedly arranged in the column direction. Furthermore, the second arrangement, the third arrangement, the fourth arrangement, and the fifth arrangement are repeated in this order in the row direction.

In this embodiment and the like, for clear explanation of the pixel layout, the horizontal direction is the row direction and the vertical direction is the column direction in the drawing; however, one embodiment of the present invention is not limited thereto and the row direction and the column direction can be interchangeable with each other. Thus, in this specification and the like, one of the row direction and the column direction is referred to as a first direction and the other of the row direction and the column direction is referred to as a second direction, in some cases. The second direction is orthogonal to the first direction. Note that in the case where the top surface shape of the display portion is a rectangular shape, each of the first direction and the second direction is not necessarily parallel to a straight line portion of the outline of the display portion. The top surface shape is not limited to a rectangular shape, and may be a polygonal shape or a shape with curve (e.g., circle or ellipse). The first direction and the second direction may be a given direction with respect to the display portion.

In this specification and the like, for clear explanation of pixel layout, the subpixels are illustrated in the order from the left of a diagram; however, without limitation thereto, the order can be changed into the order from the right. Similarly, the subpixels are illustrated in the order from the top of a diagram; however, without limitation thereto, the order can be changed into the order from the bottom.

In this specification and the like, "repeatedly arranged" means that a minimum unit of ordered subpixels is arranged twice or more.

FIG. 54A illustrates an example where each subpixel has a rectangular top surface shape, FIG. 54B illustrates an example where each subpixel has a top surface shape formed by combining two half circles and a rectangle, and FIG. 54C illustrates an example where each subpixel has an elliptical top surface shape.

In a photolithography method, as a pattern to be processed becomes finer, the influence of light diffraction becomes more difficult to ignore; thus, the fidelity in transferring a photomask pattern by light exposure is degraded, and it becomes difficult to process a resist mask into a desired shape. Thus, a pattern with rounded corners is likely to be formed even with use of a rectangular photomask pattern. Consequently, the top surface shape of a subpixel becomes a polygon with rounded corners, an ellipse, a circle, or the like, in some cases.

Furthermore, in the manufacturing method of the display apparatus of one embodiment of the present invention, the EL layer or the light-receiving layer is processed into an island-like shape with the use of a resist mask. A resist film formed over the EL layer or the light-receiving layer needs to be cured at a temperature lower than the upper temperature limit of the EL layer or the light-receiving layer. Thus, the resist film is insufficiently cured in some cases depending on the upper temperature limit of the material of the EL layer, the upper temperature limit of the material of the light-receiving layer, or the curing temperature of the resist material. An insufficiently cured resist film may have a shape different from a desired shape at the time of processing. As a result, the top surface shapes of the EL layer and the light-receiving layer each become a polygon with rounded corners, an ellipse, a circle, or the like, in some cases. For example, when a resist mask with a square top surface shape is intended to be formed, a resist mask with a circular top surface shape may be formed, and the EL layer and the light-receiving layer each have a circular top surface shape in some cases.

To obtain a desired top surface shapes of the EL layer and the light-receiving layer, a technique of correcting a mask pattern in advance so that a transferred pattern agrees with a design pattern (an OPC (Optical Proximity Correction) technique) may be used. Specifically, with the OPC technique, a pattern for correction is added to a corner portion or the like of a figure on a mask pattern.

Figure 54D:
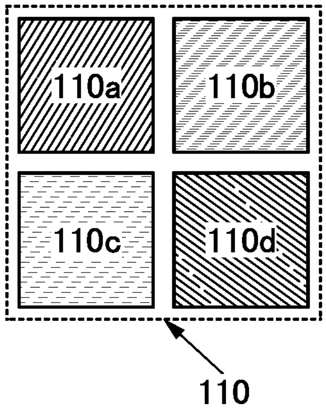
Figure 54E:
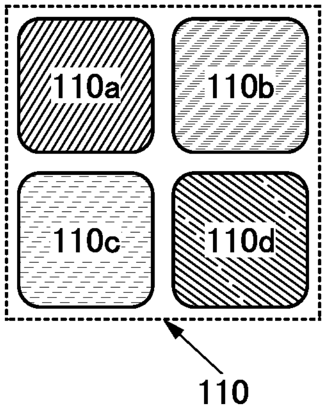
Figure 54F:
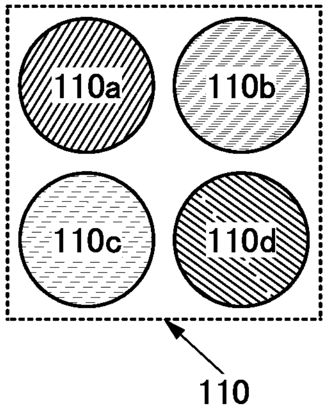

The pixels 110 illustrated in FIG. 54D to FIG. 54F employ matrix arrangement.

A display portion of a display apparatus employing the pixel layout illustrated in FIG. 54D to FIG. 54F includes a first arrangement where the subpixel 110*a* and the subpixel 110*b* are alternately arranged repeatedly in the row direction and a second arrangement where the subpixel 110*c* and the subpixel 110*d* are alternately arranged repeatedly in the row direction. Furthermore, the first arrangement and the second arrangement are repeated in this order in the column direction.

The display portion includes a third arrangement where the subpixel 110*a* and the subpixel 110*c* are alternately arranged repeatedly in the column direction and a fourth arrangement where the subpixel 110*b* and the subpixel 110*d* are alternately arranged repeatedly in the column direction. Furthermore, the third arrangement and the fourth arrangement are alternately repeated in the column direction.

FIG. 54D illustrates an example where each subpixel has a square top surface shape, FIG. 54E illustrates an example where each subpixel has a substantially square top surface shape with rounded corners, and FIG. 54F illustrates an example where each subpixel has a circular top surface shape.

Figure 54G:
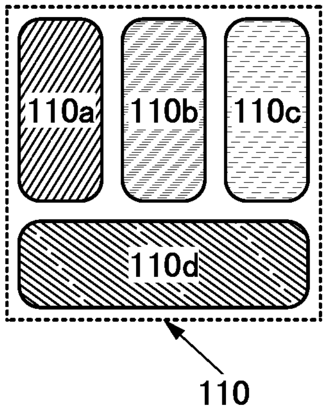

FIG. 54G illustrates an example where one the pixel 110 is composed of two rows and three columns. The pixel 110 includes three subpixels (the subpixel 110*a*, the subpixel 110*b*, and the subpixel 110*c*) in the upper row (first row) and one subpixel (the subpixel 110*d*) in the lower row (second row). In other words, the pixel 110 includes the subpixel 110*a* in the left column (first column), the subpixel 110*b* in the center column (second column), the subpixel 110*c* in the right column (third column), and the subpixel 110*d* across these three columns.

Figure 54H:
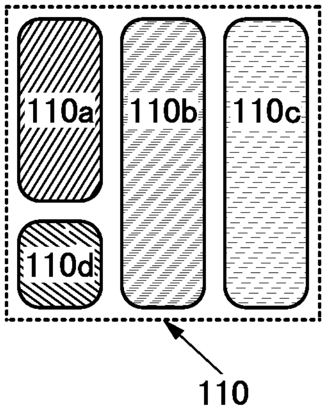

As illustrated in FIG. 54G, the subpixels may have different sizes. FIG. 54G illustrates a structure where the subpixel 110*d* is larger than the subpixel 110*a* to the subpixel 110*c*. FIG. 54H illustrates a structure where the subpixel 110*b* and the subpixel 110*c* are larger than the subpixel 110*a*, and the subpixel 110*a* is larger than the subpixel 110*d*. The pixel 110 illustrated in FIG. 54H includes two subpixels (the subpixels 110*a* and 110*d*) in the left column (first column), the subpixel 110*b* in the center column (second column), and the subpixel 110*c* in the right column (third column).

A display portion of a display apparatus employing the pixel layout illustrated in FIG. 54G includes a first arrangement where the subpixels 110*a*, the subpixels 110*b*, and the subpixels 110*c* are repeatedly arranged in this order in the row direction and a second arrangement where the subpixels 110*d* are repeatedly arranged in the row direction. Furthermore, the first arrangement and the second arrangement are alternately repeated in the column direction.

The display portion includes a third arrangement where the subpixels 110*a* and the subpixels 110*d* are alternately arranged repeatedly in the column direction, a fourth arrangement where the subpixels 110*b* and the subpixels 110*d* are alternately arranged repeatedly in the column direction, and a fifth arrangement where the subpixels 110*c* and the subpixels 110*d* are alternately arranged repeatedly in the column direction. Furthermore, the third arrangement, the fourth arrangement, and the fifth arrangement are repeated in this order in the row direction.

A display portion of a display apparatus employing the pixel layout illustrated in FIG. 54H includes a first arrangement where the subpixels 110*a*, the subpixels 110*b*, and the subpixels 110*c* are repeatedly arranged in this order in the row direction and a second arrangement where the subpixels 110*d*, the subpixels 110*b*, and the subpixels 110*c* are repeatedly arranged in this order in the row direction. Furthermore, the first arrangement and the second arrangement are alternately repeated in the column direction.

The display portion includes a third arrangement where the subpixels 110*a* and the subpixels 110*d* are alternately arranged repeatedly in the column direction, a fourth arrangement where the subpixels 110*b* are repeatedly arranged in the column direction, and a fifth arrangement where the subpixels 110*c* are repeatedly arranged in the column direction. Furthermore, the third arrangement, the fourth arrangement, and the fifth arrangement are repeated in this order in the row direction.

Figure 54I:
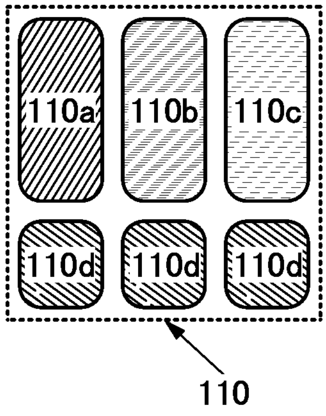

FIG. 54I illustrates an example where one pixel 110 is composed of two rows and three columns. The pixel 110 includes the subpixel 110*a*, the subpixel 110*b*, the subpixel 110*c*, and three subpixels 110*d*. The pixel 110 includes three subpixels (the subpixels 110*a*, 110*b*, and 110*c*) in the upper row (first row) and three subpixels (the three subpixels 110*d*) in the lower row (second row). In other words, the pixel 110 includes two subpixels (the subpixels 110*a* and 110*d*) in the left column (first column), two subpixels (the subpixels 110*b* and 110*d*) in the center column (second column), and two subpixels (the subpixels 110*c* and 110*d*) in the right column (third column).

A display portion of a display apparatus employing the pixel layout illustrated in FIG. 54I includes a first arrangement where the subpixels 110*a*, the subpixels 110*b*, and the subpixels 110*c* are repeatedly arranged in this order in the row direction and a second arrangement where the subpixels 110*d* are repeatedly arranged in the row direction. Furthermore, the first arrangement and the second arrangement are alternately repeated in the column direction.

The display portion includes a third arrangement where the subpixels 110*a* and the subpixels 110*d* are alternately arranged repeatedly in the column direction, a fourth arrangement where the subpixels 110*b* and the subpixels 110*d* are alternately arranged repeatedly in the column direction, and a fifth arrangement where the subpixels 110*c* and the subpixels 110*d* are alternately arranged repeatedly in the column direction. Furthermore, the third arrangement, the fourth arrangement, and the fifth arrangement are repeated in this order in the row direction.

The pixels 110 illustrated in FIG. 54A to FIG. 54I are each composed of four subpixels: the subpixel 110*a*, the subpixel 110*b*, the subpixel 110*c*, and the subpixel 110*d*. The subpixels 110*a*, 110*b*, 110*c*, and 110*d* each include a light-emitting device emitting light in a different wavelength range or a light-receiving device. For example, as illustrated in FIG. 55A to FIG. 55E, the subpixel 110*a* can be a subpixel (R) having a function of emitting red light, the subpixel 110*b* can be a subpixel (G) having a function of emitting green light, the subpixel 110*c* can be a subpixel (B) having a function of emitting blue light, and the subpixel 110*d* can be a subpixel (PS) having a light-receiving function.

Figure 55A:
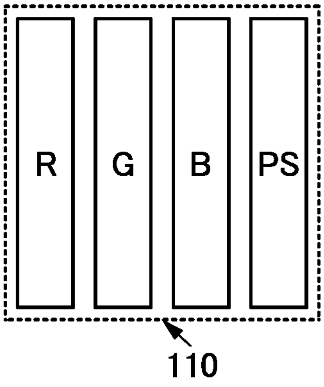
FIG. 55A to FIG. 55E are top views each illustrating an example of a pixel.

A pixel portion employing the pixel layout illustrated in FIG. 55A includes a first arrangement where the subpixel (R), the subpixel (G), the subpixel (B), and the subpixel (PS) are repeatedly arranged in this order in the row direction. Furthermore, the first arrangement is repeated in the column direction.

The display portion includes a second arrangement where the subpixels (R) are repeatedly arranged in the column direction, a third arrangement where the subpixels (G) are repeatedly arranged in the column direction, a fourth arrangement where the subpixels (B) are repeatedly arranged in the column direction, and a fifth arrangement where the subpixels (PS) are repeatedly arranged in the column direction. Furthermore, the second arrangement, the third arrangement, the fourth arrangement, and the fifth arrangement are repeated in this order in the row direction.

Figure 55B:
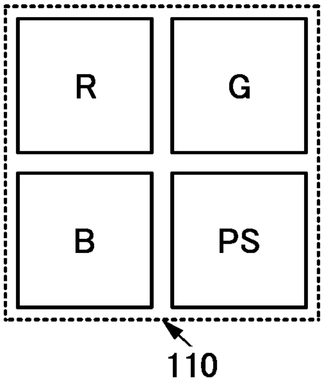

A display portion of a display apparatus employing the pixel layout illustrated in FIG. 55B includes a first arrangement where the subpixels (R) and the subpixels (G) are alternately arranged repeatedly in the row direction and a second arrangement where the subpixels (B) and the subpixels (PS) are alternately arranged repeatedly in the row direction. Furthermore, the first arrangement and the second arrangement are repeated in this order in the column direction.

The display portion includes a third arrangement where the subpixels (R) and the subpixels (B) are alternately arranged repeatedly in the column direction and a fourth arrangement where the subpixels (G) and the subpixels (PS) are alternately arranged repeatedly in the column direction. Furthermore, the third arrangement and the fourth arrangement are alternately repeated in the row direction.

Figure 55C:
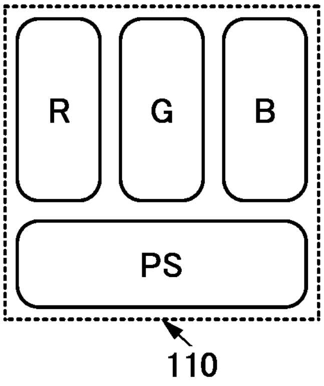

A display portion of a display apparatus employing the pixel layout illustrated in FIG. 55C includes a first arrangement where the subpixels (R), the subpixels (G), and the subpixels (B) are repeatedly arranged in this order in the row direction and a second arrangement where the subpixels (PS) are repeatedly arranged in the row direction. Furthermore, the first arrangement and the second arrangement are alternately repeated in the column direction.

The display portion includes a third arrangement where the subpixels (R) and the subpixels (PS) are alternately arranged repeatedly in the column direction, a fourth arrangement where the subpixels (G) and the subpixels (PS) are alternately arranged repeatedly in the column direction, and a fifth arrangement where the subpixels (B) and the subpixels (PS) are alternately arranged repeatedly in the column direction. Furthermore, the third arrangement, the fourth arrangement, and the fifth arrangement are repeated in this order in the row direction.

Figure 55D:
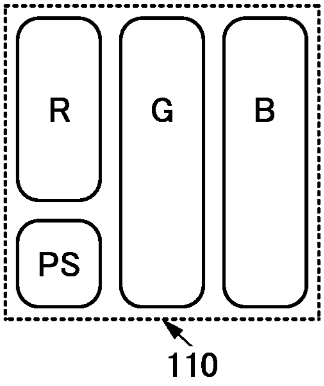

A display portion of a display apparatus employing the pixel layout illustrated in FIG. 55D includes a first arrangement where the subpixels (R), the subpixels (G), and the subpixels (B) are repeatedly arranged in this order in the row direction, and a second arrangement where the subpixels (PS), the subpixels (G), and the subpixels (B) are repeatedly arranged in this order in the row direction. Furthermore, the first arrangement and the second arrangement are alternately repeated in the column direction.

The display portion includes a third arrangement where the subpixels (R) and the subpixels (PS) are alternately arranged repeatedly in the column direction, a fourth arrangement where the subpixels (G) are repeatedly arranged in the column direction, and a fifth arrangement where the subpixels (B) are repeatedly arranged in the column direction. Furthermore, the third arrangement, the fourth arrangement, and the fifth arrangement are repeated in this order in the row direction.

Figure 55E:
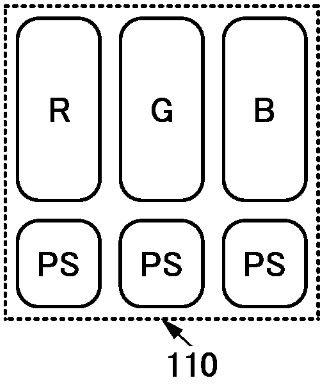

A display portion of a display apparatus employing the pixel layout illustrated in FIG. 55E includes a first arrangement where the subpixels (R), the subpixels (G), and the subpixels (B) are repeatedly arranged in this order in the row direction, and a second arrangement where the subpixels (PS) are repeatedly arranged in the row direction. Furthermore, the first arrangement and the second arrangement are alternately repeated in the column direction.

The display portion includes a third arrangement where the subpixels (R) and the subpixels (PS) are alternately arranged repeatedly in the column direction, a fourth arrangement where the subpixels (G) and the subpixels (PS) are alternately arranged repeatedly in the column direction, and a fifth arrangement where the subpixels (B) and the subpixels (PS) are alternately arranged repeatedly in the column direction. Furthermore, the third arrangement, the fourth arrangement, and the fifth arrangement are repeated in this order in the row direction.

The light-emitting areas of the subpixel (R), the subpixel (G), and the subpixel (B) including the light-emitting devices may be the same or different from each other. For example, the light-emitting area of the subpixel including the light-emitting device can be determined depending on the lifetime of the light-emitting device. The light-emitting area of the light-emitting device with a short lifetime is preferably made larger than the light-emitting areas of the other subpixels.

FIG. 55D illustrates an example where the light-emitting areas of the subpixel (G) and the subpixel (B) are larger than the light-emitting area of the subpixel (R). This structure can be suitably used in the case where the lifetimes of the light-emitting device emitting green light and the light-emitting device emitting blue light are shorter than the lifetime of the light-emitting device emitting red light. In the subpixel (G) and the subpixel (B) each having a large light-emitting area, the current densities of the light-emitting device emitting green light and the light-emitting device emitting blue light included in the subpixels are low, enabling longer lifetimes of the light-emitting devices. That is, the display apparatus can have high reliability.

Figure 56A:
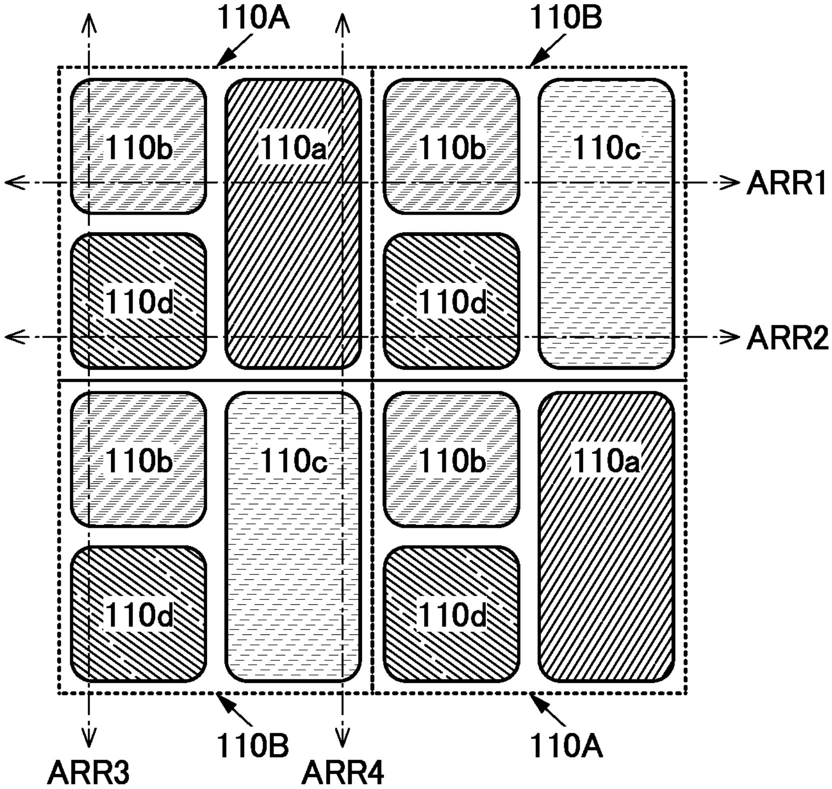
FIG. 56A to FIG. 56B are top views each illustrating an example of a pixel.
Figure 56B:
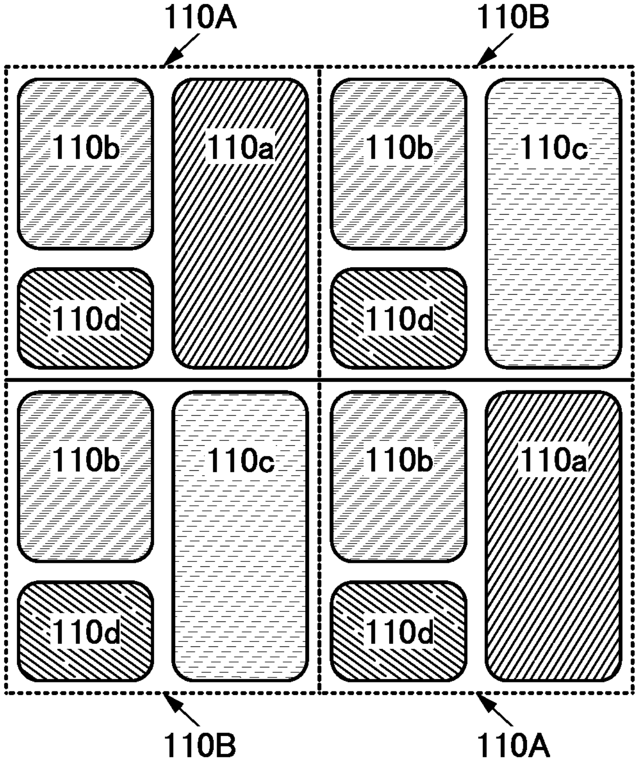

FIG. 56A and FIG. 56B illustrate pixel layout examples different from those in FIG. 54A to FIG. 54I and FIG. 55A to FIG. 55E.

FIG. 56A illustrates four pixels; in the illustrated structure, a pixel 110A and a pixel 110B that are adjacent to each other include different subpixels. The pixel 110A includes three subpixels of the subpixel 110*a*, the subpixel 110*b*, and the subpixel 110*d*, and the pixel 110B adjacent to the pixel 110A includes the subpixel 110*b*, the subpixel 110*c*, and the subpixel 110*d*. That is, the pixels 110A including the subpixel 110*a* and the pixel 110B not including the subpixels 110*a* are alternately arranged repeatedly in the column direction and the row direction. Similarly, the pixels 110A not including the subpixel 110*c* and the pixels 110B including the subpixel 110*c* are alternately arranged repeatedly in the column direction and the row direction.

The pixel 110A is composed of two rows and two columns, and includes two subpixels (the subpixels 110*b* and 110*d*) in the left column (first column) and one subpixel (the subpixel 110*a*) in the right column (second column). In other words, the pixel 110A includes two subpixels (the subpixels 110*a* and 110*b*) in the upper row (first row), two subpixels (the subpixels 110*a* and 110*d*) in the lower row (second row), and the subpixel 110*a* across these two rows.

The pixel 110B is composed of two rows and two columns, and includes two subpixels (the subpixels 110*b* and 110*d*) in the left column (first column) and one subpixel (the subpixel 110*c*) in the right column (second column). In other words, the pixel 110A includes two subpixels (the subpixels 110*b* and 110*c*) in the upper row (first row), two subpixels (the subpixels 110*c* and 110*d*) in the lower row (second row), and the subpixel 110*c* across these two rows.

The pixels illustrated in FIG. 56A have a structure where two pixels of the pixel 110A and the pixel 110B include four kinds of subpixels of the subpixel 110*a*, the subpixel 110*b*, the subpixel 110*c*, and the subpixel 110*d*. The two pixels of the pixel 110A and the pixel 110B include one subpixel 110*a*, two subpixels 110*b*, one subpixel 110*c*, and two subpixels 110*d*. Such a structure can increase the areas of the subpixels while maintaining a pseudo-high definition, thereby lowering the required processing accuracy. That is, when comparison is made with the same processing accuracy, a display apparatus having a higher definition can be manufactured. In addition, the number of transistors per area can be reduced, whereby the productivity can be increased. Accordingly, a display apparatus having a pseudo-high definition can be manufactured with high productivity.

A display portion of a display apparatus employing the pixel layout illustrated in FIG. 56A includes a first arrangement ARR1 where the subpixels 110*b*, the subpixels 110*a*, the subpixels 110*b*, and the subpixels 110*c* are repeatedly arranged in this order in the row direction, and a second arrangement ARR2 where the subpixels 110*d*, the subpixels 110*a*, the subpixels 110*d*, and the subpixels 110*c* are repeatedly arranged in this order in the row direction. Furthermore, the first arrangement ARR1 and the second arrangement ARR2 are alternately repeated in the column direction.

The display portion includes a third arrangement ARR3 where the subpixels 110*b* and the subpixels 110*d* are alternately arranged repeatedly in the column direction, and a fourth arrangement ARR4 where the subpixels 110*a* and the subpixels 110*c* are alternately arranged repeatedly in the column direction. Furthermore, the third arrangement ARR3 and the fourth arrangement ARR4 are alternately repeated in the row direction.

It is preferable that the subpixel 110*a* have a larger area than both the subpixel 110*b* and the subpixel 110*d* in the pixel 110A, and the subpixel 110*c* have a larger area than both the subpixel 110*b* and the subpixel 110*d* in the pixel 110B. Furthermore, the subpixel having the largest area in the pixel 110A (here, the subpixel 110*a*) is preferably different from the subpixel having the largest area in the pixel 110B (here, the subpixel 110*c*).

Note that in this specification and the like, the light-emitting area in a subpixel including a light-emitting device is sometimes referred to as an area of the subpixel. Similarly, the light-receiving area in a subpixel including a light-receiving device is sometimes referred to as an area of the subpixel.

Although FIG. 56A illustrates the subpixel 110*a* and the subpixel 110*c* having the same area and the subpixel 110*b* and the subpixel 110*d* having the same area, one embodiment of the present invention is not limited thereto. The subpixel 110*a* and the subpixel 110*c* may have different areas. The subpixel 110*b* and the subpixel 110*d* may have different areas. FIG. 56B illustrates an example where the area of the subpixel 110*b* is larger than the area of the subpixel 110*d*. Note that between the pixel 110A and the pixel 110B, the area of the subpixel 110*b* may be different or the area of the subpixel 110*d* may be different.

It is preferable that the subpixel 110*a*, the subpixel 110*b*, and the subpixel 110*c* include light-emitting devices emitting light in different wavelength ranges, and the subpixel 110*d* include alight-receiving device. For example, as illustrated in FIG. 57A and FIG. 57B, the subpixel 110*a* can be the subpixel (R) having a function of emitting red light, the subpixel 110*b* can be the subpixel (G) having a function of emitting green light, the subpixel 110*c* can be the subpixel (B) having a function of emitting blue light, and the subpixel 110*d* can be the subpixel (PS) having a light-receiving function.

One pixel can include light-emitting devices of two colors among the light-emitting devices of three colors of red (R), green (G), and blue (B). The light-receiving device can be provided in any of the pixels. FIG. 57A and FIG. 57B each illustrate a structure where the pixel 110A includes the subpixel (R) having a function of emitting red light, the subpixel (G) having a function of emitting green light, and the subpixel (PS) having a light-receiving function, and the pixel 110B includes the subpixel (B) having a function of emitting blue light, the subpixel (G) having a function of emitting green light, and the subpixel (PS) having a light-receiving function.

Figure 57A:
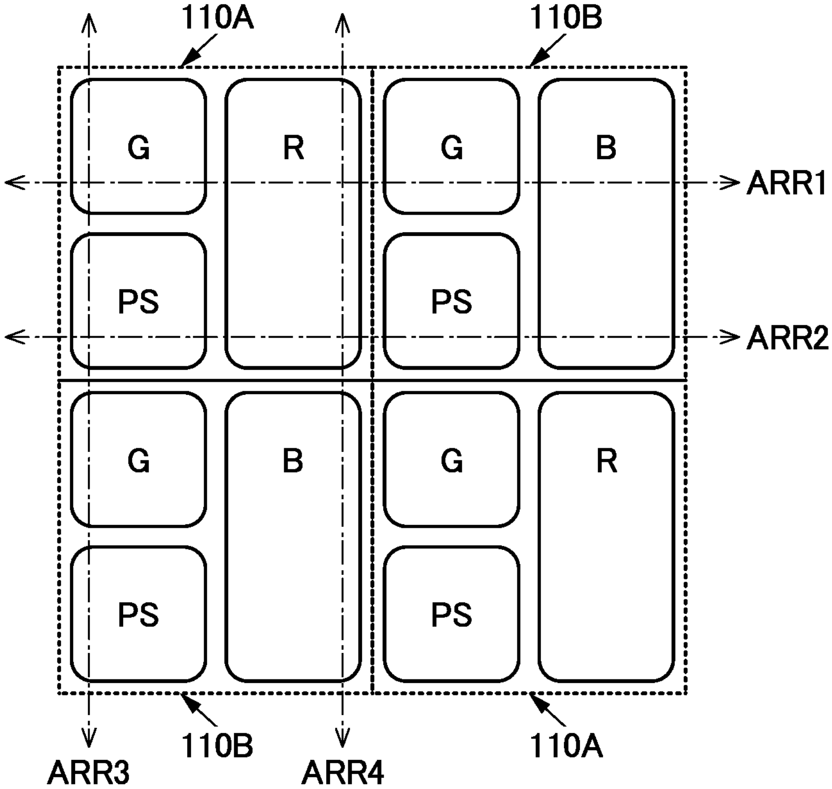
FIG. 57A and FIG. 57B are top views each illustrating an example of a pixel.
Figure 57B:
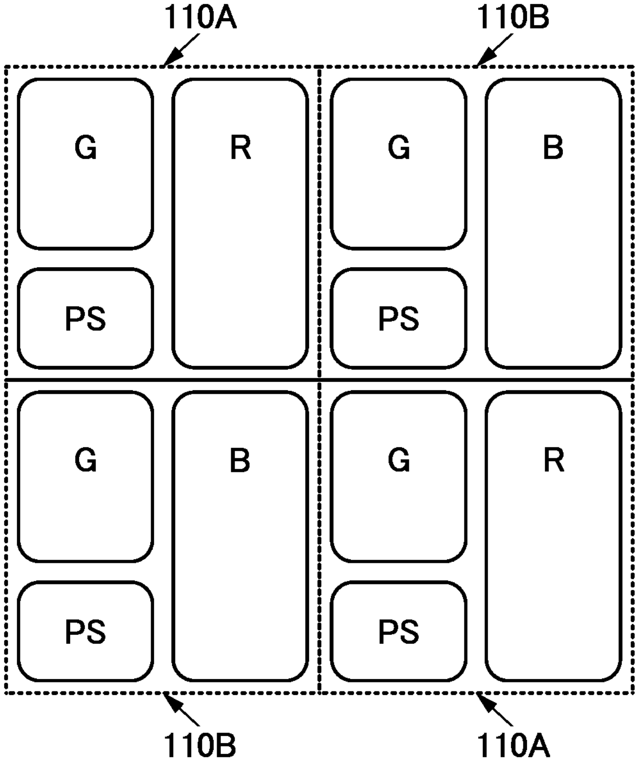

A display portion of a display apparatus employing the pixel layout illustrated in FIG. 57A and FIG. 57B includes the first arrangement ARR1 where the subpixels (G), the subpixels (R), the subpixels (G), and the subpixels (B) are repeatedly arranged in this order in the row direction, and the second arrangement ARR2 where the subpixel (PS), the subpixel (R), the subpixel (PS), and the subpixel (B) are repeatedly arranged in this order in the row direction. Furthermore, the first arrangement ARR1 and the second arrangement ARR2 are alternately repeated in the column direction.

The display portion includes the third arrangement ARR3 where the subpixels (G) and the subpixels (PS) are alternately arranged repeatedly in the column direction, and the fourth arrangement ARR4 where the subpixels (R) and the subpixels (B) are alternately arranged repeatedly in the column direction. Furthermore, the third arrangement ARR3 and the fourth arrangement ARR4 are alternately repeated in the row direction.

Although FIG. 57A and FIG. 57B each illustrate an example where the pixel 110A and the pixel 110B are each provided with the subpixel (PS) including the light-receiving device, one embodiment of the present invention is not limited thereto. In the case where the light-receiving function does not need high accuracy, a pixel not including the subpixel (PS) may be provided. That is, a structure may be employed where a pixel including the subpixel (PS) and a pixel not including the subpixel (PS) are provided.

As illustrated in FIG. 57A and FIG. 57B, the area of the subpixel (G) having a function of emitting green light is preferably smaller than the areas of both the subpixel (R) having a function of emitting red light and the subpixel (B) having a function of emitting blue light. The luminous efficiency function of human with respect to green is higher than that with respect to red and blue; thus, when the area of the subpixel (G) is smaller than the areas of the subpixel (R) and the subpixel (B), a display apparatus with high visibility and a good balance of red (R), green (G), and blue (B) can be obtained.

Although FIG. 57A and FIG. 57B each illustrate a structure where the area of the subpixel (G) is smaller than the areas of the subpixel (R) and the subpixel (B), one embodiment of the present invention is not limited thereto. For example, a structure may be employed where the area of the subpixel (R) is smaller than the areas of the subpixel (G) and the subpixel (B). Note that as described above, the areas of the subpixels including the light-emitting devices may be determined depending on the lifetimes of the light-emitting devices of different colors.

Figure 58A:
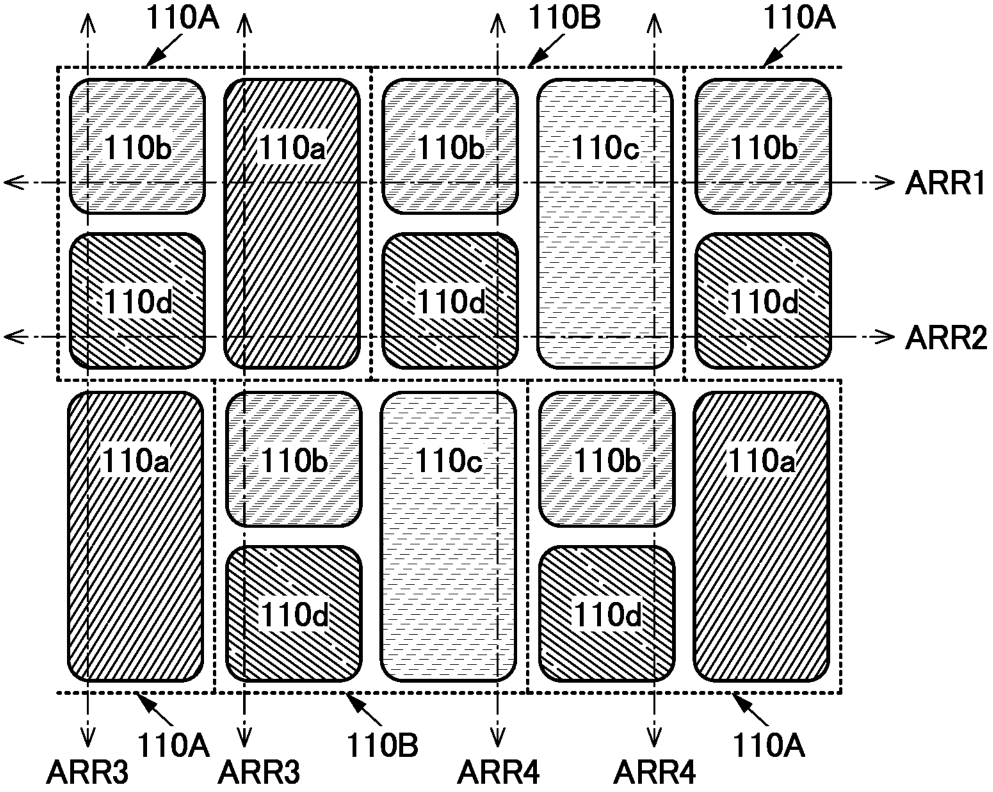
FIG. 58A and FIG. 58B are top views each illustrating an example of a pixel.
Figure 58B:
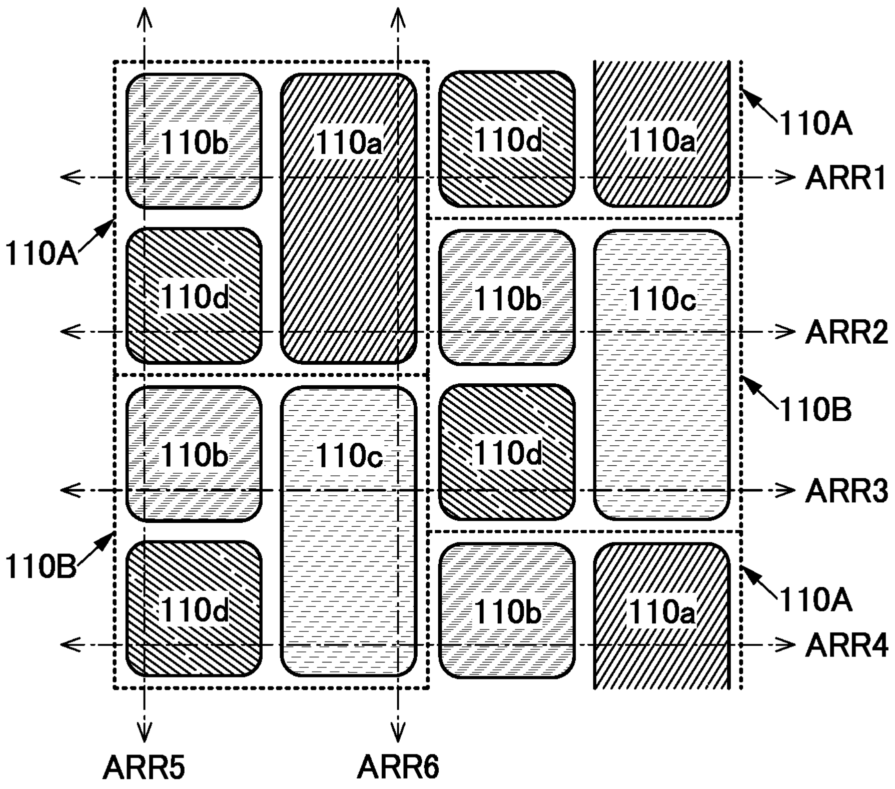

FIG. 58A and FIG. 58B illustrate modification examples of FIG. 56A.

A display portion of a display apparatus employing the pixel layout illustrated in FIG. 58A includes the first arrangement ARR1 where the subpixels 110*b*, the subpixels 110*a*, the subpixels 110*b*, and the subpixels 110*c* are repeatedly arranged in this order in the row direction, and the second arrangement ARR2 where the subpixels 110*d*, the subpixels 110*a*, the subpixels 110*d*, and the subpixels 110*c* are repeatedly arranged in this order in the row direction. Furthermore, the first arrangement ARR1 and the second arrangement ARR2 are alternately repeated in the column direction.

The display portion includes the third arrangement ARR3 where the subpixels 110*b*, the subpixels 110*d*, and the subpixels 110*a* are repeatedly arranged in this order in the column direction, and the fourth arrangement ARR4 where the subpixels 110*b*, the subpixels 110*d*, and the subpixels 110*c* are repeatedly arranged in this order in the column direction. Furthermore, the third arrangement ARR3, the third arrangement ARR3, the fourth arrangement ARR4, and the fourth arrangement ARR4 are repeated in this order in the row direction.

A display portion of a display apparatus employing the pixel layout illustrated in FIG. 58B includes the first arrangement ARR1 where the subpixels 110*b*, the subpixels 110*a*, the subpixels 110*d*, and the subpixels 110*a* are repeatedly arranged in this order in the row direction, the second arrangement ARR2 where the subpixels 110*d*, the subpixels 110*a*, the subpixels 110*b*, and the subpixels 110*c* are repeatedly arranged in this order in the row direction, the third arrangement ARR3 where the subpixels 110*b*, the subpixels

110*c*, the subpixels 110*d*, and the subpixels 110*c* are repeatedly arranged in this order in the row direction, and the fourth arrangement ARR4 where the subpixels 110*d*, the subpixels 110*c*, the subpixels 110*b*, and the subpixels 110*a* are repeatedly arranged in this order in the row direction. Furthermore, the first arrangement ARR1, the second arrangement ARR2, the third arrangement ARR3, and the fourth arrangement ARR4 are repeated in this order in the column direction.

The display portion includes a fifth arrangement ARR5 where the subpixels 110*b* and the subpixels 110*d* are alternately arranged repeatedly in the column direction, and a sixth arrangement ARR6 where the subpixels 110*a* and the subpixels 110*c* are alternately arranged repeatedly in the column direction. Furthermore, the fifth arrangement ARR5 and the sixth arrangement ARR6 are alternately repeated in the row direction.

Figure 59A:
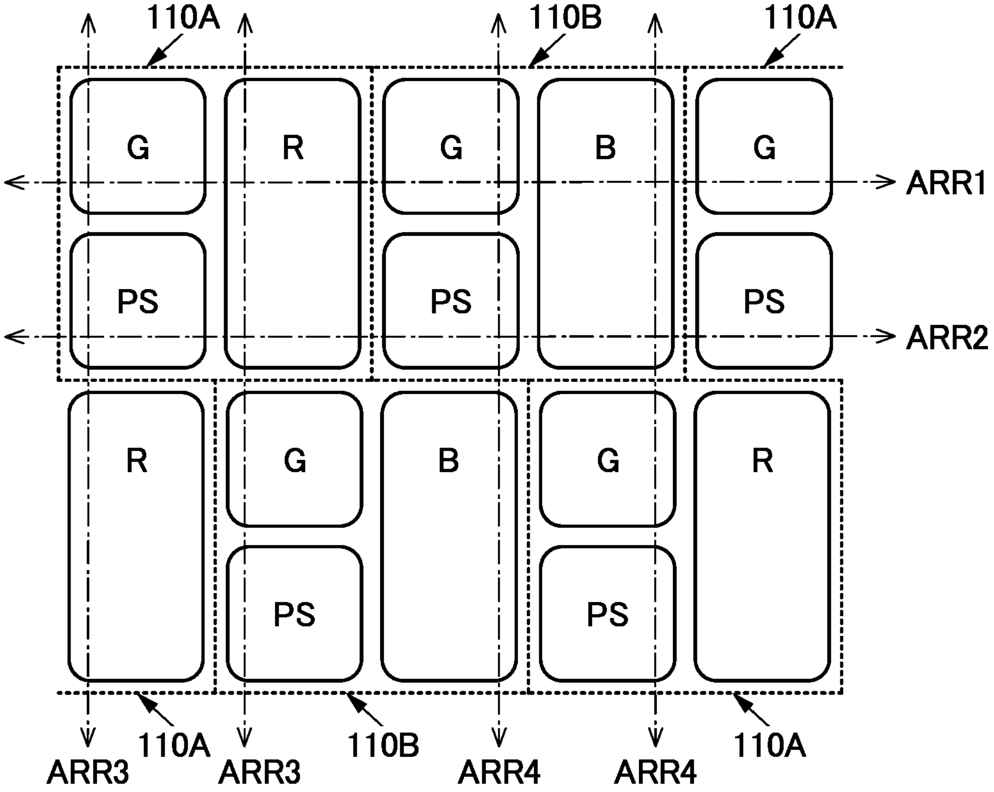
FIG. 59A and FIG. 59B are top views each illustrating an example of a pixel.
Figure 59B:
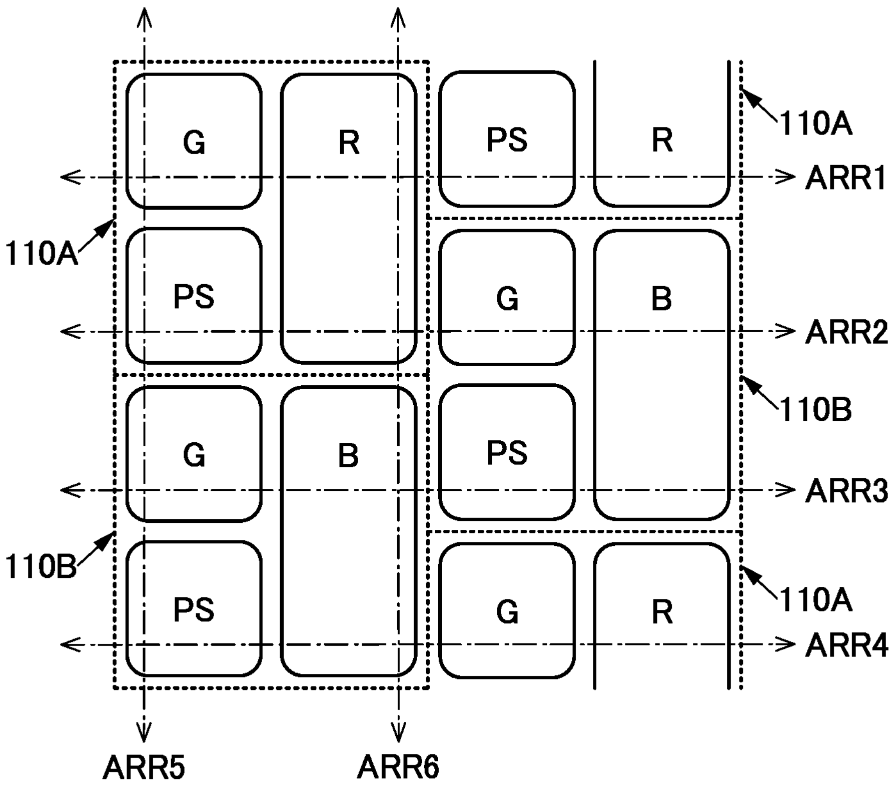

FIG. 59A and FIG. 59B illustrate structure examples where the subpixel (R) having a function of emitting red light is used as the subpixel 110*a*, the subpixel (G) having a function of emitting green light is used as the subpixel 110*b*, the subpixel (B) having a function of emitting blue light is used as the subpixel 110*c*, and the subpixel (PS) having a light-receiving function is used as the subpixel 110*d* in FIG. 58A and FIG. 58B.

A display portion of a display apparatus employing the pixel layout illustrated in FIG. 59A includes the first arrangement ARR1 where the subpixels (G), the subpixels (R), the subpixels (G), and the subpixels (B) are repeatedly arranged in this order in the row direction, and the second arrangement ARR2 where the subpixels (PS), the subpixels (R), the subpixels (PS), and the subpixels (B) are repeatedly arranged in this order in the row direction. Furthermore, the first arrangement ARR1 and the second arrangement ARR2 are alternately repeated in the column direction.

The display portion includes the third arrangement ARR3 where the subpixels (G), the subpixels (PS), and the subpixels (R) are repeatedly arranged in this order in the column direction, and the fourth arrangement ARR4 where the subpixels (G), the subpixels (PS), and the subpixels (B) are repeatedly arranged in this order in the column direction. Furthermore, the third arrangement ARR3, the third arrangement ARR3, the fourth arrangement ARR4, and the fourth arrangement ARR4 are repeated in this order in the row direction.

A display portion of a display apparatus employing the pixel layout illustrated in FIG. 59B includes the first arrangement ARR1 where the subpixels (G), the subpixels (R), the subpixels (PS), and the subpixels (R) are repeatedly arranged in this order in the row direction, the second arrangement ARR2 where the subpixels (PS), the subpixels (R), the subpixels (G), and the subpixels (B) are repeatedly arranged in this order in the row direction, the third arrangement ARR3 where the subpixels (G), the subpixels (B), the subpixels (PS), and the subpixels (B) are repeatedly arranged in this order in the row direction, and the fourth arrangement ARR4 where the subpixels (PS), the subpixels (B), the subpixels (G), and the subpixels (R) are repeatedly arranged in this order in the row direction. Furthermore, the first arrangement ARR1, the second arrangement ARR2, the third arrangement ARR3, and the fourth arrangement ARR4 are repeated in this order in the column direction.

The display portion includes the fifth arrangement ARR5 where the subpixels (G) and the subpixels (PS) are alternately arranged repeatedly in the column direction, and the sixth arrangement ARR6 where the subpixels (R) and the subpixels (B) are alternately arranged repeatedly in the column direction. Furthermore, the fifth arrangement ARR5 and the sixth arrangement ARR6 are alternately repeated in the row direction.

Figure 60A:
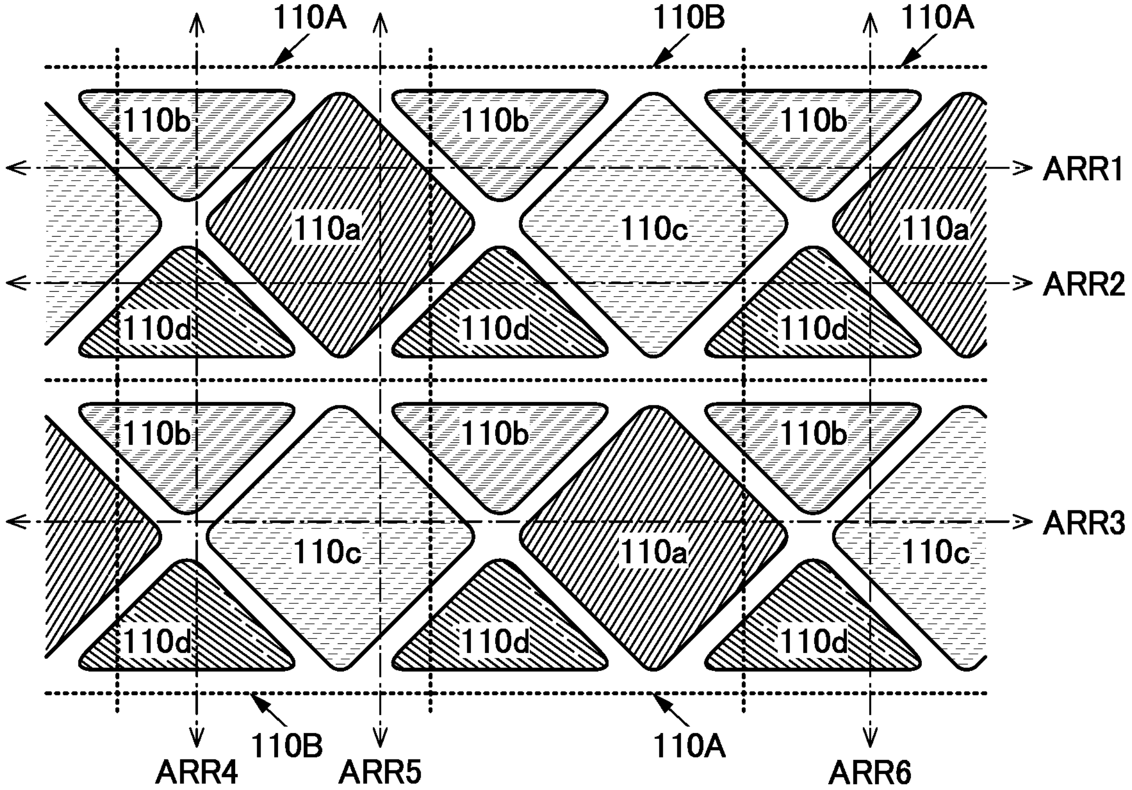
FIG. 60A and FIG. 60B are top views each illustrating an example of a pixel.

FIG. 60A illustrates a modification example of FIG. 59A.

A display portion of a display apparatus employing the pixel layout illustrated in FIG. 60A includes the first arrangement ARR1 where the subpixels 110*b*, the subpixels 110*a*, the subpixels 110*b*, and the subpixels 110*c* are repeatedly arranged in this order in the row direction, and the second arrangement ARR2 where the subpixels 110*d*, the subpixels 110*a*, the subpixels 110*d*, and the subpixels 110*c* are repeatedly arranged in this order in the row direction. Furthermore, the first arrangement ARR1 and the second arrangement ARR2 are alternately repeated in the column direction. The display portion may further include the third arrangement ARR3 where the subpixels 110*a* and the subpixels 110*c* are alternately arranged repeatedly in the row direction. Note that the pixel layout illustrated in FIG. 60A may be referred to as a diamond layout.

The display portion includes the fourth arrangement ARR4 where the subpixels 110*b* and the subpixels 110*d* are alternately arranged repeatedly in the column direction, and the fifth arrangement ARR5 where the subpixels 110*a* and the subpixels 110*c* are alternately arranged repeatedly in the column direction. Furthermore, the fourth arrangement ARR4 and the fifth arrangement ARR5 are alternately repeated in the row direction. The display portion may further include the sixth arrangement ARR6 where the subpixels 110*b*, the subpixels 110*a*, the subpixels 110*d*, the subpixels 110*b*, the subpixels 110*c*, and the subpixels 110*d* are repeatedly arranged in this order in the column direction.

Although FIG. 60A illustrates a structure where the top surface shapes of the subpixel 110*a* and the subpixel 110*c* are quadrangles with rounded corners and the top surface shapes of the subpixel 110*b* and the subpixel 110*d* are triangles with rounded corners, there is no particular limitation on the top surface shapes of the subpixels. For example, the top surface shapes of the subpixel 110*b* and the subpixel 110*d* may be quadrangles with rounded corners or may be circles.

Figure 60B:
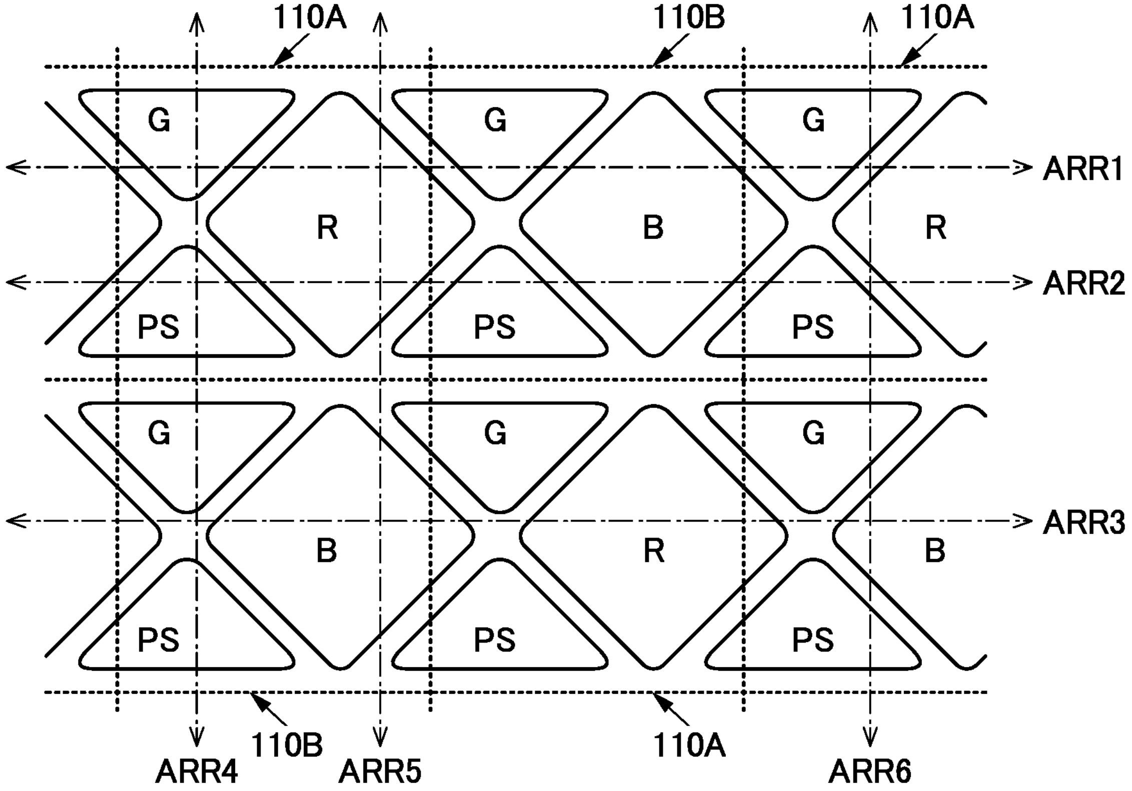

FIG. 60B illustrates a structure example where the subpixel (R) having a function of emitting red light is used as the subpixel 110*a*, the subpixel (G) having a function of emitting green light is used as the subpixel 110*b*, the subpixel (B) having a function of emitting blue light is used as the subpixel 110*c*, and the subpixel (PS) having a light-receiving function is used as the subpixel 110*d* in FIG. 60A.

A display portion of a display apparatus employing the pixel layout illustrated in FIG. 60B includes the first arrangement ARR1 where the subpixels (G), the subpixels (R), the subpixels (G), and the subpixels (B) are repeatedly arranged in this order in the row direction, and the second arrangement ARR2 where the subpixels (PS), the subpixels (R), the subpixels (PS), and the subpixels (B) are repeatedly arranged in this order in the row direction. The display portion may include the third arrangement ARR3 where the subpixels (R) and the subpixels (B) are alternately arranged repeatedly in the row direction.

The display portion includes the fourth arrangement ARR4 where the subpixels (G), the subpixels (R), the subpixels (PS), the subpixels (G), the subpixels (B), and the subpixels (PS) are repeatedly arranged in this order in the column direction. The display portion may include the fifth arrangement ARR5 where the subpixels (R) and the subpixels (B) are alternately arranged repeatedly in the column direction, and may include the sixth arrangement ARR6 where the subpixels (G) and the subpixels (PS) are alternately arranged repeatedly in the column direction.

Structure Example 2 of Display Apparatus

Figure 61A:
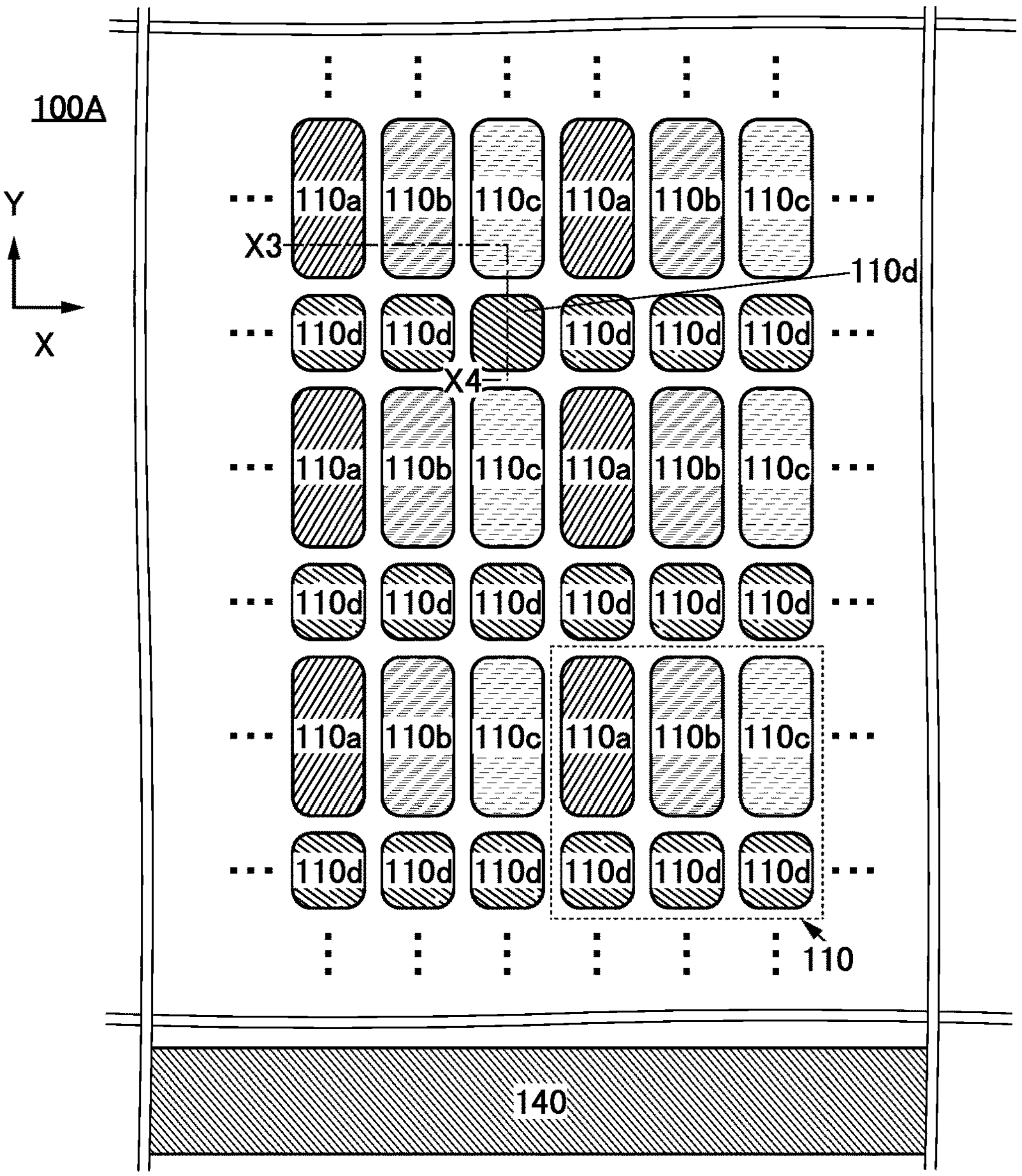
FIG. 61A is a top view illustrating an example of a display apparatus.
Figure 61B:
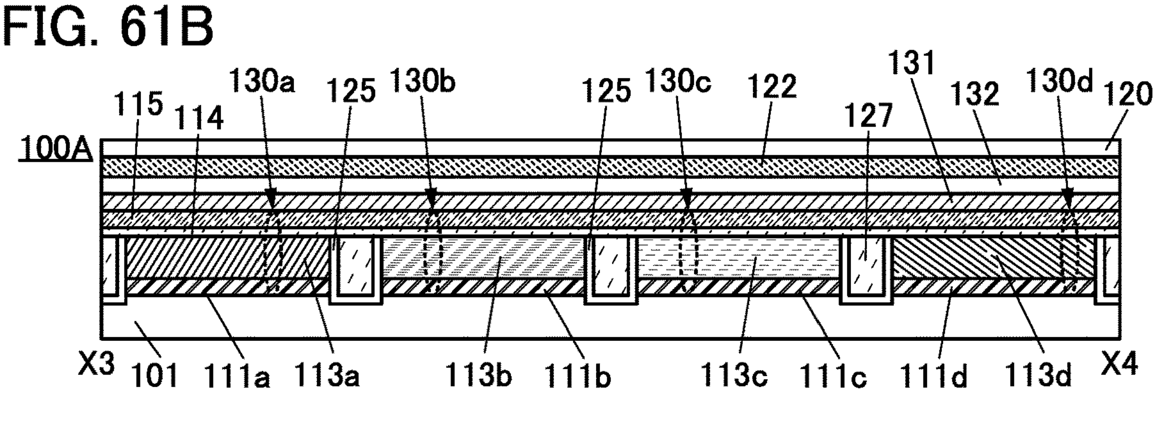
FIG. 61B is a cross-sectional view illustrating an example of the display apparatus.

FIG. 61A and FIG. 61B illustrate a structure example different from that of the display apparatus 100.

FIG. 61A is a top view of a display apparatus 100A. FIG. 61B illustrates a cross-sectional view along a dashed-dotted line X3-X4 in FIG. 61A. The display apparatus 100A is an example where the arrangement of the pixel 110 illustrated in FIG. 54I is employed.

<Manufacturing Method Example of Display Apparatus>

Next, a manufacturing method example of a display apparatus is described with reference to FIG. 62 to FIG. 71. FIG. 62A to FIG. 62F are top views illustrating the manufacturing method of the display apparatus 100 illustrated in FIG. 53A and FIG. 53B. FIG. 63A to FIG. 63C each illustrate a cross section along the dashed-dotted line X1-X2 and a cross section along the dashed-dotted line Y1-Y2 in FIG. 53A side by side. FIG. 64 to FIG. 69 and FIG. 70A are similar to FIG. 63. FIG. 70B to FIG. 70D are cross-sectional views taken along the dashed-dotted line X1-X2 in FIG. 53A. FIG. 70E is a cross-sectional view taken along the dashed-dotted line Y1-Y2 in FIG. 53A. FIG. 71A to FIG. 71F are enlarged views each illustrating a cross-sectional structure of and around the insulating layer 127.

Thin films included in the display apparatus (insulating films, semiconductor films, conductive films, and the like) can be formed by a sputtering method, a chemical vapor deposition (CVD) method, a vacuum evaporation method, a pulsed laser deposition (PLD) method, an ALD method, or the like. Examples of the CVD method include a plasma-enhanced chemical vapor deposition (PECVD: Plasma Enhanced CVD) method and a thermal CVD method. An example of a thermal CVD method is a metal organic chemical vapor deposition (MOCVD: Metal Organic CVD) method.

The thin films included in the display apparatus (insulating films, semiconductor films, conductive films, and the like) can be formed by a method such as spin coating, dipping, spray coating, ink-jetting, dispensing, screen printing, offset printing, a doctor knife, slit coating, roll coating, curtain coating, or knife coating.

Specifically, for formation of the light-emitting device, a vacuum process such as an evaporation method and a solution process such as a spin coating method or an inkjet method can be used. Examples of an evaporation method include physical vapor deposition methods (PVD method) such as a sputtering method, an ion plating method, an ion beam evaporation method, a molecular beam evaporation method, and a vacuum evaporation method, and a chemical vapor deposition method (CVD method). Specifically, functional layers (e.g., a hole-injection layer, a hole-transport layer, a light-emitting layer, an electron-transport layer, and an electron-injection layer) included in the EL layer can be formed by an evaporation method (e.g., a vacuum evaporation method), a coating method (e.g., a dip coating method, a die coating method, a bar coating method, a spin coating method, or a spray coating method), a printing method (e.g., an inkjet method, a screen printing (stencil) method, an offset printing (planography) method, a flexography (relief printing) method, a gravure printing method, or a micro-contact printing method), or the like.

The thin films included in the display apparatus can be processed by a photolithography method or the like. Alternatively, the thin films may be processed by a nanoimprinting method, a sandblasting method, a lift-off method, or the like. Alternatively, island-shaped thin films may be directly formed by a deposition method using a shielding mask such as a metal mask.

There are the following two typical examples of a photolithography method. In one of the methods, a resist mask is formed over a thin film that is to be processed, the thin film is processed by etching or the like, and then the resist mask is removed. In the other method, a photosensitive thin film is formed and then processed into a desired shape by light exposure and development.

For light used for light exposure in a photolithography method, for example, it is possible to use light with the i-line (wavelength: 365 nm), light with the g-line (wavelength: 436 nm), light with the h-line (wavelength: 405 nm), or combined light of any of them. Alternatively, ultraviolet light, KrF laser light, ArF laser light, or the like can be used. Light exposure may be performed by liquid immersion exposure technique. As the light for the light exposure, extreme ultraviolet (EUV) light or X-rays may be used. Furthermore, instead of light used for the light exposure, an electron beam can also be used. It is preferable to use extreme ultraviolet light, X-rays, or an electron beam because extremely minute processing can be performed. Note that a photomask is not needed when light exposure is performed by scanning with a beam such as an electron beam.

For etching of the thin film, a dry etching method, a wet etching method, a sandblast method, or the like can be used.

First, as illustrated in FIG. 63A, a conductive film 111 is formed over the layer 101 including transistors.

Then, a first layer 113A is formed over the conductive film 111, a first sacrificial layer 118A is formed over the first layer 113A, and a second sacrificial layer 119A is formed over the first sacrificial layer 118A.

As illustrated in FIG. 63A, an end portion of the first layer 113A on the connection portion 140 side is positioned inward from an end portion of the first sacrificial layer 118A in the cross-sectional view along Y1-Y2. For example, by using a mask for specifying a deposition area (which is also referred to as an area mask or a rough metal mask to be distinguished from a fine metal mask), the first layer 113A can be formed in a region different from those of the first sacrificial layer 118A and the second sacrificial layer 119A. In one embodiment of the present invention, the light-emitting device is formed using a resist mask; by combining the resist mask and the area mask as described above, the light-emitting device can be manufactured through a relatively simple process.

The conductive film 111 is a layer that is processed later to be the pixel electrodes 111*a*, 111*b*, and 111*c* and a conductive layer 123. Therefore, the conductive film 111 can employ the above-described structure applicable to the pixel electrode. For formation of the conductive film 111, a sputtering method or a vacuum evaporation method can be used, for example.

The first layer 113A is a layer to be the EL layer 113*a* later. Thus, the above structure applicable to the EL layer 113*a* can be employed. The first layer 113A can be formed by a method such as an evaporation method (including a vacuum evaporation method), a transfer method, a printing method, an inkjet method, or a coating method. The first layer 113A is preferably formed by an evaporation method. A premix material may be used in the deposition by an evaporation method. Note that in this specification and the like, a premix material is a composite material in which a plurality of materials are combined or mixed in advance.

As each of the first sacrificial layer 118A and the second sacrificial layer 119A, a film that is highly resistant to the process conditions for the first layer 113A, a second layer 113B, a third layer 113C, and the like formed in later steps, specifically, a film that has high etching selectivity with respect to the EL layers, is used.

The first sacrificial layer 118A and the second sacrificial layer 119A can be formed by a sputtering method, an ALD method (a thermal ALD method and a PEALD method), a CVD method, or a vacuum evaporation method, for example. The first sacrificial layer 118A, which is formed over and in contact with the EL layer, is preferably formed by a formation method that causes less damage to the EL layer than a formation method of the second sacrificial layer 119A. For example, the first sacrificial layer 118A is preferably formed by an ALD method or a vacuum evaporation method rather than a sputtering method. The first sacrificial layer 118A and the second sacrificial layer 119A are formed at a temperature lower than the upper temperature limit of the EL layer (typically at 200° C. or lower, preferably 100° C. or lower, further preferably 80° C. or lower).

As each of the first sacrificial layer 118A and the second sacrificial layer 119A, a film that can be removed by a wet etching method is preferably used. The use of a wet etching method can reduce damage to the first layer 113A in processing of the first sacrificial layer 118A and the second sacrificial layer 119A, as compared with the case of using a dry etching method.

As the first sacrificial layer 118A, it is preferable to use a film having high etching selectivity with respect to the second sacrificial layer 119A.

In the manufacturing method of a display apparatus of this embodiment, it is desirable that the layers (e.g., the hole-injection layer, the hole-transport layer, the light-emitting layer, and the electron-transport layer) included in the EL layer be not easily processed in the step of processing the sacrificial layers, and that the sacrificial layers be not easily processed in the steps of processing the layers included in the EL layer. These are preferably taken into consideration to select the materials and a processing method of the sacrificial layers and processing methods of the EL layer.

Although this embodiment shows an example where the sacrificial layer is formed to have a two-layer structure of the first sacrificial layer and the second sacrificial layer, the sacrificial layer may have a single-layer structure or a stacked-layer structure of three or more layers.

The first sacrificial layer 118A and the second sacrificial layer 119A can each be formed using an inorganic film such as a metal film, an alloy film, a metal oxide film, a semiconductor film, or an inorganic insulating film, for example.

For the first sacrificial layer 118A and the second sacrificial layer 119A, a metal material such as gold, silver, platinum, magnesium, nickel, tungsten, chromium, molybdenum, iron, cobalt, copper, palladium, titanium, aluminum, yttrium, zirconium, or tantalum or an alloy material containing the metal material can be used. It is particularly preferable to use a low-melting-point material such as aluminum or silver. The use of a metal material capable of blocking ultraviolet light for one or both of the first sacrificial layer 118A and the second sacrificial layer 119A is preferable, in which case irradiation of the EL layer with ultraviolet light can be inhibited and deterioration of the EL layer can be inhibited.

For the first sacrificial layer 118A and the second sacrificial layer 119A, a metal oxide such as In—Ga—Zn oxide can be used. As the first sacrificial layer 118A and the second sacrificial layer 119A, an In—Ga—Zn oxide film can be formed by a sputtering method, for example. It is also possible to use indium oxide, In—Zn oxide, In—Sn oxide, indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or the like. Alternatively, indium tin oxide containing silicon or the like can also be used.

Note that an element M (M is one or more kinds selected from aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) may be used instead of gallium. Specifically, M is preferably one or more kinds selected from gallium, aluminum, and yttrium.

As the first sacrificial layer 118A and the second sacrificial layer 119A, a variety of inorganic insulating films that can be used as the protective layers 131 and 132 can be used. In particular, an oxide insulating film is preferable because its adhesion to the EL layer is higher than that of a nitride insulating film. For example, an inorganic insulating material such as aluminum oxide, hafnium oxide, or silicon oxide can be used for the first sacrificial layer 118A and the second sacrificial layer 119A. As the first sacrificial layer 118A or the second sacrificial layer 119A, an aluminum oxide film can be formed by an ALD method, for example. The use of an ALD method is preferable, in which case damage to a base (especially, the EL layer or the like) can be reduced.

For example, an inorganic insulating film (e.g., an aluminum oxide film) formed by an ALD method can be used as the first sacrificial layer 118A, and an In—Ga—Zn oxide film formed by a sputtering method can be used as the second sacrificial layer 119A. Alternatively, an aluminum film or a tungsten film may be used as the second sacrificial layer 119A.

A material that can be dissolved in a solvent that is chemically stable with respect to at least a film positioned in the uppermost portion of the first layer 113A may be used for the first sacrificial layer 118A and the second sacrificial layer 119A. Specifically, a material that will be dissolved in water or alcohol can be suitably used for the first sacrificial layer 118A or the second sacrificial layer 119A. In depositing such a material, it is preferable to perform application of the material dissolved in a solvent such as water or alcohol by a wet process, and then perform heat treatment for evaporating the solvent. At this time, the heat treatment is preferably performed in a reduced-pressure atmosphere, in which case the solvent can be removed at a low temperature in a short time and thermal damage to the EL layer can be reduced accordingly.

The first sacrificial layer 118A and the second sacrificial layer 119A may be formed by a wet process such as spin coating, dipping, spray coating, ink-jetting, dispensing, screen printing, offset printing, a doctor knife method, slit coating, roll coating, curtain coating, or knife coating.

For the first sacrificial layer 118A and the second sacrificial layer 119A, an organic material such as polyvinyl alcohol (PVA), polyvinylbutyral, polyvinylpyrrolidone, polyethylene glycol, polyglycerin, pullulan, water-soluble cellulose, or an alcohol-soluble polyamide resin may be used.

Next, a resist mask 190*a* is formed over the second sacrificial layer 119A as illustrated in FIG. 63B. The resist mask can be formed by application of a photosensitive resin (photoresist), light exposure, and development.

The resist mask may be formed using either a positive resist material or a negative resist material.

Figure 62A:
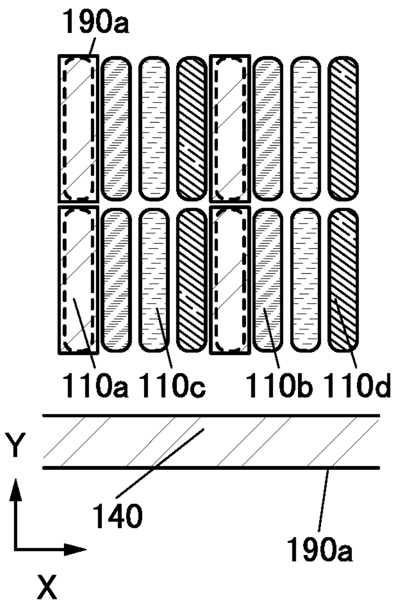
FIG. 62A to FIG. 62F are top views illustrating an example of a manufacturing method of a display apparatus.
Figure 63A:
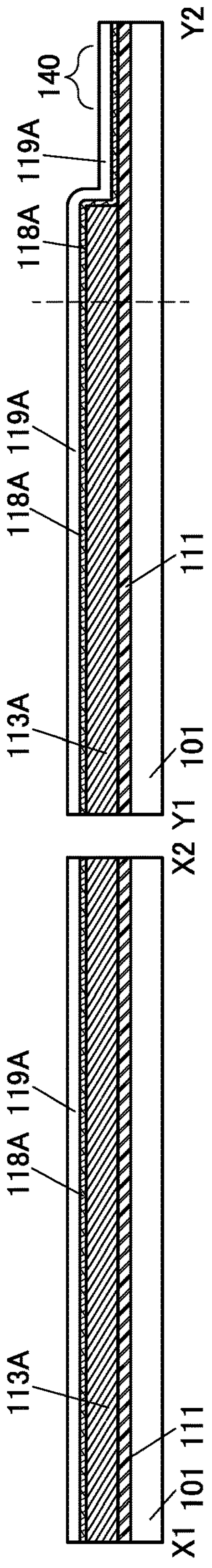
FIG. 63A to FIG. 63C are cross-sectional views illustrating an example of a manufacturing method of a display apparatus.
Figure 63B:
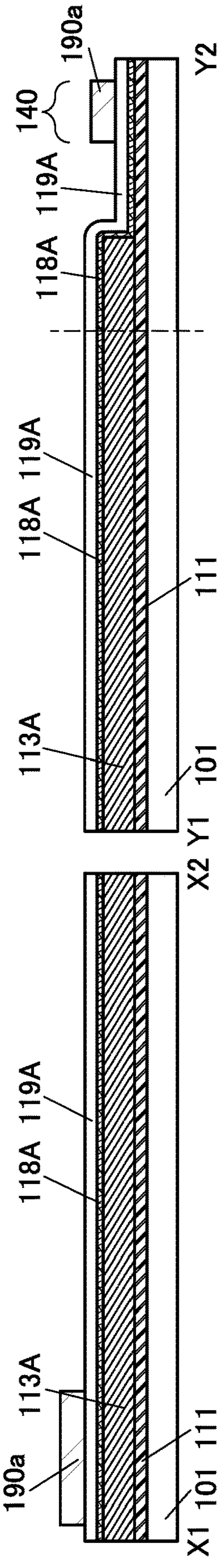
Figure 63C:
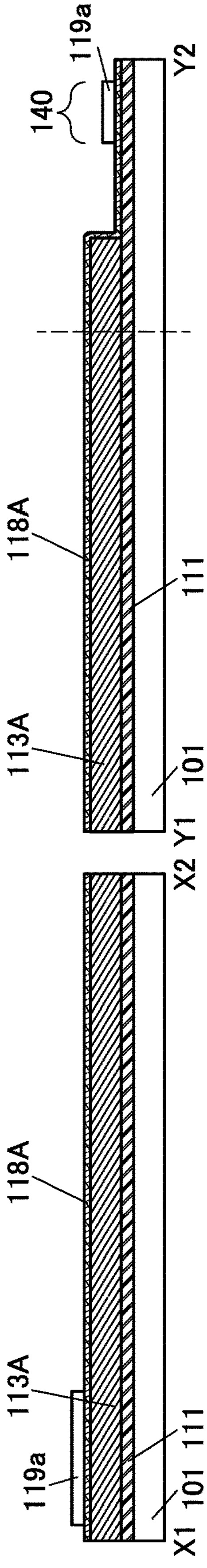

As illustrated in FIG. 62A, the resist mask 190_a_ is provided at a position overlapping with a region to be the subpixel 110_a_ later. One island-shaped pattern is preferably provided for one subpixel 110_a_ as the resist mask 190_a_. Alternatively, one band-like pattern for a plurality of subpixels 110_a_ aligned in one column (aligned in the Y direction in FIG. 62A) may be formed as the resist mask 190_a_.

Note that the resist mask 190_a_ is preferably provided also at a position overlapping with a region to be the connection portion 140 later. This can inhibit a region of the conductive film 111, which is to be the conductive layer 123 later, from being damaged during the manufacturing process of the display apparatus.

Then, as illustrated in FIG. 63C, part of the second sacrificial layer 119A is removed using the resist mask 190_a_, so that the second sacrificial layer 119_a_ is formed. The second sacrificial layer 119_a_ remains in the region to be the subpixel 110_a_ later and the region to be the connection portion 140 later.

In etching the second sacrificial layer 119A, an etching condition with high selectivity is preferably employed so that the first sacrificial layer 118A is not removed by the etching. Since the EL layer is not exposed in processing the second sacrificial layer 119A, the range of choices of the processing method is wider than that for processing the first sacrificial layer 118A. Specifically, deterioration of the EL layer can be further inhibited even when a gas containing oxygen is used as an etching gas in processing the second sacrificial layer 119A.

After that, the resist mask 190_a_ is removed. The resist mask 190_a_ can be removed by ashing using oxygen plasma, for example. Alternatively, the resist mask 190_a_ may be removed by wet etching. At this time, the first sacrificial layer 118A is positioned on the outermost surface and the first layer 113A is not exposed; thus, the first layer 113A can be inhibited from being damaged in the step of removing the resist mask 190_a_. In addition, the range of choices of the method for removing the resist mask 190_a_ can be widened.

Figures 64A, 64B, 64C:
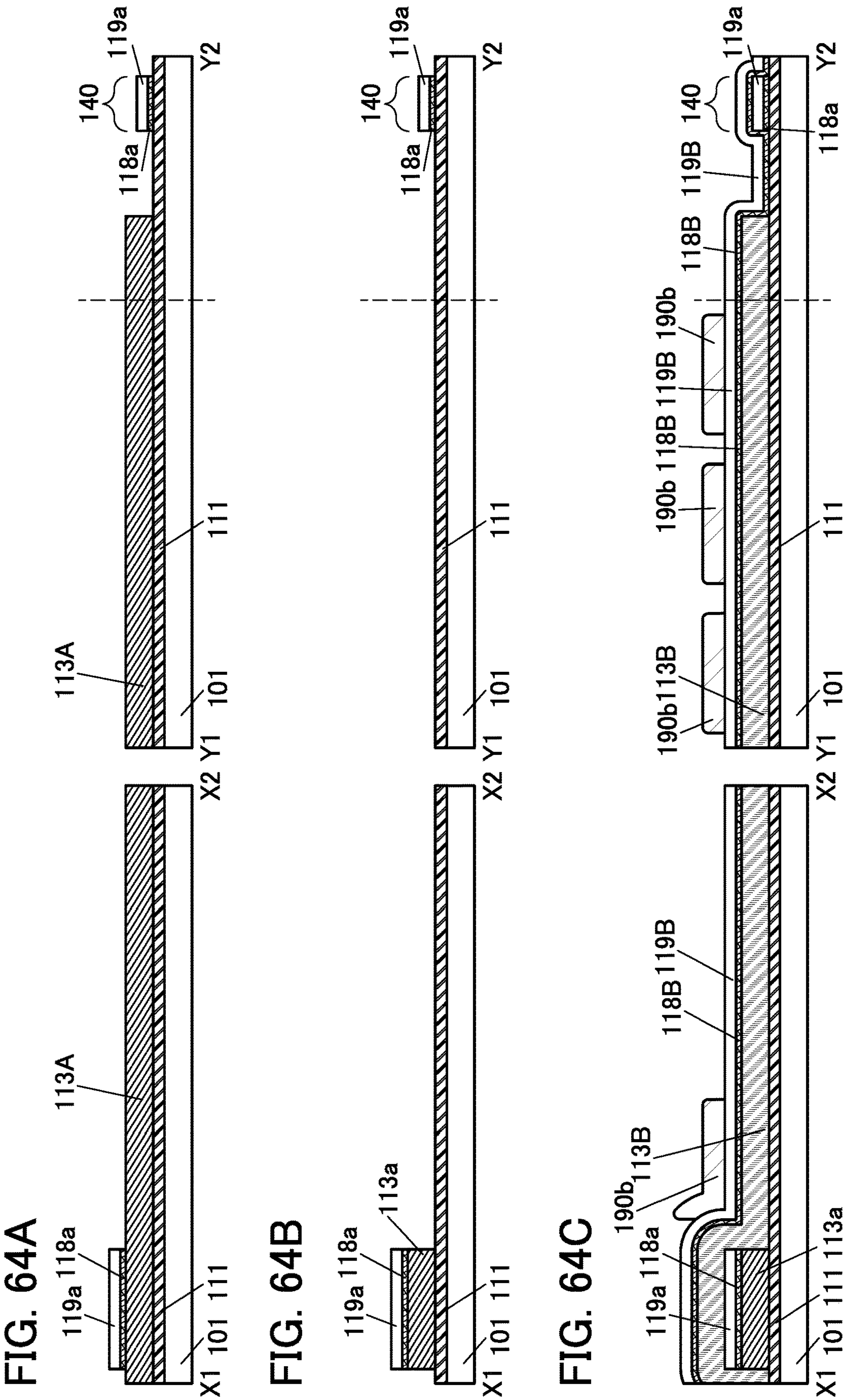
FIG. 64A to FIG. 64C are cross-sectional views illustrating an example of a manufacturing method of FIG. 65A to FIG. 65C are cross-sectional views illustrating an example of a manufacturing method of a display apparatus.

Next, as illustrated in FIG. 64A, part of the first sacrificial layer 118A is removed using the second sacrificial layer 119_a_ as a hard mask, so that a first sacrificial layer 118_a_ is formed.

The first sacrificial layer 118A and the second sacrificial layer 119A can each be processed by a wet etching method or a dry etching method. The first sacrificial layer 118A and the second sacrificial layer 119A are preferably processed by anisotropic etching.

The use of a wet etching method can reduce damage to the first layer 113A in processing the first sacrificial layer 118A and the second sacrificial layer 119A, as compared with the case of using a dry etching method. In the case of using a wet etching method, it is preferable to use a developer, an aqueous solution of tetramethylammonium hydroxide (TMAH), dilute hydrofluoric acid, oxalic acid, phosphoric acid, acetic acid, nitric acid, a chemical solution containing a mixed solution thereof, or the like, for example.

In the case of using a dry etching method, deterioration of the first layer 113A can be inhibited by not using a gas containing oxygen as the etching gas. In the case of using a dry etching method, it is preferable to use $CF_4$, $C_4F_8$, $SF_6$, $CHF_3$, $Cl_2$, $H_2O$, $BCl_3$, or a gas containing a noble gas (also referred to as rare gas) such as He as the etching gas, for example.

For example, when an aluminum oxide film formed by an ALD method is used as the first sacrificial layer 118A, the first sacrificial layer 118A can be processed by a dry etching method using $CHF_3$ and He. In the case where an In—Ga—Zn oxide film formed by a sputtering method is used as the second sacrificial layer 119A, the second sacrificial layer 119A can be processed by a wet etching method using a diluted phosphoric acid.

Subsequently, as illustrated in FIG. 64B, part of the first layer 113A is removed using the second sacrificial layer 119_a_ and the first sacrificial layer 118_a_ as hard masks, whereby the EL layer 113_a_ is formed.

Thus, as illustrated in FIG. 64B, a stacked-layer structure of the EL layer 113_a_, the first sacrificial layer 118_a_, and the second sacrificial layer 119_a_ remains over the conductive film 111 in a region corresponding to the subpixel 110_a_. In a region corresponding to the connection portion 140, a stacked-layer structure of the first sacrificial layer 118_a_ and the second sacrificial layer 119_a_ remains over the conductive film 111.

Through the above process, regions of the first layer 113A, the first sacrificial layer 118A, and the second sacrificial layer 119A, which do not overlap with the resist mask 190_a_, can be removed.

Note that part of the first layer 113A may be removed using the resist mask 190_a_. After that, the resist mask 190_a_ may be removed.

Alternatively, the next step may be performed without removing the resist mask 190_a_. In this case, not only the sacrificial layers but also the resist mask can be used as a mask in processing the conductive film 111 in a later step. Using the resist masks 190_a_, 190_b_, and 190_c_ for processing the conductive film 111 sometimes makes it easier to process the conductive film 111 than the case of using only the sacrificial layers as hard masks. For example, it is possible to expand the range of choices of the processing conditions of the conductive film 111, the materials of the sacrificial layers, the materials of the conductive films, and the like.

The first layer 113A is preferably processed by anisotropic etching. Anisotropic dry etching is particularly preferable. Alternatively, wet etching may be used.

In the case of using a dry etching method, deterioration of the first layer 113A can be inhibited by not using a gas containing oxygen as the etching gas.

A gas containing oxygen may be used as the etching gas. When the etching gas contains oxygen, the etching rate can be increased. Therefore, the etching can be performed under a low-power condition while an adequately high etching rate is maintained. Thus, damage to the first layer 113A can be inhibited. Furthermore, a defect such as attachment of a reaction product generated at the etching can be inhibited.

In the case of using a dry etching method, it is preferable to use a gas containing at least one of $H_2$, $CF_4$, $C_4F_8$, $SF_6$, $CHF_3$, $Cl_2$, $H_2O$, $BCl_3$, and a noble gas (also referred to as a rare gas) such as He or Ar as the etching gas, for example. Alternatively, a gas containing oxygen and at least one of the above are preferably used as the etching gas. Alternatively, an oxygen gas may be used as the etching gas. Specifically, for example, a gas containing $H_2$ and Ar or a gas containing $CF_4$ and He can be used as the etching gas. As another example, a gas containing $CF_4$, He, and oxygen can be used as the etching gas.

Next, as illustrated in FIG. 64C, the second layer 113B is formed over the second sacrificial layer 119_a_ and the conductive film 111, the first sacrificial layer 118B is formed over the second layer 113B, and the second sacrificial layer 119B is formed over the first sacrificial layer 118B.

As illustrated in FIG. 64C, an end portion of the second layer 113B on the connection portion 140 side is positioned inward from an end portion of the first sacrificial layer 118B in the cross-sectional view along Y1-Y2.

The second layer 113B is a layer to be the EL layer 113*b* later. The EL layer 113*b* emits light in a wavelength range different from that of light from the EL layer 113*a*. Structures, materials, and the like that can be used for the EL layer 113*b* are similar to those of the EL layer 113*a*. The second layer 113B can be formed by a method similar to that for the first layer 113A.

The first sacrificial layer 118B can be formed using a material that can be used for the first sacrificial layer 118A. The second sacrificial layer 119B can be formed using a material that can be used for the second sacrificial layer 119A.

Next, a resist mask 190*b* is formed over the second sacrificial layer 119B as illustrated in FIG. 64C.

Figure 62B:
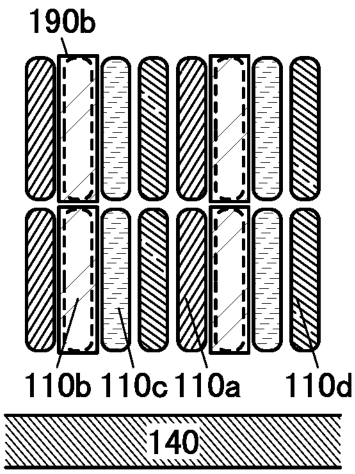

As illustrated in FIG. 62B, the resist mask 190*b* is provided at a position overlapping with a region to be the subpixel 110*b* later. One island-shaped pattern is preferably provided for one subpixel 110*b* as the resist mask 190*b*. Alternatively, one band-like pattern for a plurality of subpixels 110*b* aligned in one column may be formed as the resist mask 190*b*.

The resist mask 190*b* may be provided also at a position overlapping with the region to be the connection portion 140 later.

Next, part of the second sacrificial layer 119B is removed using the resist mask 190*b*, so that a second sacrificial layer 119*b* is formed. The second sacrificial layer 119*b* remains in the region to be the subpixel 110*b* later.

After that, the resist mask 190*b* is removed. Then, part of the first sacrificial layer 118B is removed using the second sacrificial layer 119*b* as a hard mask, so that the first sacrificial layer 118*b* is formed.

Figures 65A, 65B, 65C:
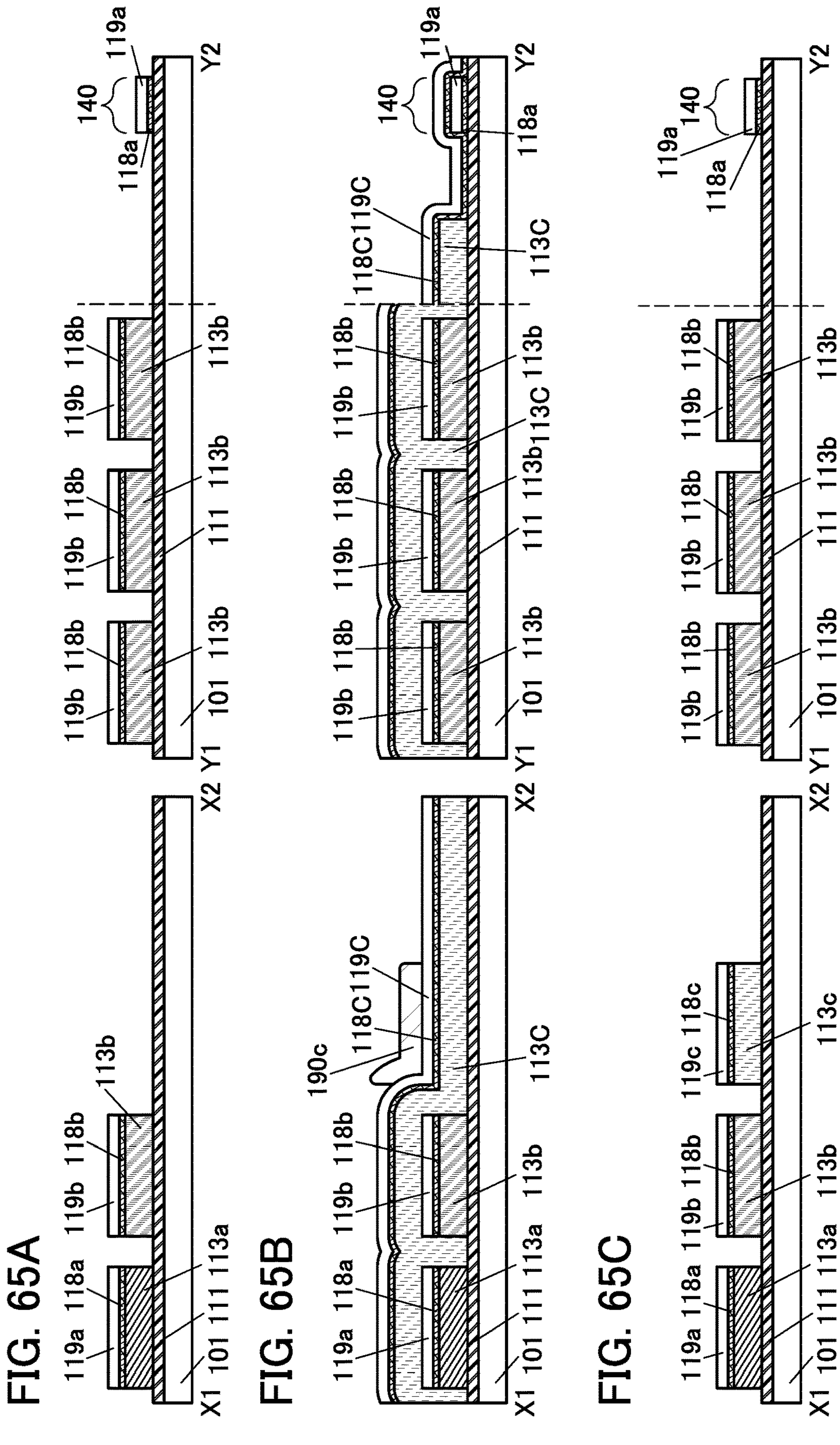

Then, as illustrated in FIG. 65A, part of the second layer 113B is removed using the second sacrificial layer 119*b* and the first sacrificial layer 118*b* as hard masks, whereby the EL layer 113*b* is formed.

Accordingly, as illustrated in FIG. 65A, a stacked-layer structure of the EL layer 113*b*, the first sacrificial layer 118*b*, and the second sacrificial layer 119*b* remains over the conductive film 111 in a region corresponding to the subpixel 110*b*. In the region corresponding to the connection portion 140, a stacked-layer structure of the first sacrificial layer 118*a* and the second sacrificial layer 119*a* remains over the conductive film 111.

Through the above process, regions of the second layer 113B, the first sacrificial layer 118B, and the second sacrificial layer 119B, which do not overlap with the resist mask 190*b*, can be removed. For processing these layers, a method that can be used for processing the second layer 113B, the first sacrificial layer 118A, and the second sacrificial layer 119A can be used.

Next, as illustrated in FIG. 65B, the third layer 113C is formed over the second sacrificial layer 119*a*, the second sacrificial layer 119*b*, and the conductive film 111, a first sacrificial layer 118C is formed over the third layer 113C, and a second sacrificial layer 119C is formed over the first sacrificial layer 118C.

As illustrated in FIG. 65B, an end portion of the third layer 113C on the connection portion 140 side is positioned inward from an end portion of the first sacrificial layer 118C in the cross-sectional view along Y1-Y2.

The third layer 113C is a layer to be the EL layer 113*c* later. The EL layer 113*c* emits light in a wavelength range different from that of light from the EL layer 113*a* and the EL layer 113*b*. Structures, materials, and the like that can be used for the EL layer 113*c* are similar to those of the EL layer 113*a*. The third layer 113C can be formed by a method similar to that for the first layer 113A.

The first sacrificial layer 118C can be formed using a material that can be used for the first sacrificial layer 118A. The second sacrificial layer 119C can be formed using a material that can be used for the second sacrificial layer 119A.

Next, a resist mask 190*c* is formed over the second sacrificial layer 119C as illustrated in FIG. 65B.

Figure 62C:
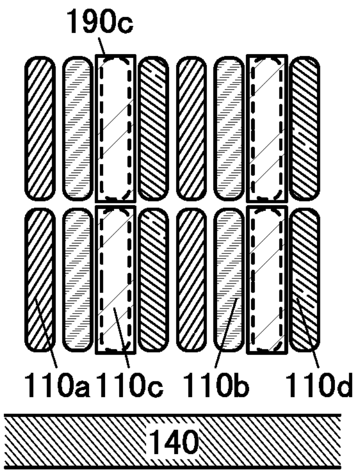

As illustrated in FIG. 62C, the resist mask 190*c* is provided at a position overlapping with a region to be the subpixel 110*c* later. One island-shaped pattern is preferably provided for one subpixel 110*c* as the resist mask 190*c*. Alternatively, one band-like pattern for a plurality of subpixels 110*c* aligned in one column may be formed as the resist mask 190*c*.

The resist mask 190*c* may be provided also at a position overlapping with the region to be the connection portion 140 later.

Next, part of the second sacrificial layer 119C is removed using the resist mask 190*c*, so that a second sacrificial layer 119*c* is formed. The second sacrificial layer 119*c* remains in the region to be the subpixel 110*c* later.

After that, the resist mask 190*c* is removed. Then, part of the first sacrificial layer 118C is removed using the second sacrificial layer 119*c* as a hard mask, so that the first sacrificial layer 118*c* is formed.

Then, as illustrated in FIG. 65C, part of the third layer 113C is removed using the second sacrificial layer 119*c* and the first sacrificial layer 118*c* as hard masks, whereby the EL layer 113*c* is formed.

Accordingly, as illustrated in FIG. 65C, in a region corresponding to the subpixel 110*c*, a stacked-layer structure of the EL layer 113*c*, the first sacrificial layer 118*c*, and the second sacrificial layer 119*c* remains over the conductive film 111. In the region corresponding to the connection portion 140, a stacked-layer structure of the first sacrificial layer 118*a* and the second sacrificial layer 119*a* remains over the conductive film 111.

Through the above process, regions of the third layer 113C, the first sacrificial layer 118C, and the second sacrificial layer 119C, which do not overlap with the resist mask 190*c*, can be removed. For processing these layers, a method that can be used for processing the first layer 113A, the first sacrificial layer 118A, and the second sacrificial layer 119A can be used.

Figure 66A:
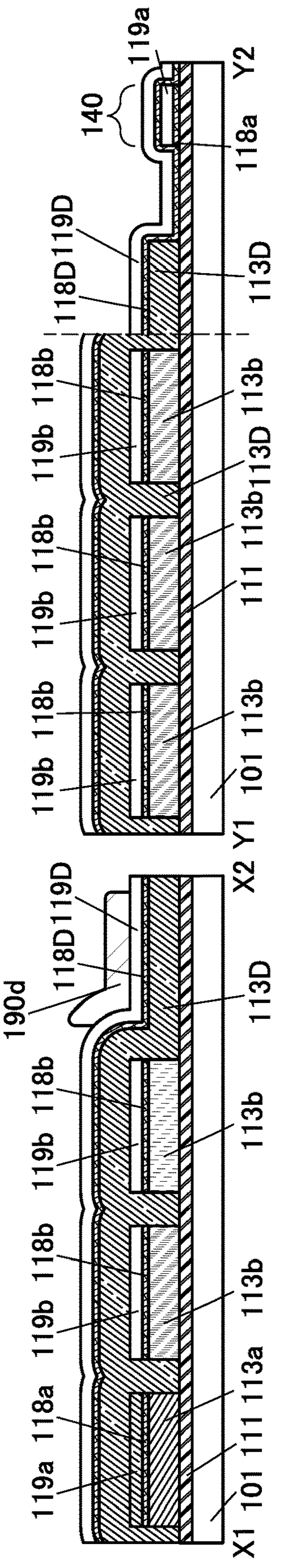
FIG. 66A and FIG. 66B are cross-sectional views illustrating an example of a manufacturing method of a display apparatus.

Next, as illustrated in FIG. 66A, a fourth layer 113D is formed over the second sacrificial layer 119*a*, the second sacrificial layer 119*b*, the second sacrificial layer 119*c*, and the conductive film 111, a first sacrificial layer 118D is formed over the fourth layer 113D, and a second sacrificial layer 119D is formed over the first sacrificial layer 118D.

As illustrated in FIG. 66A, an end portion of the fourth layer 113D on the connection portion 140 side is positioned inward from an end portion of the first sacrificial layer 118D in the cross-sectional view along Y1-Y2.

The fourth layer 113D is a layer to be the light-receiving layer 113*d* later. The light-receiving layer 113*d* includes an active layer. The fourth layer 113D can be formed by a method similar to that for the first layer 113A.

The first sacrificial layer 118D can be formed using a material that can be used for the first sacrificial layer 118A. The second sacrificial layer 119D can be formed using a material that can be used for the second sacrificial layer 119A.

Next, a resist mask 190*d* is formed over the second sacrificial layer 119D as illustrated in FIG. 66A.

Figure 62D:
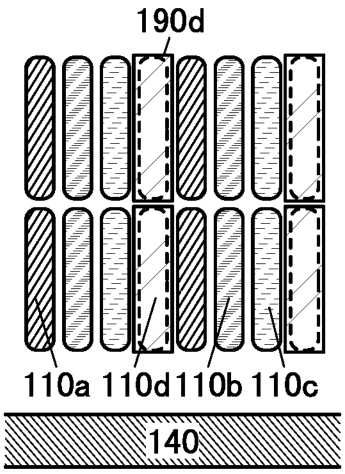

As illustrated in FIG. 62D, the resist mask 190*d* is provided at a position overlapping with a region to be the subpixel 110*d* later. One island-shaped pattern is preferably provided for one subpixel 110*d* as the resist mask 190*d*. Alternatively, one band-like pattern for a plurality of subpixels 110*d* aligned in one column may be formed as the resist mask 190*d*.

The resist mask 190*d* may be provided also at a position overlapping with the region to be the connection portion 140 later.

Next, part of the second sacrificial layer 119D is removed using the resist mask 190*d*, so that a second sacrificial layer 119*d* is formed. The second sacrificial layer 119*d* remains in the region to be the subpixel 110*d* later.

After that, the resist mask 190*d* is removed. Then, part of the first sacrificial layer 118D is removed using the second sacrificial layer 119*d* as a hard mask, so that a first sacrificial layer 118*d* is formed.

Figure 66B:
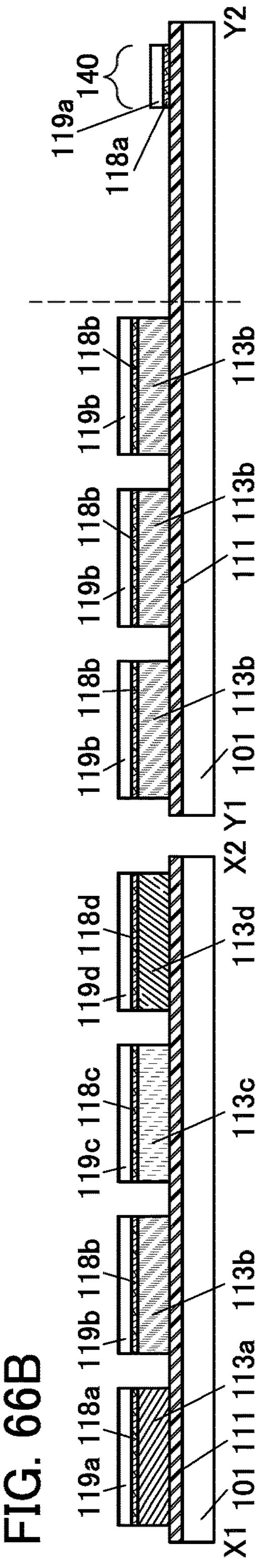

Then, as illustrated in FIG. 66B, part of the fourth layer 113D is removed using the second sacrificial layer 119*d* and the first sacrificial layer 118*d* as hard masks, whereby the light-receiving layer 113*d* is formed.

Accordingly, as illustrated in FIG. 66B, a stacked-layer structure of the light-receiving layer 113*d*, the first sacrificial layer 118*d*, and the second sacrificial layer 119*d* remains over the conductive film 111 in a region corresponding to the subpixel 110*d*. In the region corresponding to the connection portion 140, a stacked-layer structure of the first sacrificial layer 118*a* and the second sacrificial layer 119*a* remains over the conductive film 111.

Through the above process, regions of the fourth layer 113D, the first sacrificial layer 118D, and the second sacrificial layer 119D, which do not overlap with the resist mask 190*d*, can be removed. For processing these layers, a method that can be used for processing the first layer 113A, the first sacrificial layer 118A, and the second sacrificial layer 119A can be used.

Note that the side surfaces of the EL layer 113*a*, the EL layer 113*b*, the EL layer 113*c*, and the light-receiving layer 113*d* are preferably perpendicular or substantially perpendicular to their formation surfaces. For example, the angle between the formation surface and the side surface is preferably greater than or equal to 60° and less than or equal to 90°.

Figure 67A:
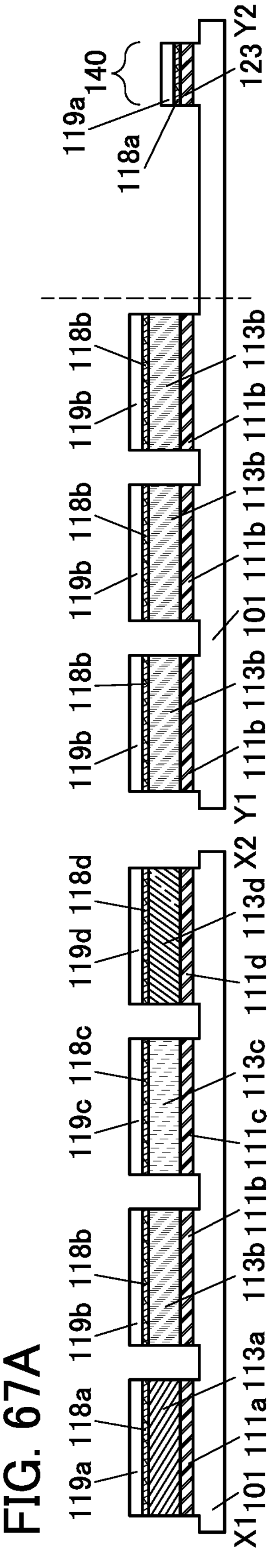
FIG. 67A to FIG. 67C are cross-sectional views illustrating an example of a manufacturing method of a display apparatus.

Next, as illustrated in FIG. 67A, the conductive film 111 is processed using the first sacrificial layer 118*a*, the first sacrificial layer 118*b*, the first sacrificial layer 118*c*, the first sacrificial layer 118*d*, the second sacrificial layer 119*a*, the second sacrificial layer 119*b*, the second sacrificial layer 119*c*, and the second sacrificial layer 119*d* as hard masks, whereby the pixel electrode 111*a*, the pixel electrode 111*b*, the pixel electrode 111*c*, the pixel electrode 111*d*, and the conductive layer 123 are formed.

In processing the conductive film 111, part of the layer 101 including transistors (specifically, an insulating layer positioned on the outermost surface) is processed to form a depressed portion in some cases. Although the description below is made using the case where a depressed portion is provided in the layer 101 including transistors as an example, the depressed portion is not necessarily provided.

Here, in order to form the conductive layer 123, any one of the first sacrificial layer 118*a*, the first sacrificial layer 118*b*, the first sacrificial layer 118*c*, and the first sacrificial layer 118*d* and any one of the second sacrificial layer 119*a*, the second sacrificial layer 119*b*, the second sacrificial layer 119*c*, and the second sacrificial layer 119*d* are preferably provided in the connection portion 140. Any two or all of the first sacrificial layer 118*a*, the first sacrificial layer 118*b*, the first sacrificial layer 118*c*, and the first sacrificial layer 118*d* and any two or all of the second sacrificial layer 119*a*, the second sacrificial layer 119*b*, the second sacrificial layer 119*c*, and the second sacrificial layer 119*d* may be provided in the connection portion 140. Provision of the sacrificial layer in the connection portion 140 can inhibit a region of the conductive film 111, which is to be the conductive layer 123 later, from being damaged during the manufacturing process of the display apparatus. Thus, the first sacrificial layer 118*a* and the second sacrificial layer 119*a*, which are manufactured earliest in the process, are preferably formed in the connection portion 140.

The conductive film 111 can be processed by a wet etching method or a dry etching method. The conductive film 111 is preferably processed by anisotropic etching.

Figure 67B:
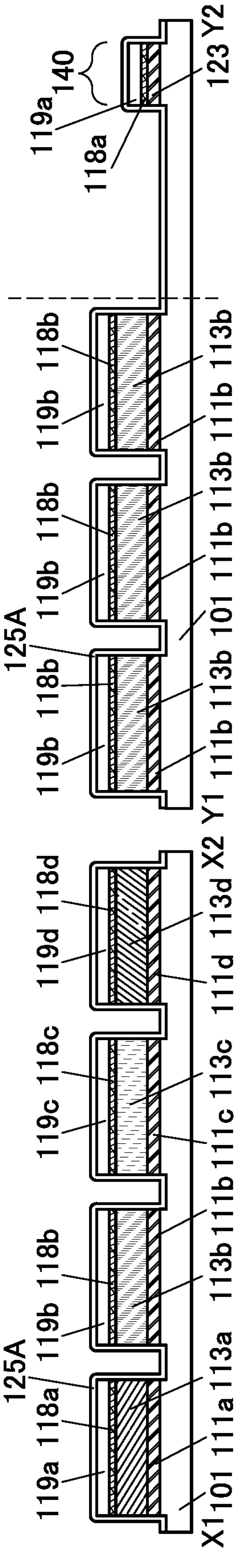

Next, as illustrated in FIG. 67B, an insulating film 125A is formed to cover the pixel electrode 111*a*, the pixel electrode 111*b*, the pixel electrode 111*c*, the pixel electrode 111*d*, the EL layer 113*a*, the EL layer 113*b*, the EL layer 113*c*, the light-receiving layer 113*d*, the first sacrificial layer 118*a*, the first sacrificial layer 118*b*, the first sacrificial layer 118*c*, the first sacrificial layer 118*d*, the second sacrificial layer 119*a*, the second sacrificial layer 119*b*, the second sacrificial layer 119*c*, and the second sacrificial layer 119*d*.

As the insulating film 125A, an inorganic insulating film such as an oxide insulating film, a nitride insulating film, an oxynitride insulating film, or a nitride oxide insulating film can be used, for example. Examples of the oxide insulating film include a silicon oxide film, an aluminum oxide film, a magnesium oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film. Alternatively, a metal oxide film such as an indium gallium zinc oxide film may be used.

The insulating film 125A preferably has a function of a barrier insulating film against at least one of water and oxygen. Alternatively, the insulating film 125A preferably has a function of inhibiting diffusion of at least one of water and oxygen. Alternatively, the insulating film 125A preferably has a function of capturing or fixing (also referred to as gettering) at least one of water and oxygen.

Note that in this specification and the like, a barrier insulating film refers to an insulating film having a barrier property. In this specification and the like, a barrier property means a function of inhibiting diffusion of a particular substance (also referred to as having low permeability). Alternatively, a barrier property means a function of capturing or fixing (also referred to as gettering) a particular substance.

When the insulating film 125A has a function of the barrier insulating film or a gettering function, entry of impurities (typically, water or oxygen) that would diffuse into the light-emitting devices from the outside can be inhibited. With such a structure, a highly reliable display apparatus can be provided.

Figure 67C:
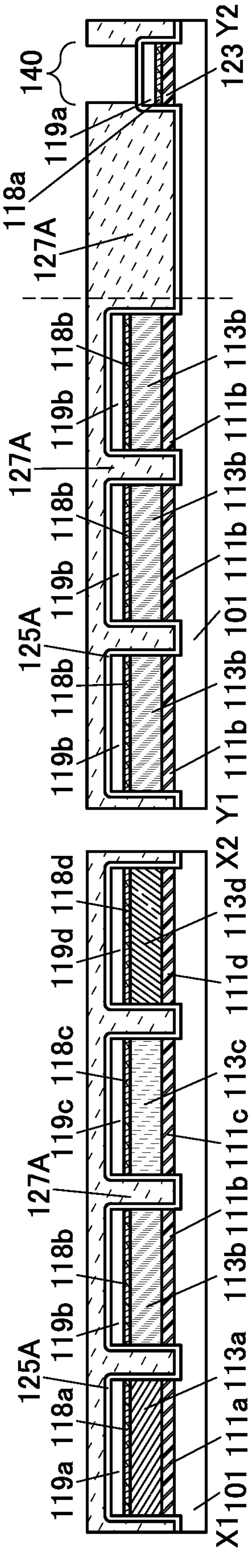

Next, as illustrated in FIG. 67C, an insulating film 127A is formed over the insulating film 125A.

Figure 62E:
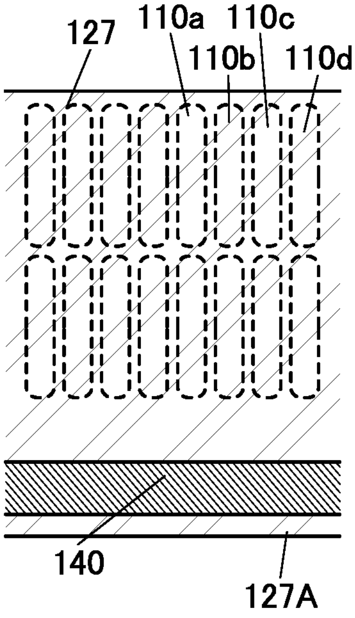

As illustrated in FIG. 62E, the insulating film 127A is preferably formed to include an opening at a position overlapping with the conductive layer 123 (the connection portion 140). The insulating film 127A can be formed into a pattern by application of a photosensitive resin, light exposure, and development, for example.

Note that as illustrated in FIG. 70A, the insulating film 127A may be formed to include an opening also at a position overlapping with the pixel electrode 111*a*, the pixel electrode 111*b*, the pixel electrode 111*c*, and the pixel electrode 111*d*.

For the insulating film 127A, an organic material can be used. Examples of the organic material include an acrylic resin, a polyimide resin, an epoxy resin, an imide resin, a polyamide resin, a polyimide-amide resin, a silicone resin, a siloxane resin, a benzocyclobutene-based resin, a phenol resin, and precursors of these resins. For the insulating film 127A, an organic material such as polyvinyl alcohol (PVA), polyvinylbutyral, polyvinylpyrrolidone, polyethylene glycol, polyglycerin, pullulan, water-soluble cellulose, or an alcohol-soluble polyamide resin may be used. Moreover, the insulating film 127A can be formed using a photosensitive resin. A photoresist may be used for the photosensitive resin. As the photosensitive resin, a positive photosensitive material or a negative photosensitive material can be used.

There is no particular limitation on the formation method of the insulating film 127A; for example, the insulating film 127A can be formed by a wet process such as spin coating, dipping, spray coating, ink-jetting, dispensing, screen printing, offset printing, a doctor knife method, slit coating, roll coating, curtain coating, and knife coating. Specifically, the insulating film 127A is preferably formed by spin coating.

The insulating film 125A and the insulating film 127A are preferably formed by a formation method that causes less damage to the EL layer. In particular, the insulating film 125A, which is formed in contact with a side surface of the EL layer, is preferably formed by a formation method that causes less damage to the EL layer than the formation method of the insulating film 127A. The insulating film 125A and the insulating film 127A are each formed at a temperature lower than the upper temperature limit of the EL layer (typically at 200° C. or lower, preferably 100° C. or lower, further preferably 80° C. or lower). For example, an aluminum oxide film can be formed as the insulating film 125A by an ALD method. An ALD method is preferably used, in which case deposition damage is reduced and a film with good coverage can be formed.

Figures 68A, 68B, 68C:
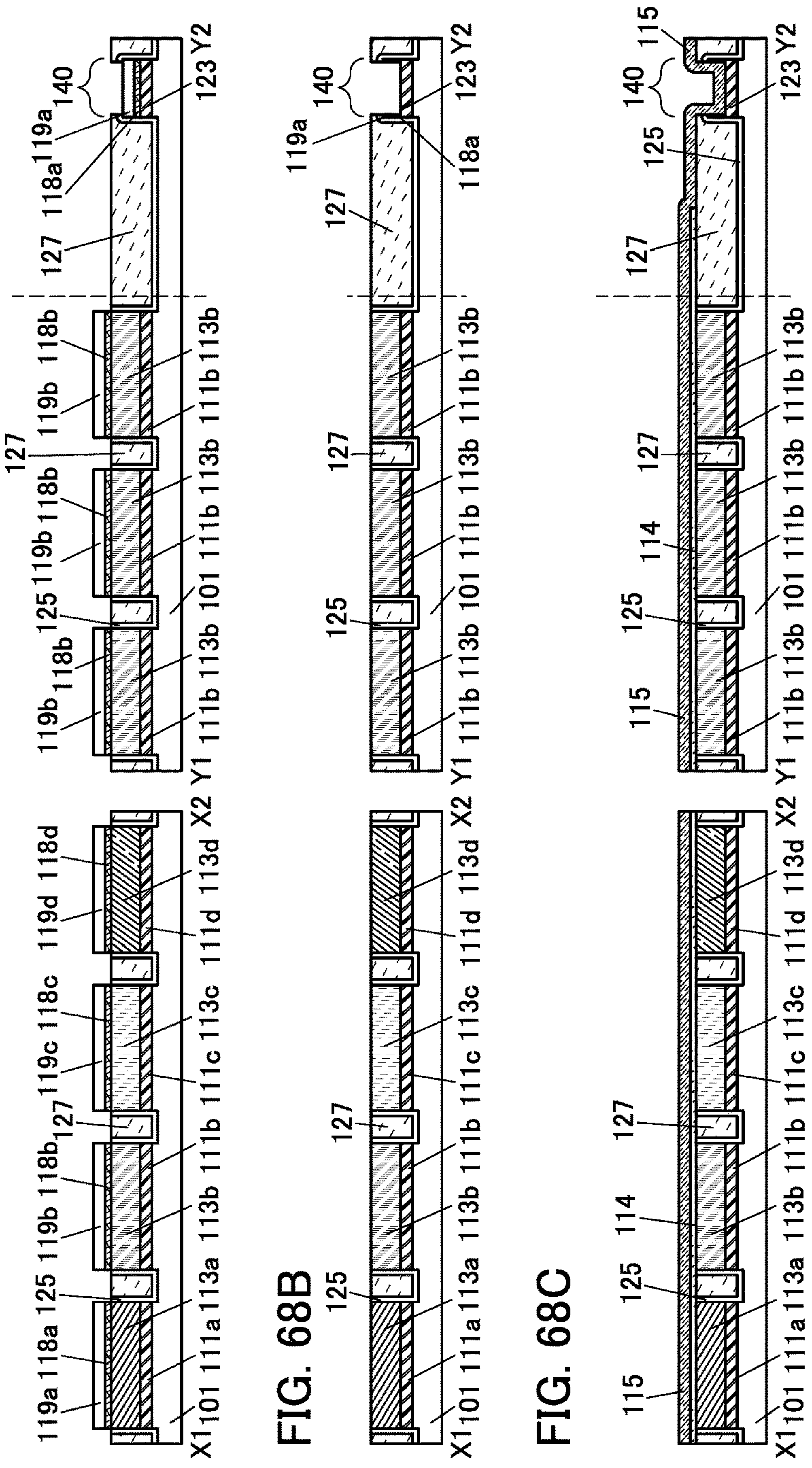
FIG. 68A to FIG. 68C are cross-sectional views illustrating an example of a manufacturing method of a display apparatus.

Then, as illustrated in FIG. 68A, the insulating film 125A and the insulating film 127A are processed, whereby the insulating layer 125 and the insulating layer 127 are formed. The insulating layer 127 is formed in contact with the side surface of the insulating layer 125 and the top surface of the depressed portion. The insulating layer 125 (and the insulating layer 127) is (are) provided to cover the side surfaces of the pixel electrode 111*a*, the pixel electrode 111*b*, the pixel electrode 111*c*, and the pixel electrode 111*d*. This can inhibit the pixel electrode 111*a*, the pixel electrode 111*b*, the pixel electrode 111*c*, and the pixel electrode 111*d* from being in contact with a film to be formed later (a film included in the EL layer, a film included in the light-receiving layer, or a common electrode), thereby inhibiting a short circuit in the light-emitting devices. Furthermore, the insulating layer 125 and the insulating layer 127 are preferably provided to cover the side surfaces of the EL layer 113*a*, the EL layer 113*b*, the EL layer 113*c*, and the light-receiving layer 113*d*. This can inhibit the side surfaces of these layers from being in contact with a film to be formed later, thereby inhibiting a short circuit in the light-emitting devices. In addition, the EL layer 113*a*, the EL layer 113*b*, the EL layer 113*c*, and the light-receiving layer 113*d* can be inhibited from being damaged in a later step.

In particular, the depressed portion is preferably provided in part of the layer 101 including transistors (specifically, an insulating layer positioned on the outermost surface), in which case the side surfaces of the pixel electrode 111*a*, the pixel electrode 111*b*, the pixel electrode 111*c*, and the pixel electrode 111*d* can be entirely covered with the insulating layer 125 and the insulating layer 127.

The insulating film 125A is preferably processed by a dry etching method. The insulating film 125A is preferably processed by anisotropic etching. The insulating film 125A can be processed using an etching gas that can be used for processing the first sacrificial layer 118A and the second sacrificial layer 119A.

The insulating film 127A is preferably processed by ashing using oxygen plasma, for example.

Next, as illustrated in FIG. 68B, the first sacrificial layer 118*a*, the first sacrificial layer 118*b*, the first sacrificial layer 118*c*, the first sacrificial layer 118*d*, the second sacrificial layer 119*a*, the second sacrificial layer 119*b*, the second sacrificial layer 119*c*, and the second sacrificial layer 119*d* are removed. Accordingly, the EL layer 113*a* is exposed over the pixel electrode 111*a*, the EL layer 113*b* is exposed over the pixel electrode 111*b*, the EL layer 113*c* is exposed over the pixel electrode 111*c*, the light-receiving layer 113*d* is exposed over the pixel electrode 111*d*, and the conductive layer 123 is exposed in the connection portion 140. Note that part of the first sacrificial layer 118*a*, the first sacrificial layer 118*b*, the first sacrificial layer 118*c*, the first sacrificial layer 118*d*, the second sacrificial layer 119*a*, the second sacrificial layer 119*b*, the second sacrificial layer 119*c*, or the second sacrificial layer 119*d* may remain. For example, in the connection portion 140 or the like, a region of the sacrificial layer overlapping with the insulating layer 125 remains in some cases (see FIG. 68B).

The top surface level of the insulating layer 125 and the top surface level of the insulating layer 127 are each preferably equal to or substantially equal to the top surface level of at least one of the EL layer 113*a*, the EL layer 113*b*, the EL layer 113*c*, and the light-receiving layer 113*d*. The top surface of the insulating layer 127 preferably has a flat shape and may include a projected portion or a depressed portion.

The step of removing the sacrificial layers can be performed by a method similar to that for the step of processing the sacrificial layers. In particular, the use of a wet etching method can reduce damage to the EL layer 113*a*, the EL layer 113*b*, the EL layer 113*c*, and the light-receiving layer 113*d* at the time of removing the first sacrificial layer and the second sacrificial layer, as compared to the case of using a dry etching method.

The first sacrificial layer and the second sacrificial layer may be removed in different steps or the same step.

One or both of the first sacrificial layer and the second sacrificial layer may be removed by being dissolved in a solvent such as water or alcohol. Examples of alcohol include ethyl alcohol, methyl alcohol, isopropyl alcohol (IPA), and glycerin.

After the first sacrificial layer and the second sacrificial layer are removed, drying treatment may be performed to remove water included in the EL layer and water adsorbed on the surface of the EL layer. For example, heat treatment can be performed in an inert gas atmosphere or a reduced-pressure atmosphere. The heat treatment can be performed at a substrate temperature higher than or equal to 50° C. and lower than or equal to 200° C., preferably higher than or equal to 60° C. and lower than or equal to 150° C., further preferably higher than or equal to 70° C. and lower than or equal to 120° C. The heat treatment is preferably performed in a reduced-pressure atmosphere, in which case drying at a lower temperature is possible.

Next, as illustrated in FIG. 68C, the layer 114 is formed to cover the insulating layers 125 and 127, the EL layer 113$a$, the EL layer 113$b$, the EL layer 113$c$, and the light-receiving layer 113$d$. As illustrated in FIG. 68C, an end portion of the layer 114 on the connection portion 140 side is positioned inward from the connection portion 140 in the cross-sectional view along Y1-Y2, and the conductive layer 123 is exposed. Note that the layer 114 may be provided in the connection portion 140 depending on the level of the conductivity of the layer 114.

Materials that can be used for the layer 114 are as described above. The layer 114 can be formed by a method such as an evaporation method (including a vacuum evaporation method), a transfer method, a printing method, an inkjet method, or a coating method. The layer 114 may be formed using a premix material.

Here, in the case where the insulating layer 125 and the insulating layer 127 are not provided, any of the pixel electrode 111$a$, the pixel electrode 111$b$, the pixel electrode 111$c$, and the pixel electrode 111$d$ might be in contact with the layer 114. A contact between these layers might cause a short circuit of the light-emitting devices or the light-receiving device when the layer 114 has high conductivity, for example. In the display apparatus of one embodiment of the present invention, however, the insulating layer 125 and the insulating layer 127 cover the side surfaces of the EL layer 113$a$, the EL layer 113$b$, the EL layer 113$c$, the light-receiving layer 113$d$, the pixel electrode 111$a$, the pixel electrode 111$b$, the pixel electrode 111$c$, and the pixel electrode 111$d$, which can inhibit a contact between the layer 114 having high conductivity and these layers, thereby inhibiting a short circuit of the light-emitting devices. Thus, the reliability of the light-emitting devices can be increased.

Then, the common electrode 115 is formed over the layer 114 and the conductive layer 123 as illustrated in FIG. 68C.

Materials that can be used for the common electrode 115 are as described above. The common electrode 115 can be formed by a sputtering method or a vacuum evaporation method, for example. Alternatively, a film formed by an evaporation method and a film formed by a sputtering method may be stacked.

After that, the protective layer 131 is formed over the common electrode 115, and the protective layer 132 is formed over the protective layer 131. Furthermore, the substrate 120 is bonded onto the protective layer 132 with the resin layer 122, whereby the display apparatus 100 illustrated in FIG. 53B can be manufactured.

Materials and deposition methods that can be used for the protective layers 131 and 132 are as described above. Examples of the deposition method of the protective layers 131 and 132 include a vacuum evaporation method, a sputtering method, a CVD method, and an ALD method. The protective layer 131 and the protective layer 132 may be films formed by different deposition methods. The protective layers 131 and 132 may each have a single-layer structure or a stacked-layer structure.

Note that a mask for specifying a deposition area (which is also referred to as an area mask or a rough metal mask) may be used to form the common electrode 115. Alternatively, the common electrode 115 may be formed without using the mask; the step of processing the common electrode 115 illustrated in FIG. 69A and FIG. 69B may be performed after the step illustrated in FIG. 68C, and then the step of forming the protective layer 131 may be performed.

Figure 62F:
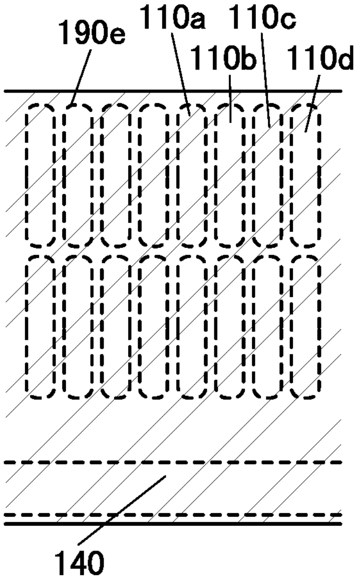
Figure 69A:
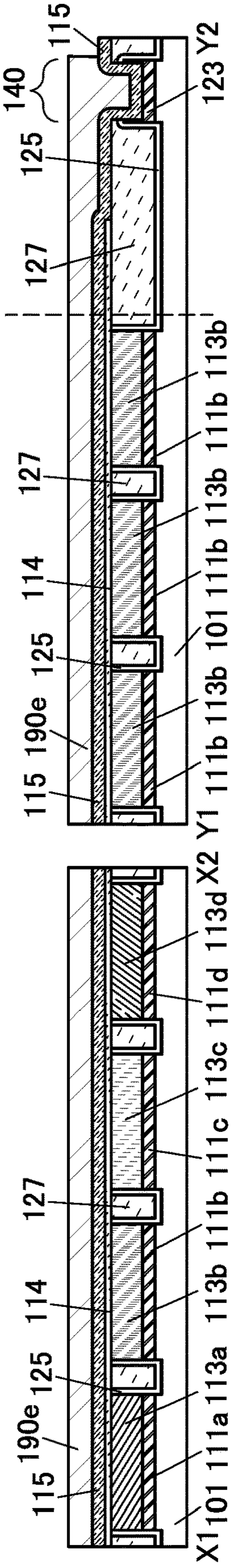
FIG. 69A and FIG. 69B are cross-sectional views illustrating an example of a manufacturing method of a display apparatus.
Figures 70A, 70B, 70C, 70D, 70E:
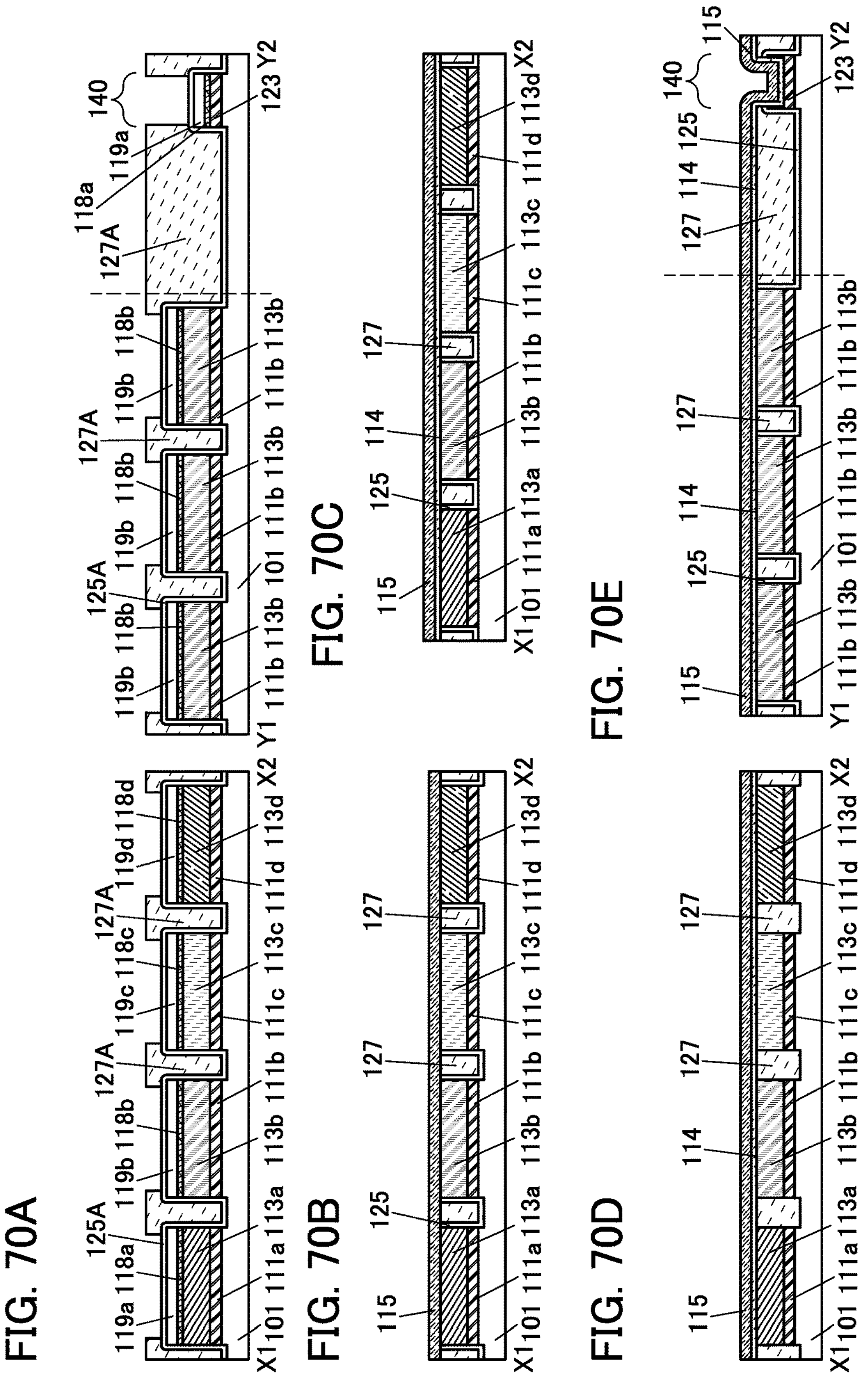
FIG. 70A to FIG. 70E are cross-sectional views illustrating an example of a manufacturing method of a display apparatus.

As illustrated in FIG. 69A and FIG. 62F, a resist mask 190$e$ is formed over the common electrode 115. An end portion on the Y2 side in FIG. 69A includes a portion where the resist mask 190$e$ is not provided. As illustrated in FIG. 62F, the resist mask 190$e$ is provided in a region overlapping with the subpixels and the connection portion 140. That is, the region where the resist mask 190$e$ is not provided is positioned on the outer side of the connection portion 140.

Figure 69B:
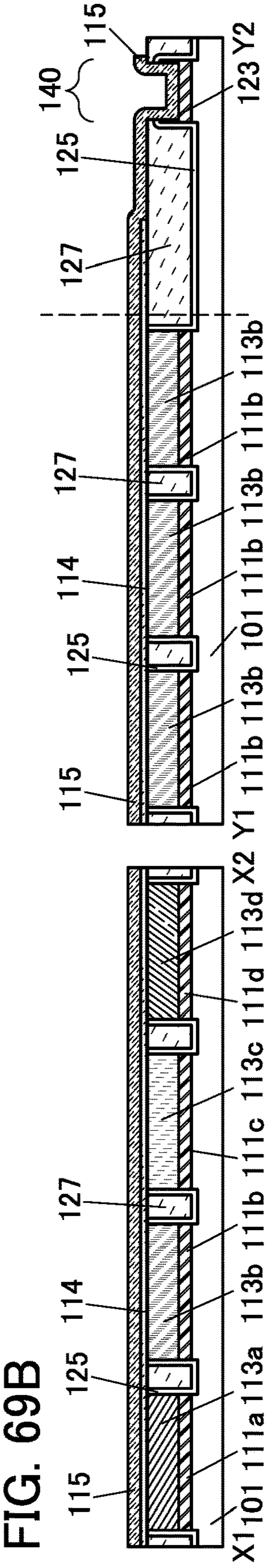

Next, as illustrated in FIG. 69B, part of the common electrode 115 is removed using the resist mask 190$e$. In the above manner, the common electrode 115 can be processed.

Note that in the case where the resist mask 190$e$ is used, processing steps of the resist mask 190$a$, the resist mask 190$b$, the resist mask 190$c$, the resist mask 190$d$, the resist mask 190$e$, and the insulating film 127A are performed; thus, six photomasks are used in the series of manufacturing process. In the case where the resist mask 190$e$ is not used, processing steps of the resist mask 190$a$, the resist mask 190$b$, the resist mask 190$c$, the resist mask 190$d$, and the insulating film 127A are performed; thus, five photomasks are used in the series of manufacturing process, and meanwhile, a mask for specifying a deposition area is used for forming the common electrode 115. In the manufacturing method of the display apparatus of one embodiment of the present invention, it is not necessary to use a metal mask with a high-definition pattern for forming an island-shaped EL layer, a mask for forming a pixel electrode into an island-like shape, and a mask for forming an insulating layer covering an end portion of the pixel electrode, whereby the number of masks and the cost can be reduced.

As illustrated in FIG. 70B, without formation of the layer 114, the common electrode 115 may be formed to cover the insulating layers 125 and 127, the EL layer 113$a$, the EL layer 113$b$, the EL layer 113$c$, and the light-receiving layer 113$d$. That is, all layers included in the EL layers may be formed separately between the light-emitting devices emitting light of different colors. In this case, all the EL layers in the light-emitting devices are formed into island-like shapes.

Here, a short circuit in the light-emitting device might be caused when the common electrode 115 is in contact with any of the pixel electrode 111$a$, the pixel electrode 111$b$, the pixel electrode 111$c$, and the pixel electrode 111$d$. In the display apparatus of one embodiment of the present invention, however, the insulating layers 125 and 127 cover the side surfaces of the EL layer 113$a$, the EL layer 113$b$, the EL layer 113$c$, the light-receiving layer 113$d$, the pixel electrode 11$a$, the pixel electrode 111$b$, the pixel electrode 111$c$, and the pixel electrode 111$d$, which can inhibit the common electrode 115 from being in contact with these layers, thereby inhibiting a short circuit in the light-emitting devices or the light-receiving device. Thus, the reliability of the light-emitting devices and the light-receiving device can be increased.

As illustrated in FIG. 70C, in the case where part of the layer 101 including transistors (specifically, an insulating layer positioned on the outermost surface) is not processed in processing the conductive film 111, a depressed portion is not provided in the layer 101 including transistors in some cases.

The insulating layer 125 is not necessarily provided as illustrated in FIG. 70D. In this case, it is preferable to use, for the insulating layer 127, an organic material that causes less damage to the EL layer 113$a$, the EL layer 113$b$, the EL layer 113$c$, and the light-receiving layer 113$d$. For the insulating layer 127, an organic material such as polyvinyl alcohol (PVA), polyvinylbutyral, polyvinylpyrrolidone, polyethylene glycol, polyglycerin, pullulan, water-soluble cellulose, or an alcohol-soluble polyamide resin is preferably used, for example.

Note that in the case where the layer 114 is provided in the connection portion 140, the conductive layer 123 and the common electrode 115 are electrically connected to each other with the layer 114 therebetween, as illustrated in FIG. 70E.

FIG. 71A to FIG. 71F each illustrate a cross-sectional structure of a region 139 including the insulating layer 127 and its surroundings.

Figure 71A:
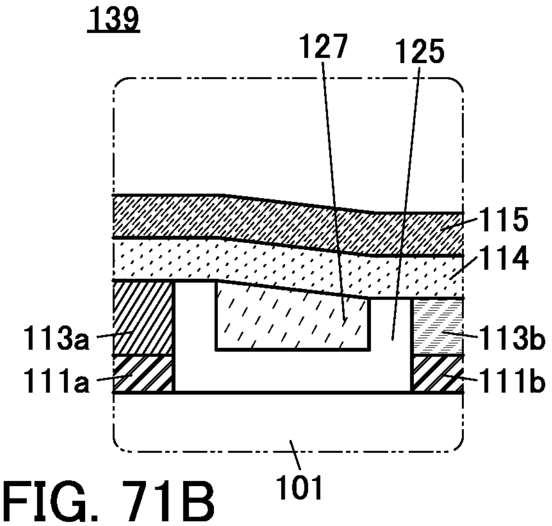
FIG. 71A to FIG. 71F are cross-sectional views illustrating an example of a manufacturing method of a display apparatus.

FIG. 71A illustrates an example where the EL layer 113*a* and the EL layer 113*b* have different thicknesses. The top surface level of the insulating layer 125 is equal to or substantially equal to the top surface level of the EL layer 113*a* on the EL layer 113*a* side, and equal to or substantially equal to the top surface level of the EL layer 113*b* on the EL layer 113*b* side. The top surface of the insulating layer 127 has a gentle slope such that the side closer to the EL layer 113*a* is higher and the side closer to the EL layer 113*b* is lower. In this manner, the levels of the insulating layer 125 and the insulating layer 127 are preferably equal to the top surface level of an adjacent EL layer. Alternatively, the levels of the insulating layers may be equal to the top surface level of any of adjacent EL layers so that their top surfaces have a flat shape portion.

Figure 71B:
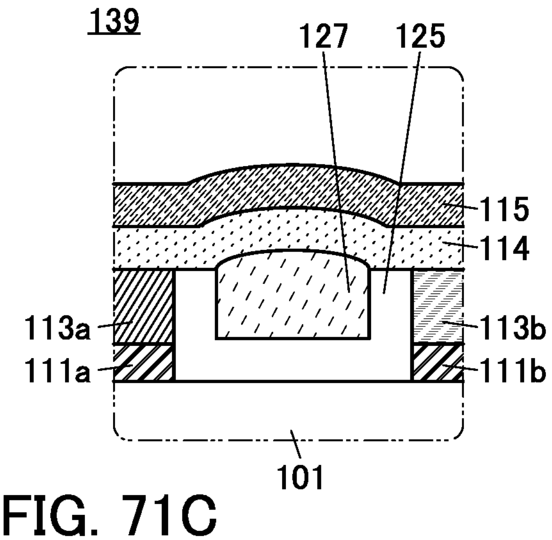

In FIG. 71B, the top surface of the insulating layer 127 includes a region higher in level than the top surface of the EL layer 113*a* and the top surface of the EL layer 113*b*. Moreover, the top surface of the insulating layer 127 has a convex shape that is gently bulged toward the center.

Figure 71C:
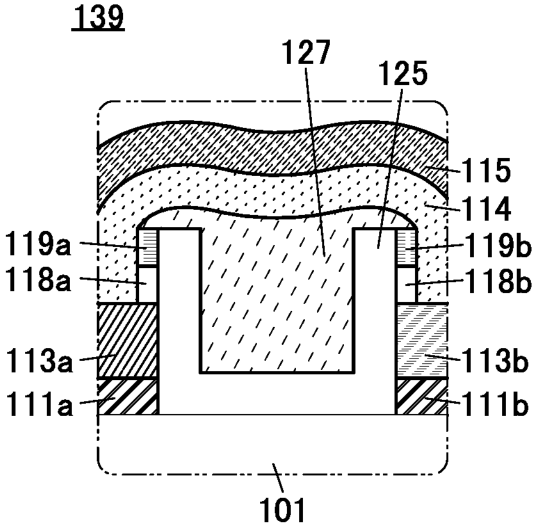

In FIG. 71C, the insulating layer 127 includes a region higher in level than the top surface of the EL layer 113*a* and the top surface of the EL layer 113*b*. In the region 139, the display apparatus 100 includes at least one of the first sacrificial layer 118*a* and the second sacrificial layer 119*a*, and includes a first region where the insulating layer 127 is higher in level than the top surface of the EL layer 113*a* and the top surface of the EL layer 113*b* and positioned on the outer side of the insulating layer 125. The first region is positioned over at least one of the first sacrificial layer 118*a* and the second sacrificial layer 119*a*. In the region 139, the display apparatus 100 includes at least one of the first sacrificial layer 118*b* and the second sacrificial layer 119*b*, and includes a second region where the insulating layer 127 is higher in level than the top surface of the EL layer 113*a* and the top surface of the EL layer 113*b* and positioned on the outer side of the insulating layer 125. The second region is positioned over at least one of the first sacrificial layer 118*b* and the second sacrificial layer 119*b*.

Note that the top surface of the insulating layer 127 may have a shape corresponding to the shape of the formation surface of the insulating layer 127 (e.g., the top surfaces of the insulating layer 125, the second sacrificial layer 119*a*, and the second sacrificial layer 119*b*). FIG. 71C illustrates an example where the top surface of the insulating layer 127 has a recessed shape in a region overlapping with the depressed portion of the insulating layer 125.

Figure 71D:
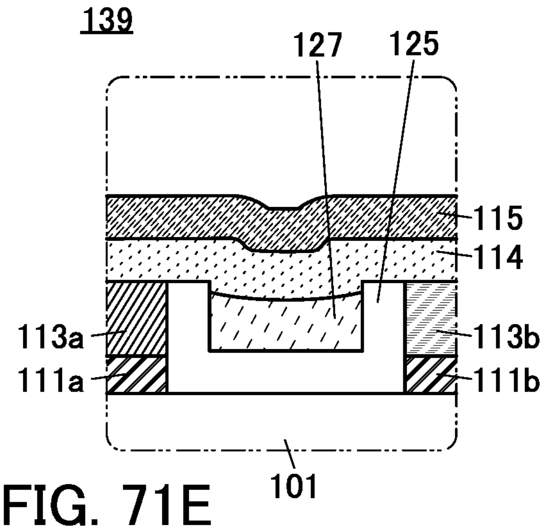

In FIG. 71D, the top surface of the insulating layer 127 includes a region lower in level than the top surface of the EL layer 113*a* and the top surface of the EL layer 113*b*. Moreover, the top surface of the insulating layer 127 has a concave shape that is gently recessed toward the center.

Figure 71E:
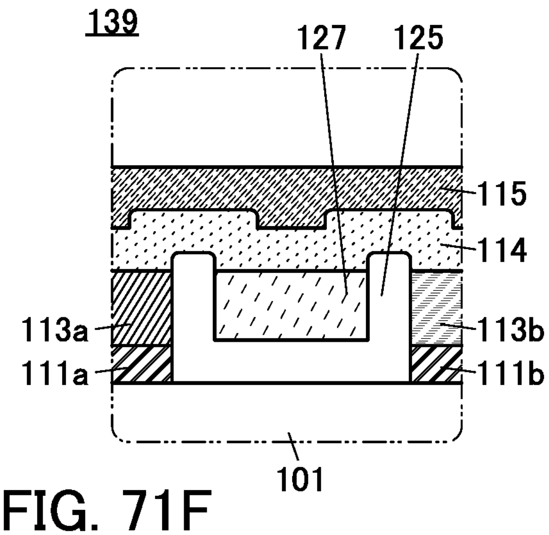

In FIG. 71E, the top surface of the insulating layer 125 includes a region higher in level than the top surface of the EL layer 113*a* and the top surface of the EL layer 113*b*. That is, the insulating layer 125 protrudes from the formation surface of the layer 114, and forms a projected portion.

In formation of the insulating layer 125, for example, in the case where the insulating layer 125 is formed to be level with or substantially level with the sacrificial layer, a shape such that the insulating layer 125 protrudes is sometimes formed as illustrated in FIG. 71E.

Figure 71F:
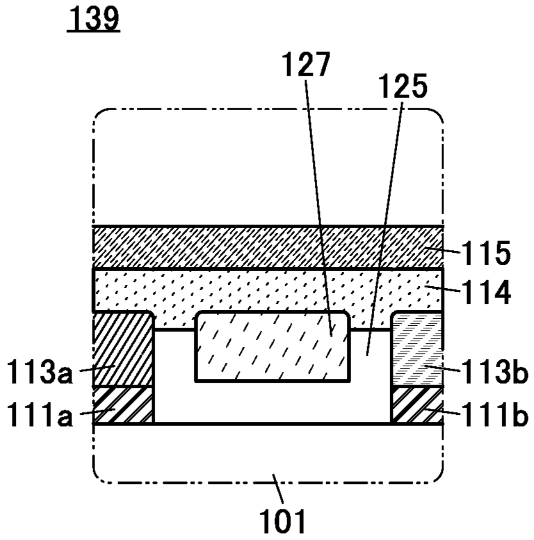

In FIG. 71F, the top surface of the insulating layer 125 includes a region lower in level than the top surface of the EL layer 113*a* and the top surface of the EL layer 113*b*. That is, the insulating layer 125 forms a depressed portion on the formation surface of the layer 114.

As described above, the insulating layer 125 and the insulating layer 127 can have a variety of shapes.

As described above, in the manufacturing method of the display apparatus of one embodiment of the present invention, an island-shaped EL layer is formed by processing an EL layer formed over the entire surface, not with a pattern of a metal mask; thus, the island-shaped EL layer can be formed to have a uniform thickness. Accordingly, a display apparatus with high definition or a display apparatus with a high aperture ratio can be achieved.

The first layer, the second layer, and the third layer included in the light-emitting devices of different colors are formed in separate steps. Accordingly, the EL layers can be formed to have structures (a material, thickness, and the like) appropriate for the light-emitting devices of different colors. Thus, the light-emitting devices can have favorable characteristics.

The display apparatus of one embodiment of the present invention includes an insulating layer that covers side surfaces of a pixel electrode, a light-emitting layer, and a carrier-transport layer. In the manufacturing process of the display apparatus, the EL layer is processed while the light-emitting layer and the carrier-transport layer are stacked; hence, damage to the light-emitting layer is reduced in the display apparatus. In addition, the insulating layer inhibits the pixel electrode from being in contact with a carrier-injection layer or a common electrode, thereby inhibiting a short circuit in the light-emitting device.

Note that there is no particular limitation on the order of forming the light-emitting device 130*a*, the light-emitting device 130*b*, the light-emitting device 130*c*, and the light-receiving device 130*d*.

This embodiment can be combined with the other embodiments as appropriate. In the case where a plurality of structure examples are described in one embodiment in this specification, the structure examples can be combined as appropriate.

Embodiment 5

In this embodiment, a display apparatus of one embodiment of the present invention is described with reference to FIG. 72 to FIG. 74.

The display apparatus of this embodiment can be a high-resolution display apparatus or large-sized display apparatus. Accordingly, the display apparatus of this embodiment can be used for display portions of electronic devices such as a digital camera, a digital video camera, a digital photo frame, a mobile phone, a portable game console, a portable information terminal, and an audio reproducing device, in addition to display portions of electronic devices with a relatively large screen, such as a television device, a desktop or notebook personal computer, a monitor of a computer or the like, digital signage, and a large game machine such as a pachinko machine.

In this specification and the like, a display panel that is one embodiment of a display apparatus has a function of displaying (outputting) an image or the like on (to) a display surface. Therefore, the display panel is one embodiment of an output device.

In this specification and the like, a display apparatus to which a connector such as a flexible printed circuit (FPC) or a TCP (Tape Carrier Package) is attached, or a display apparatus on which an integrated circuit (IC) is mounted by a COG (Chip On Glass) method, a COF (Chip On Film) method, or the like is referred to as a display panel module, a display module, or simply a display panel or the like in some cases.

<Display Apparatus 100A>

Figure 72:
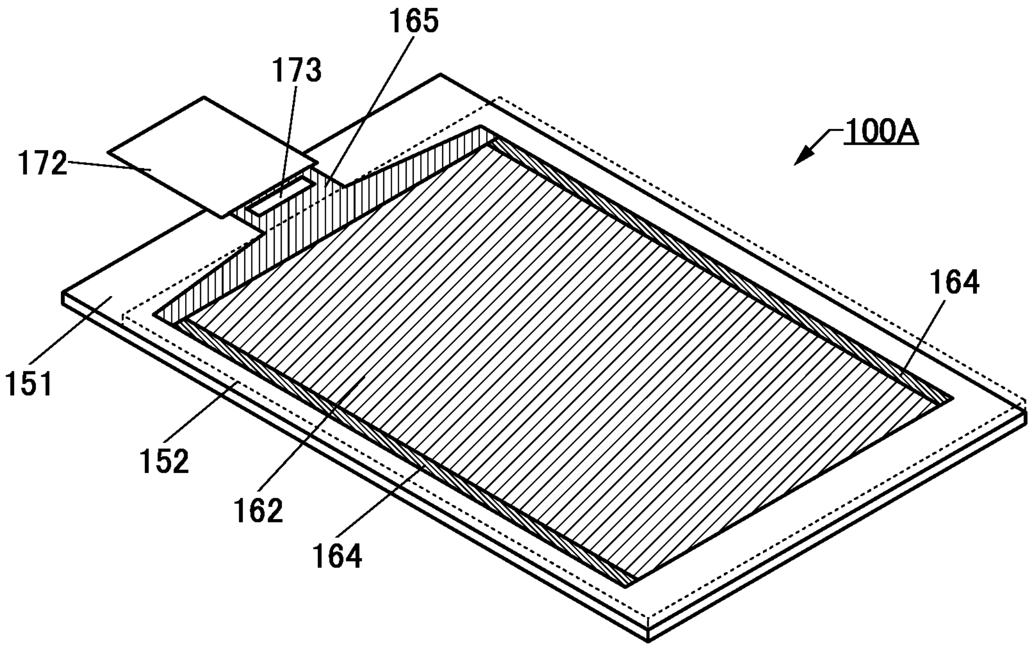
FIG. 72 is a perspective view illustrating an example of a display apparatus.

FIG. 72 illustrates a perspective view of the display apparatus 100A, and FIG. 73A illustrates a cross-sectional view of the display apparatus 100A.

The display apparatus 100A has a structure where a substrate 152 and a substrate 151 are bonded to each other. In FIG. 72, the substrate 152 is denoted by a dashed line.

The display apparatus 100A includes a display portion 162, a circuit 164, a wiring 165, and the like. FIG. 72 illustrates an example where an IC 173 and an FPC 172 are mounted on the display apparatus 100A. Thus, the structure illustrated in FIG. 72 can be regarded as a display module including the display apparatus 100A, the IC (integrated circuit), and the FPC.

As the circuit 164, for example, a scan line driver circuit can be used.

The wiring 165 has a function of supplying a signal and power to the display portion 162 and the circuit 164. The signal and power are input to the wiring 165 from the outside through the FPC 172 or input to the wiring 165 from the IC 173.

FIG. 72 illustrates an example where the IC 173 is provided over the substrate 151 by a COG (Chip On Glass) method, a COF (Chip On Film) method, or the like. An IC including a scan line driver circuit, a signal line driver circuit, or the like can be used as the IC 173, for example. Note that the display apparatus 100A and the display module are not necessarily provided with an IC. The IC may be mounted on the FPC by a COF method or the like.

FIG. 73A illustrates an example of cross sections of part of a region including the FPC 172, part of the circuit 164, part of the display portion 162, and part of a region including an end portion of the display apparatus 100A.

The display apparatus 100A includes light-emitting devices, a light-receiving device, a transistor 207, a transistor 205, and the like between the substrate 151 and the substrate 152. FIG. 73A illustrates, as the light-emitting devices and the light-receiving device, the light-emitting device 130*a* emitting red light, the light-emitting device 130*b* emitting green light, and the light-receiving device 130*d*.

In the case where a pixel of the display apparatus includes three kinds of subpixels including light-emitting devices emitting different colors, the three subpixels can be subpixels of three colors of R, G, and B or subpixels of three colors of yellow (Y), cyan (C), and magenta (M). In the case where four subpixels are included, the four subpixels can be subpixels of four colors of R, G, B, and white (W) or subpixels of four colors of R, G, B, and Y.

The light-emitting device 130*a* and the light-emitting device 130*b* each include an optical adjustment layer between a pixel electrode and an EL layer, and the light-receiving device 130*d* includes an optical adjustment layer between a pixel electrode and a light-receiving layer. As the optical adjustment layer, the light-emitting device 130*a* includes a conductive layer 126*a*, the light-emitting device 130*b* includes a conductive layer 126*b*, and the light-receiving device 130*d* includes a conductive layer 126*d*. Embodiment 1 can be referred to for the details of the light-emitting devices and the light-receiving device. The side surfaces of the pixel electrode 11*a*, the pixel electrode 111*b*, the pixel electrode 111*d*, the conductive layers 126*a*, 126*b*, and 126*d*, the EL layer 113*a*, the EL layer 113*b*, and the light-receiving layer 113*d* are covered with the insulating layers 125 and 127. The layer 114 is provided over the EL layer 113*a*, the EL layer 113*b*, the light-receiving layer 113*d*, and the insulating layers 125 and 127, and the common electrode 115 is provided over the layer 114. The protective layer 131 is provided over the light-emitting device 130*a*, the light-emitting device 130*b*, and the light-receiving device 130*d*. The protective layer 132 is provided over the protective layer 131.

The protective layer 132 and the substrate 152 are bonded to each other with an adhesive layer 142. A solid sealing structure, a hollow sealing structure, or the like can be employed to seal the light-emitting devices. In FIG. 73A, a solid sealing structure is employed in which a space between the substrate 152 and the substrate 151 is filled with the adhesive layer 142. Alternatively, a hollow sealing structure where the space is filled with an inert gas (e.g., nitrogen or argon) may be employed. The adhesive layer 142 may be provided not to overlap with the light-emitting device. The space may be filled with a resin different from that of the frame-like adhesive layer 142.

The pixel electrode 111*a*, the pixel electrode 111*b*, and the pixel electrode 111*d* are each connected to a conductive layer 222*b* included in the transistor 205 through an opening provided in an insulating layer 214.

Depressed portions are formed in the pixel electrode 111*a*, the pixel electrode 111*b*, and the pixel electrode 111*d* to cover the openings provided in the insulating layer 214. A layer 128 is preferably embedded in the depressed portion. It is preferable that the conductive layer 126*a* be formed over the pixel electrode 111*a* and the layer 128, the conductive layer 126*b* be formed over the pixel electrode 111*b* and the layer 128, and the conductive layer 126*d* be formed over the pixel electrode 111*d* and the layer 128. The conductive layer 126*a*, the conductive layer 126*b*, and the conductive layer 126*d* can also be referred to as pixel electrodes.

The layer 128 has a planarization function for the depressed portions of the pixel electrode 111*a*, the pixel electrode 111*b*, and the pixel electrode 111*d*. The formation of the layer 128 can reduce unevenness of the formation surfaces of the EL layers and the light-receiving layer, and accordingly can improve the coverage. When the conductive layer 126*a*, the conductive layer 126*b*, and the conductive layer 126*d* electrically connected to the pixel electrode 111*a*, the pixel electrode 111*b*, and the pixel electrode 111*d* are provided over the pixel electrode 111*a*, the pixel electrode 111*b*, the pixel electrode 111*d*, and the layer 128, regions overlapping with the depressed portions of the pixel electrode 111*a*, the pixel electrode 111*b*, and the pixel electrode 111*d* can be used as the light-emitting regions in some cases. Thus, the aperture ratio of a pixel can be increased.

The layer 128 may be an insulating layer or a conductive layer. Any of a variety of inorganic insulating materials, organic insulating materials, and conductive materials can be used for the layer 128 as appropriate. In particular, the layer 128 is preferably formed using an insulating material.

An insulating layer containing an organic material can be suitably used for the layer 128. As the layer 128, an acrylic resin, a polyimide resin, an epoxy resin, a polyamide resin, a polyimide-amide resin, a siloxane resin, a benzocyclobutene-based resin, a phenol resin, a precursor of any of these resins, or the like can be used, for example. A photosensitive resin can also be used for the layer 128. As the photosensitive resin, a positive photosensitive material or a negative photosensitive material can be used.

When a photosensitive resin is used, the layer 128 can be formed through only light-exposure and development steps, reducing the influence of dry etching, wet etching, or the like on the surfaces of the pixel electrode 111*a*, the pixel electrode 111*b*, and the pixel electrode 111*d*. When the layer 128 is formed using a negative photosensitive resin, the layer 128 can sometimes be formed using the photomask (light-exposure mask) used for forming the opening in the insulating layer 214.

The conductive layer 126*a* is provided over the pixel electrode 111*a* and the layer 128. The conductive layer 126*a* includes a first region in contact with the top surface of the pixel electrode 11*a* and a second region in contact with the top surface of the layer 128. The top surface level of the pixel electrode 111*a* in contact with the first region and the top surface level of the layer 128 in contact with the second region are preferably equal to or substantially equal to each other.

Similarly, the conductive layer 126*b* is provided over the pixel electrode 111*b* and the layer 128. The conductive layer 126*b* includes a first region in contact with the top surface of the pixel electrode 111*b* and a second region in contact with the top surface of the layer 128. The top surface level of the pixel electrode 111*b* in contact with the first region and the top surface level of the layer 128 in contact with the second region are preferably equal to or substantially equal to each other.

The conductive layer 126*d* is provided over the pixel electrode 111*d* and the layer 128. The conductive layer 126*d* includes a first region in contact with the top surface of the pixel electrode 111*d* and a second region in contact with the top surface of the layer 128. The top surface level of the pixel electrode 111*d* in contact with the first region and the top surface level of the layer 128 in contact with the second region are preferably equal to or substantially equal to each other.

The pixel electrode contains a material reflecting visible light, and a counter electrode contains a material transmitting visible light.

The display apparatus 100A is of a top emission type. Light from the light-emitting device is emitted toward the substrate 152 side. For the substrate 152, a material having a high transmitting property with respect to visible light is preferably used. For the substrate 152, a material having a high transmitting property with respect to visible light and infrared light is further preferably used. Light is incident on the light-receiving device through the substrate 152.

A stacked-layer structure from the substrate 151 to the insulating layer 214 corresponds to the substrate 23 described in Embodiment 1 or the layer 101 including transistors described in Embodiment 2 and the like.

The transistor 207 and the transistor 205 are each formed over the substrate 151. These transistors can be manufactured using the same materials through the same process.

An insulating layer 217, an insulating layer 213, an insulating layer 215, and the insulating layer 214 are provided in this order over the substrate 151. Parts of the insulating layer 217 function as gate insulating layers of the transistors. Parts of the insulating layer 213 function as gate insulating layers of the transistors. The insulating layer 215 is provided to cover the transistors. The insulating layer 214 is provided to cover the transistors and has a function of a planarization layer. Note that there is no limitation on the number of gate insulating layers and the number of insulating layers covering the transistors, and each insulating layer may be a single layer or include two or more layers.

A material through which impurities such as water and hydrogen do not easily diffuse is preferably used for at least one of the insulating layers covering the transistors. Thus, such an insulating layer can function as a barrier layer. Such a structure can effectively inhibit diffusion of impurities into the transistors from the outside and increase the reliability of the display apparatus.

An inorganic insulating film is preferably used as each of the insulating layer 217, the insulating layer 213, and the insulating layer 215. As the inorganic insulating film, for example, a silicon nitride film, a silicon oxynitride film, a silicon oxide film, a silicon nitride oxide film, an aluminum oxide film, or an aluminum nitride film, or the like can be used. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may also be used. A stack including two or more of the above insulating films may also be used.

Here, an organic insulating film often has a lower barrier property than an inorganic insulating film. Therefore, the organic insulating film preferably has an opening in the vicinity of an end portion of the display apparatus 100A. This can inhibit entry of impurities from the end portion of the display apparatus 100A through the organic insulating film. Alternatively, the organic insulating film may be formed so that its end portion is positioned inward from the end portion of the display apparatus 100A, to prevent the organic insulating film from being exposed at the end portion of the display apparatus 100A.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins. Alternatively, the insulating layer 214 may have a stacked-layer structure of an organic insulating film and an inorganic insulating film. The outermost layer of the insulating layer 214 preferably functions as an etching protective film. Accordingly, a depressed portion can be inhibited from being formed in the insulating layer 214 at the time of processing the pixel electrode 111*a*, the conductive layer 126*a*, or the like. Alternatively, a depressed portion may be formed in the insulating layer 214 at the time of processing the pixel electrode 111*a*, the conductive layer 126*a*, or the like.

In a region 228 illustrated in FIG. 73A, an opening is formed in the insulating layer 214. This can inhibit entry of impurities into the display portion 162 from the outside through the insulating layer 214 even when an organic insulating film is used as the insulating layer 214. Consequently, the reliability of the display apparatus 100A can be increased.

Each of the transistor 207 and the transistors 205 includes a conductive layer 221 functioning as a gate, the insulating layer 217 functioning as the gate insulating layer, a conductive layer 222a and the conductive layer 222b functioning as a source and a drain, a semiconductor layer 231, the insulating layer 213 functioning as the gate insulating layer, and a conductive layer 223 functioning as a gate. Here, a plurality of layers obtained by processing the same conductive film are shown with the same hatching pattern. The insulating layer 217 is positioned between the conductive layer 221 and the semiconductor layer 231. The insulating layer 213 is positioned between the conductive layer 223 and the semiconductor layer 231.

There is no particular limitation on the structure of the transistors included in the display apparatus of this embodiment. For example, a planar transistor, a staggered transistor, an inverted staggered transistor, or the like can be used. A top-gate or a bottom-gate transistor structure may be employed. Alternatively, gates may be provided above and below the semiconductor layer where a channel is formed.

The structure where the semiconductor layer where a channel is formed is interposed between two gates is used for the transistor 207 and the transistors 205. The two gates may be connected to each other and supplied with the same signal to drive the transistor. Alternatively, a potential for controlling the threshold voltage may be supplied to one of the two gates and a potential for driving may be supplied to the other to control the threshold voltage of the transistor.

There is no particular limitation on the crystallinity of a semiconductor material used for the transistors, and any of an amorphous semiconductor and a semiconductor having crystallinity (a microcrystalline semiconductor, a polycrystalline semiconductor, a single crystal semiconductor, or a semiconductor partly including crystal regions) may be used. It is preferable to use a semiconductor having crystallinity, in which case degradation of the transistor characteristics can be inhibited.

The semiconductor layer of the transistor preferably includes a metal oxide (also referred to as an oxide semiconductor). That is, a transistor including a metal oxide in its channel formation region (hereinafter, also referred to as an OS transistor) is preferably used for the display apparatus of this embodiment. Alternatively, the semiconductor layer of the transistor may contain silicon. Examples of silicon include amorphous silicon and crystalline silicon (e.g., low-temperature polysilicon or single crystal silicon).

The semiconductor layer preferably contains indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more kinds selected from aluminum, gallium, yttrium, and tin.

It is particularly preferable that an oxide containing indium (In), gallium (Ga), and zinc (Zn) (also referred to as IGZO) be used as the semiconductor layer. Alternatively, an oxide containing indium (In), aluminum (Al), and zinc (Zn) (also referred to as IAZO) may be used for the semiconductor layer. Alternatively, an oxide containing indium (In), aluminum (Al), gallium (Ga), and zinc (Zn) (also referred to as IAGZO) may be used for the semiconductor layer.

In the case where the semiconductor layer is an In-M-Zn oxide, the atomic proportion of In is preferably greater than or equal to the atomic proportion of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=1:3:2 or a composition in the neighborhood thereof, In:M:Zn=1:3:4 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio.

For example, when the atomic ratio is described as In:Ga:Zn=4:2:3 or a composition in the neighborhood thereof, the case is included where the atomic ratio of Ga is greater than or equal to 1 and less than or equal to 3 and the atomic ratio of Zn is greater than or equal to 2 and less than or equal to 4 with the atomic ratio of In being 4. When the atomic ratio is described as In:Ga:Zn=5:1:6 or a composition in the neighborhood thereof, the case is included where the atomic ratio of Ga is greater than 0.1 and less than or equal to 2 and the atomic ratio of Zn is greater than or equal to 5 and less than or equal to 7 with the atomic ratio of In being 5. When the atomic ratio is described as In:Ga:Zn=1:1:1 or a composition in the neighborhood thereof, the case is included where the atomic ratio of Ga is greater than 0.1 and less than or equal to 2 and the atomic ratio of Zn is greater than 0.1 and less than or equal to 2 with the atomic ratio of In being 1.

The transistor included in the circuit 164 and the transistor included in the display portion 162 may have the same structure or different structures. A plurality of transistors included in the circuit 164 may have the same structure or two or more kinds of structures. Similarly, a plurality of transistors included in the display portion 162 may have the same structure or two or more kinds of structures.

FIG. 73B and FIG. 73C illustrate other structure examples of transistors.

Each of a transistor 209 and a transistor 210 includes the conductive layer 221 functioning as a gate, the insulating layer 217 functioning as a gate insulating layer, the semiconductor layer 231 including a channel formation region 231i and a pair of low-resistance regions 231n, the conductive layer 222a connected to one of the pair of low-resistance regions 231n, the conductive layer 222b connected to the other of the pair of low-resistance regions 231n, the insulating layer 225 functioning as a gate insulating layer, the conductive layer 223 functioning as a gate, and the insulating layer 215 covering the conductive layer 223. The insulating layer 217 is positioned between the conductive layer 221 and the channel formation region 231i. The insulating layer 225 is positioned at least between the conductive layer 223 and the channel formation region 231i. Furthermore, an insulating layer 218 covering the transistor may be provided.

FIG. 73B illustrates an example of the transistor 209 where the insulating layer 225 covers the top and side surfaces of the semiconductor layer 231. The conductive layer 222a and the conductive layer 222b are connected to the corresponding low-resistance regions 231n through openings provided in the insulating layer 225 and the insulating layer 215. One of the conductive layer 222a and the conductive layer 222b functions as a source, and the other functions as a drain.

In the transistor 210 illustrated in FIG. 73C, the insulating layer 225 overlaps with the channel formation region 231i of the semiconductor layer 231 and does not overlap with the low-resistance regions 231*n*. The structure illustrated in FIG. 73C can be manufactured by processing the insulating layer 225 using the conductive layer 223 as a mask, for example. In FIG. 73C, the insulating layer 215 is provided to cover the insulating layer 225 and the conductive layer 223, and the conductive layer 222*a* and the conductive layer 222*b* are connected to the corresponding low-resistance regions 231*n* through the openings in the insulating layer 215.

A connection portion 204 is provided in a region of the substrate 151 which does not overlap with the substrate 152. In the connection portion 204, the wiring 165 is electrically connected to the FPC 172 through a conductive layer 166 and a connection layer 242. An example is illustrated where the conductive layer 166 has a stacked-layer structure of a conductive film obtained by processing the same conductive film as the pixel electrode 111*a*, the pixel electrode 111*b*, and the pixel electrode 111*d* and a conductive film obtained by processing the same conductive film as the conductive layer 126*a*, the conductive layer 126*b*, and the conductive layer 126*d*. On the top surface of the connection portion 204, the conductive layer 166 is exposed. Thus, the connection portion 204 and the FPC 172 can be electrically connected to each other through the connection layer 242.

A light-blocking layer 117 is preferably provided on the surface of the substrate 152 on the substrate 151 side. A variety of optical members can be arranged on the outer surface of the substrate 152. Examples of the optical members include a polarizing plate, a retardation plate, a light diffusion layer (a diffusion film or the like), an anti-reflective layer, and a light-condensing film. Furthermore, an antistatic film to inhibit attachment of dust, a water repellent film to reduce attachment of stain, a hard coat film to inhibit generation of a scratch caused by the use, an impact-absorbing layer, or the like may be arranged on the outer surface of the substrate 152.

The protective layer 131 and the protective layer 132 provided to cover the light-emitting device can inhibit an impurity such as water from entering the light-emitting device. As a result, the reliability of the light-emitting device can be enhanced.

In the region 228 in the vicinity of the end portion of the display apparatus 100A, the insulating layer 215 and the protective layer 131 or the protective layer 132 are preferably in contact with each other through an opening in the insulating layer 214. In particular, the inorganic insulating films are preferably in contact with each other. This can inhibit entry of impurities into the display portion 162 from the outside through the organic insulating film. Consequently, the reliability of the display apparatus 100A can be increased.

For each of the substrate 151 and the substrate 152, glass, quartz, ceramics, sapphire, a resin, a metal, an alloy, a semiconductor, or the like can be used. The substrate on the side where light from the light-emitting device is extracted is formed using a material transmitting the light. When the substrate 151 and the substrate 152 are formed using a flexible material, the flexibility of the display apparatus can be increased. Furthermore, a polarizing plate may be used as the substrate 151 or the substrate 152.

For each of the substrate 151 and the substrate 152, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyether sulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber can be used, for example. Glass that is thin enough to have flexibility may be used for one or both of the substrate 151 and the substrate 152.

In the case where a circularly polarizing plate overlaps with the display apparatus, a highly optically isotropic substrate is preferably used as the substrate included in the display apparatus. A highly optically isotropic substrate has a low birefringence (in other words, a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of a highly optically isotropic film include a triacetyl cellulose (TAC, also referred to as cellulose triacetate) film, a cycloolefin polymer (COP) film, a cycloolefin copolymer (COC) film, and an acrylic film.

In the case where a film is used for the substrate and the film absorbs water, the shape of the display panel might be changed, e.g., creases are generated. Thus, for the substrate, a film with a low water absorption rate is preferably used. For example, the water absorption rate of the film is preferably lower than or equal to 1%, further preferably lower than or equal to 0.1%, still further preferably lower than or equal to 0.01%.

As the adhesive layer, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferable. Alternatively, a two-component resin may be used. An adhesive sheet or the like may be used.

As the connection layer 242, an anisotropic conductive film (ACF), an anisotropic conductive paste (ACP), or the like can be used.

As materials that can be used for a gate, a source, and a drain of a transistor and conductive layers such as a variety of wirings and electrodes included in a display apparatus, metals such as aluminum, titanium, chromium, nickel, copper, yttrium, zirconium, molybdenum, silver, tantalum, or tungsten, an alloy containing any of these metals as its main component, and the like can be given. A film containing any of these materials can be used as a single layer or a stacked-layer structure.

As a light-transmitting conductive material, a conductive oxide such as indium oxide, indium tin oxide, indium zinc oxide, zinc oxide, or zinc oxide containing gallium, or graphene can be used. Alternatively, a metal material such as gold, silver, platinum, magnesium, nickel, tungsten, chromium, molybdenum, iron, cobalt, copper, palladium, or titanium, or an alloy material containing the metal material can be used. Further alternatively, a nitride of the metal material (e.g., titanium nitride) or the like may be used. Note that in the case of using the metal material or the alloy material (or the nitride thereof), it is preferably thinned so as to have a light-transmitting property. A stacked film of any of the above materials can be used as a conductive layer. For example, a stacked film of indium tin oxide and an alloy of silver and magnesium, or the like is preferably used to increase the conductivity. They can also be used for conductive layers such as wirings and electrodes included in the display apparatus, and conductive layers (e.g., a conductive layer functioning as a pixel electrode or a common electrode) included in a light-emitting device.

As an insulating material that can be used for each insulating layer, for example, a resin such as an acrylic resin or an epoxy resin, and an inorganic insulating material such as silicon oxide, silicon oxynitride, silicon nitride oxide, silicon nitride, or aluminum oxide can be given.

<Display Apparatus 100B>

Figure 74:
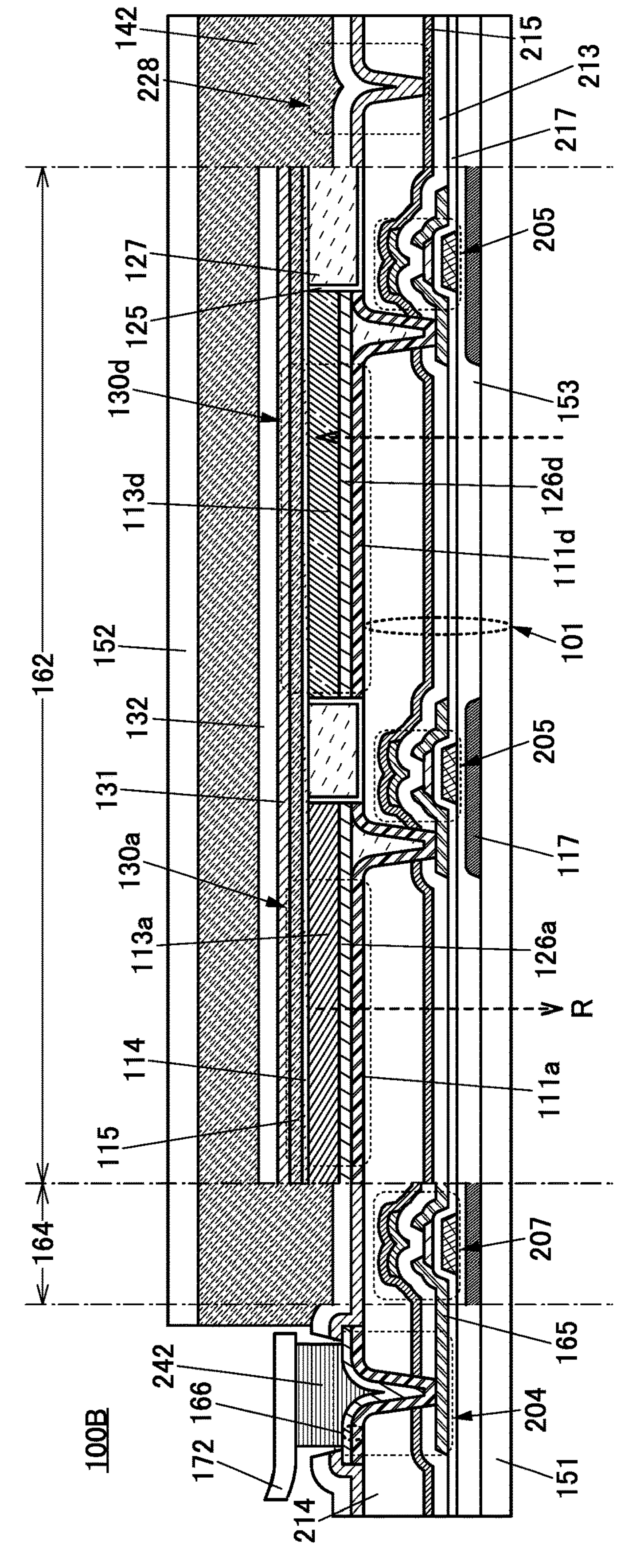
FIG. 74 is a cross-sectional view illustrating an example of a display apparatus.

A display apparatus 100B illustrated in FIG. 74 is different from the display apparatus 100A mainly in having a bottom-emission structure. Note that portions similar to those in the display apparatus 100A are not described in some cases.

Light from the light-emitting device is emitted toward the substrate 151 side. For the substrate 151, a material having a high transmitting property with respect to visible light is preferably used. For the substrate 151, a material having a high transmitting property with respect to visible light and infrared light is further preferably used. By contrast, there is no limitation on the light-transmitting property of a material used for the substrate 152. Light is incident on the light-receiving device through the substrate 151.

The light-blocking layer 117 is preferably formed between the substrate 151 and the transistor 207 and between the substrate 151 and the transistor 205. FIG. 74 illustrates an example where the light-blocking layer 117 is provided over the substrate 151, an insulating layer 153 is provided over the light-blocking layer 117, and the transistors 207 and 205 and the like are provided over the insulating layer 153.

This embodiment can be combined with any of the other embodiments as appropriate.

Embodiment 6

In this embodiment, display apparatuses of one embodiment of the present invention are described with reference to FIG. 75 to FIG. 81.

The display apparatus of this embodiment can be a high-definition display apparatus. Accordingly, the display apparatus of this embodiment can be used for display portions of information terminals (wearable devices) such as watch-type and bracelet-type information terminals and display portions of wearable devices capable of being worn on the head, such as a VR (Virtual Reality) device like a head mounted display and a glasses-type AR (Augmented Reality) device.

<Display Module>

Figure 75A:
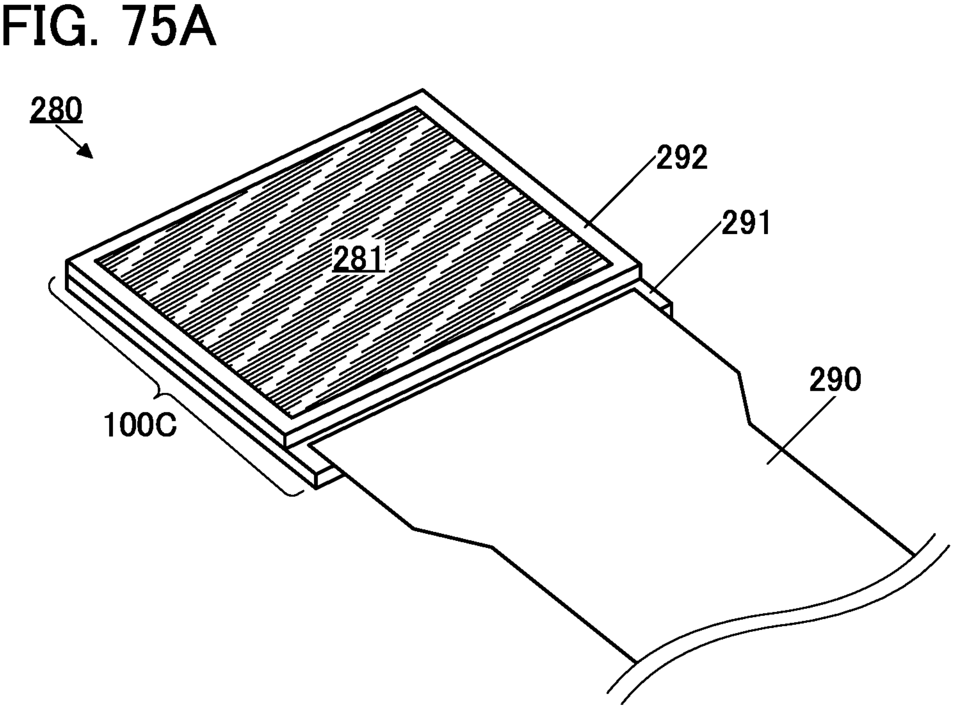
FIG. 75A and FIG. 75B are perspective views illustrating an example of a display module.

FIG. 75A is a perspective view of a display module 280. The display module 280 includes a display apparatus 100C and an FPC 290. Note that the display apparatus included in the display module 280 is not limited to the display apparatus 100C and may be a display apparatus 100D or a display apparatus 100E described later.

The display module 280 includes a substrate 291 and a substrate 292. The display module 280 includes a display portion 281. The display portion 281 is a region of the display module 280 where an image is displayed, and is a region where light from pixels provided in a pixel portion 284 described later can be seen.

Figure 75B:
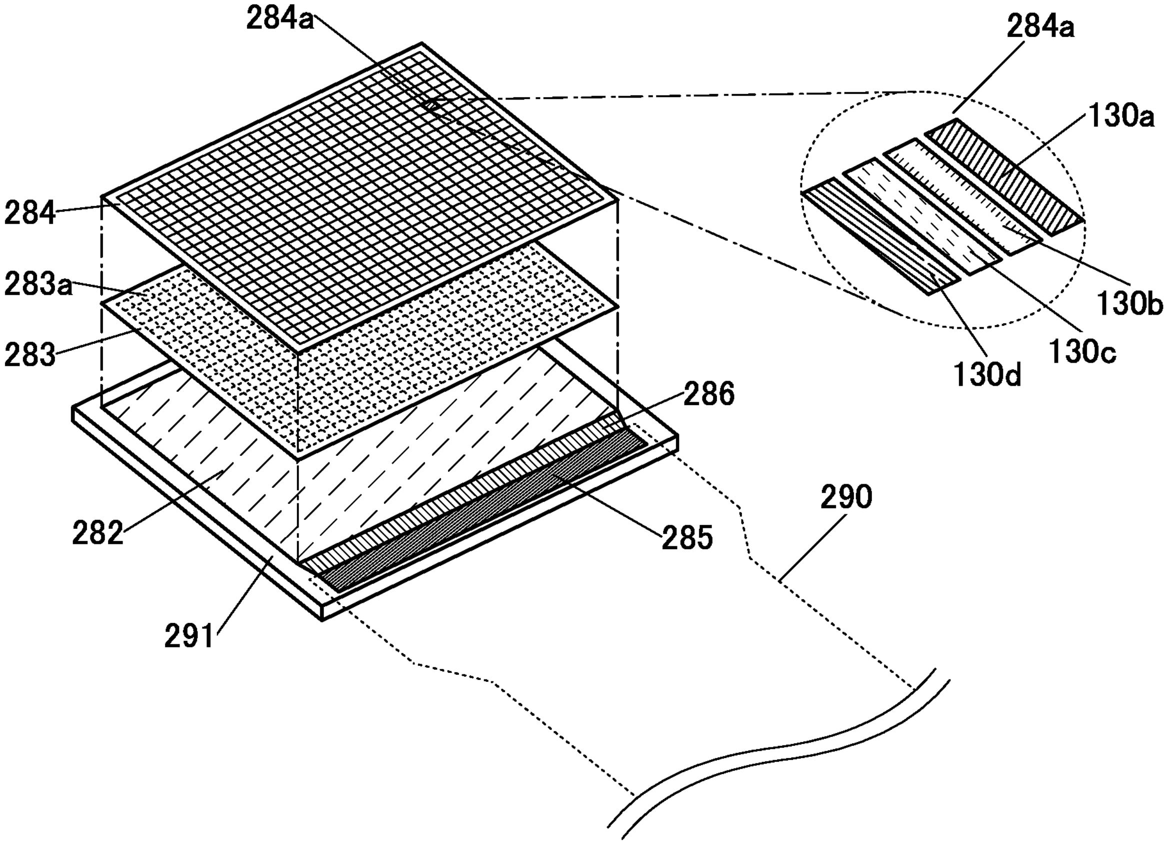

FIG. 75B is a perspective view schematically illustrating a structure on the substrate 291 side. Over the substrate 291, a circuit portion 282, a pixel circuit portion 283 over the circuit portion 282, and the pixel portion 284 over the pixel circuit portion 283 are stacked. In addition, a terminal portion 285 for connection to the FPC 290 is included in a portion not overlapping with the pixel portion 284 over the substrate 291. The terminal portion 285 and the circuit portion 282 are electrically connected to each other through a wiring portion 286 formed of a plurality of wirings.

The pixel portion 284 includes a plurality of pixels 284*a* arranged periodically. An enlarged view of one pixel 284*a* is illustrated on the right side of FIG. 75B. The pixel 284*a* includes a light-emitting device 130*a*, a light-emitting device 130*b*, and a light-emitting device 130*c* emitting light of different colors and a light-receiving device 130*d*. The light-emitting devices and the light-receiving device can be arranged in a stripe pattern as illustrated in FIG. 75B. Alternatively, a variety of arrangement methods of light-emitting devices, such as delta arrangement or PenTile arrangement can be employed.

The pixel circuit portion 283 includes a plurality of pixel circuits 283*a* arranged periodically.

One pixel circuit 283*a* is a circuit that controls light emission of the light-emitting device and light reception of light-receiving device in one pixel 284*a*. For example, in the case where one pixel 284*a* includes three light-emitting devices and one light-receiving device, one pixel circuit 283*a* is a circuit controlling light emission of the three light-emitting devices and light reception of the one light-receiving device. One pixel circuit 283*a* may have a structure where three circuits each controlling light emission from one light-emitting device are provided and one circuit controlling light reception of one light-receiving device is provided. For example, the pixel circuit 283*a* can include at least one selection transistor, one current control transistor (driving transistor), and a capacitor for one light-emitting device. A gate signal is input to a gate of the selection transistor, and a source signal is input to one of a source and a drain of the selection transistor. With such a structure, an active-matrix display apparatus is achieved. As the pixel circuit 283*a*, the pixel circuit described in Embodiment 1 can be used, for example.

The circuit portion 282 includes a circuit for driving the pixel circuits 283*a* in the pixel circuit portion 283. For example, one or both of a gate line driver circuit and a source line driver circuit are preferably included. In addition, at least one of an arithmetic circuit, a memory circuit, a power supply circuit, and the like may be included.

The FPC 290 functions as a wiring for supplying a video signal, a power supply potential, or the like to the circuit portion 282 from the outside. An IC may be mounted on the FPC 290.

The display module 280 can have a structure where one or both of the pixel circuit portion 283 and the circuit portion 282 are stacked below the pixel portion 284; hence, the aperture ratio (effective display area ratio) of the display portion 281 can be significantly high. For example, the aperture ratio of the display portion 281 can be higher than or equal to 40% and lower than 100%, preferably higher than or equal to 50% and lower than or equal to 95%, further preferably higher than or equal to 60% and lower than or equal to 95%. Furthermore, the pixels 284*a* can be arranged at very high density and thus the display portion 281 can have an extremely high definition. For example, the pixels 284*a* are preferably arranged in the display portion 281 with a definition higher than or equal to 500 ppi, preferably higher than or equal to 1000 ppi, further preferably higher than or equal to 2000 ppi, still further preferably higher than or equal to 3000 ppi, yet further preferably higher than or equal to 5000 ppi, yet still further preferably higher than or equal to 6000 ppi, and lower than or equal to 20000 ppi or lower than or equal to 30000 ppi.

Such a display module 280 has an extremely high definition, and thus can be suitably used for a VR device such as a head mounted display or a glasses-type AR device. For example, even with a structure where the display portion of the display module 280 is seen through a lens, pixels of the extremely-high-definition display portion 281 included in the display module 280 are prevented from being perceived when the display portion is enlarged by the lens, so that display providing a high sense of immersion can be performed. Without being limited thereto, the display module 280 can be suitably used for electronic devices including a relatively small display portion. For example, the display module 280 can be favorably used for a display portion of a wearable electronic device, such as a wrist watch.

<Display Apparatus 100C>

Figure 76:
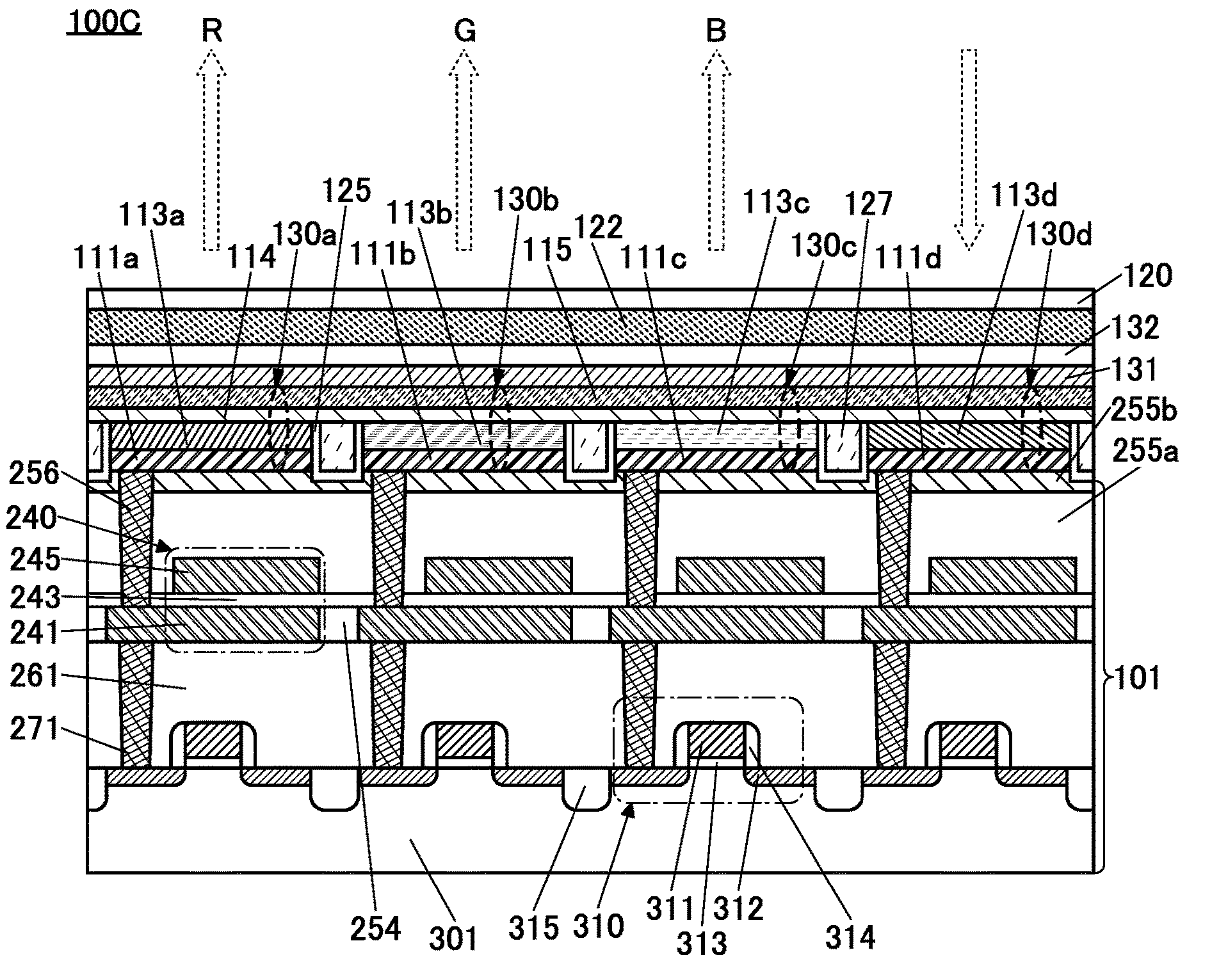
FIG. 76 is a cross-sectional view illustrating an example of a display apparatus.

The display apparatus 100C illustrated in FIG. 76 includes a substrate 301, the light-emitting device 130*a*, the light-remitting device 130*b*, the light-emitting device 130*c*, the light-receiving device 130*d*, a capacitor 240, and a transistor 310.

The substrate 301 corresponds to the substrate 291 in FIG. 75A and FIG. 75B.

The transistor 310 is a transistor including a channel formation region in the substrate 301. As the substrate 301, a semiconductor substrate such as a single crystal silicon substrate can be used, for example. The transistor 310 includes part of the substrate 301, a conductive layer 311, a low-resistance region 312, an insulating layer 313, and an insulating layer 314. The conductive layer 311 functions as a gate electrode. The insulating layer 313 is positioned between the substrate 301 and the conductive layer 311 and functions as a gate insulating layer. The low-resistance region 312 is a region where the substrate 301 is doped with an impurity, and functions as one of a source and a drain. The insulating layer 314 is provided to cover a side surface of the conductive layer 311, and serves as an insulating layer.

An element isolation layer 315 is provided between two adjacent transistors 310 to be embedded in the substrate 301.

An insulating layer 261 is provided to cover the transistor 310, and the capacitor 240 is provided over the insulating layer 261.

The capacitor 240 includes a conductive layer 241, a conductive layer 245, and an insulating layer 243 positioned therebetween. The conductive layer 241 functions as one electrode of the capacitor 240, the conductive layer 245 functions as the other electrode of the capacitor 240, and the insulating layer 243 functions as a dielectric of the capacitor 240.

The conductive layer 241 is provided over the insulating layer 261 and embedded in an insulating layer 254. The conductive layer 241 is electrically connected to one of the source and the drain of the transistor 310 through a plug 271 embedded in the insulating layer 261. The insulating layer 243 is provided to cover the conductive layer 241. The conductive layer 245 is provided in a region overlapping with the conductive layer 241 with the insulating layer 243 therebetween.

An insulating layer 255*a* is provided to cover the capacitor 240, an insulating layer 255*b* is provided over the insulating layer 255*a*, and the light-emitting device 130*a*, the light-emitting device 130*b*, the light-emitting device 130*c*, the light-receiving device 130*d*, and the like are provided over the insulating layer 255*b*. The side surfaces of the pixel electrode 111*a*, the pixel electrode 111*b*, the pixel electrode 111*c*, the pixel electrode 111*d*, the EL layer 113*a*, the EL layer 113*b*, the EL layer 113*c*, and the light-receiving layer 113*d* are each covered with the insulating layers 125 and 127. The layer 114 is provided over the EL layer 113*a*, the EL layer 113*b*, the EL layer 113*c*, the light-receiving layer 113*d*, the insulating layer 125, and the insulating layer 127, and the common electrode 115 is provided over the layer 114. The protective layer 131 is provided over the light-emitting device 130*a*, the light-emitting device 130*b*, the light-emitting device 130*c*, and the light-receiving device 130*d*. The protective layer 132 is provided over the protective layer 131, and the substrate 120 is bonded onto the protective layer 132 with the resin layer 122. The above description can be referred to for details of the light-emitting devices and the components thereover up to the substrate 120.

As each of the insulating layers 255*a* and 255*b*, a variety of inorganic insulating films such as an oxide insulating film, a nitride insulating film, an oxynitride insulating film, and a nitride oxide insulating film can be suitably used. As the insulating layer 255*a*, an oxide insulating film or an oxynitride insulating film, such as a silicon oxide film, a silicon oxynitride film, or an aluminum oxide film, is preferably used. As the insulating layer 255*b*, a nitride insulating film or a nitride oxide insulating film, such as a silicon nitride film or a silicon nitride oxide film, is preferably used. Specifically, it is preferable that a silicon oxide film be used as the insulating layer 255*a* and a silicon nitride film be used as the insulating layer 255*b*. The insulating layer 255*b* preferably has a function of an etching protective film. Alternatively, a nitride insulating film or a nitride oxide insulating film may be used as the insulating layer 255*a*, and an oxide insulating film or an oxynitride insulating film may be used as the insulating layer 255*b*. Although this embodiment illustrates an example where a depressed portion is provided in the insulating layer 255*b*, a depressed portion is not necessarily provided in the insulating layer 255*b*.

The pixel electrode of the light-emitting device is electrically connected to one of the source and the drain of the transistor 310 through a plug 256 embedded in the insulating layers 255*a* and 255*b*, the conductive layer 241 embedded in the insulating layer 254, and the plug 271 embedded in the insulating layer 261. The top surface level of the insulating layer 255*b* and the top surface level of the plug 256 are equal to or substantially equal to each other. Any of a variety of conductive materials can be used for the plugs.

<Display Apparatus 100D>

Figure 77:
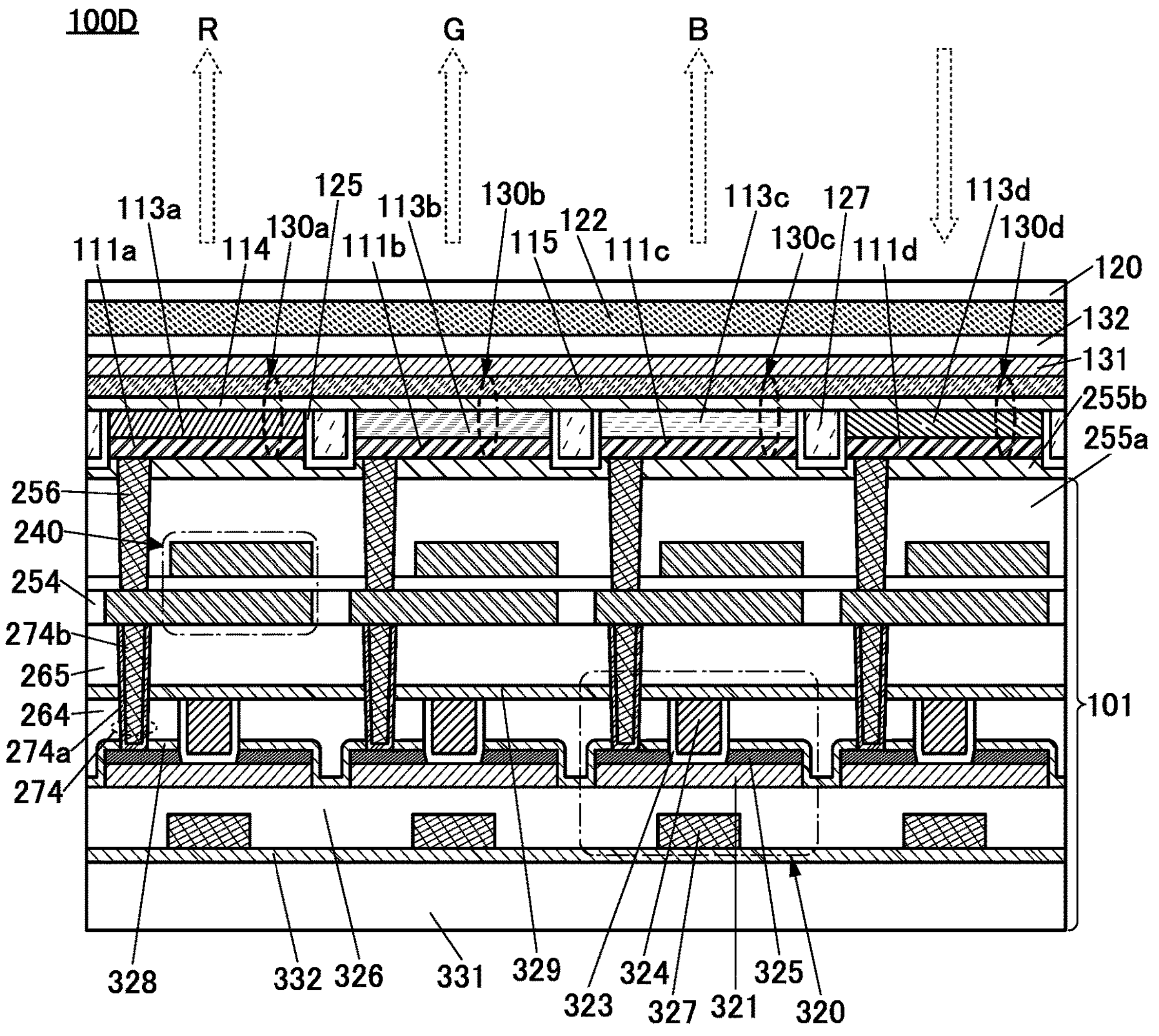
FIG. 77 is a cross-sectional view illustrating an example of a display apparatus.

The display apparatus 100D illustrated in FIG. 77 is different from the display apparatus 100C mainly in a structure of a transistor. Note that portions similar to those of the display apparatus 100C are not described in some cases.

A transistor 320 is a transistor including a metal oxide (also referred to as an oxide semiconductor) in a semiconductor layer where a channel is formed (i.e., an OS transistor).

The transistor 320 includes a semiconductor layer 321, an insulating layer 323, a conductive layer 324, a pair of conductive layers 325, an insulating layer 326, and a conductive layer 327.

A substrate 331 corresponds to the substrate 291 in FIG. 75A and FIG. 75B. A stacked-layer structure including the substrate 331 and the components thereover up to the insulating layer 255*b* corresponds to the layer 101 including transistors in Embodiment 1. As the substrate 331, an insulating substrate or a semiconductor substrate can be used.

An insulating layer 332 is provided over the substrate 331. The insulating layer 332 functions as a barrier layer that prevents diffusion of impurities such as water and hydrogen from the substrate 331 into the transistor 320 and release of oxygen from the semiconductor layer 321 to the insulating layer 332 side. As the insulating layer 332, for example, a film, such as an aluminum oxide film, a hafnium oxide film, or a silicon nitride film, in which hydrogen or oxygen is less likely to diffuse than in a silicon oxide film can be used.

The conductive layer 327 is provided over the insulating layer 332, and the insulating layer 326 is provided to cover the conductive layer 327. The conductive layer 327 functions as a first gate electrode of the transistor 320, and part of the insulating layer 326 functions as a first gate insulating layer. An oxide insulating film such as a silicon oxide film is preferably used as at least part of the insulating layer 326 that is in contact with the semiconductor layer 321. The top surface of the insulating layer 326 is preferably planarized.

The semiconductor layer 321 is provided over the insulating layer 326. The semiconductor layer 321 preferably includes a metal oxide (also referred to as an oxide semiconductor) film having semiconductor characteristics.

The pair of conductive layers 325 are provided over and in contact with the semiconductor layer 321 and function as a source electrode and a drain electrode.

An insulating layer 328 is provided to cover the top and side surfaces of the pair of conductive layers 325, the side surface of the semiconductor layer 321, and the like, and an insulating layer 264 is provided over the insulating layer 328. The insulating layer 328 functions as a barrier layer that prevents diffusion of impurities such as water and hydrogen from the insulating layer 264 and the like into the semiconductor layer 321 and release of oxygen from the semiconductor layer 321. As the insulating layer 328, an insulating film similar to the insulating layer 332 can be used.

An opening reaching the semiconductor layer 321 is provided in the insulating layer 328 and the insulating layer 264. The insulating layer 323 that is in contact with the side surfaces of the insulating layer 264, the insulating layer 328, and the conductive layer 325 and the top surface of the semiconductor layer 321, and the conductive layer 324 are embedded in the opening. The conductive layer 324 functions as a second gate electrode, and the insulating layer 323 functions as a second gate insulating layer.

The top surface of the conductive layer 324, the top surface of the insulating layer 323, and the top surface of the insulating layer 264 are planarized so that their levels are equal to or substantially equal to each other, and an insulating layer 329 and an insulating layer 265 are provided to cover these layers.

The insulating layer 264 and the insulating layer 265 each function as an interlayer insulating layer. The insulating layer 329 functions as a barrier layer that prevents diffusion of impurities such as water and hydrogen from the insulating layer 265 or the like into the transistor 320. As the insulating layer 329, an insulating film similar to the insulating layer 328 and the insulating layer 332 can be used.

A plug 274 electrically connected to one of the pair of conductive layers 325 is provided to be embedded in the insulating layer 265, the insulating layer 329, and the insulating layer 264. Here, the plug 274 preferably includes a conductive layer 274*a* that covers a side surface of an opening of the insulating layer 265, the insulating layer 329, the insulating layer 264, and the insulating layer 328 and part of the top surface of the conductive layer 325, and a conductive layer 274*b* in contact with the top surface of the conductive layer 274*a*. In this case, a conductive material in which hydrogen and oxygen are less likely to diffuse is preferably used for the conductive layer 274*a*.

The structures of the insulating layer 254 and the components thereover up to the substrate 120 in the display apparatus 100D are similar to those in the display apparatus 100C.

<Display Apparatus 100E>

Figure 78:
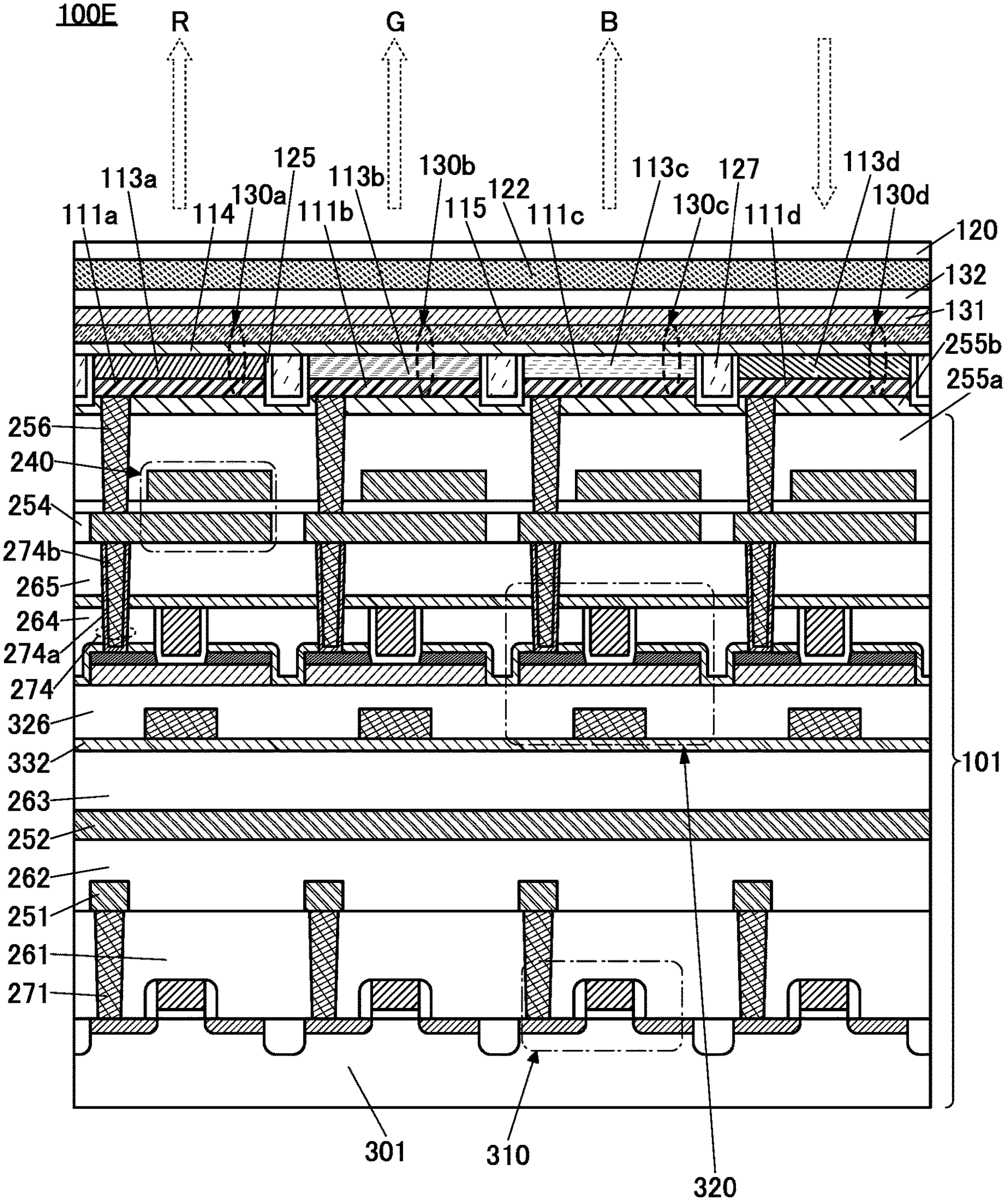
FIG. 78 is a cross-sectional view illustrating an example of a display apparatus.

The display apparatus 100E illustrated in FIG. 78 has a structure where the transistor 310 whose channel is formed in the substrate 301 and the transistor 320 including a metal oxide in the semiconductor layer where the channel is formed are stacked. Note that explanation of portions similar to those in the display apparatuses 100C and 100D is omitted in some cases.

The insulating layer 261 is provided to cover the transistor 310, and a conductive layer 251 is provided over the insulating layer 261. An insulating layer 262 is provided to cover the conductive layer 251, and a conductive layer 252 is provided over the insulating layer 262. The conductive layer 251 and the conductive layer 252 each function as a wiring. An insulating layer 263 and the insulating layer 332 are provided to cover the conductive layer 252, and the transistor 320 is provided over the insulating layer 332. The insulating layer 265 is provided to cover the transistor 320, and the capacitor 240 is provided over the insulating layer 265. The capacitor 240 and the transistor 320 are electrically connected to each other through the plug 274.

The transistor 320 can be used as a transistor included in the pixel circuit. The transistor 310 can be used as a transistor included in the pixel circuit or a transistor included in a driver circuit for driving the pixel circuit (a gate line driver circuit or a source line driver circuit). The transistor 310 and the transistor 320 can also be used as transistors included in a variety of circuits such as an arithmetic circuit and a memory circuit.

With such a structure, not only the pixel circuit but also the driver circuit and the like can be formed directly under the light-emitting devices; thus, the display apparatus can be downsized as compared with the case where a driver circuit is provided around a display region.

<Display Apparatus 100F>

Figure 79:
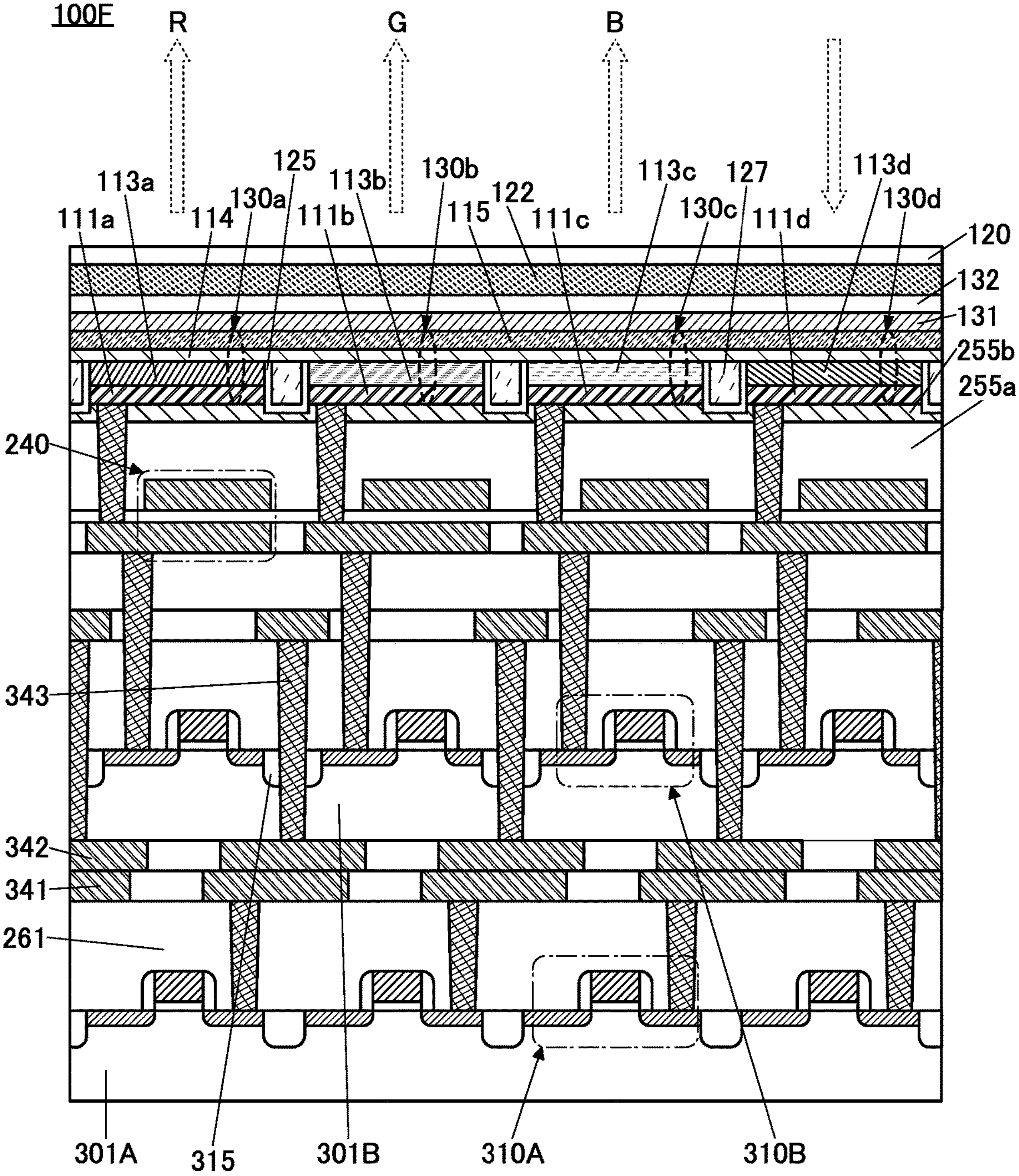
FIG. 79 is a cross-sectional view illustrating an example of a display apparatus.

A display apparatus 100F illustrated in FIG. 79 has a structure where a transistor 310A and a transistor 310B in each of which a channel is formed in a semiconductor substrate are stacked.

In the display apparatus 100F, a substrate 301B provided with the transistor 310B, the capacitor 240, and the light-emitting devices is bonded to a substrate 301A provided with the transistor 310A.

The substrate 301B is provided with a plug 343 that penetrates the substrate 301B. The plug 343 is electrically connected to a conductive layer 342 provided on the rear surface of the substrate 301B (a surface opposite to the substrate 120 side). A conductive layer 341 is provided over the insulating layer 261 over the substrate 301A.

The conductive layer 341 and the conductive layer 342 are bonded to each other, whereby the substrate 301A and the substrate 301B are electrically connected to each other.

The conductive layer 341 and the conductive layer 342 are preferably formed using the same conductive material. For example, a metal film containing an element selected from Al, Cr, Cu, Ta, Ti, Mo, and W, a metal nitride film containing the above element as a component (a titanium nitride film, a molybdenum nitride film, or a tungsten nitride film), or the like can be used. Copper is particularly preferably used for the conductive layer 341 and the conductive layer 342. In this case, it is possible to employ Cu—Cu direct bonding (a technique for establishing electrical continuity by connecting Cu (copper) pads). Note that the conductive layer 341 and the conductive layer 342 may be bonded to each other through a bump.

<Display Apparatus 100G>

Figure 80:
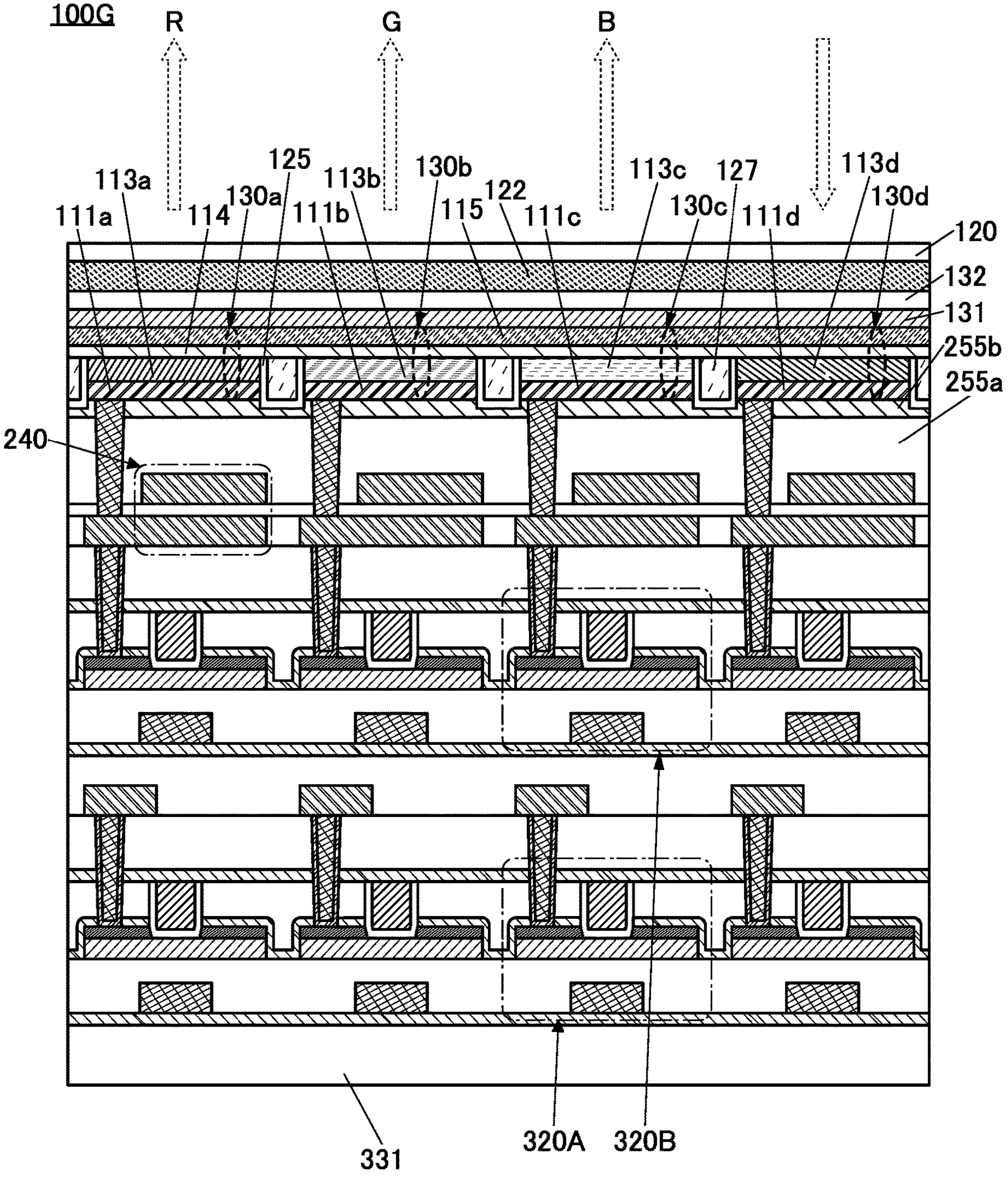
FIG. 80 is a cross-sectional view illustrating an example of a display apparatus.

In a display apparatus 100G illustrated in FIG. 80, a transistor 320A and a transistor 320B each including an oxide semiconductor in a semiconductor layer where a channel is formed are stacked.

The description of the display apparatus 100D can be referred to for the transistor 320A, the transistor 320B, and the components around them.

Although the structure where two transistors including an oxide semiconductor are stacked is described, the present invention is not limited thereto. For example, three or more transistors may be stacked.

<Structure Example of Transistor>

Cross-sectional structure examples of a transistor that can be used for the display apparatuses are described below.

Figure 81A:
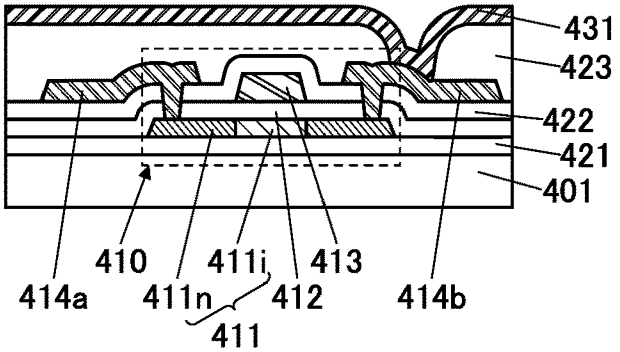
FIG. 81A to FIG. 81D are diagrams each illustrating an example of a transistor.

FIG. 81A is a cross-sectional view including a transistor 410.

The transistor 410 is a transistor provided over a substrate 401 and includes polycrystalline silicon as its semiconductor layer. For example, the transistor 410 corresponds to the transistor M12 in the pixel 81 illustrated in FIG. 40B. In other words, FIG. 81A illustrates an example where one of a source and a drain of the transistor 410 is electrically connected to a conductive layer 431 of the light-emitting device.

The transistor 410 includes a semiconductor layer 411, an insulating layer 412, a conductive layer 413, and the like. The semiconductor layer 411 includes a channel formation region 411*i* and low-resistance regions 411*n*. The semiconductor layer 411 contains silicon. The semiconductor layer 411 preferably contains polycrystalline silicon. Part of the insulating layer 412 functions as a gate insulating layer. Part of the conductive layer 413 functions as a gate electrode.

Alternatively, the semiconductor layer 411 can contain a metal oxide exhibiting semiconductor characteristics (also referred to as an oxide semiconductor). In this case, the transistor 410 can be referred to as an OS transistor.

The low-resistance region 411*n* is a region containing an impurity element. For example, in the case where the transistor 410 is an n-channel transistor, phosphorus, arsenic, or the like is added to the low-resistance region 411*n*. Meanwhile, in the case where the transistor 410 is a p-channel transistor, boron, aluminum, or the like is added to the low-resistance region 411*n*. In addition, in order to control the threshold voltage of the transistor 410, the above-described impurity may be added to the channel formation region 411*i*.

An insulating layer 421 is provided over the substrate 401. The semiconductor layer 411 is provided over the insulating layer 421. The insulating layer 412 is provided to cover the semiconductor layer 411 and the insulating layer 421. The conductive layer 413 is provided at a position that is over the insulating layer 412 and overlaps with the semiconductor layer 411.

An insulating layer 422 is provided to cover the conductive layer 413 and the insulating layer 412. A conductive layer 414*a* and a conductive layer 414*b* are provided over the insulating layer 422. The conductive layer 414*a* and the conductive layer 414*b* are electrically connected to the low-resistance regions 411*n* in the opening portions provided through the insulating layer 422 and the insulating layer 412. Part of the conductive layer 414*a* functions as one of a source electrode and a drain electrode and part of the conductive layer 414*b* functions as the other of the source electrode and the drain electrode. An insulating layer 423 is provided to cover the conductive layer 414*a*, the conductive layer 414*b*, and the insulating layer 422.

The conductive layer 431 functioning as a pixel electrode is provided over the insulating layer 423. The conductive layer 431 is provided over the insulating layer 423 and is electrically connected to the conductive layer 414*b* through an opening provided in the insulating layer 423. Although not illustrated here, an EL layer and a common electrode can be stacked over the conductive layer 431.

Figure 81B:
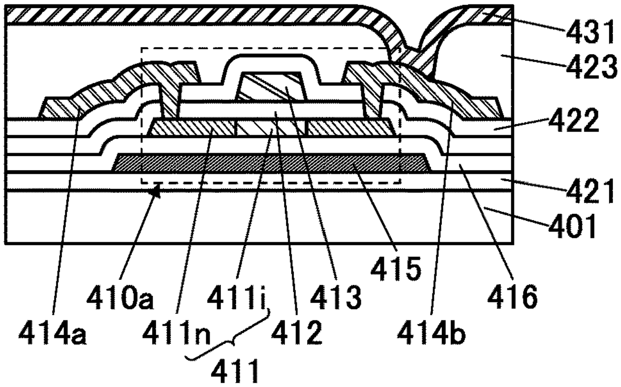

FIG. 81B illustrates a transistor 410*a* including a pair of gate electrodes. The transistor 410*a* illustrated in FIG. 81B is different from FIG. 81A mainly in including a conductive layer 415 and an insulating layer 416.

The conductive layer 415 is provided over the insulating layer 421. The insulating layer 416 is provided to cover the conductive layer 415 and the insulating layer 421. The semiconductor layer 411 is provided such that at least the channel formation region 411*i* overlaps with the conductive layer 415 with the insulating layer 416 therebetween.

In the transistor 410*a* illustrated in FIG. 81B, part of the conductive layer 413 functions as a first gate electrode, and part of the conductive layer 415 functions as a second gate electrode. At this time, part of the insulating layer 412 functions as a first gate insulating layer, and part of the insulating layer 416 functions as a second gate insulating layer.

Here, to electrically connect the first gate electrode to the second gate electrode, the conductive layer 413 is electrically connected to the conductive layer 415 through an opening portion provided in the insulating layer 412 and the insulating layer 416 in a region not illustrated. To electrically connect the second gate electrode to a source or a drain, the conductive layer 415 is electrically connected to the conductive layer 414*a* or the conductive layer 414*b* through an opening portion provided in the insulating layer 422, the insulating layer 412, and the insulating layer 416 in a region not illustrated.

In the case of using LTPS transistors as all of the transistors included in the pixel 81, the transistor 410 illustrated in FIG. 81A as an example or the transistor 410*a* illustrated in FIG. 81B as an example can be used. In this case, the transistors 410*a* may be used as all of the transistors included in the pixel 81, the transistors 410 may be used as all of the transistors, or the transistors 410*a* and the transistors 410 may be used in combination.

Described below is an example of a structure including both a transistor including silicon as its semiconductor layer and a transistor including a metal oxide as its semiconductor layer.

Figure 81C:
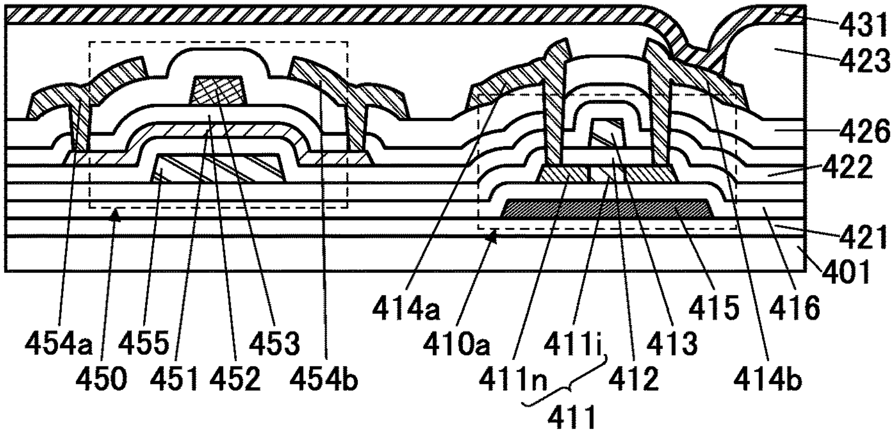

FIG. 81C is a schematic cross-sectional view including the transistor 410*a* and a transistor 450.

The above description in Structure example 1 can be referred to for the transistor 410*a*. Although an example using the transistor 410*a* is illustrated here, a structure including the transistor 410 and the transistor 450 may be employed or a structure including all of the transistor 410, the transistor 410*a*, and the transistor 450 may be employed.

The transistor 450 is a transistor including a metal oxide as its semiconductor layer. The structure illustrated in FIG. 81C shows an example where the transistor 450 and the transistor 410*a* correspond to the transistor M11 and the transistor M12, respectively, in the pixel 81. That is, FIG. 81C illustrates an example where one of the source and the drain of the transistor 410*a* is electrically connected to the conductive layer 431.

FIG. 81C illustrates an example where the transistor 450 includes a pair of gates.

The transistor 450 includes a conductive layer 455, the insulating layer 422, a semiconductor layer 451, an insulating layer 452, a conductive layer 453, and the like. Part of the conductive layer 453 functions as a first gate of the transistor 450, and part of the conductive layer 455 functions as a second gate of the transistor 450. In this case, part of the insulating layer 452 functions as a first gate insulating layer of the transistor 450, and part of the insulating layer 422 functions as a second gate insulating layer of the transistor 450.

The conductive layer 455 is provided over the insulating layer 412. The insulating layer 422 is provided to cover the conductive layer 455. The semiconductor layer 451 is provided over the insulating layer 422. The insulating layer 452 is provided to cover the semiconductor layer 451 and the insulating layer 422. The conductive layer 453 is provided over the insulating layer 452 and includes a region overlapping with the semiconductor layer 451 and the conductive layer 455.

An insulating layer 426 is provided to cover the insulating layer 452 and the conductive layer 453. A conductive layer 454*a* and a conductive layer 454*b* are provided over the insulating layer 426. The conductive layer 454*a* and the conductive layer 454*b* are electrically connected to the semiconductor layer 451 in opening portions provided in the insulating layer 426 and the insulating layer 452. Part of the conductive layer 454*a* functions as one of a source electrode and a drain electrode and part of the conductive layer 454*b* functions as the other of the source electrode and the drain electrode. The insulating layer 423 is provided to cover the conductive layer 454*a*, the conductive layer 454*b*, and the insulating layer 426.

Here, the conductive layer 414*a* and the conductive layer 414*b* electrically connected to the transistor 410*a* are preferably formed by processing the same conductive film as the conductive layer 454*a* and the conductive layer 454*b*. FIG. 81C illustrates a structure where the conductive layer 414*a*, the conductive layer 414*b*, the conductive layer 454*a*, and the conductive layer 454*b* are formed on the same plane (i.e., in contact with the top surface of the insulating layer 426) and contain the same metal element. In this case, the conductive layer 414*a* and the conductive layer 414*b* are electrically connected to the low-resistance regions 411*n* through openings provided in the insulating layer 426, the insulating layer 452, the insulating layer 422, and the insulating layer 412. This is preferable because the manufacturing process can be simplified.

The conductive layer 413 functioning as the first gate electrode of the transistor 410*a* and the conductive layer 455 functioning as the second gate electrode of the transistor 450 are preferably formed by processing the same conductive film. FIG. 81C illustrates a structure where the conductive layer 413 and the conductive layer 455 are formed on the same plane (i.e., in contact with the top surface of the insulating layer 412) and contain the same metal element. This is preferable because the manufacturing process can be simplified.

Figure 81D:
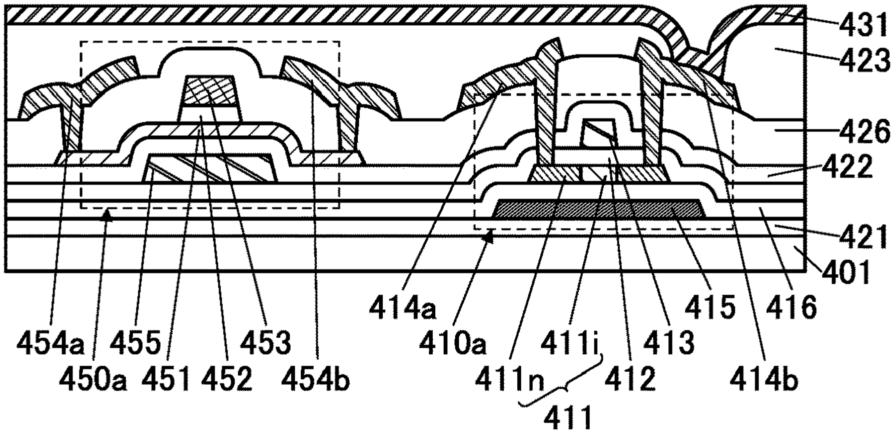

FIG. 81C illustrates a structure where the insulating layer 452 functioning as the first gate insulating layer of the transistor 450 covers an end portion of the semiconductor layer 451; however, as in a transistor 450*a* illustrated in FIG. 81D, the insulating layer 452 may be processed to have the same or substantially the same top surface shape as the conductive layer 453.

Note that in this specification and the like, the expression "having substantially the same top surface shapes" means that at least outlines of stacked layers partly overlap with each other. For example, the case of processing an upper layer and a lower layer with the use of the same mask pattern or mask patterns that are partly the same is included. However, in some cases, the outlines do not completely overlap with each other and the upper layer is positioned on an inner side of the lower layer or the upper layer is positioned on an outer side of the lower layer; such a case is also represented by the expression "having substantially the same top surface shapes".

Although the example where the transistor 410*a* corresponds to the transistor M12 and is electrically connected to the pixel electrode is shown here, one embodiment of the present invention is not limited thereto. For example, a structure where the transistor 450 or the transistor 450*a* corresponds to the transistor M12 may be employed. In this case, the transistor 410*a* corresponds to the transistor M11, the transistor M13, or another transistor.

This embodiment can be combined with any of the other embodiments as appropriate.

Embodiment 7

In this embodiment, electronic devices of one embodiment of the present invention will be described with reference to FIG. 82 to FIG. 85.

An electronic device of this embodiment includes the display apparatus of one embodiment of the present invention in a display portion. The display apparatus of one embodiment of the present invention can be easily increased in definition and resolution. Thus, the display apparatus of one embodiment of the present invention can be used for display portions of a variety of electronic devices.

Examples of electronic devices include a digital camera, a digital video camera, a digital photo frame, a mobile phone, a portable game machine, a portable information terminal, and an audio reproducing device in addition to electronic devices with a relatively large screen, such as a television device, a desktop or laptop personal computer, a monitor of a computer or the like, digital signage, and a large game machine such as a pachinko machine.

In particular, a display apparatus of one embodiment of the present invention can have high definition, and thus can be suitably used for an electronic device having a relatively small display portion. Examples of such an electronic device include a watch-type or a bracelet-type information terminal device (wearable device), and a wearable device worn on a head, such as a device for VR such as a head-mounted display, a glasses-type device for AR, and a device for MR.

The resolution of the display apparatus of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K (number of pixels: 3840×2160), or 8K (number of pixels: 7680×4320). In particular, the resolution is preferably 4K, 8K, or higher. Furthermore, the pixel density (density) of the display apparatus of one embodiment of the present invention is preferably higher than or equal to 100 ppi, higher than or equal to 300 ppi, further preferably higher than or equal to 500 ppi, still further preferably higher than or equal to 1000 ppi, still further preferably higher than or equal to 2000 ppi, still further preferably higher than or equal to 3000 ppi, still further preferably higher than or equal to 5000 ppi, yet further preferably higher than or equal to 7000 ppi. With the use of such a display apparatus having one or both of high resolution and high definition, the electronic device can have higher realistic sensation, sense of depth, and the like in personal use such as portable use and home use. There is no particular limitation on the screen ratio (aspect ratio) of the display apparatus of one embodiment of the present invention. For example, the display apparatus is compatible with a variety of screen ratios such as 1:1 (square), 4:3, 16:9, and 16:10.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, odor, or infrared rays).

The electronic device in this embodiment can have a variety of functions. For example, the electronic device can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 82A:
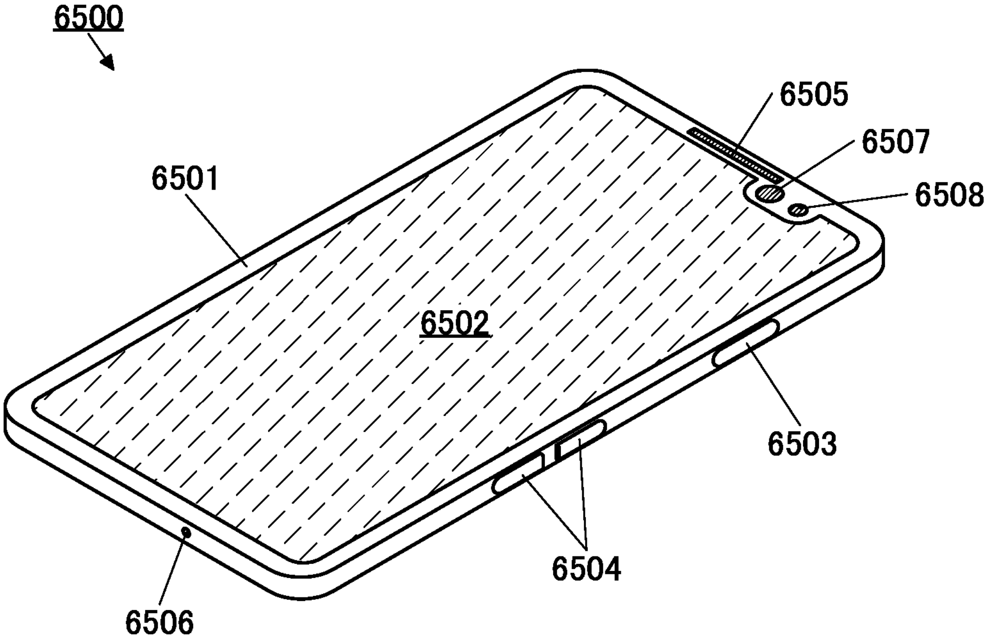
FIG. 82A and FIG. 82B are diagrams illustrating an example of an electronic device.

An electronic device 6500 illustrated in FIG. 82A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display apparatus of one embodiment of the present invention can be used in the display portion 6502.

Figure 82B:
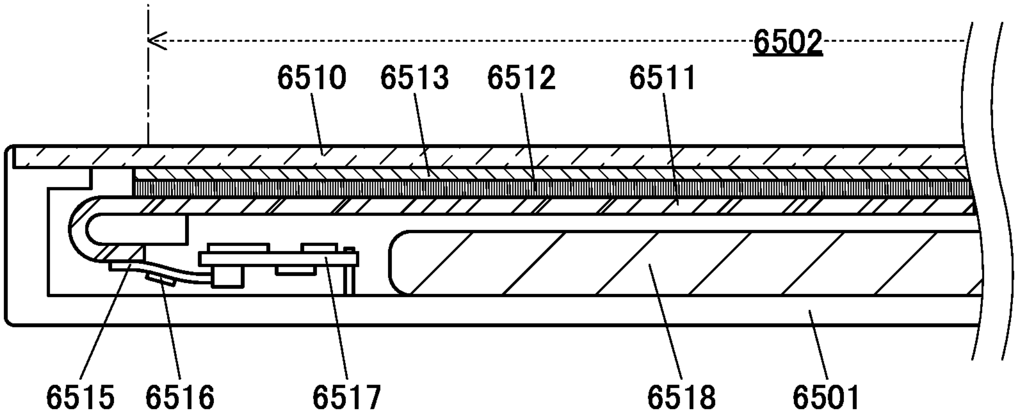

FIG. 82B is a schematic cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are placed in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be achieved. Since the display panel 6511 is extremely thin, the battery 6518 with high capacity can be mounted while the thickness of the electronic device is reduced. Moreover, part of the display panel 6511 is folded back so that a connection portion with the FPC 6515 is placed on the back side of a pixel portion, whereby an electronic device with a narrow bezel can be achieved.

Figure 83A:
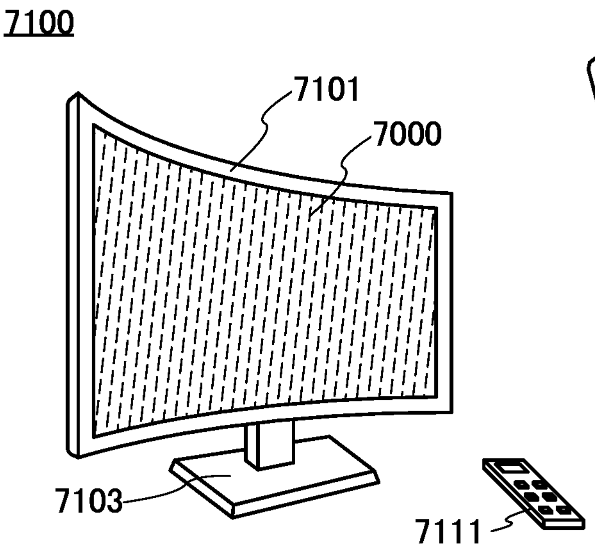
FIG. 83A to FIG. 83D are diagrams illustrating examples of electronic devices.

FIG. 83A illustrates an example of a television device. In a television device 7100, a display portion 7000 is incorporated in a housing 7101. Here, the housing 7101 is supported by a stand 7103.

The display apparatus of one embodiment of the present invention can be used for the display portion 7000.

Operation of the television device 7100 illustrated in FIG. 83A can be performed with an operation switch provided in the housing 7101 and a separate remote controller 7111. Alternatively, the display portion 7000 may be provided with a touch sensor, and the television device 7100 may be operated by touch on the display portion 7000 with a finger or the like. The remote controller 7111 may include a display portion for displaying information output from the remote controller 7111. With operation keys or a touch panel provided in the remote controller 7111, channels and volume can be operated and an image displayed on the display portion 7000 can be operated.

Note that the television device 7100 has a structure where a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 83B:
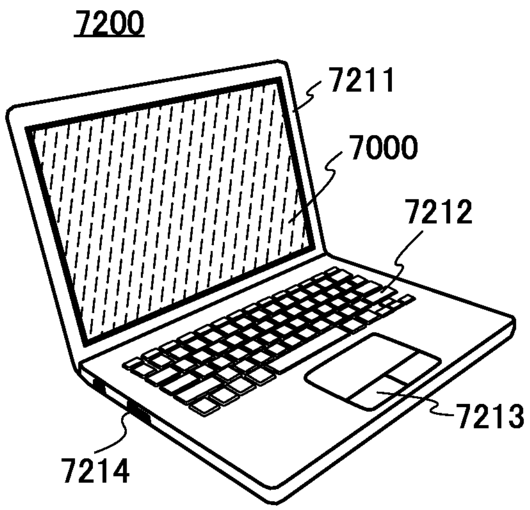

FIG. 83B illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

The display apparatus of one embodiment of the present invention can be used for the display portion 7000.

Figure 83C:
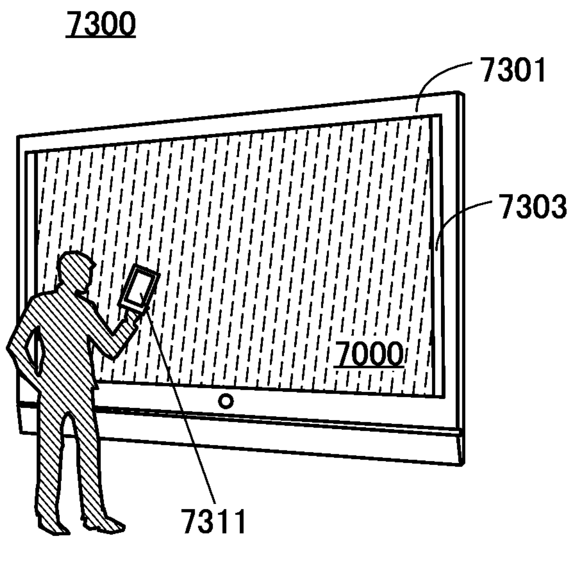
Figure 83D:
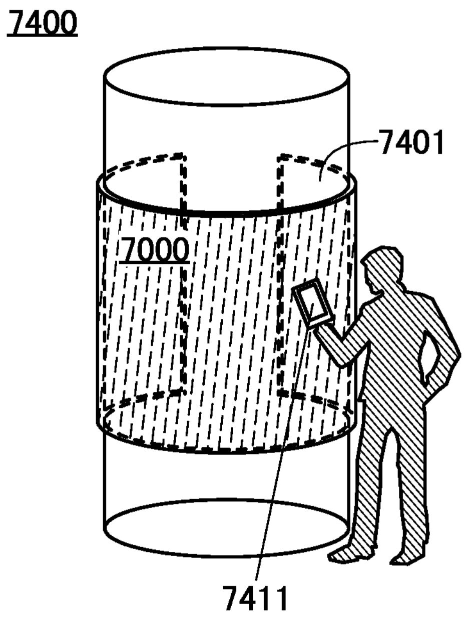

FIG. 83C and FIG. 83D illustrate examples of digital signage.

Digital signage 7300 illustrated in FIG. 83C includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 83D is digital signage 7400 attached to a cylindrical pillar 7401. The digital signage 7400 includes the display portion 7000 provided along a curved surface of the pillar 7401.

The display apparatus of one embodiment of the present invention can be used for the display portion 7000 in FIG. 83C and FIG. 83D.

A larger area of the display portion 7000 can increase the amount of information that can be provided at a time. The larger display portion 7000 attracts more attention, so that the effectiveness of the advertisement can be increased, for example.

The use of a touch panel in the display portion 7000 is preferable because in addition to display of an image or a moving image on the display portion 7000, intuitive operation by a user is possible. Moreover, for an application for providing information such as route information or traffic information, usability can be enhanced by intuitive operation.

As illustrated in FIG. 83C and FIG. 83D, it is preferable that the digital signage 7300 or the digital signage 7400 can work with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Electronic devices illustrated in FIG. 84A to FIG. 84F each include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, odor, or infrared rays), a microphone 9008, and the like.

The electronic devices illustrated in FIG. 84A to FIG. 84F have a variety of functions. For example, the electronic devices can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may each include a plurality of display portions. The electronic devices may each be provided with a camera or the like and have a function of taking a still image or a moving image, a function of storing the taken image in a recording medium (an external recording medium or a recording medium incorporated in the camera), a function of displaying the taken image on the display portion, or the like.

The electronic devices illustrated in FIG. 84A to FIG. 84F will be described in detail below.

Figure 84A:
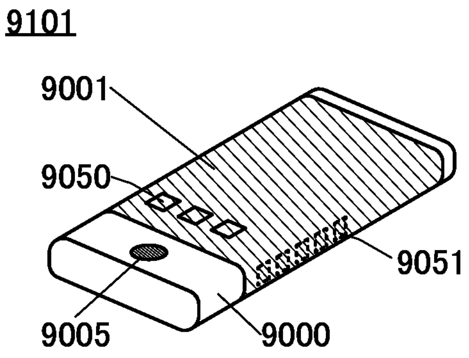
FIG. 84A to FIG. 84F are diagrams illustrating examples of electronic devices.

FIG. 84A is a perspective view illustrating a portable information terminal 9101. For example, the portable information terminal 9101 can be used as a smartphone. Note that the portable information terminal 9101 may include the speaker 9003, the connection terminal 9006, the sensor 9007, or the like. The portable information terminal 9101 can display characters and image information on its plurality of surfaces. FIG. 84A illustrates an example where three icons 9050 are displayed. Furthermore, information 9051 indicated by dashed rectangles can be displayed on another surface of the display portion 9001. Examples of the information 9051 include notification of reception of an e-mail, an SNS message, or an incoming call, the title and sender of an e-mail, an SNS message, or the like, the date, the time, remaining battery, and the radio field intensity. Alternatively, the icon 9050 or the like may be displayed at the position where the information 9051 is displayed.

Figure 84B:
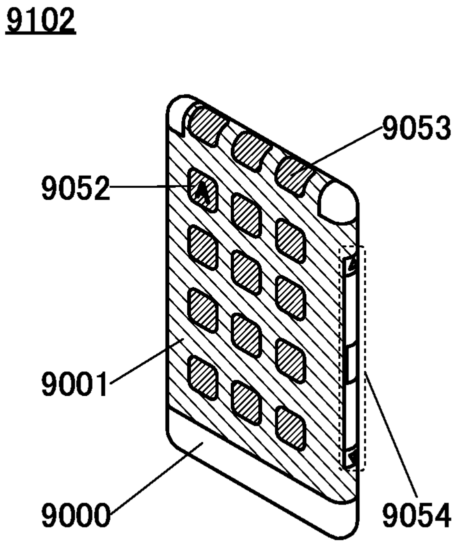

FIG. 84B is a perspective view illustrating a portable information terminal 9102. The portable information terminal 9102 has a function of displaying information on three or more surfaces of the display portion 9001. Here, an example is illustrated where information 9052, information 9053, and information 9054 are displayed on different surfaces. For example, a user of the portable information terminal 9102 can check the information 9053 displayed such that it can be seen from above the portable information terminal 9102, with the portable information terminal 9102 put in a breast pocket of his/her clothes. The user can see the display without taking out the portable information terminal 9102 from the pocket and decide whether to answer the call, for example.

Figure 84C:
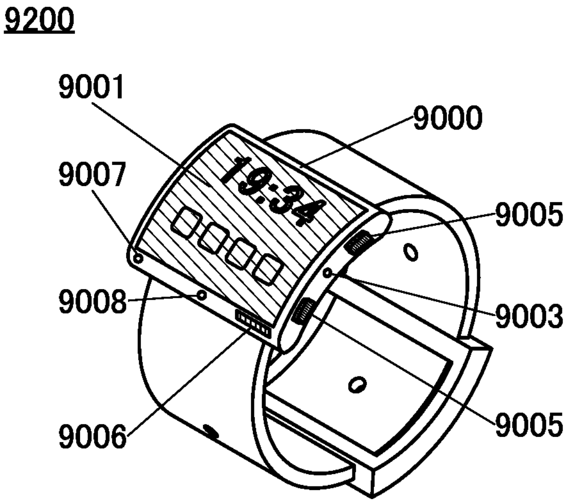

FIG. 84C is a perspective view illustrating a watch-type portable information terminal 9200. For example, the portable information terminal 9200 can be used as a Smartwatch (registered trademark). The display surface of the display portion 9001 is curved, and display can be performed on the curved display surface. Furthermore, intercommunication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 84D:
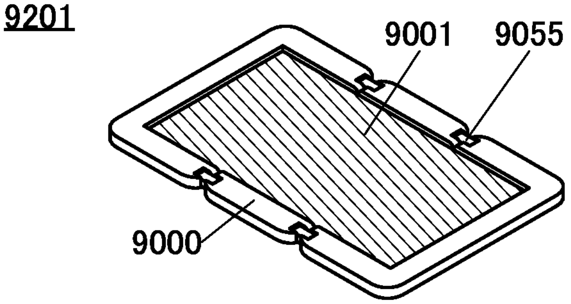
Figure 84E:
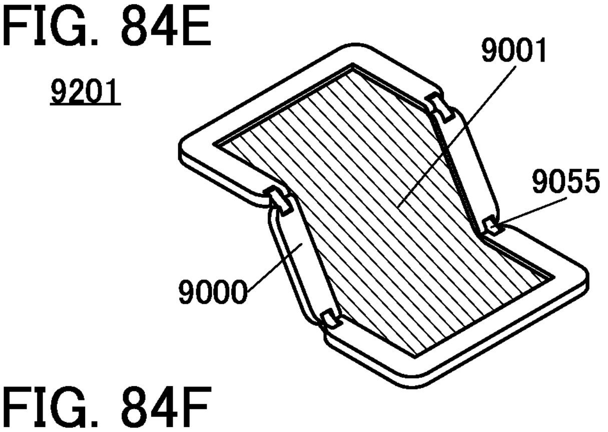
Figure 84F:
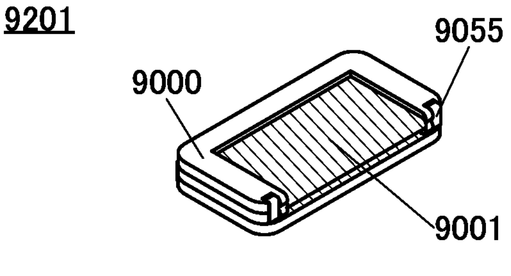

FIG. 84D to FIG. 84F are perspective views illustrating a foldable portable information terminal 9201. FIG. 84D is a perspective view of an opened state of the portable information terminal 9201, FIG. 84F is a perspective view of a folded state thereof, and FIG. 84E is a perspective view of a state in the middle of change from one of FIG. 84D and FIG. 84F to the other. The portable information terminal 9201 is highly portable in the folded state and is highly browsable in the opened state because of a seamless large display region. The display portion 9001 of the portable information terminal 9201 is supported by three housings 9000 joined together by hinges 9055. The display portion 9001 can be folded with a radius of curvature of greater than or equal to 0.1 mm and less than or equal to 150 mm, for example.

The display apparatus and the electronic device of one embodiment of the present invention can be incorporated in an inside wall or an outside wall of a house or a building or the interior or the exterior of a vehicle.

Figure 85:
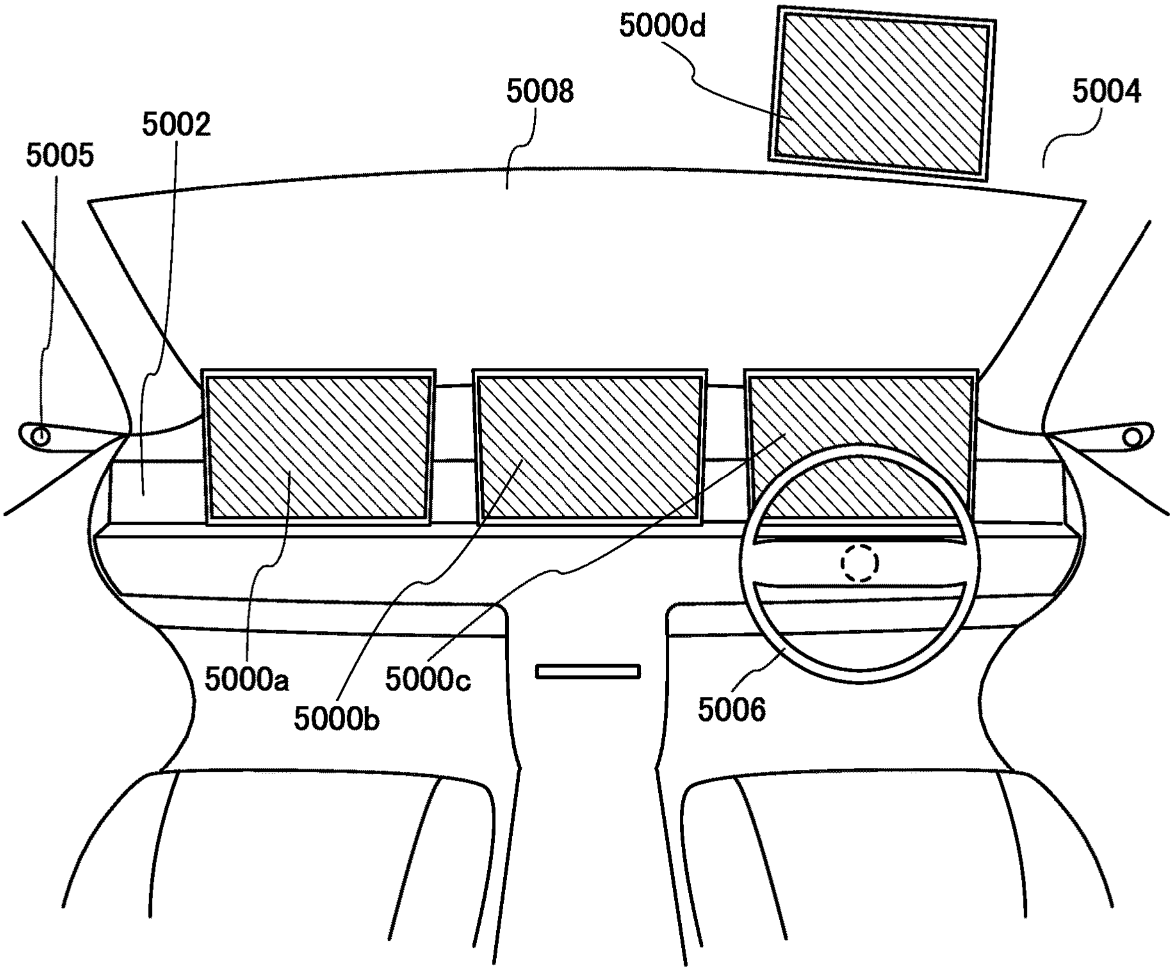
FIG. 85 is a diagram illustrating an example of a vehicle.

FIG. 85 illustrates an example where the display apparatus of one embodiment of the present invention is installed in a vehicle. In the vehicle illustrated in FIG. 85, a display apparatus 5000*a*, a display apparatus 5000*b*, and a display apparatus 5000*c* are installed on a dashboard 5002. A display apparatus 5000*d* is installed on a ceiling 5004 on the driver's seat side. Note that in the example illustrated in FIG. 85, the display apparatus 5000*d* is installed in, but not limited to, a right-hand drive vehicle; installation in a left-hand drive vehicle is also possible. In that case, the left and right of the components arranged in FIG. 85 are reversed. FIG. 85 illustrates a steering wheel 5006, a windshield 5008, and the like that are arranged around a driver's seat and a front passenger seat.

It is preferable that one or more of the display apparatus 5000*a* to the display apparatus 5000*d* have a near touch sensor function. With the near touch sensor function, the user can operate the display apparatus without staring at the display apparatus. In particular, a driver can operate the display apparatus without significantly moving the line of sight from the front side, which can enhance the safety while the vehicle is driven and stopped. A display portion of each of the display apparatus 5000*a* to the display apparatus 5000*d* has a diagonal preferably greater than or equal to 5 inches, further preferably greater than or equal to 10 inches. A display apparatus in which a display portion has a diagonal of approximately 13 inches can be suitably used as each of the display apparatus 5000*a* to the display apparatus 5000*d*, for example.

Note that the display apparatus 5000*a* to the display apparatus 5000*d* may be flexible. The flexible display apparatuses can be incorporated along even a curved surface. For example, the display apparatuses can be provided along a curved surface such as the dashboard 5002 or the ceiling 5004.

A plurality of cameras 5005 may be provided outside the vehicle. The cameras 5005 can capture images of the surroundings of the vehicle, e.g., the situations at the rear side. Although the cameras 5005 are provided instead of side mirrors in the example illustrated in FIG. 85, both the side mirrors and the cameras may be provided.

As the cameras 5005, a CCD camera, a CMOS camera, or the like can be used. In addition, an infrared camera may be used in combination with such a camera. The infrared camera, which has a higher output level with a higher temperature of an object, can detect or extract a living body such as a human or an animal.

Images captured with the cameras 5005 can be output to one or more of the display apparatus 5000*a* to the display apparatus 5000*d*. The display apparatus 5000*a* to the display apparatus 5000*d* are mainly used for supporting driving of the vehicle. Images of the situations at the rear side are captured at a wide angle of view with the cameras 5005, and the images are displayed on one or more of the display apparatus 5000*a* to the display apparatus 5000*d* so that the driver can see a blind area for avoiding an accident.

A distance image sensor may be provided, for example, over a roof of the vehicle, and an image obtained by the distance image sensor may be displayed on one or more of the display apparatus 5000*a* to the display apparatus 5000*d*. As the distance image sensor, an image sensor, LIDAR (Light Detection and Ranging), or the like can be used. When an image obtained by the image sensor and the image obtained by the distance image sensor are displayed on one or more of the display apparatus 5000*a* to the display apparatus 5000*d*, more pieces of information can be provided to the driver to support driving.

One or more of the display apparatus 5000*a* to the display apparatus 5000*d* may have a function of displaying map information, traffic information, television images, DVD images, and the like.

A display panel having an image capturing function is preferably used for at least one of the display apparatus 5000*a* to the display apparatus 5000*d*. For example, when the driver touches the display panel, the vehicle can perform biometric authentication such as fingerprint authentication or palm print authentication. The vehicle may have a function of setting an environment to meet the driver's preference when the driver is authenticated by biometric authentication. For example, one or more of adjustment of the position of the seat, adjustment of the position of the steering wheel, adjustment of the direction of the cameras 5005, setting of brightness, setting of an air conditioner, setting of the speed (frequency) of wipers, volume setting of audio, and reading of the playlist of the audio are preferably performed after authentication.

A vehicle can be brought into a state where the vehicle can be driven, e.g., a state where an engine is started, after the driver is authenticated by biometric authentication. This is preferable because a conventional key is unnecessary.

This embodiment can be combined with any of the other embodiments as appropriate.

<Supplementary Notes on Description in this Specification and the Like>

The following are notes on the description of the foregoing embodiments and the structures in the embodiments.

One embodiment of the present invention can be constituted by appropriately combining the structure described in an embodiment with any of the structures described in the other embodiments. In addition, in the case where a plurality of structure examples are described in one embodiment, some of the structure examples can be combined as appropriate.

Note that a content (or part thereof) described in one embodiment can be applied to, combined with, or replaced with another content (or part thereof) described in the embodiment and/or a content (or part thereof) described in another embodiment or other embodiments, for example.

Note that in each embodiment, a content described in the embodiment is a content described using a variety of diagrams or a content described with text disclosed in the specification.

Note that by combining a diagram (or part thereof) described in one embodiment with another part of the diagram, a different diagram (or part thereof) described in the embodiment, and/or a diagram (or part thereof) described in another embodiment or other embodiments, much more diagrams can be formed.

In this specification and the like, components are classified according to their functions, and illustrated as blocks independent of one another in block diagrams. However, in an actual circuit or the like, it is difficult to classify components according to their functions, and there is such a case where one circuit relates to a plurality of functions or a case where a plurality of circuits relate to one function. Therefore, the blocks in the block diagrams are not limited by the components described in the specification, and the description can be changed appropriately depending on the situation.

In drawings, the size, the layer thickness, or the region is shown arbitrarily for description convenience. Therefore, the size, the layer thickness, or the region is not limited to the illustrated scale. Note that the drawings schematically components for clarity, and embodiments of the present invention are not limited to shapes, values, or the like shown in the drawings. For example, variations in a signal, a voltage, or a current due to noise, variations in a signal, a voltage, or a current due to difference in timing, or the like can be included.

In this specification and the like, the terms "one of a source and a drain" (or a first electrode or a first terminal) and "the other of the source and the drain" (or a second electrode or a second terminal) are used to describe the connection relationship of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In addition, in this specification and the like, the terms "electrode" and "wiring" do not functionally limit these components. For example, an "electrode" is used as part of a "wiring" in some cases, and vice versa. Furthermore, the term "electrode" or "wiring" also includes the case where a plurality of "electrodes" or "wirings" are formed in an integrated manner, for example.

In this specification and the like, voltage and potential can be replaced with each other as appropriate. The term voltage refers to a potential difference from a reference potential, and when the reference potential is a ground potential, for example, voltage can be replaced with potential. The ground potential does not necessarily mean 0 V. Potentials are relative values, and a potential supplied to a wiring or the like is sometimes changed depending on the reference potential.

In this specification and the like, the terms “film” and “layer” can be interchanged with each other depending on the case or circumstances. For example, the term “conductive layer” can be changed into the term “conductive film” in some cases. Also, for example, the term “insulating film” can be changed into the term “insulating layer” in some cases.

In this specification and the like, a switch is in a conduction state (on state) or in a non-conduction state (off state) to determine whether current flows therethrough or not. Alternatively, a switch has a function of selecting and changing a current path.

In this specification and the like, the channel length refers to, for example, the distance between a source and a drain in a region where a semiconductor (or a portion where current flows in a semiconductor when a transistor is in an on state) and a gate overlap with each other or a region where a channel is formed in a top view of the transistor.

In this specification and the like, the channel width refers to, for example, the length of a portion where a source and a drain face each other in a region where a semiconductor (or a portion where current flows in a semiconductor when a transistor is in an on state) and a gate electrode overlap with each other or a region where a channel is formed.

In the case where there is description “X and Y are connected” in this specification and the like, the case where X and Y are electrically connected, the case where X and Y are functionally connected, and the case where X and Y are directly connected are regarded as being disclosed in this specification and the like. Accordingly, without being limited to a predetermined connection relation, for example, a connection relation illustrated in drawings or texts, a connection relation other than one illustrated in drawings or texts is regarded as being disclosed in the drawings or the texts. Each of X and Y denotes an object (e.g., a device, an element, a circuit, a wiring, an electrode, a terminal, a conductive film, and a layer).

For example, in the case where X and Y are electrically connected, one or more elements that allow electrical connection between X and Y (e.g., a switch, a transistor, a capacitor, an inductor, a resistor, a diode, a display device, a light-emitting device, and a load) can be connected between X and Y. Note that a switch has a function of being controlled to be turned on or off. That is, the switch has a function of being in a conduction state (on state) or a non-conduction state (off state) to control whether current flows or not.

In the case where an element and a power supply line (e.g., a wiring supplying VDD (high power supply potential), VSS (low power supply potential), GND (the ground potential), or a desired potential) are both provided between X and Y, X and Y are not defined as being electrically connected. In the case where only a power supply line is provided between X and Y, there is no element between X and Y; therefore, X and Y are directly connected. Accordingly, in the case where only a power supply line is provided between X and Y, X and Y can be expressed as being “electrically connected”. However, in the case where an element and a power supply line are both provided between X and Y, X and Y are not defined as being electrically connected, although X and the power supply line are electrically connected (through the element) and Y and the power supply line are electrically connected. Note that in the case where a gate and a source of a transistor are located between X and Y, X and Y are not defined as being electrically connected. Similarly, in the case where a gate and a drain of a transistor are located between X and Y, X and Y are not defined as being electrically connected. That is, in the case where a drain and a source of a transistor are located between X and Y, X and Y are defined as being electrically connected. In the case where a capacitor is provided between X and Y, X and Y are defined as being electrically connected in some cases and not defined in other cases. For example, in the case where a capacitor is provided between X and Y in a digital circuit or a logic circuit, X and Y are not defined as being electrically connected in some cases. On the other hand, for example, in the case where a capacitor is provided between X and Y in an analog circuit, X and Y are defined as being electrically connected in some cases.

For example, in the case where X and Y are functionally connected, one or more circuits that allow functional connection between X and Y (e.g., a logic circuit (an inverter, a NAND circuit, or a NOR circuit); a signal converter circuit (a digital-to-analog converter circuit, an analog-to-digital converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; or a control circuit) can be connected between X and Y. As an example, even if another circuit is interposed between X and Y, X and Y are regarded as being functionally connected when a signal output from X is transmitted to Y.

Note that an explicit description “X and Y are electrically connected” includes the case where X and Y are electrically connected (i.e., the case where X and Y are connected with another element or another circuit provided therebetween) and the case where X and Y are directly connected (i.e., the case where X and Y are connected without another element or another circuit provided therebetween).

The expressions include, for example, “X, Y, a source (to put it differently, for example, a first terminal or the like) of a transistor, and a drain (to put it differently, for example, a second terminal or the like) of the transistor are electrically connected to each other, and X, the source of the transistor, the drain of the transistor, and Y are electrically connected to each other in this order”. Alternatively, it can be expressed as “a source of a transistor is electrically connected to X; a drain of the transistor is electrically connected to Y; and X, the source of the transistor, the drain of the transistor, and Y are electrically connected to each other in this order”. Alternatively, it can be expressed as “X is electrically connected to Y through a source and a drain of a transistor, and X, the source of the transistor, the drain of the transistor, and Y are provided in this connection order”. When the connection order in a circuit configuration is defined by an expression similar to the above examples, a source and a drain of a transistor can be distinguished from each other to specify the technical scope. Note that these expressions are non-limiting examples. Here, X and Y each denote an object (e.g., a device, an element, a circuit, a wiring, an electrode, a terminal, a conductive film, or a layer).

REFERENCE NUMERALS

ACL: wiring, C11: capacitor, C21: capacitor, GL: wiring, M11: transistor, M12: transistor, M13: transistor, M15: transistor, M16: transistor, M17: transistor, M18: transistor, RL: wiring, RS: wiring, TX: wiring, V11: wiring, V12: wiring, V13: wiring, WX: wiring, 10: display apparatus, 11: light-emitting device, 12: light-receiving device, 15: electrode, 17: EL layer, 19: light-receiving layer, 23: substrate, 80: pixel, 81: pixel, 82: pixel

The invention claimed is:

1. A display apparatus comprising:
a power supply line;
a first transistor;
a second transistor;
a light-emitting device; and
a light-receiving device,
wherein the light-emitting device comprises a first electrode, a light-emitting layer, a first electron-transport layer, an electron-injection layer, and a second electrode that are stacked in this order,
wherein the light-receiving device comprises a third electrode, an active layer, a first hole-transport layer, the electron-injection layer, and the second electrode that are stacked in this order,
wherein the first electrode is electrically connected to one of a source and a drain of the first transistor,
wherein the third electrode is electrically connected to one of a source and a drain of the second transistor, and
wherein the power supply line is electrically connected to the other of the source and the drain of the first transistor and the other of the source and the drain of the second transistor.

2. A display apparatus comprising:
a power supply line;
a first transistor;
a second transistor;
a light-emitting device; and
a light-receiving device,
wherein the light-emitting device comprises a first electrode, a light-emitting layer, a first electron-transport layer, an electron-injection layer, and a second electrode that are stacked in this order,
wherein the light-receiving device comprises a third electrode, an active layer, a first hole-transport layer, the electron-injection layer, and the second electrode that are stacked in this order,
wherein the first electrode is electrically connected to one of a source and a drain of the first transistor,
wherein the third electrode is electrically connected to one of a source and a drain of the second transistor,
wherein the power supply line is electrically connected to the other of the source and the drain of the first transistor and the other of the source and the drain of the second transistor, and
wherein a potential of the power supply line is higher than a potential of the second electrode.

3. The display apparatus according to claim 1,
wherein the first electrode and the third electrode are provided over a same surface.

4. The display apparatus according to claim 1,
wherein the light-emitting device comprises a second hole-transport layer between the first electrode and the light-emitting layer.

5. The display apparatus according to claim 1,
wherein the light-receiving device comprises a second electron-transport layer between the third electrode and the active layer.

6. The display apparatus according to claim 1,
wherein the light-emitting device is configured to emit visible light, and
wherein the light-receiving device is configured to detect visible light.

7. The display apparatus according to claim 1,
wherein the light-emitting device is configured to emit infrared light, and
wherein the light-receiving device is configured to detect infrared light.

8. A display module comprising:
the display apparatus according to claim 1, and
at least one of a connector and an integrated circuit.

9. An electronic device comprising:
the display module according to claim 8, and
at least one of a housing, a battery, a camera, a speaker, and a microphone.

10. The display apparatus according to claim 2,
wherein the first electrode and the third electrode are provided over a same surface.

11. The display apparatus according to claim 2,
wherein the light-emitting device comprises a second hole-transport layer between the first electrode and the light-emitting layer.

12. The display apparatus according to claim 2,
wherein the light-receiving device comprises a second electron-transport layer between the third electrode and the active layer.

13. The display apparatus according to claim 2,
wherein the light-emitting device is configured to emit visible light, and
wherein the light-receiving device is configured to detect visible light.

14. The display apparatus according to claim 2,
wherein the light-emitting device is configured to emit infrared light, and
wherein the light-receiving device is configured to detect infrared light.

15. A display module comprising:
the display apparatus according to claim 2, and
at least one of a connector and an integrated circuit.

16. An electronic device comprising:
the display module according to claim 15, and
at least one of a housing, a battery, a camera, a speaker, and a microphone.

* * * * *